United States Patent
Goto et al.

(10) Patent No.: US 12,554,196 B2
(45) Date of Patent: Feb. 17, 2026

(54) ACTINIC RAY-SENSITIVE OR RADIATION-SENSITIVE RESIN COMPOSITION, PATTERN FORMING METHOD, RESIST FILM, METHOD FOR MANUFACTURING ELECTRONIC DEVICE, COMPOUND, AND METHOD FOR PRODUCING COMPOUND

(71) Applicant: FUJIFILM Corporation, Tokyo (JP)

(72) Inventors: Akiyoshi Goto, Haibara-gun (JP); Akira Takada, Haibara-gun (JP); Aina Ushiyama, Haibara-gun (JP); Masafumi Kojima, Haibara-gun (JP); Michihiro Shirakawa, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 518 days.

(21) Appl. No.: 18/059,329

(22) Filed: Nov. 28, 2022

(65) Prior Publication Data

US 2023/0148344 A1     May 11, 2023

Related U.S. Application Data

(63) Continuation of application No. PCT/JP2021/016156, filed on Apr. 21, 2021.

(30) Foreign Application Priority Data

May 29, 2020    (JP) ................... 2020-094485

(51) Int. Cl.
    *G03F 7/038*     (2006.01)
    *G03F 7/039*     (2006.01)

(52) U.S. Cl.
    CPC .......... *G03F 7/0382* (2013.01); *G03F 7/0392* (2013.01)

(58) Field of Classification Search
    None
    See application file for complete search history.

(56) References Cited

U.S. PATENT DOCUMENTS

| | | | |
|---|---|---|---|
| 6,111,143 A | 8/2000 | Park et al. | |
| 6,210,859 B1 * | 4/2001 | Jeon | G03F 7/0045 430/920 |
| 2022/0334476 A1 | 10/2022 | Kojima et al. | |

FOREIGN PATENT DOCUMENTS

| | | |
|---|---|---|
| JP | 2000-034274 A | 2/2000 |
| JP | 2001-114822 A | 4/2001 |
| JP | 2009-019028 A | 1/2009 |
| TW | 482754 B | 4/2002 |
| WO | 2021/039244 A1 | 3/2021 |

OTHER PUBLICATIONS

Communication dated Jun. 6, 2023 issued by the Japanese Patent Office in application No. 2022-527592.
International Search Report dated Jun. 29, 2021 from the International Searching Authority in International Application No. PCT/JP2021/016156.
Written Opinion dated Jun. 29, 2021 from the International Searching Authority in International Application No. PCT/JP2021/016156.
International Preliminary Report on Patentability with the translation of Written Opinion dated Nov. 17, 2022 from the International Searching Authority in International Application No. PCT/JP2021/016156.
Taiwanese Office Action dated Sep. 27, 2024 in Application No. 110116127.
Korean Office Action dated Apr. 9, 2024 in Application No. 10-2022-7041620.
Extended European Search Report dated Nov. 8, 2023 in European Application No. 21812472.5.
Office Action issued Mar. 25, 2025 in Taiwanese Patent Application No. 110116127.

* cited by examiner

*Primary Examiner* — Anca Eoff
(74) *Attorney, Agent, or Firm* — Sughrue Mion, PLLC

(57) ABSTRACT

The present invention provides an actinic ray-sensitive or radiation-sensitive resin composition with which a pattern having excellent LWR performance can be obtained, a resist film, a pattern forming method, a method for manufacturing an electronic device, a compound, and a method for producing the compound. The actinic ray-sensitive or radiation-sensitive resin composition of an embodiment of the present invention is an actinic ray-sensitive or radiation-sensitive resin composition including a resin having a repeating unit having a group having a polarity that increases through decomposition by the action of an acid, in which the actinic ray-sensitive or radiation-sensitive resin composition further includes, in addition to the resin, a compound having at least one cation represented by General Formula (1), or the resin further has, in addition to the repeating unit, a repeating unit having the cation represented by General Formula (1).

$$(R^{d1})_m —[X^{d1}]^+ -(L^{d1}-Ar^{d1}—(S—X^{d2})_p)_n \quad (1)$$

17 Claims, No Drawings

ACTINIC RAY-SENSITIVE OR RADIATION-SENSITIVE RESIN COMPOSITION, PATTERN FORMING METHOD, RESIST FILM, METHOD FOR MANUFACTURING ELECTRONIC DEVICE, COMPOUND, AND METHOD FOR PRODUCING COMPOUND

CROSS-REFERENCE TO RELATED APPLICATIONS

This application is a Continuation of PCT International Application No. PCT/JP2021/016156 filed on Apr. 21, 2021, which claims priority under 35 U.S.C. § 119(a) to Japanese Patent Application No. 2020-094485 filed on May 29, 2020. The above application is hereby expressly incorporated by reference, in its entirety, into the present application.

BACKGROUND OF THE INVENTION

1. Field of the Invention

The present invention relates to an actinic ray-sensitive or radiation-sensitive resin composition, a pattern forming method, a resist film, a method for manufacturing an electronic device, a compound, and a method for producing the compound.

2. Description of the Related Art

In processes for manufacturing semiconductor devices such as an integrated circuit (IC) and a large scale integrated circuit (LSI), microfabrication by lithography using a photosensitive composition has been performed.

Examples of the lithographic method include a method in which a resist film is formed with a photosensitive composition, and then the obtained film is exposed and then developed.

In JP2009-019028A, a predetermined compound is disclosed as an acid generator to be used in a photosensitive composition, and for example, the following compounds are exemplified.

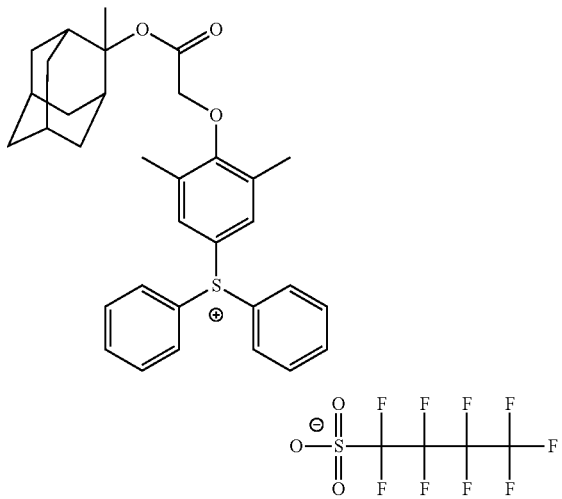

SUMMARY OF THE INVENTION

The present inventors have specifically examined the characteristics of the compounds disclosed in JP2009-019028A, and have thus found that an actinic ray-sensitive or radiation-sensitive resin composition including the compound described in JP2009-019028A has room for improvement in the line width roughness (LWR) performance of a pattern obtained.

Therefore, an object of the present invention is to provide an actinic ray-sensitive or radiation-sensitive resin composition with which a pattern having excellent LWR performance is obtained.

In addition, another object of the present invention is to provide a resist film, a pattern forming method, a method for manufacturing an electronic device, a compound, and a method for producing the compound, each relating to the actinic ray-sensitive or radiation-sensitive resin composition.

The present inventors have found that the objects can be accomplished by the following configurations.

(1) An actinic ray-sensitive or radiation-sensitive resin composition comprising a resin having a repeating unit having a group having a polarity that increases through decomposition by an action of an acid,
 in which the actinic ray-sensitive or radiation-sensitive resin composition further includes, in addition to the resin, a compound having at least one cation represented by General Formula (1) which will be described later, or
 the resin further has, in addition to the repeating unit, a repeating unit having a cation represented by General Formula (1) which will be described later.

(2) The actinic ray-sensitive or radiation-sensitive resin composition as described in (1),
 in which the actinic ray-sensitive or radiation-sensitive resin composition has a compound having at least one cation represented by General Formula (1), and
 the compound having at least one cation represented by General Formula (1) includes at least one selected from the group consisting of a compound represented by General Formula (2) which will be described later and a compound represented by General Formula (3) which will be described later.

(3) The actinic ray-sensitive or radiation-sensitive resin composition as described in (1) or (2),
 in which $X^{d1}$ is a sulfur atom.

(4) The actinic ray-sensitive or radiation-sensitive resin composition as described in any one of (1) to (3),
 in which in General Formula (1), the group having a polarity that increases through decomposition by an action of an acid is a group represented by General Formula (a-1) which will be described later.

(5) The actinic ray-sensitive or radiation-sensitive resin composition as described in any one of (1) to (4),
 in which in General Formula (1), n represents an integer of 2 or 3, or p represents an integer of 2 to 5.

(6) A resist film formed of the actinic ray-sensitive or radiation-sensitive resin composition as described in any one of (1) to (5).

(7) A pattern forming method comprising:
 a step of forming a resist film on a substrate using the actinic ray-sensitive or radiation-sensitive resin composition as described in any one of (1) to (5);
 a step of exposing the resist film; and
 a step of developing the exposed resist film using a developer to form a pattern.

(8) A method for manufacturing an electronic device, comprising the pattern forming method as described in (7).

(9) A compound comprising at least one cation represented by General Formula (1) which will be described later.

(10) The compound as described in (9),
in which the compound is a compound represented by General Formula (2) which will be described later or a compound represented by General Formula (3) which will be described later.
(11) The compound as described in (9) or (10),
in which $X^{d1}$ is a sulfur atom.
(12) The compound as described in any one of (9) to (11),
in which in General Formula (1), the group having a polarity that increases through decomposition by an action of an acid is a group represented by General Formula (a-1) which will be described later.
(13) The compound as described in any one of (9) to (12),
in which in General Formula (1), n is an integer of 2 or 3, or p is an integer of 2 to 5.
(14) A method for producing the compound having at least one cation represented by General Formula (1) as described in any one of (9) to (13),
in which a compound having at least one cation represented by General Formula (4) which will be described later is reacted with a compound represented by General Formula (5) which will be described later in a presence of a basic compound to produce the compound having at least one cation represented by General Formula (1).

According to the present invention, it is possible to provide an actinic ray-sensitive or radiation-sensitive resin composition by which a pattern having excellent LWR performance can be obtained.

In addition, according to the present invention, it is possible to provide a resist film, a pattern forming method, a method for manufacturing an electronic device, a compound, and a method for producing the compound, each relating to the actinic ray-sensitive or radiation-sensitive resin composition.

DESCRIPTION OF THE PREFERRED EMBODIMENTS

Hereinafter, an example of a form for carrying out the present invention will be described.

A numerical value range expressed using "to" in the present specification means a range that includes the preceding and succeeding numerical values of "to" as a lower limit value and an upper limit value, respectively.

In notations for a group (atomic group) in the present specification, in a case where the group is noted without specifying whether it is substituted or unsubstituted, the group includes both a group having no substituent and a group having a substituent. For example, an "alkyl group" includes not only an alkyl group having no substituent (unsubstituted alkyl group), but also an alkyl group having a substituent (substituted alkyl group).

The substituent is preferably a monovalent substituent unless otherwise specified.

An "organic group" in the present specification refers to a group including at least one carbon atom.

Examples of the halogen atom in the present specification include a fluorine atom, a chlorine atom, a bromine atom, and an iodine atom.

The bonding direction of divalent groups noted in the present specification is not limited unless otherwise specified. For example, in a case where Y in a compound represented by General Formula "X—Y—Z" is —COO—, Y may be —CO—O— or —O—CO—. In addition, the compound may be "X—CO—O—Z" or "X—O—CO—Z".

"(Meth)acryl" in the present specification is a generic term encompassing acryl and methacryl, and means "at least one of acryl or methacryl". Similarly, "(meth)acrylic acid" means "at least one of acrylic acid or methacrylic acid".

"Actinic rays" or "radiation" in the present specification means, for example, a bright line spectrum of a mercury lamp, far ultraviolet rays typified by an excimer laser, extreme ultraviolet rays (EUV light), X-rays, electron beams (EB), or the like. "Light" in the present specification means actinic rays or radiation.

Unless otherwise specified, "exposure" in the present specification encompasses not only exposure by a bright line spectrum of a mercury lamp, far ultraviolet rays typified by an excimer laser (an ArF excimer laser and the like), X-rays, EUV light, or the like, but also lithography by particle beams such as electron beams and ion beams.

The weight-average molecular weight (Mw), the number-average molecular weight (Mn), and the dispersity (hereinafter also referred to as a "molecular weight distribution") (Mw/Mn) of a resin in the present specification are defined as values expressed in terms of polystyrene by means of gel permeation chromatography (GPC) measurement (solvent: tetrahydrofuran, flow amount (amount of a sample injected): 10 µL, columns: TSK gel Multipore HXL-M manufactured by Tosoh Corporation, column temperature: 40° C., flow rate: 1.0 mL/min, and detector: differential refractive index detector) using a GPC apparatus (HLC-8120GPC manufactured by Tosoh Corporation).

1 Å is $1 \times 10^{-10}$ m.

An acid dissociation constant (pKa) in the present specification represents a pKa in an aqueous solution, and is specifically a value determined by computation from a value based on a Hammett's substituent constant and database of publicly known literature values, using the following software package 1. Any of the pKa values described in the present specification indicate values determined by computation using the software package.

Software Package 1: Advanced Chemistry Development (ACD/Labs) Software V 8.14 for Solaris (1994-2007 ACD/Labs).

On the other hand, the pKa can also be determined by a molecular orbital computation method. Specifically, a method in which the calculation is performed by computing H+ dissociation free energy in a solvent based on a thermodynamic cycle may be mentioned. (Furthermore, in the present specification, water is usually used as the solvent, and in a case where a pKa is not determined with water, dimethyl sulfoxide (DMSO) is used.)

With regard to the method for computing the H+ dissociation free energy, the H+ dissociation free energy can be computed by, for example, density functional theory (DFT), but various other methods have been reported in literature and the like, and are not limited thereto. Furthermore, there are a plurality of software applications capable of performing DFT, and examples thereof include Gaussian 16.

The pKa in the present specification refers to a value determined by computation from a value based on a Hammett's substituent constant and database of publicly known literature values, using the software package 1, as described above, but in a case where the pKa cannot be calculated by the method, a value obtained by Gaussian 16 based on density functional theory (DFT) shall be adopted.

[Actinic Ray-Sensitive or Radiation-Sensitive Resin Composition]

The actinic ray-sensitive or radiation-sensitive resin composition of an embodiment of the present invention (hereinafter also referred to as a "resist composition") will be described.

The resist composition of the embodiment of the present invention may be either a positive tone resist composition or a negative tone resist composition. In addition, the resist composition may be either a resist composition for alkali development or a resist composition for organic solvent development.

The composition of the embodiment of the present invention is typically a chemically amplified resist composition.

The resist composition of the embodiment of the present invention is a resist composition including a resin (hereinafter also referred to as an "acid-decomposable resin") having a repeating unit having a group having a polarity that increases through decomposition by the action of an acid (hereinafter also referred to as a "repeating unit having an acid-decomposable group"), in which the resist composition further includes, in addition to the acid-decomposable resin, a compound (hereinafter also referred to as a "specific compound") having at least one cation (hereinafter also referred to as a "specific cation") represented by General Formula (1) which will be described later, or the acid-decomposable resin further has, in addition to the repeating unit having an acid-decomposable group, a repeating unit having a cation represented by General Formula (1) which will be described later (hereinafter also referred to as a "specific repeating unit").

In other words, the resist composition of the embodiment of the present invention includes an acid-decomposable resin and a specific compound, or includes an acid-decomposable resin having a specific repeating unit.

Mechanism by which the objects of the present invention can be accomplished through such configurations is not clear, but is presumed to be as follows. Furthermore, the mechanism will be described below by taking an aspect in which the specific compound is used as an example.

The specific compound usually acts as a photoacid generator. Since the specific compound includes a sulfur atom at a predetermined position, the polarity of a cation is reduced as compared to the compound described in JP2009-019028A, the aggregation between the specific compounds, and the like are suppressed, and the compatibility with the acid-decomposable resin is also improved, whereby the LWR performance of a pattern thus formed is excellent. In particular, by generating a polar group through decomposition of the acid-decomposable group contained in the specific compound, together with a polar group generated from the acid-decomposable resin, an increase in the solubility of the exposed portion in an alkali developer and a decrease in solubility in an organic solvent developer are shown, and the LWR performance tends to be improved in both a positive tone and a negative tone.

Hereinafter, in the present specification, a fact that a pattern having more excellent LWR performance can be obtained can also be expressed as follows: the effect of the present invention is excellent.

[Resist Composition]

Hereinafter, components that can be included in the resist composition will be described in detail.

<Compound Having at Least One Cation Represented by General Formula (1)>

The resist composition of the embodiment of the present invention includes a specific compound, or includes an acid-decomposable resin having a specific repeating unit which will be described later. First, the specific compound will be described in detail below.

The specific compound acts as a photoacid generator or an acid diffusion control agent. The photoacid generator is a compound that generates an acid upon irradiation (exposure) with actinic rays or radiation (preferably EUV light or ArF). The acid diffusion control agent is a compound that acts as a quencher trapping an acid generated from a photoacid generator and controls the phenomenon of acid diffusion in the resist film.

In a case where the specific compound acts as an photoacid generator, although not being particularly limited, the pKa of an acid generated from the specific compound is often smaller than the pKa of an acid generated from an acid diffusion control agent which will be described later in the resist composition. In a case where the specific compound acts as the photoacid generator, the acid-decomposable resin which will be described later can often decompose by the action of an acid.

In a case where the specific compound acts as an acid diffusion control agent, although not being particularly limited, the pKa of an acid generated from the specific compound is often more than the pKa of an acid generated from a photoacid generator separately included in the resist composition. In a case where the specific compound acts as the acid diffusion control agent, an acid-decomposable resin which will be described later cannot often decompose by the action of an acid.

That is, the specific compound can act as a photoacid generator or an acid diffusion control agent, depending on a relative relationship with components included in other resist compositions.

The volume of an acid generated from the specific compound is not particularly limited, but from the viewpoint of suppressing the diffusion of the acid generated upon exposure into the non-exposed area and improving the resolution, the volume is preferably 240 $Å^3$ or more, more preferably 305 $Å^3$ or more, still more preferably 350 $Å^3$ or more, and particularly preferably 400 $Å^3$ or more. Incidentally, from the viewpoint of the sensitivity or the solubility in an application solvent, the volume of the acid generated from the specific compound is preferably 1,500 $Å^3$ or less, more preferably 1,000 $Å^3$ or less, and still more preferably 700 $Å^3$ or less.

The value of the volume is obtained using "WinMOPAC" manufactured by Fujitsu Limited. In the computation of the value of the volume, first, the chemical structure of an acid according to each example is input, next, using this structure as an initial structure, the most stable conformation of each acid is determined by molecular force field computation using a molecular mechanics (MM) 3 method, and thereafter with respect to the most stable conformation, molecular orbital computation using a parameterized model number (PM) 3 method is performed, whereby the "accessible volume" of each acid can be computed.

The specific compound is preferably a compound that generates an acid (preferably an organic acid) upon exposure.

Examples of the acid include sulfonic acids (an aliphatic sulfonic acid, an aromatic sulfonic acid, and a camphor sulfonic acid), carboxylic acids (an aliphatic carboxylic acid, an aromatic carboxylic acid, and an aralkylcarboxylic acid), a carbonylsulfonylimide acid, a bis(alkylsulfonyl)imide acid, and a tris(alkylsulfonyl)methide acid.

The structure of an acid generated from the specific compound is not particularly limited, but from the viewpoint that the diffusion of the acid is suppressed and the resolution is improved, it is preferable that the interaction between the acid generated from the specific compound and an acid-decomposable resin which will be described later is strong. From this viewpoint, in a case where the acid generated from the photoacid generator is an organic acid, it is preferable, for example, that the organic acid further has a polar group, in addition to an organic acid group such as a sulfonic acid group, a carboxylic acid group, a carbonylsulfonylimide acid group, a bissulfonylimide acid group, and a trissulfonylmethide acid group.

Examples of the polar group include an ether group, an ester group, an amide group, an acyl group, a sulfo group, a sulfonyloxy group, a sulfonamide group, a thioether group, a thioester group, a urea group, a carbonate group, a carbamate group, a hydroxyl group, and a mercapto group.

The number of the polar groups in the generated acid is not particularly limited, but is preferably 1 or more, and more preferably 2 or more. It should be noted that from the viewpoint of suppressing excessive development, the number of the polar groups is preferably less than 6, and more preferably less than 4.

The specific compound is a compound having at least one cation represented by General Formula (1).

The number of the cations represented by General Formula (1) contained in the specific compound is not particularly limited, and may be 1 or more, or may be 2 or more.

In a case where the specific compound has two or more cations represented by General Formula (1), the number of the cations is preferably 2 or 3.

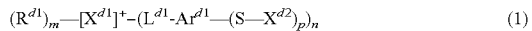

(1)

In General Formula (1), $X^{d1}$ represents a sulfur atom or an iodine atom.

Among those, $X^{d1}$ is preferably the sulfur atom from the viewpoint that the effect of the present invention is excellent.

In a case where $X^{d1}$ represents the sulfur atom, n represents an integer of 1 to 3, m represents an integer of 0 to 2, and m+n is 3. In a case where $X^{d1}$ represents the iodine atom, n represents 1 or 2, m represents 0 or 1, and m+n is 2.

p represents an integer of 1 to 5.

Among those, p is preferably an integer of 1 to 4, more preferably an integer of 1 to 3, and still more preferably 1 from the viewpoint that the effect of the present invention is excellent.

Furthermore, in a case where n is 2 or more, a plurality of p's may be same as or different from each other.

In addition, from the viewpoint that the effect of the present invention is more excellent, it is preferable that n is 2 or 3, or p is 2 to 5, and it is more preferable that n is 2 or 3, or p is 2 or 3.

$R^{d1}$ represents a linear, branched, or cyclic alkyl group which may have a substituent, a linear, branched, or cyclic alkenyl group which may have a substituent, or an aryl group which may have a substituent.

Among those, $R^{d1}$ is preferably the linear, branched, or cyclic alkyl group which may have a substituent, or the aryl group which may have a substituent, and more preferably the aryl group which may have a substituent.

The aryl group which may have a substituent, represented by $R^{d1}$, may be a monocycle or a polycycle. Among those, the aryl group is preferably the monocycle. In addition, the alkyl group or alkenyl group is preferably cyclic.

$R^{d1}$ may have a substituent or may be unsubstituted.

The substituent contained in $R^{d1}$ is preferably an alkyl group which may have a heteroatom, and more preferably an alkyl group having at least one selected from the group consisting of an oxygen atom and a halogen atom.

The group represented by $R^{d1}$ preferably has 30 or less carbon atoms, more preferably has 25 or less carbon atoms, and still more preferably has 20 or less carbon atoms. The lower limit of the number of carbon atoms is not particularly limited, but is preferably 3 or more.

In a case where m represents 2, two Rd's may be bonded to each other to form a ring. The number of ring members of the ring formed as above is preferably 5 or 6. In the ring formed by the mutual bonding of $R^{d1}$'s, one of the methylene groups constituting the ring may be substituted with a heteroatom such as an oxygen atom or a group having a heteroatom, such as a carbonyl group.

$L^{d1}$'s each independently represent a single bond or a divalent linking group.

Among those, $L^{d1}$ is preferably the single bond from the viewpoint that the effect of the present invention is more excellent.

Examples of the divalent linking group represented by $L^{d1}$ include —O—, —CO—, —COO—, —S—, —NH—, —CS—, —SO—, —SO$_2$—, a hydrocarbon group (for example, an alkylene group, a cycloalkylene group, an alkenylene group, and an arylene group) which may have a substituent, and a linking group formed by the linking of a plurality of those groups.

Among those, the divalent linking group preferably has a hydrocarbon group which may have a substituent, and more preferably has a methylene group, an ethylene group, or a propylene group.

$Ar^{d1}$ represents an aromatic hydrocarbon ring group which may have a substituent.

The aromatic hydrocarbon ring group may be a monocycle or a polycycle. Among these, the monocycle is preferable.

Examples of the aromatic hydrocarbon ring groups represented by Ara include a benzene ring group, a naphthalene ring group, and an anthracene ring group. Among those, the aromatic hydrocarbon ring group is preferably the benzene ring group or the naphthalene ring group, and more preferably the benzene ring group.

The aromatic hydrocarbon ring group represented by $Ar^{d1}$ may have a substituent or may be unsubstituted. Among those, the aromatic hydrocarbon ring group is preferably unsubstituted.

Examples of the substituent contained in the aromatic hydrocarbon ring group include a halogen atom, a linear or branched alkyl group which may have a halogen atom, and an alkoxy group which may have a halogen atom. Among those, the unsubstituted linear or branched alkyl group is preferable as the substituent.

$X^{d2}$ represents a group represented by General Formula (1-1) or a leaving group that leaves by the action of an acid. In General Formula (1-1), * represents a bonding position.

$$*\text{-}L^{d2}\text{-}R^{d2} \qquad \text{General Formula (1-1)}$$

In General Formula (1-1), $L^{d2}$ represents a single bond or a divalent linking group. Among those, $L^{d2}$ is preferably the divalent linking group from the viewpoint that the effect of the present invention is more excellent.

Examples of the divalent linking group represented by $L^{d2}$ include the divalent linking groups exemplified for $L^{d1}$ mentioned above.

$R^{d2}$ represents a group having a polarity that increases through decomposition by the action of an acid (hereinafter also referred to as an "acid-decomposable group").

The acid-decomposable group refers to a group that decomposes by the action of an acid to generate a polar group. The acid-decomposable group preferably has a structure in which the polar group is protected by a leaving group that leaves by the action of an acid. That is, the specific compound has a group that decomposes by the action of an acid to generate a polar group. The polarity increases by the action of an acid, and thus, the solubility in an alkali developer increases and the solubility in an organic solvent decreases.

As the polar group, an alkali-soluble group is preferable, and examples thereof include an acidic group such as a carboxyl group, a hydroxyl group, a phenolic hydroxyl group, a sulfonic acid group, a phosphoric acid group, a sulfonamide group, a sulfonylimide group, an (alkylsulfonyl)(alkylcarbonyl)methylene group, an (alkylsulfonyl)(alkylcarbonyl)imide group, a bis(alkylcarbonyl)methylene group, a bis(alkylcarbonyl)imide group, a bis(alkylsulfonyl)methylene group, a bis(alkyl sulfonyl)imide group, a tris(alkylcarbonyl)methylene group, and a tris(alkylsulfonyl) methylene group.

Among those, as the polar group, at least one selected from the group consisting of the carboxyl group, the hydroxyl group, the phenolic hydroxyl group, and the sulfonic acid group is preferable, and the carboxyl group, the hydroxyl group, or the phenolic hydroxyl group is more preferable.

Examples of the leaving group that leaves by the action of an acid include groups represented by General Formulae (S1) to (S3).

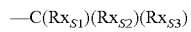  General Formula (S1):

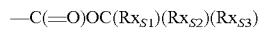  General Formula (S2):

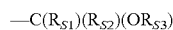  General Formula (S3):

In General Formulae (S1) and (S2), $Rx_{S1}$ to $Rx_{S3}$ each independently represent a linear or branched alkyl group which may have a substituent, a (monocyclic or polycyclic) cycloalkyl group which may have a substituent, or an (monocyclic or polycyclic) aryl group which may have a substituent.

Above all, it is preferable that $Rx_{S1}$ to $Rx_{S3}$ are each independently the linear or branched alkyl group which may have a substituent, and it is more preferable that $Rx_{S1}$ to $Rx_{S3}$ each independently represent the linear alkyl group which may have a substituent.

Two of $Rx_{S1}$ to $Rx_{S3}$ may be bonded to each other to form a monocycle or a polycycle.

As the alkyl group of each of $Rx_{S1}$ to $Rx_{S3}$, an alkyl group having 1 to 10 carbon atoms, such as a tert-butyl group, a tert-heptyl group, a methyl group, an ethyl group, an n-propyl group, an isopropyl group, an n-butyl group, and an isobutyl group, is preferable.

As the cycloalkyl group of each of $Rx_1$ to $Rx_3$, a monocyclic cycloalkyl group such as a cyclopentyl group and a cyclohexyl group, or a polycyclic cycloalkyl group such as a norbornyl group, a tetracyclodecanyl group, a tetracyclododecanyl group, and an adamantyl group is preferable.

As a ring formed by the bonding of two of $Rx_{S1}$ to $Rx_{S3}$, a cycloalkyl group is preferable. As the cycloalkyl group formed by the bonding of two of $Rx_{S1}$ to $Rx_{S3}$, a monocyclic cycloalkyl group such as a cyclopentyl group or a cyclohexyl group, or a polycyclic cycloalkyl group such as a norbornyl group, a tetracyclodecanyl group, a tetracyclododecanyl group, or an adamantyl group is preferable, and a monocyclic cycloalkyl group having 5 or 6 carbon atoms is more preferable.

In the cycloalkyl group formed by the bonding of two of $Rx_{S1}$ to $Rx_{S3}$, for example, one of the methylene groups constituting the ring may be substituted with a heteroatom such as an oxygen atom, other than a fluorine atom, or a group having a heteroatom other than a fluorine atom, such as a carbonyl group.

In General Formula (S3), $R_{S1}$ to $R_{S3}$ each independently represent a hydrogen atom or a monovalent organic group. $R_{S1}$ to $R_{S3}$ may be bonded to each other to form a ring. Examples of the monovalent organic group include a linear or branched alkyl group which may have a substituent, and a cycloalkyl group which may have a substituent. A hydrogen atom is also preferable as $R_{S1}$.

Furthermore, the alkyl group and the cycloalkyl group may include a heteroatom such as an oxygen atom, and/or a group having a heteroatom, such as a carbonyl group. For example, in the alkyl group and the cycloalkyl group, for example, one or more of the methylene groups may be substituted with a heteroatom such as an oxygen atom, and/or a group having a heteroatom, such as a carbonyl group.

In addition, $R_{S3}$ and another substituent contained in the main chain of the repeating unit may be bonded to each other to form a ring.

As the acid-decomposable group, a group represented by each of General Formulae (a-1) to (a-5) is preferable, the group represented by General Formula (a-1) or (a-2) is more preferable, and the group represented by General Formula (a-1) is still more preferable.

In General Formula (a-1), $R^{a1}$ represents a leaving group that leaves by the action of an acid. * represents a bonding position.

Examples of the leaving group that leaves by the action of an acid include groups represented by General Formulae (S1) to (S3) mentioned above.

Among those, $R^{a1}$ preferably represents the linear or branched alkyl group which may have a substituent, or the cycloalkyl group which may have a substituent.

The linear or branched alkyl group which may have a substituent, represented by $R^{a1}$, is preferably the branched alkyl group which may have a substituent from the viewpoint that the effect of the present invention is more excellent.

The alkyl group may be a linear or branched alkyl group having a substituent, or may be an unsubstituted linear or branched alkyl group. As the substituent contained in the alkyl group, a heteroatom such as an oxygen atom, or an alkyl group including a heteroatom such as an oxygen atom is preferable. Among those, as the alkyl group, the unsubstituted linear or branched alkyl group is preferable from the viewpoint that the effect of the present invention is more excellent.

The alkyl group preferably has 1 to 20 carbon atoms, more preferably has 2 to 10 carbon atoms, and still more preferably has 2 to 8 carbon atoms.

Examples of the alkyl group represented by $R^{a1}$ include a tert-butyl group, a tert-heptyl group, a methyl group, an ethyl group, an n-propyl group, an isopropyl group, an n-butyl group, an isobutyl group, a sec-butyl group, an n-pentyl group, an isopentyl group, a neopentyl group, a tert-pentyl group, an n-hexyl group, a 1-methylpentyl group, a 4-methyl-2-pentyl group, a 2-ethylbutyl group, an n-heptyl group, a 1-methylhexyl group, an n-octyl group, a 1-methylheptyl group, and a 2-ethylhexyl group.

Among those, the alkyl group represented by $R^{a1}$ is preferably the tert-butyl group or the tert-heptyl group from the viewpoint that the effect of the present invention is more excellent.

The cycloalkyl group which may have a substituent, represented by $R^{a1}$, may be a monocycle or a polycycle.

The cycloalkyl group may be a cycloalkyl group having a substituent or may be an unsubstituted cycloalkyl group. Among those, the cycloalkyl group having a substituent is preferable.

Examples of the substituent contained in the cycloalkyl group include an alkyl group which may have a substituent and an aryl group which may have a substituent.

Among those, an alkyl group having 1 to 6 carbon atoms, or the aryl group which may have a substituent is preferable, and a methyl group or an ethyl group is more preferable.

The cycloalkyl group preferably has 4 to 25 carbon atoms, more preferably has 4 to 20 carbon atoms, and still more preferably has 4 to 15 carbon atoms.

Examples of the cycloalkyl group represented by $R^{a1}$ include cyclopentyl groups such as a methylcyclopentyl group and an ethylcyclopentyl group, and cyclohexyl groups such as a methylcyclohexyl group and an ethylcyclohexyl group; and a cycloheptyl group, a cyclooctyl group, a cyclodecanyl group, a norbornyl group, a tricyclodecanyl group, a tetracyclododecanyl group, and adamantane groups such as a methyladamantyl group and an ethyladamantane group.

Among those, the cycloalkyl group represented by $R^{a1}$ is preferably at least one selected from the group consisting of the cyclopentyl group, the cyclohexyl group, the cycloheptyl group, and the adamantane group, and more preferably the methylcyclopentyl group, the ethylcyclopentyl group, the methylcyclohexyl group, the ethylcyclohexyl group, the methyladamantyl group, or the ethyladamantane group from the viewpoint that the effect of the present invention is more excellent.

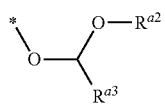

(a-2)

In General Formula (a-2), * represents a bonding position. $R^{a2}$ represents a linear or branched alkyl group which may have a substituent or a cycloalkyl group which may have a substituent.

The linear or branched alkyl group which may have a substituent, represented by Rae, has the same definition as the linear or branched alkyl group which may have a substituent, represented by $R^{a1}$, mentioned above.

Examples of the cycloalkyl group which may have a substituent, represented by $R^{a2}$, include the cycloalkyl group which may have a substituent, represented by $R^{a1}$, mentioned above.

$R^{a1}$ represents a hydrogen atom, a linear or branched alkyl group which may have a substituent, or a cycloalkyl group which may have a substituent.

The linear or branched alkyl group which may have a substituent, represented by $R^{a3}$, has the same definition as the linear or branched alkyl group which may have a substituent, represented by $R^{a1}$, mentioned above.

The cycloalkyl group which may have a substituent, represented by $R^{a3}$, has the same definition as the cycloalkyl group which may have a substituent, represented by $R^{a1}$, mentioned above.

$R^{a2}$ and $R^{a1}$ may be bonded to each other to form a ring.

The ring formed by the mutual bonding of $R^{a2}$ and $R^{a3}$ may be a monocycle or a polycycle. Among these, the monocycle is preferable.

Examples of the monocycle formed by the mutual bonding of $R^{a2}$ and $R^{a3}$ include a cycloalkane having 3 to 6 carbon atoms. More specific examples thereof include a cyclopropane ring, a cyclobutane ring, a cyclopentane ring, and a cyclohexane ring. Some of the carbon atoms in the ring may be substituted with a heteroatom such as an oxygen atom.

(a-3)

In General Formula (a-3), * represents a bonding position. $R^{a4}$ represents a leaving group that leaves by the action of an acid.

Examples of the leaving group include groups represented by General Formulae (S1) to (S3) mentioned above.

(a-4)

In General Formula (a-4), * represents a bonding position. $R^{a5}$ and $R^{a6}$ each independently represent a linear or branched alkyl group.

$R^{a5}$ and $R^{a6}$ may be bonded to each other to form a monocycle (for example, an aliphatic hydrocarbon ring) or a polycycle.

(a-5)

In General Formula (a-5), * represents a bonding position. $R^{a7}$ and $R^{a8}$ each independently represent a linear or branched alkyl group which may have a substituent.

The type of the leaving group that leaves by the action of an acid, represented by $X^{d2}$, is not particularly limited, and examples thereof include known leaving groups. Incidentally, in a case where the leaving group that leaves by the action of an acid, represented by $X^{d2}$, leaves from the group represented by —S—$X^{d2}$ in General Formula (1), an SH group (thiol group) is formed.

Examples of the leaving group include groups represented by General Formulae (S1) to (S3) mentioned above.

(Organic Anion)

The specific compound preferably includes an organic anion.

The organic anion may be a monovalent or divalent organic anion. Among those, the organic anion is preferably monovalent to trivalent.

The organic anion is preferably an anion having a significantly low ability to cause a nucleophilic reaction, and specific examples thereof include a non-nucleophilic anion.

Examples of the non-nucleophilic anion include a sulfonate anion (an aliphatic sulfonate anion, an aromatic sulfonate anion, a camphor sulfonate anion, and the like), a carboxylate anion (an aliphatic carboxylate anion, an aromatic carboxylate anion, an aralkyl carboxylate anion, and the like), a sulfonylimide anion, a bis(alkylsulfonyl)imide anion, and a tris(alkylsulfonyl)methide anion.

The aliphatic moiety in the aliphatic sulfonate anion and the aliphatic carboxylate anion may be a linear or branched alkyl group, or may be a cycloalkyl group. A linear or branched alkyl group having 1 to 30 carbon atoms, or a cycloalkyl group having 3 to 30 carbon atoms is preferable.

The alkyl group may be, for example, a fluoroalkyl group (which may be a perfluoroalkyl group).

The aryl group in the aromatic sulfonate anion and the aromatic carboxylate anion is preferably an aryl group having 6 to 14 carbon atoms, and examples thereof include a phenyl group, a tolyl group, and a naphthyl group.

The alkyl group, the cycloalkyl group, and the aryl group may have a substituent. The substituent is not particularly limited, but specific examples of the substituent include a nitro group, a halogen atom such as fluorine atom and a chlorine atom, a carboxyl group, a hydroxyl group, an amino group, a cyano group, an alkoxy group (preferably having 1 to 15 carbon atoms), an alkyl group (preferably having 1 to 10 carbon atoms), a cycloalkyl group (preferably having 3 to 15 carbon atoms), an aryl group (preferably having 6 to 14 carbon atoms), an alkoxycarbonyl group (preferably having 2 to 7 carbon atoms), an acyl group (preferably having 2 to 12 carbon atoms), an alkoxycarbonyloxy group (preferably having 2 to 7 carbon atoms), an alkylthio group (preferably having 1 to 15 carbon atoms), an alkylsulfonyl group (preferably having 1 to 15 carbon atoms), an alkyliminosulfonyl group (preferably having 1 to 15 carbon atoms), and an aryloxysulfonyl group (preferably having 6 to 20 carbon atoms).

The aralkyl group in the aralkyl carboxylate anion is preferably an aralkyl group having 7 to 14 carbon atoms, and examples thereof include a benzyl group, a phenethyl group, a naphthylmethyl group, a naphthylethyl group, and a naphthylbutyl group.

Examples of the sulfonylimide anion include a saccharin anion.

The alkyl group in the bis(alkylsulfonyl)imide anion and the tris(alkylsulfonyl)methide anion is preferably an alkyl group having 1 to 5 carbon atoms. Examples of the substituent of such an alkyl group include a halogen atom, an alkyl group substituted with a halogen atom, an alkoxy group, an alkylthio group, an alkyloxysulfonyl group, an aryloxysulfonyl group, and a cycloalkylaryloxysulfonyl group.

Among those, the fluorine atom or the alkyl group substituted with a fluorine atom is preferable.

In addition, the alkyl groups in the bis(alkylsulfonyl)imide anion may be bonded to each other to form a ring structure. Thus, the acid strength increases.

Examples of the other non-nucleophilic anions include fluorinated phosphorus (for example, $PF_6^-$), fluorinated boron (for example, $BF_4^-$), and fluorinated antimony (for example, $SbF_6^-$).

As the non-nucleophilic anion, an aliphatic sulfonate anion in which at least α-position of sulfonic acid is substituted with a fluorine atom, an aromatic sulfonate anion substituted with a fluorine atom or a group having a fluorine atom, a bis(alkylsulfonyl)imide anion in which an alkyl group is substituted with a fluorine atom, or a tris(alkylsulfonyl)methide anion in which an alkyl group is substituted with a fluorine atom is preferable. Among these, a perfluoroaliphatic sulfonate anion (preferably having 4 to 8 carbon atoms) or a fluorine atom-containing benzenesulfonate anion is more preferable, and a nonafluorobutanesulfonate anion, a perfluorooctanesulfonate anion, a pentafluorobenzenesulfonate anion, or a 3,5-bis(trifluoromethyl)benzenesulfonate anion is still more preferable.

As the non-nucleophilic anion, an anion represented by Formula (AN1) is also preferable.

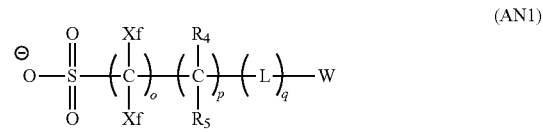

(AN1)

In General Formula (AN1), o represents an integer of 1 to 3. p represents an integer of 0 to 10. q represents an integer of 0 to 10.

Xf represents a fluorine atom or an alkyl group substituted with at least one fluorine atom. The alkyl group preferably has 1 to 10 carbon atoms, and more preferably has 1 to 4 carbon atoms. In addition, a perfluoroalkyl group is preferable as the alkyl group substituted with at least one fluorine atom.

Xf is preferably the fluorine atom or a perfluoroalkyl group having 1 to 4 carbon atoms, and more preferably the fluorine atom or $CF_3$. In particular, it is still more preferable that both Xf s are fluorine atoms.

$R_4$ and $R_5$ each independently represent a hydrogen atom, a fluorine atom, an alkyl group, or an alkyl group substituted with at least one fluorine atom. In a case where $R_4$'s and $R_5$'s are each present in a plural number, $R_4$'s and $R_5$'s may each be the same as or different from each other.

The alkyl group represented by each of $R_4$ and $R_5$ may have a substituent, and preferably has 1 to 4 carbon atoms. $R_4$ and $R_5$ are each preferably the hydrogen atom.

Specific examples and suitable aspects of the alkyl group substituted with at least one fluorine atom are the same ones as the specific examples and the suitable aspects of Xf in General Formula (AN1), respectively.

L represents a divalent linking group. In a case where L's are present in a plural number, they may be the same as or different from each other.

Examples of the divalent linking group include —O—CO—O—, —COO—, —OCO—, —CONH—, —NHCO—, —CO—, —O—, —S—, —SO—, —SO$_2$—, an alkylene group (preferably having 1 to 6 carbon atoms), a cycloalkylene group (preferably having 3 to 15 carbon atoms), an alkenylene group (preferably having 2 to 6 carbon atoms), and a divalent linking group formed by combination of a plurality of these groups. Among those, —O—CO—O—, —COO—, —OCO—, —CONH—, —NHCO—, —CO—, —O—, —SO$_2$—, —O—CO—O- alkylene group-, -alkylene group-O—CO—O—, —COO-alkylene group-, —OCO-alkylene group-, —CONH-alkylene group-, or —NHCO-alkylene group- is preferable; and —O—CO—O—, —O—CO—O-alkylene group-, -alkylene group-O—CO—O—, —COO—, —OCO—, —CONH—, —SO$_2$—, —COO-alkylene group-, or —OCO-alkylene group- is more preferable.

W represents an organic group including a cyclic structure. Among those, W is preferably a cyclic organic group.

Examples of the cyclic organic group include an alicyclic group, an aryl group, and a heterocyclic group.

The alicyclic group may be either a monocycle or a polycycle. Examples of the monocyclic alicyclic group include monocyclic cycloalkyl groups such as a cyclopentyl group, a cyclohexyl group, and a cyclooctyl group. Examples of the polycyclic alicyclic group include polycyclic cycloalkyl groups such as a norbornyl group, a tricyclodecanyl group, a tetracyclodecanyl group, a tetracyclododecanyl group, and an adamantyl group. Among those, an alicyclic group having a bulky structure having 7 or more carbon atoms, such as a norbornyl group, a tricyclodecanyl group, a tetracyclodecanyl group, a tetracyclododecanyl group, and an adamantyl group, is preferable.

The aryl group may be either a monocycle or a polycycle. Examples of the aryl group include a phenyl group, a naphthyl group, a phenanthryl group, and an anthryl group.

The heterocyclic group may be either a monocycle or a polycycle. The polycycle can further suppress acid diffusion. Furthermore, the heterocyclic group may have aromaticity or may not have aromaticity. Examples of the heterocyclic ring having aromaticity include a furan ring, a thiophene ring, a benzofuran ring, a benzothiophene ring, a dibenzofuran ring, a dibenzothiophene ring, and a pyridine ring. Examples of the heterocyclic ring not having aromaticity include a tetrahydropyran ring, a lactone ring, a sultone ring, and a decahydroisoquinoline ring. As the heterocyclic ring in the heterocyclic group, the furan ring, the thiophene ring, the pyridine ring, or the decahydroisoquinoline ring is particularly preferable.

The cyclic organic group may have a substituent. Examples of the substituent include an alkyl group (which may be either linear or branched, preferably having 1 to 12 carbon atoms), a cycloalkyl group (which may be any of a monocycle, a polycycle, and a spirocycle, and preferably has 3 to 20 carbon atoms), an aryl group (preferably having 6 to 14 carbon atoms), a hydroxyl group, an alkoxy group, an ester group, an amide group, a urethane group, a ureide group, a thioether group, a sulfonamide group, and a sulfonic acid ester group. Incidentally, the carbon constituting the cyclic organic group (carbon contributing to ring formation) may be carbonyl carbon.

As the anion represented by General Formula (AN1), SO$_3^-$—CF$_2$—CH$_2$—OCO-(L)q'-W, SO$_3^-$—CF$_2$—CHF—CH$_2$—OCO-(L)q'-W, SO$_3^-$—CF$_2$—COO-(L)q'-W, SO$_3^-$—CF$_2$—CF$_2$—CH$_2$—CH$_2$-(L)q-W, or SO$_3^-$—CF$_2$—CH(CF$_3$)—OCO-(L)q'-W is preferable. Here, L, q, and W are each the same as in General Formula (AN1). q' represents an integer of 0 to 10.

As the non-nucleophilic anion, an anion represented by Formula (AN2) is also preferable.

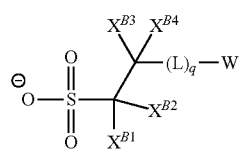

(AN2)

In General Formula (AN2), $X^{B1}$ and $X^{B2}$ each independently represent a hydrogen atom or a monovalent organic group having no fluorine atom. It is preferable that $X^{B1}$ and $X^{B2}$ are each the hydrogen atom.

$X^{B3}$ and $X^{B4}$ each independently represent a hydrogen atom or a monovalent organic group. It is preferable that at least one of $X^{B3}$ or $X^{B4}$ is a fluorine atom or a monovalent organic group having a fluorine atom, and it is more preferable that both of $X^{B3}$ and $X^{B4}$ are fluorine atoms or monovalent organic groups having a fluorine atom. It is still more preferable that both $X^{B3}$ and $X^{B4}$ are alkyl groups substituted with a fluorine atom.

L, q, and W are the same as in General Formula (AN1).

As the non-nucleophilic anion, an anion represented by Formula (AN3) is preferable.

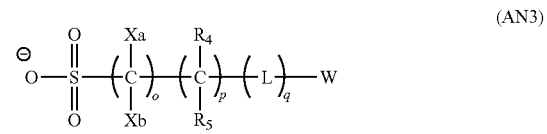

(AN3)

In General Formula (AN3), Xa's each independently represent a fluorine atom or an alkyl group substituted with at least one fluorine atom. Xb's each independently represent a hydrogen atom or an organic group having no fluorine atom. The definitions and preferred aspects of o, p, q, $R_4$, $R_5$, L, and W are each the same as those in General Formula (AN1).

As the non-nucleophilic anion, an anion represented by Formula (AN4) is also preferable.

(AN4)

In General Formula (AN4), $R^1$ and $R^2$ each independently represent a substituent that is not an electron-withdrawing group, or a hydrogen atom.

Examples of the substituent that is not the electron-withdrawing group include a hydrocarbon group, a hydroxyl group, an oxyhydrocarbon group, an oxycarbonyl hydrocarbon group, an amino group, a hydrocarbon-substituted amino group, and a hydrocarbon-substituted amide group.

In addition, it is preferable that the substituents which are not electron-withdrawing groups are each independently —R', —OH, —OR', —OCOR', —NH$_2$, —NR'$_2$, —NHR', or —NHCOR. R' is a monovalent hydrocarbon group.

Examples of the monovalent hydrocarbon group represented by R' include monovalent linear or branched hydrocarbon groups such as alkyl groups such as a methyl group, an ethyl group, a propyl group, and a butyl group; alkenyl groups such as an ethenyl group, a propenyl group, and a butenyl group; and alkynyl groups such as an ethynyl group, a propynyl group, and a butynyl group; monovalent alicyclic hydrocarbon groups such as cycloalkyl groups such as a cyclopropyl group, a cyclobutyl group, a cyclopentyl group, a cyclohexyl group, a norbornyl group, and an adamantyl group; cycloalkenyl groups such as a cyclopropenyl group, a cyclobutenyl group, a cyclopentenyl group, and a norbornenyl group; and monovalent aromatic hydrocarbon groups such as aryl groups such as a phenyl group, a tolyl group, a xylyl group, a mesityl group, a naphthyl group, a methylnaphthyl group, an anthryl group, and a methyl anthryl group; and aralkyl groups such as a benzyl group, a phenethyl group, a phenylpropyl group, a naphthylmethyl group, and an anthrylmethyl group.

Among those, $R^1$ and $R^2$ are each independently preferably the hydrocarbon group (preferably a cycloalkyl group) or the hydrogen atom.

In General Formula (AN4), L represents a divalent linking group consisting of a combination of one or more linking groups S and one or more alkylene groups which may have a substituent, or a divalent linking group consisting of one or more linking groups S.

The linking group S is a group selected from the group consisting of $*^A$—O—CO—O—$*^B$, $*^A$—CO—$*^B$, $*^A$—CO—O—$*^B$, $*^A$—O—CO—$*^B$, $*^A$—O—$*^B$, $*^A$—S—$*^B$, and $*^A$—SO$_2$—$*^B$.

It should be noted that in a case where L is a "divalent linking group consisting of a combination of one or more linking groups S and one or more alkylene groups which have no substituent, which is one form of a "divalent linking group consisting of a combination of one or more linking groups S and one or more alkylene groups which may have a substituent", it is preferable that the linking group S is a group selected from the group consisting of $*^A$—O—CO—O—$*^B$, $*^A$—CO—$*^B$, $*^A$—O—CO—$*^B$, $*^A$+O—$*^B$, $*^A$—S—$*^B$, and $*^A$—SO$_2$—$*^B$. In other words, in a case where the alkylene groups in the "divalent linking group consisting of a combination of one or more linking groups S and one or more alkylene groups which may have a substituent" are all unsubstituted alkylene groups, it is preferable that the linking group S is a group selected from the group consisting of $*^A$—O—CO—O—$*^B$, $*^A$—CO—$*^B$, $*^A$—O—CO—$*^B$, $*^A$—O—$*^B$, $*^A$—S—$*^B$, and $*^A$—SO$_2$—$*^B$.

$*^A$ represents a bonding position on the $R^3$ side in General Formula (AN4) and $*^B$ represents a bonding position on the —SO$_3^-$ side in General Formula (AN4).

In the divalent linking group consisting of a combination of one or more linking groups S and one or more alkylene groups which may have a substituent, only one linking group S may be present, or two or more linking groups S may be present. Similarly, with regard to the alkylene group which may have a substituent, only one alkylene group which may have a substituent may be present, or two or more alkylene groups which may have a substituent may be present. In a case where the linking groups S are present in a plural number, the linking groups S that are present in a plural number may be the same as or different from each other. In a case where the alkylene groups are present in a plural number, the alkylene groups that are present in a plural number may be the same as or different from each other.

Furthermore, the linking groups S may be successively bonded to each other. It should be noted that it is preferable that groups selected from the group consisting of $*^A$-CO—$*^B$, $*^A$—O—CO—$*^B$, and $*^A$—O—$*^B$ are successively bonded not to form "$*^A$—O—CO—O—$*^B$". In addition, it is preferable that groups selected from the group consisting of $*^A$-CO—$*^B$ and $*^A$—O—$*^B$ are successively bonded not to form any of "*A-O—CO—$*^B$" and "$*^A$—CO—O—$*^B$".

Also in the divalent linking group consisting of one or more linking groups S, only one linking group S may be present, or two or more linking groups S may be present. In a case where the linking groups S are present in a plural number, the linking groups S that are present in a plural number may be the same as or different from each other.

Also in this case, it is preferable that "$*^A$—O—CO—O—$*^B$" is not formed by the successive bonding of groups selected from the group consisting of $*^A$—CO—$*^B$, $*^A$—O—CO—$*^B$, and $*^A$—O—$*^B$. In addition, it is preferable that groups selected from the group consisting of $*^A$-CO—$*^B$ and $*^A$—O—$*^B$ are successively bonded not to form any of "$*^A$—O—CO—$*^B$" and "$*^A$-CO—O—$*^B$".

It should be noted that in any case, in L, an atom at the β-position with respect to —SO$_3^-$ is not a carbon atom having a fluorine atom as a substituent.

Furthermore, in a case where the atom at the β-position is a carbon atom, the carbon atom only needs to be not directly substituted with a fluorine atom, and the carbon atom may have a substituent having a fluorine atom (for example, a fluoroalkyl group such as a trifluoromethyl group).

In addition, the atom at the β-position is, in other words, the atom in L directly bonded to —C(R$^1$)(R$^2$)— in General Formula (AN4).

Above all, it is preferable that L has only one linking group S.

That is, it is preferable that L represents a divalent linking group consisting of a combination of one linking group S and one or more alkylene groups which may have a substituent, or a divalent linking group consisting of one linking group S.

L is preferably, for example, a group represented by Formula (AN4-2).

$$*^a—(CR^{2a}_2)_X\text{-}Q\text{-}(CR^{2b}_2)_Y—*^b \quad \text{(AN4-2)}$$

In General Formula (AN4-2), $*^a$ represents a bonding position to $R^3$ in General Formula (AN4)

$*^b$ represents a bonding position to —C(R$^1$)(R$^2$)— in General Formula (AN4).

X and Y each independently represent an integer of 0 to 10, and is preferably an integer of 0 to 3.

$R^{2a}$ and $R^{2b}$ each independently represent a hydrogen atom or a substituent.

In a case where $R^{2a}$'s and $R^{2b}$'s are each present in a plural number, $R^{2a}$'s which are present in a plural number and $R^{2b}$'s which are present in a plural number may each be the same as or different from each other.

It should be noted that in a case where Y is 1 or more, $R^{2b}$ in CR$^{2b}_2$ which is directly bonded to —C(R$^1$)(R$^2$)— in General Formula (AN4) is other than a fluorine atom.

Q represents $*^A$—O—CO—O—$*^B$, $*^A$—CO—$*^B$, $*^A$—CO—O—$*^B$, $*^A$—O—CO—*B $*^A$—O—$*^B$, $*^A$—S—$*^B$, or $*^A$—SO$_2$—$*^B$.

It should be noted that in a case where X+Y in General Formula (AN4-2) is 1 or more and both of $R^{2a}$ and $R^{2b}$ in General Formula (AN4-2) are all hydrogen atoms, Q represents $*^A$—O—CO—O—$*^B$, $*^A$—CO—$*^B$, $*^A$—O—CO—$*^B$, $*^A$—O—$*^B$, $*^A$—S—$*^B$, or $*^A$—SO$_2$—$*^B$.

$*^A$ represents a bonding position on the $R^3$ side in General Formula (AN4) and $*^B$ represents a bonding position on the —SO$_3^-$ side in General Formula (AN4).

In General Formula (AN4), $R^3$ represents an organic group.

The organic group is not limited as long as it has one or more carbon atoms, may be a linear group (for example, a linear alkyl group) or a branched group (for example, a branched alkyl group such as a t-butyl group), and may have a cyclic structure. The organic group may or may not have a substituent. The organic group may or may not have a heteroatom (an oxygen atom, a sulfur atom, a nitrogen atom, and/or the like).

Among those, $R^3$ is preferably an organic group having a cyclic structure. The cyclic structure may be a monocycle or a polycycle, and may have a substituent. The ring in the organic group including a cyclic structure is preferably directly bonded to L in General Formula (AN4).

The organic group having a cyclic structure may or may not have, for example, a heteroatom (an oxygen atom, a sulfur atom, a nitrogen atom, and/or the like). The heteroatom may be substituted with one or more of carbon atoms forming the cyclic structure.

The organic group having a cyclic structure is preferably a hydrocarbon group with a cyclic structure, a lactone ring group, or a sultone ring group. Among those, the organic group having a cyclic structure is preferably a hydrocarbon group with a cyclic structure.

The hydrocarbon group with a cyclic structure is preferably a monocyclic or polycyclic cycloalkyl group. Such a group may have a substituent.

The cycloalkyl group may be a monocycle (a cyclohexyl group or the like) or a polycycle (an adamantyl group or the like), and preferably has 5 to 12 carbon atoms.

As the lactone group and the sultone group, for example, a group formed by extracting one hydrogen atom from a ring member atom constituting the lactone structure or the sultone structure in any of the structures represented by General Formulae (LC1-1) to (LC1-21) which will be described later and the structures represented by General Formulae (SL1-1) to (SL1-3) as described above is preferable.

The non-nucleophilic anion may be a benzenesulfonate anion, and is preferably a benzenesulfonate anion substituted with a branched alkyl group or a cycloalkyl group.

As the non-nucleophilic anion, an aromatic sulfonate anion represented by Formula (AN5) is also preferable.

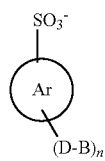

(AN5)

In General Formula (AN5),

Ar represents an aryl group (a phenyl group and the like), and may further have a substituent other than a sulfonate anion and a -(D-B) group. Examples of the substituent which may be further contained include a fluorine atom and a hydroxyl group.

n represents an integer of 0 or more. n is preferably an integer of 1 to 4, more preferably an integer of 2 or 3, and still more preferably 3.

D represents a single bond or a divalent linking group. Examples of the divalent linking group include an ether group, a thioether group, a carbonyl group, a sulfoxide group, a sulfone group, a sulfonic acid ester group, an ester group, and a group consisting of a combination of two or more of these.

B represents a hydrocarbon group.

B preferably has an aliphatic hydrocarbon structure, and is more preferably an isopropyl group, a cyclohexyl group, or an aryl group (a tricyclohexylphenyl group and the like) which may further have a substituent.

A disulfonamide anion is also preferable as the non-nucleophilic anion.

Examples of the disulfonamide anion include an anion represented by $N^-(SO_2\text{-}R^q)_2$.

$R^q$ represents an alkyl group which may have a substituent, and is preferably a fluoroalkyl group, and more preferably a perfluoroalkyl group. Two of $R^q$'s may be bonded to each other to form a ring. A group formed by the mutual bonding of two of $R^q$'s is preferably an alkylene group which may have a substituent, more preferably a fluoroalkylene group, and still more preferably a perfluoroalkylene group. The alkylene group preferably has 2 to 4 carbon atoms.

In addition, examples of the anion include anions represented by Formulae (d1-1) to (d1-3).

The specific compound having the anion represented by each of Formulae (d1-1) to (d1-3) as an anion can also have a function as an acid diffusion control agent which will be described later.

(d1-1)

(d1-2)

(d1-3)

In General Formula (d1-1), $R^{51}$ represents a hydrocarbon group (for example, an aryl group such as a phenyl group) which may have a substituent (for example, a hydroxyl group).

In General Formula (d1-2), $Z^{2c}$ represents a hydrocarbon group having 1 to 30 carbon atoms, which may have a substituent (provided that a carbon atom adjacent to S is not substituted with a fluorine atom).

The hydrocarbon group for $Z^{2c}$ may be linear or branched, and may have a cyclic structure. In addition, a carbon atom in the hydrocarbon group (preferably a carbon atom that is a ring member atom in a case where the hydrocarbon group has the cyclic structure) may be carbonyl carbon (—CO—). Examples of the hydrocarbon group include a group having a norbornyl group which may have a substituent. The carbon atom forming the norbornyl group may be carbonyl carbon.

In addition, it is preferable that "$Z^{2c}$—$SO_3^-$" in General Formula (d1-2) is different from the above-described anions represented by General Formulae (AN1) to (AN5). For example, $Z^{2c}$ is preferably a group other than an aryl group. In addition, for example, the atoms at the α-position and the β-position with respect to —$SO_3^-$ in $Z^{2c}$ are preferably atoms other than the carbon atom having a fluorine atom as a substituent. For example, in $Z^{2c}$, it is preferable that the atom at the α-position and/or the atom at the β-position with respect to —$SO_3^-$ is a ring member atom in the cyclic group.

In General Formula (d1-3), $R^{52}$ represents an organic group (preferably a hydrocarbon group having a fluorine atom), $Y^3$ represents a linear, branched, or cyclic alkylene group, an arylene group, or a carbonyl group, and Rf represents a hydrocarbon group.

Examples of the anions are shown below.

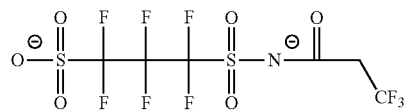

-continued
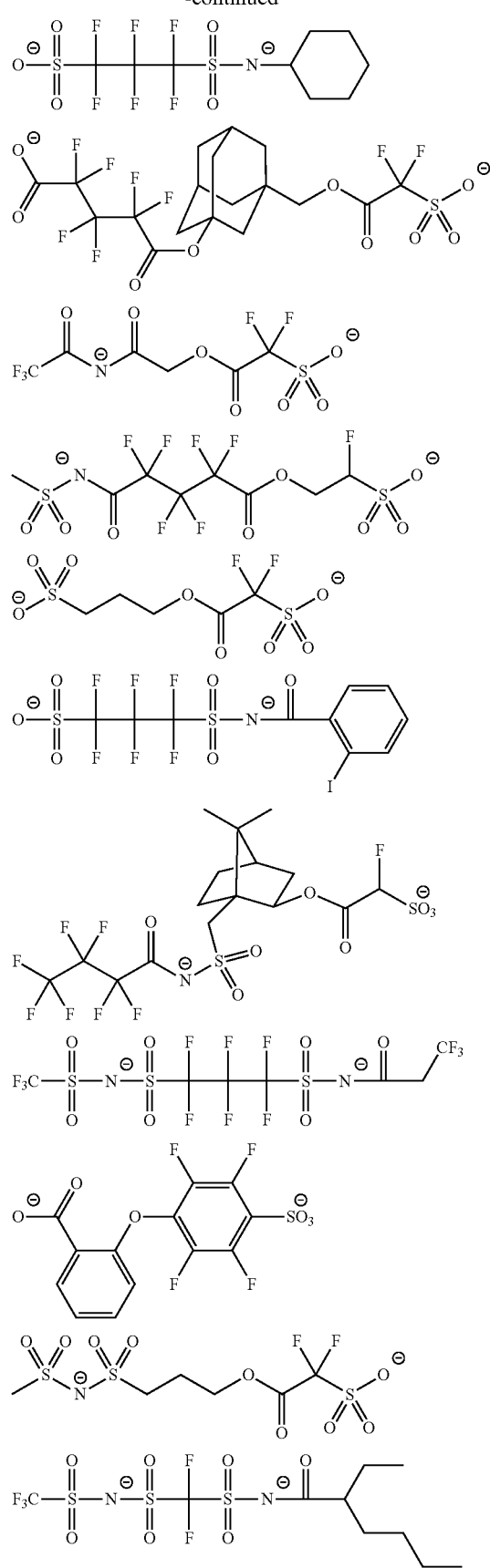
-continued
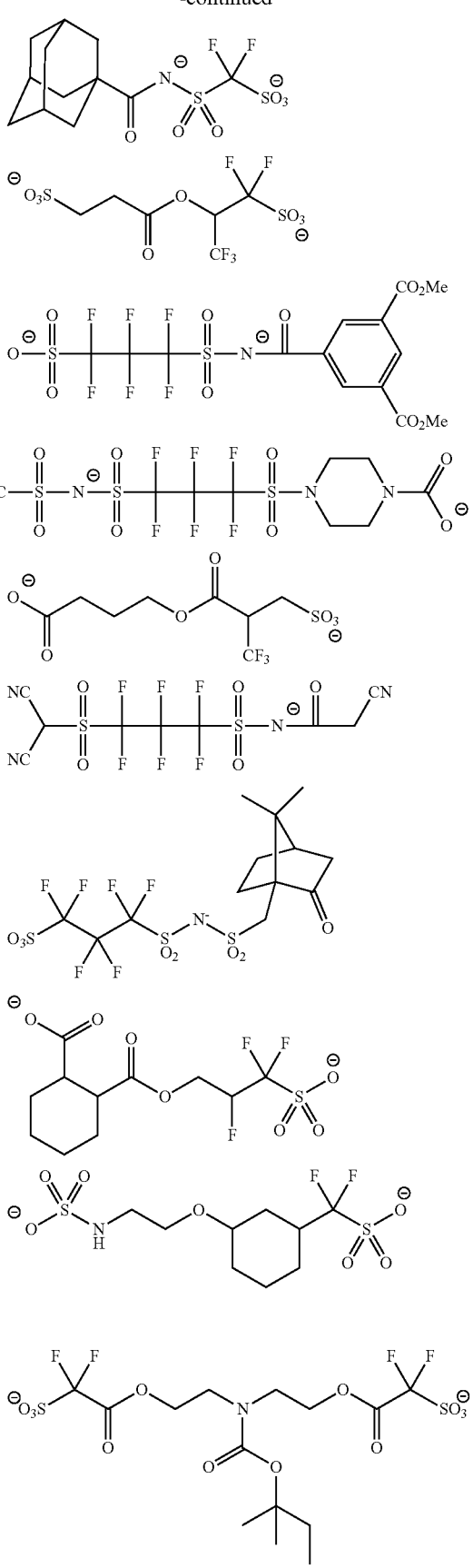

-continued

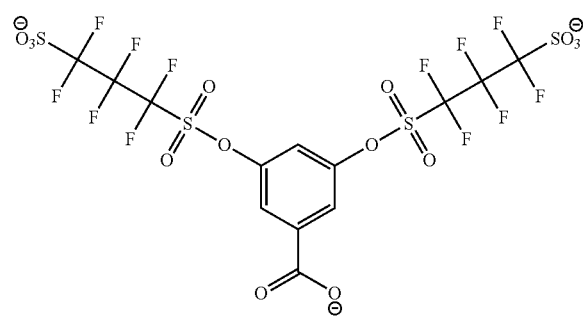

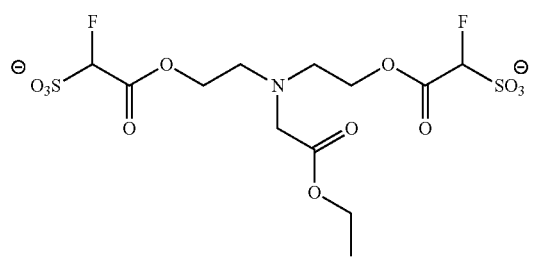

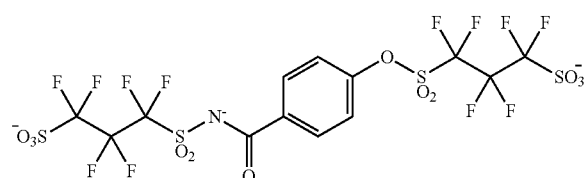

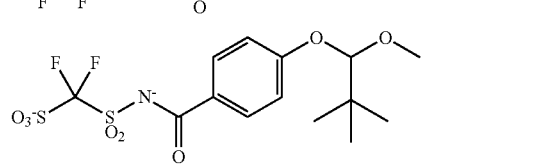

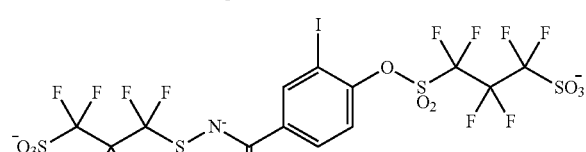

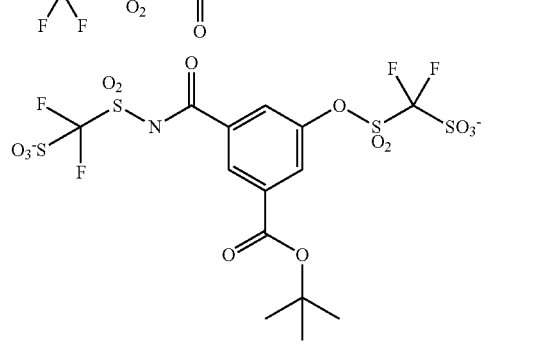

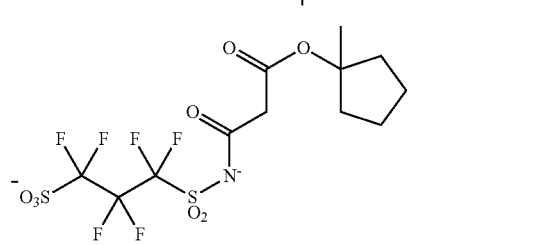

-continued

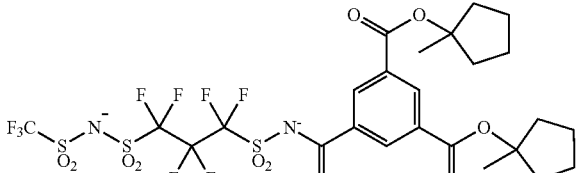

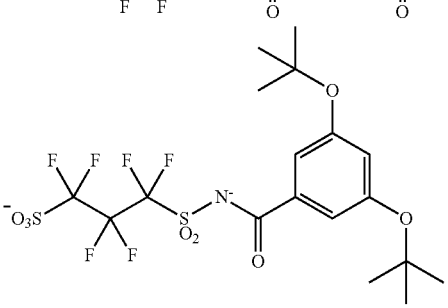

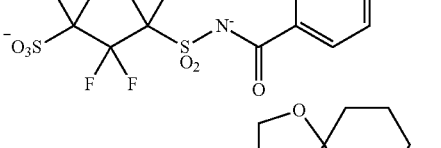

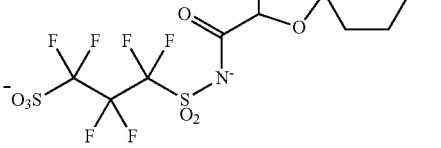

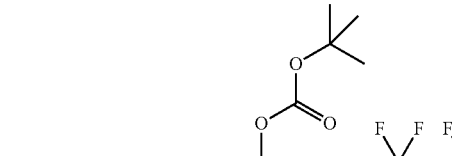

As described above, the specific compound has one or more cations represented by General Formula (1).

The number of organic anions contained in the specific compound is not particularly limited, but in a case where the number of cations represented by General Formula (1) contained in the specific compound is 1, the number of organic anions is preferably 1.

(Compound Represented by General Formula (2))

As the specific compound, a compound represented by General Formula (2) is preferable from the viewpoint that the effect of the present invention is more excellent. The compound represented by General Formula (2) corresponds to a salt compound having one cation represented by General Formula (1) and one organic anion.

$$Z_1^+ Y_1^-$$ General Formula (2)

In General Formula (2), $Z_1^+$ represents the cation represented by General Formula (1). The definition of the cation represented by General Formula (1) is as described above.

$Y_1^-$ represents a monovalent organic anion. The monovalent organic anion is intended to be a monovalent organic anion among the above-mentioned organic anions.

(Compound Represented by General Formula (S-1))

As the specific compound (compound represented by General Formula (2)), a compound represented by General Formula (S-1) is preferable.

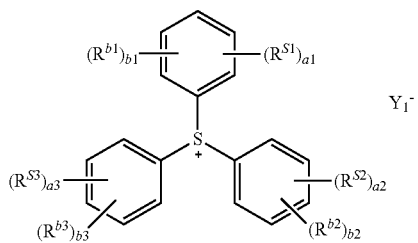

In General Formula (S-1), $Y_1^-$ represents a monovalent organic anion. The monovalent organic anion is intended to be a monovalent organic anion among the above-mentioned organic anions.

$R^{S1}$ to $R^{S3}$ each independently represent a group represented by General Formula (T-1). Among those, $R^{S1}$ to $R^{S3}$ each preferably represent the same group.

In General Formula (T-1), * represents a bonding position.

General Formula (T-1)

In General Formula (T-1), $X^{d2}$ represents the group represented by General Formula (1-1) mentioned above or a leaving group that leaves by the action of an acid.

The definition of each group represented by $X^{d2}$ is as described above.

$R^{b1}$ to $R^{b3}$ each independently represent a substituent other than the group represented by General Formula (T-1). Examples of the substituent include a linear or branched alkyl group which may have a substituent, a cycloalkyl group which may have a substituent, and an aryl group which may have a substituent.

The number of carbon atoms of each of the alkyl group and the cycloalkyl group is not particularly limited, but is preferably 1 to 10, more preferably 1 to 5, and still more preferably 1 to 3.

As the substituent, the linear or branched alkyl group which may have a substituent is preferable, and the linear or branched alkyl group which may have a heteroatom is more preferable.

Furthermore, $R^{b1}$ and $R^{b2}$, $R^{b2}$ and $R^{b3}$, and $R^{b1}$ and $R^{b3}$ may each be bonded to each other to form a single bond or a divalent linking group (for example, —O—).

a1 represents an integer of 1 to 5, a2 represents an integer of 0 to 5, and a3 represents an integer of 0 to 5.

b1 represents an integer of 0 to 4, b2 represents an integer of 0 to 5, and b3 represents an integer of 0 to 5.

A sum of a1 and b1 represents an integer of 1 to 5, a sum of a2 and b2 represents an integer of 0 to 5, and a sum of a3 and b3 represents an integer of 0 to 5.

Among those, a1 to a3 preferably each independently represent an integer of 1 to 3, and more preferably each independently represent an integer of 1 or 2.

In addition, the sum of a1, a2, and a3 is preferably an integer of 1 to 5, and more preferably an integer of 1 to 3.

b1 to b3 preferably each independently represent an integer of 0 to 3, and more preferably each independently represent an integer of 0 to 2.

In addition, the sum of b1, b2, and b3 is preferably an integer of 0 to 5, and more preferably an integer of 0 to 3.

Examples of the specific compound include a compound having two or more cationic moieties and the same number of anionic moieties as the cationic moieties, in which at least one of the cationic moieties is a specific cation (hereinafter also simply referred to as a "compound W").

A cationic moiety is a structural moiety that contains a positively charged atom or atomic group. As described above, in compound W, at least one of the two or more cationic moieties is a specific cation. Among those, all of the two or more cationic moieties included in the compound W are preferably the specific cations from the viewpoint that the effect of the present invention is more excellent.

Furthermore, in the compound W, at least one of the two or more cationic moieties may be a specific cation, and may include an organic cation other than the specific cation. Examples of the organic cation other than the specific cation include sulfonium cations other than specific cations and iodonium ions.

The anionic moiety is a structural moiety including a negatively charged atom or atomic group, and for example, an anionic functional group that may be present in the compound W may be used as the anionic moiety.

The compound W preferably has an organic anion having the same number of anionic functional groups as that of the cationic moiety contained in the compound W.

As described above, the compound W has two or more (preferably two or three) cationic moieties and the same number of anionic moieties as the cationic moieties.

That is, the compound W has two or more (preferably two or three) anionic moieties (preferably anionic functional groups). A plurality of anionic functional groups may be linked via a single bond or a linking group.

Examples of the anionic functional group include —$SO_3^-$ and a group having —$SO_3^-$ in a part thereof, —$COO^-$ and a group having —$COO^-$ in a part thereof, a group having —$N^-$— in a part thereof, and a group having a carbanion (—$C^-$<) in a part thereof.

As specific examples of the anionic functional group, groups represented by General Formulae (B-1) to (B-13) which will be described later are preferable.

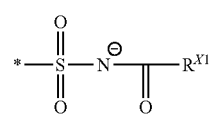
B-1

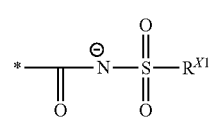
B-2

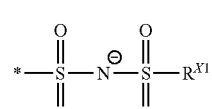
B-3

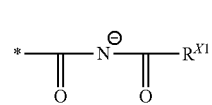
B-4

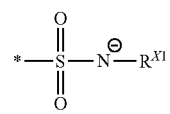
B-5

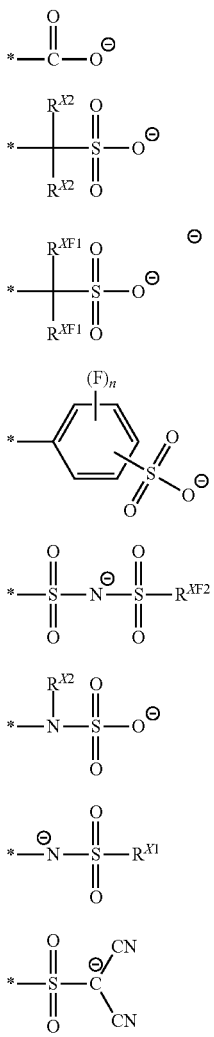

B-6

B-7

B-8

B-9

B-10

B-11

B-12

B-13

In General Formulae (B-1) to (B-13), * represents a bonding position.

Furthermore, it is also preferable that * in General Formula (B-12) is a bonding position to a group which is neither —CO— nor —SO$_2$—.

In General Formulae (B-1) to (B-5), and (B-12), $R^{X1}$ represents an organic group.

As $R^{X1}$, a linear, branched, or cyclic alkyl group, or an aryl group which may have a substituent is preferable.

The alkyl group preferably has 1 to 15 carbon atoms, and more preferably has 1 to 10 carbon atoms.

The alkyl group may have a substituent. As the substituent, a fluorine atom or a cyano group is preferable. In a case where the alkyl group has a fluorine atom as the substituent, it may be a perfluoroalkyl group.

In addition, the alkyl group may have a carbon atom substituted with a carbonyl group.

As the aryl group, a phenyl group or a naphthyl group is preferable, and the phenyl group is more preferable.

The aryl group may have a substituent. As the substituent, a fluorine atom, a perfluoroalkyl group (preferably having 1 to 10 carbon atoms, and more preferably having 1 to 6 carbon atoms), or a cyano group is preferable.

Furthermore, in General Formula (B-5), the atom directly bonded to N$^-$ in $R^{X1}$ is preferably neither a carbon atom in —CO— nor a sulfur atom in —SO$_2$—.

In addition, it is preferable that $R^{X1}$ in General Formula (B-3) includes no fluorine atom.

In General Formulae (B-7) and (B-11), $R^{X2}$ represents a hydrogen atom or a substituent other than a fluorine atom and a perfluoroalkyl group.

As the substituent other than a fluorine atom and a perfluoroalkyl group, represented by $R^{X2}$, an alkyl group (which may be linear, branched, or cyclic) other than the perfluoroalkyl group is preferable.

The alkyl group preferably has 1 to 15 carbon atoms, and more preferably has 1 to 10 carbon atoms.

It is preferable that the alkyl group has no fluorine atom. That is, in a case where the alkyl group has a substituent, a substituent other than a fluorine atom is preferable.

In General Formula (B-8), $R^{XF1}$ represents a hydrogen atom, a fluorine atom, or a perfluoroalkyl group. It should be noted that at least one of the plurality of $R^{XF1}$'s represents a fluorine atom or a perfluoroalkyl group.

The perfluoroalkyl group represented by $R^{XF1}$ preferably has 1 to 15 carbon atoms, more preferably has 1 to 10 carbon atoms, and still more preferably has 1 to 6 carbon atoms.

In General Formula (B-10), $R^{XF2}$ represents a fluorine atom or a perfluoroalkyl group.

The perfluoroalkyl group represented by $R^{XF2}$ preferably has 1 to 15 carbon atoms, more preferably has 1 to 10 carbon atoms, and still more preferably has 1 to 6 carbon atoms.

In General Formula (B-9), n represents an integer of 0 to 4.

A combination of the anionic functional groups represented by $A_{11}^-$ and $A_{12}^-$ is not particularly limited, but for example, in a case where $A_{11}^-$ is a group represented by General Formula (B-8) or (B-10), examples of the anionic functional group represented by $A_{12}^-$ include a group represented by General Formula (B-1) to (B-7), (B-9), or (B-11) to (B-13); in a case where $A_{11}^-$ is a group represented by General Formula (B-7), examples of the anionic functional group represented by $A_{12}^-$ includes a group represented by General Formula (B-6); in a case where $A_{11}^-$ is a group represented by General Formula (B-9), examples of the anionic functional group represented by $A_{12}^-$ include a group represented by General Formula (B-6); and in a case where $A_{11}^-$ is a group represented by General Formula (B-1), examples of the anionic functional group represented by $A_{12}^-$ includes a group represented by General Formula (B-3).

Above all, the compound W preferably has an anionic moiety $A_B^-$ (anionic functional group $A_B^-$) as an anionic moiety.

The anionic moiety $A_B^-$ (anionic functional group $A_B^-$) is a group represented by any of General Formulae (BX-1) to (BX-4).

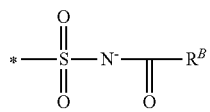

BX-1

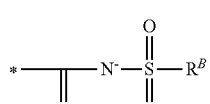

BX-2

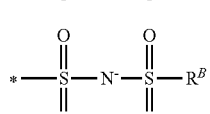

BX-3

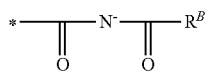

In General Formulae (BX-1) to (BX-4), * represents a bonding position.

In General Formulae (BX-1) to (BX-4), $R^B$ represents an organic group.

Examples of the organic group in $R^B$ include the same ones as the examples of the organic group in $R^{X1}$ in General Formulae (B-1) to (B-5), and (B-12).

Moreover, it is preferable that the compound W further has an anionic moiety $A_A^-$ (anionic functional group $A_A^-$), in addition to the anionic moiety $A_B^-$ (anionic functional group $A_B^-$) as an anionic moiety.

The anionic moiety $A_A^-$ (anionic functional group $A_A^-$) is a group represented by any one of General Formula (AX-1) or (AX-2).

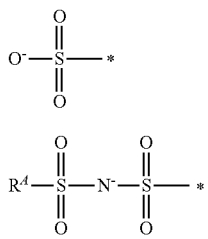

In General Formulae (AX-1) and (AX-2), * represents a bonding position.

In General Formula (AX-2), $R^A$ represents an organic group.

$R^A$ is preferably an alkyl group.

The alkyl group may be linear or branched.

The alkyl group preferably has 1 to 10 carbon atoms, and more preferably has 1 to 5 carbon atoms.

The substituent which may be contained in the alkyl group is preferably a fluorine atom.

The alkyl group having a fluorine atom as the substituent may or may not be a perfluoroalkyl group.

The compound W may or may not further have an additional anionic moiety (preferably an additional anionic functional group), in addition to the anionic moiety $A_B^-$ (anionic functional group $A_B^-$) and the anionic moiety $A_A^-$ (anionic functional group $A_A^-$) as an anionic moiety.

The compound W is preferably a compound represented by General Formula (3).

$$L\text{-}(Y_2^-Z_2^+)_q \quad (3)$$

In General Formula (3), $Z_2^+$'s represents a cation, and at least one of $Z_2^+$'s represents the cation represented by General Formula (1).

The definition of the cation represented by General Formula (1) is as described above. Cations other than the cation represented by General Formula (1) are not particularly limited, and examples thereof include known sulfonium cations and iodonium cations.

At least one $Z^+$ among the plurality of $Z^+$'s only needs to be a specific cation, and from the viewpoint that the effect of the present invention is more excellent, it is preferable that two or more $Z^+$'s are specific cations, and it is more preferable that all $Z^+$'s are specific cations.

$Y_2^-$ represents an anionic functional group. The definition of the anionic functional group is as described above. $Y_2^-$'s which are present in a plural number may be the same as or different from each other.

$Y_2^-$'s which are present in a plural number may have, for example, at least "a group represented by General Formula (B-8) or (B-10) and a group represented by General Formula (B-1) to (B-7), (B-9), or (B-11) to (B-13)", may have at least "a group represented by General Formula (B-7) and a group represented by General Formula (B-6)", and may have at least "a group represented by any of General Formulae (BX-1) to (BX-4) and a group represented by any of General Formulae (AX-1) and (AX-2).

q represents an integer of 2 or more. Among those, q is preferably an integer of 2 to 5, more preferably an integer of 2 or 3, from the viewpoint that the effect of the present invention is more excellent.

L represents a q-valent linking group.

For example, in a case where q is 2, L represents a divalent linking group.

Examples of the divalent linking group include —COO—, —CONH—, —CO—, —O—, an alkylene group (which preferably has 1 to 6 carbon atoms, and may be linear or branched), a cycloalkylene group (which preferably has 3 to 15 carbon atoms), an alkenylene group (which preferably has 2 to 6 carbon atoms), and a divalent linking group formed by combination of a plurality of these groups.

One or more of the methylene groups constituting a cycloalkane ring of the cycloalkylene group may be substituted with a carbonyl carbon and/or a heteroatom (an oxygen atom and the like).

These divalent linking groups are further selected from the group consisting of —S—, —SO—, —SO$_2$—, and —NR$^N$— (R$^N$ is a hydrogen atom or a substituent) It is also preferred to have selected groups.

Examples of the trivalent or higher linking group include a group obtained by combination of each group which can be taken as a single bond and/or the divalent linking group with —CR$^q$<, —N<, >C<, a trivalent or higher hydrocarbon ring group, and/or a trivalent or higher heterocyclic group. R$^q$ represents a hydrogen atom or a substituent.

Compounds (I-A) to (III-A) which will be described later are also preferable as the specific compound.

(Compound (I-A))

The compound (I-A) will be described below.

Compound (I-A): a compound having each one of the following structural moiety X and the following structural moiety Y, the compound generating an acid including the following first acidic moiety derived from the following structural moiety X and the following second acidic moiety derived from the following structural moiety Y upon irradiation with actinic rays or radiation Structural moiety X: A structural moiety which consists of an anionic moiety $A_1^-$ and a cationic moiety $M_1^+$, and forms a first acidic moiety represented by $HA_1$ upon irradiation with actinic rays or radiation Structural moiety Y: a structural moiety which consists of an anionic moiety $A_2^-$ and a cationic moiety $M_2^+$, and forms a second acidic moiety represented by $HA_2$, having a structure different from that of the first acidic moiety formed by the structural moiety X, upon irradiation with actinic rays or radiation It should be noted that at least one of the cationic moiety $M_1^+$ or the cationic moiety $M_2^+$ is a specific cation.

In addition, the compound (I-A) satisfies the following condition I.

Condition I: a compound PI formed by substituting the cationic moiety $M_1^+$ in the structural moiety X and the cationic moiety $M_2^+$ in the structural moiety Y with $H^+$ in the compound (I-A) has an acid dissociation constant a1 derived from an acidic moiety represented by $HA_1$, formed by substituting the cationic moiety $M_1^+$ in the structural moiety X with $H^+$, and an acid dissociation constant a2 derived from an acidic moiety represented by $HA_2$, formed by substituting the cationic moiety $M_2^+$ in the structural moiety Y with $H^+$, and the acid dissociation constant a2 is larger than the acid dissociation constant a1.

Furthermore, the acid dissociation constant a1 and the acid dissociation constant a2 are determined by the above-mentioned method. More specifically, with regard to the acid dissociation constant a1 and the acid dissociation constant a2 of the compound PI, in a case where the acid dissociation constant of the compound PI is determined, the pKa with which the compound PI (in which the compound PI corresponds to a "compound having $HA_1$ and $HA_2$") serves as a "compound having $A_1^-$ and $HA_2$" is the acid dissociation constant a1, and the pKa with which "compound having $A_1^-$ and $HA_2$" serves as a "compound having $A_1^-$ and $A_2^-$" is the acid dissociation constant a2.

In addition, the compound PI corresponds to an acid generated by irradiating the compound (I-A) with actinic rays or radiation.

From the viewpoint that the effect of the present invention is more excellent, in the compound PI, the difference between the acid dissociation constant a1 and the acid dissociation constant a2 is preferably 2.0 or more, and more preferably 3.0 or more. Furthermore, the upper limit value of the difference between the acid dissociation constant a1 and the acid dissociation constant a2 is not particularly limited, but is preferably 15.0 or less.

In addition, from the viewpoint that the effect of the present invention is more excellent, the acid dissociation constant a2 is, for example, 6.5 or less in the compound PI, and from the viewpoint that the stability of the cationic moiety of the compound (I-A) in the resist composition is more excellent, the acid dissociation constant a2 is preferably 2.0 or less, and more preferably 1.0 or less in the compound PI. Furthermore, the lower limit value of the acid dissociation constant a2 is preferably −5.0 or more, more preferably −3.5 or more, and still more preferably −2.0 or more.

In addition, from the viewpoint that the effect of the present invention is more excellent, in the compound PI, the acid dissociation constant a1 is preferably 2.0 or less, more preferably 0.5 or less, and still more preferably −0.1 or less. Furthermore, a lower limit value of the acid dissociation constant a1 is preferably −15.0 or more.

The compound (I-A) is not particularly limited, and examples thereof include a compound represented by General Formula (Ia).

(Ia)

In General Formula (Ia), "$M_{11}^+A_{11}^-$" and "$A_{12}^-M_{12}^+$" correspond to the structural moiety X and the structural moiety Y, respectively. The compound (Ia) generates an acid represented by $HA_{11}$-$L_1$-$A_{21}H$ upon irradiation with actinic rays or radiation. That is, "$M_{11}^+A_{11}^-$" forms a first acidic moiety represented by $HA_{11}$, and "$A_{12}^-M_{12}^+$" forms a second acidic moiety represented by $HA_{12}$, which has a structure different from that of the first acidic moiety.

In General Formula (Ia), $M_{11}^+$ and $M_{12}+$ each independently represent a cation (a specific cation or an organic cation other than the specific cation).

At least one (preferably both) of $M_{11}^+$ or $M_{12}^+$ is the specific cation.

$A_{11}^-$ and $A_{12}^-$ each independently represent an anionic functional group. It should be noted that $A_{12}^-$ represents a structure different from the anionic functional group represented by $A_{11}^-$.

$L_1$ represents a divalent linking group.

It should be noted that in the compound PIa ($HA_{11}$-$L_1$-$A_{12}H$) formed by substituting specific cations represented by $M_{11}^+$ and $M_{12}^+$ with $H^+$ in General Formula (Ia), the acid dissociation constant a2 derived from the acidic moiety represented by $A_{12}H$ is larger than the acid dissociation constant a1 derived from the acidic moiety represented by $HA_{11}$. Furthermore, suitable values of the acid dissociation constant a1 and the acid dissociation constant a2 are as described above.

In General Formula (Ia), $M_{11}^+$ and $M_{12}^+$ each independently represent a cation (a specific cation or an organic cation other than the specific cation).

At least one (preferably both) of $M_{11}^+$ or $M_{12}^+$ is the specific cation.

The specific cation is as described above.

The organic cation other than the specific cation is as described above.

In General Formula (Ia), $A_{11}^-$ and $A_{12}^-$ each independently represent an anionic functional group. It should be noted that $A_{12}^-$ represents a structure different from the anionic functional group represented by $A_{11}^-$.

The anionic functional group is as described above.

The anionic functional groups of $A_{11}^-$ and $A_{12}^-$ are each independently preferably a group represented by each of General Formulae (B-1) to (B-13) mentioned above.

A combination of the anionic functional groups represented by $A_{11}^-$ and $A_{12}^-$ is not particularly limited, but for example, in a case where $A_{11}^-$ is a group represented by General Formula (B-8) or (B-10), examples of the anionic functional group represented by $A_{12}^-$ include a group represented by General Formula (B-1) to (B-7), (B-9), or (B-11) to (B-13); and in a case where $A_{11}^-$ is a group represented by General Formula (B-7), examples of the anionic functional group represented by $A_{11}^-$ includes a group represented by General Formula (B-6).

In General Formula (Ia), the divalent linking group represented by $L_1$ is not particularly limited, and examples thereof include —CO—, —$NR^{L1}$—, —CO—, —O—, an alkylene group (which preferably has 1 to 6 carbon atoms, and may be linear or branched), a cycloalkylene group (preferably having 3 to 15 carbon atoms), an alkenylene group (preferably having 2 to 6 carbon atoms), a divalent aliphatic heterocyclic group (preferably having a 5- to 10-membered ring, more preferably having a 5- to 7-membered ring, and still more preferably having a 5- or 6-membered ring, each having at least one of an N atom, an O atom, an S atom, or an Se atom in the ring structure), a divalent aromatic heterocyclic group (preferably having a 5- to 10-membered ring, more preferably having a 5- to 7-membered ring, and still more preferably having a 5- or 6-membered ring, each having at least one of an N atom, an O atom, an S atom, or an Se atom in the ring structure), a divalent aromatic hydrocarbon ring group (preferably having a 6- to 10-membered ring, and more preferably having a 6-membered ring), and a divalent linking group formed by combination of a plurality of these groups. Examples of $R^{L1}$ include a hydrogen atom or a monovalent organic group. The monovalent organic group is not particularly limited, but is preferably, for example, an alkyl group (preferably having 1 to 6 carbon atoms).

The divalent linking group may further include a group selected from the group consisting of —S—, —SO—, and —SO$_2$—.

In addition, the alkylene group, the cycloalkylene group, the alkenylene group, the divalent aliphatic heterocyclic group, the divalent aromatic heterocyclic group, and the divalent aromatic hydrocarbon ring group may be substituted with a substituent. Examples of the substituent include a halogen atom (preferably a fluorine atom).

Among those, a compound represented by General Formula (Ib) is preferable as the compound (I-A).

$$M_1^+A^-\text{-}L\text{-}B^-M_2^+ \qquad (Ib)$$

In General Formula (Ib), $M_1^+$ and $M_2^+$ each independently represent a cation (a specific cation or an organic cation other than the specific cation).

At least one (preferably both) of $M_1^+$ or $M_2^+$ represents a specific cation.

The specific cation is as described above.

The organic cation other than the specific cation is also as mentioned above.

In General Formula (Ib), L represents a divalent organic group.

Examples of the divalent organic group include —COO—, —CONH—, —CO—, —O—, an alkylene group (which preferably has 1 to 6 carbon atoms, and may be linear or branched), a cycloalkylene group (which preferably has 3 to 15 carbon atoms), an alkenylene group (which preferably has 2 to 6 carbon atoms), and a divalent linking group formed by combination of a plurality of these groups.

One or more of the methylene groups constituting a cycloalkane ring of the cycloalkylene group may be substituted with a carbonyl carbon and/or a heteroatom (an oxygen atom and the like).

It is also preferable that the divalent linking group further has a group selected from the group consisting of —S—, —SO—, and —SO$_2$—.

Among those, L is preferably a group represented by General Formula (L).

$$\text{*A-LA-LB-LC-LD-LE-*B} \qquad (L)$$

In General Formula (L), *A represents a bonding position to $A^-$ in General Formula (Ib).

In General Formula (L), *B represents a bonding position to $B^-$ in General Formula (Ib).

In General Formula (L), LA represents —(C(R$_{LA1}$)(R$_{LA2}$))$_{XA}$—.

XA represents an integer of 1 or more, and is preferably an integer of 1 to 10, and more preferably an integer of 1 to 3.

R$_{LA1}$ and R$_{LA2}$ each independently represent a hydrogen atom or a substituent.

The substituents of R$_{LA1}$ and R$_{LA2}$ are each independently preferably a fluorine atom or a fluoroalkyl group, more preferably the fluorine atom or a perfluoroalkyl group, and still more preferably the fluorine atom or a perfluoromethyl group.

In a case where XA is 2 or more, XA pieces of R$_{LA1}$'s may be the same as or different from each other.

In a case where XA is 2 or more, XA pieces of R$_{LA2}$'s may be the same as or different from each other.

—(C(R$_{LA1}$)(R$_{LA2}$))— is preferably —CH$_2$—, —CHF—, —CH(CF$_3$)—, or —CF$_2$—.

Among those, —(C(R$_{LA1}$)(R$_{LA2}$))— which is directly bonded to $A^-$ in General Formula (Ib) is preferably —CH$_2$—, —CHF—, —CH(CF$_3$)—, or —CF$_2$—.

—(C(R$_{LA1}$)(R$_{LA2}$))—'s other than —(C(R$_{LA1}$)(R$_{LA2}$))— which is directly bonded to $A^-$ in General Formula (Ib) are each independently preferably —CH$_2$—, —CHF—, or —CF$_2$—.

In General Formula (L), LB represents a single bond, an ester group (—COO—), or a sulfonyl group (—SO$_2$—).

In General Formula (L), LC represents a single bond, an alkylene group, a cycloalkylene group, or a group formed by combination thereof ("-alkylene group-cycloalkylene group-" and the like).

The alkylene group may be linear or branched.

The alkylene group preferably has 1 to 5 carbon atoms, more preferably has 1 or 2 carbon atoms, and still more preferably has one carbon atom.

The cycloalkylene group preferably has 3 to 15 carbon atoms, and more preferably has 5 to 10 carbon atoms.

The cycloalkylene group may be a monocycle or a polycycle.

Examples of the cycloalkylene group include a norbornanediyl group and an adamantandiyl group.

As a substituent which may be contained in the cycloalkylene group, an alkyl group (which may be linear or branched, and preferably has 1 to 5 carbon atoms) is preferable.

One or more of the methylene groups constituting a cycloalkane ring of the cycloalkylene group may be substituted with a carbonyl carbon and/or a heteroatom (an oxygen atom and the like).

In a case where LC is "-alkylene group-cycloalkylene group-", the alkylene group moiety is preferably present on the LB side.

In a case where the LB is the single bond, LC is preferably the single bond or the cycloalkylene group.

In General Formula (L), LD represents a single bond, an ether group (—O—), a carbonyl group (—CO—), or an ester group (—COO—).

In General Formula (L), LE represents a single bond or —(C(R$_{LE1}$)(R$_{LE2}$))$_{XE}$—.

XE in —(C(R$_{LE1}$)(R$_{LE2}$))$_{XE}$— represents an integer of 1 or more, and is preferably 1 to 10, and more preferably 1 to 3.

R$_{LE1}$ and R$_{LE2}$ each independently represent a hydrogen atom or a substituent.

In a case where XE is 2 or more, XE pieces of R$_{LE1}$'s may be the same as or different from each other.

In a case where XE is 2 or more, XE pieces of R$_{LE2}$'s may be the same as or different from each other.

Among those, —(C(R$_{LE1}$)(R$_{LE2}$))— is preferably —CH$_2$— or —CF$_2$—.

In a case where LB, LC, and LD are single bonds in General Formula (L), it is preferable that LE is also the single bond.

In General Formula (Ib), $A^-$ and $B^-$ each independently represent an anionic functional group.

The anionic functional group is as described above.

Among those, $A^-$ is preferably a group represented by any one of General Formula (AX-1) or (AX-2).

$B^-$ preferably represents a group represented by any one of General Formula (BX-1), or (BX-4).

It is preferable that $A^-$ and $B^-$ have different structures.

Among those, it is preferable that $A^-$ is the group represented by General Formula (AX-1) and $B^-$ is the group represented by any of General Formulae (BX-1) to (BX-4), or that $A^-$ is the group represented by General Formula (AX-2) and $B^-$ is the group represented by any of General Formula (BX-1), General Formula (BX-3), and General Formula (BX-4).

It should be noted that in a compound represented by HA-L-BH in which $M_1^+$ and $M_2^+$ of the compound represented by General Formula (Ib) are each substituted with a hydrogen atom, a pKa of a group represented by HA is lower than a pKa of a group represented by BH.

More specifically, in a case where an acid dissociation constant is determined for the compound represented by HA-L-BH, the pKa in a case where "HA-L-BH" serves as "A⁻-L-BH" is defined as the "pKa of a group represented by HA", and the pKa in a case where "A⁻-L-BH" serves as "A⁻-L-B⁻" is defined as the "pKa of the group represented by BH".

The "pKa of the group represented by HA" and the "pKa of the group represented by BH" are each determined using "Software Package 1" or "Gaussian 16".

For example, the pKa of the group represented by HA corresponds to the above-mentioned acid dissociation constant a1, and a preferred range thereof is also the same.

The pKa of the group represented by BH corresponds to the above-mentioned acid dissociation constant a2, and a preferred range thereof is also the same.

A difference between the pKa of the group represented by HB and the pKa of the group represented by HA ("pKa of the group represented by HB"-"pKa of the group represented by HA") corresponds to a difference between the acid dissociation constant a1 and the acid dissociation constant a2, and a preferred range thereof is also the same.

Next, the compound (II-A) will be described.

Compound (II-A): a compound having the two or more structural moieties X and the structural moiety Y, the compound generating an acid including the two or more first acidic moieties derived from the structural moieties X and the second acidic moiety derived from the structural moiety Y upon irradiation with actinic rays or radiation It should be noted that at least one of the cationic moiety $M_1^+$ or the cationic moiety $M_2^+$ is a specific cation.

In addition, the compound (II-A) satisfies the following condition II.

Condition II: a compound PII formed by substituting the cationic moiety $M_1^+$ in the structural moiety X and the cationic moiety $M_2^+$ in the structural moiety Y with $H^+$ in the compound (II-A) has an acid dissociation constant a1 derived from an acidic moiety represented by $HA_1$, formed by substituting the cationic moiety $M_1^+$ in the structural moiety X with $H^+$ and an acid dissociation constant a2 derived from an acidic moiety represented by $HA_2$, formed by substituting the cationic moiety $M_2^+$ in the structural moiety Y with $H^+$, and the acid dissociation constant a2 is larger than the acid dissociation constant a1.

The acid dissociation constant a1 and the acid dissociation constant a2 are determined by the above-mentioned method.

Here, the acid dissociation constant a1 and the acid dissociation constant a2 of the compound PII will be more specifically described. In a case where the compound (II-A) is, for example, a compound that generates an acid having two of the first acidic moieties derived from the structural moiety X and one of the second acidic moieties derived from the structural moiety Y, the compound PII corresponds to a "compound having two $HA_1$'s and one $HA_2$". In a case where the acid dissociation constant of the compound PII was determined, the pKa in a case where the compound PII serves as a "compound having one $A_1^-$, one $HA_1$, and one $HA_2$" is the acid dissociation constant a1, and the pKa in a case where the compound having two $A_1^-$'s and one $HA_2$ serves as a "compound having two $A_1^-$'s and one $A_2^-$" is the acid dissociation constant a2. That is, in a case where the compound PII has a plurality of acid dissociation constants derived from the acidic moiety represented by $HA_1$, formed by substituting the cationic moiety $M_1^+$ in the structural moiety X with $H^+$, the smallest value is considered as the acid dissociation constant a1.

In addition, the compound PII corresponds to an acid generated by irradiating the compound (II-A) with actinic rays or radiation.

Furthermore, the compound (II-A) may have a plurality of the structural moieties Y.

From the viewpoint that the effect of the present invention is more excellent, in the compound PII, the difference between the acid dissociation constant a1 and the acid dissociation constant a2 is preferably 2.0 or more, and more preferably 3.0 or more. Furthermore, the upper limit value of the difference between the acid dissociation constant a1 and the acid dissociation constant a2 is not particularly limited, but is, for example, 15.0 or less.

In addition, in the compound PII, the acid dissociation constant a2 is preferably 6.5 or less, and from the viewpoint that the stability of the cationic moiety of the compound (II-A) in the resist composition is more excellent, the acid dissociation constant a2 is more preferably 2.0 or less, and still more preferably 1.0 or less. Furthermore, a lower limit value of the acid dissociation constant a2 is preferably −2.0 or more.

In addition, from the viewpoint that the effect of the present invention is more excellent, in the compound PII, the acid dissociation constant a1 is preferably 2.0 or less, more preferably 0.5 or less, and still more preferably −0.1 or less. Furthermore, a lower limit value of the acid dissociation constant a1 is preferably −15.0 or more.

The compound (II-A) is not particularly limited, and examples thereof include a compound represented by General Formula (IIa).

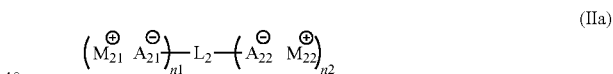

(IIa)

In General Formula (IIa), "$M_{21}^+A_{21}^-$" and "$A_{22}^-M_{22}^+$" correspond to the structural moiety X and the structural moiety Y, respectively. The compound (IIa) generates an acid represented by General Formula (IIa-1) upon irradiation with actinic rays or radiation. That is, "$M_{21}^+A_{21}^-$" forms a first acidic moiety represented by $HA_{21}$, and "$A_{22}^-M_{22}^+$" forms a second acidic moiety represented by $HA_{22}$ having a structure different from that of the first acidic moiety.

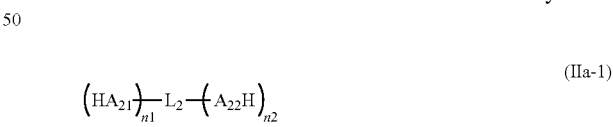

(IIa-1)

In General Formula (IIa), $M_{21}^+$ and $M_{22}^+$ each independently represent a cation (a specific cation or an organic cation other than the specific cation).

At least one (preferably both) of $M_{21}^+$ or $M_{22}^+$ represents the specific cation.

$A_{21}^-$ and $A_{22}^-$ each independently represent an anionic functional group. It should be noted that $A_{22}^-$ represents a structure different from the anionic functional group represented by $A_{21}^-$.

$L_2$ represents a (n1+n2) valent organic group.

n1 represents an integer of 2 or more.

n2 represents an integer of 1 or more.

It should be noted that in the compound PIIa (corresponding to a compound represented by General Formula (IIa-1)), formed by substituting cations represented by $M_{21}^+$ and $M_{22}^+$ with $H^+$ in General Formula (IIa), the acid dissociation constant a2 derived from the acidic moiety represented by $A_{22}H$ is larger than the acid dissociation constant a1 derived from the acidic moiety represented by $HA_{21}$. Furthermore, suitable values of the acid dissociation constant a1 and the acid dissociation constant a2 are as described above.

In General Formula (IIa), $M_{21}^+$, $M_{22}^+$, $A_{21}^-$, and $A_{22}^-$ have the same definitions as $M_{11}^+$, $M_{12}^+$, $A_{11}^-$, and $A_{12}^-$ in General Formula (Ia), respectively, and suitable aspects thereof are also the same.

In General Formula (IIa), n1 pieces of $M_{21}^+$ and n1 pieces of $A_{21}^+$ represent the same group as each other.

In General Formula (IIa), the (n1+n2)-valent organic group represented by $L_2$ is not particularly limited, and examples thereof include groups represented by General Formulae (A1) and (A2). Furthermore, in General Formulae (A1) and (A2), at least two of *'s represent bonding positions to $A_{21}^-$, and at least one of *'s represents a bonding position to $A_{22}^-$.

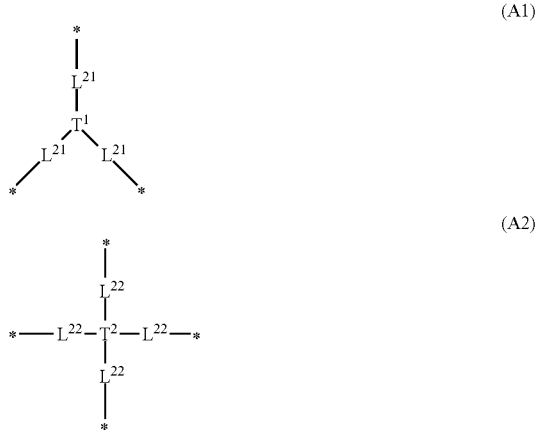

In General Formulae (A1) and (A2), $T^1$ represents a trivalent hydrocarbon ring group or a trivalent heterocyclic group, and $T^2$ represents a carbon atom, a tetravalent hydrocarbon ring group, or a tetravalent heterocyclic group.

The hydrocarbon ring group may be an aromatic hydrocarbon ring group or an aliphatic hydrocarbon ring group. The number of carbon atoms included in the hydrocarbon ring group is preferably 6 to 18, and more preferably 6 to 14.

The heterocyclic group may be either an aromatic heterocyclic group or an aliphatic heterocyclic group. The heterocyclic group is preferably a 5- to 10-membered ring, more preferably a 5- to 7-membered ring, and still more preferably a 5- or 6-membered ring, each of which has at least one N atom, 0 atom, S atom, or Se atom in the ring structure.

In addition, in General Formulae (A1) and (A2), $L^{21}$ and $L^{22}$ each independently represent a single bond or a divalent linking group.

The divalent linking group represented by each of $L^{21}$ and $L^{22}$ has the same definition as the divalent linking group represented by $L_1$ in General Formula (Ia), and a suitable aspect thereof is also the same.

n1 represents an integer of 2 or more. The upper limit is not particularly limited, but is, for example, an integer of 6 or less, preferably an integer of 4 or less, and more preferably an integer of 3 or less.

n2 represents an integer of 1 or more. The upper limit is not particularly limited, but is, for example, an integer of 3 or less, and preferably an integer of 2 or less.

(Compound (III-A))

Next, the compound (III-A) will be described.

Compound (III-A): a compound having the two or more structural moieties X and the following structural moiety Z, the compound generating an acid including the two or more first acidic moieties derived from the structural moieties X and the structural moiety Z upon irradiation with actinic rays or radiation Structural moiety Z: A nonionic organic moiety capable of neutralizing an acid It should be noted that at least one of the cationic moieties $M_1^+$ is a specific cation.

The nonionic moiety capable of neutralizing an acid in the structural moiety Z is not particularly limited, and is preferably, for example, a moiety including a functional group having a group or electron which is capable of electrostatically interacting with a proton.

Examples of the functional group having a group or electron capable of electrostatically interacting with a proton include a functional group with a macrocyclic structure, such as a cyclic polyether, or a functional group having a nitrogen atom having an unshared electron pair not contributing to π-conjugation. The nitrogen atom having an unshared electron pair not contributing to π-conjugation is, for example, a nitrogen atom having a partial structure represented by the following formula.

Unshared electron pair

Examples of the partial structure of the functional group having a group or electron capable of electrostatically interacting with a proton include a crown ether structure, an azacrown ether structure, primary to tertiary amine structures, a pyridine structure, an imidazole structure, and a pyrazine structure, and among these, the primary to tertiary amine structures are preferable.

In the compound PIII formed by substituting the cationic moiety $M_1^+$ in the structural moiety X with $H^+$ in the compound (III-A), the acid dissociation constant a1 derived from the acidic moiety represented by $HA_1$, formed by substituting the cationic moiety $M_1^+$ in the structural moiety X with $H^+$, is preferably 2.0 or less, more preferably 0.5 or less, and still more preferably −0.1 or less, from the viewpoint that the effect of the present invention is more excellent. Furthermore, a lower limit value of the acid dissociation constant a1 is preferably −15.0 or more.

Furthermore, in a case where the compound PIII has a plurality of acid dissociation constants derived from the acidic moiety represented by $HA_1$, formed by substituting the cationic moiety $M_1^+$ in the structural moiety X with $H^+$, the smallest value is considered as the acid dissociation constant a1.

That is, in a case where the compound (III-A) is, for example, a compound that generates an acid having two of the first acidic moieties derived from the structural moiety X and the structural moiety Z, the compound PIII corresponds to a "compound having two $HA_1$'s". In a case where the acid dissociation constant of this compound PIII is determined, the pKa in a case where the compound PIII serves as a "compound having one $A_1^-$ and one $HA_1$" is the acid dissociation constant a1. That is, in a case where the compound PIII has a plurality of acid dissociation constants derived from the acidic moiety represented by $HA_1$, formed by substituting the cationic moiety $M_1^+$ in the structural moiety X with $H^+$, the smallest value is considered as the acid dissociation constant a1.

Furthermore, for example, in a case where the compound (III-A) is a compound represented by the compound (Ma) which will be described later, the compound PIII formed by substituting the cationic moiety $M_1^+$ in the structural moiety X with $H^+$ in the compound (III-A) corresponds to $HA_{31}$-$L_3$-$N(R^{2X})$-$L_4$-$A_{31}H$.

The compound (III-A) is not particularly limited, and examples thereof include a compound represented by General Formula (Ma).

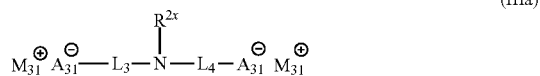

(IIIa)

In General Formula (Ma), "$M_{31}^+A_{31}^-$" corresponds to the structural moiety X. The compound (Ma) generates an acid represented by $HA_{31}$-$L_3$-$N(R^{2X})$-$L_4$-$A_{31}H$ upon irradiation with actinic rays or radiation. That is, "$M_{31}^+A_{31}^-$" forms the first acidic moiety represented by $HA_{31}$.

In General Formula (Ma), $M_{31}^+$ represents a specific cation.

$A_{31}^-$ represents an anionic functional group.

$L_3$ and $L_4$ each independently represent a divalent linking group.

$R^{2X}$ represents a monovalent organic group.

In General Formula (Ma), $M_{31}^+$ and $A_{31}^-$ have the same definitions as $M_{11}^+$ and $A_{11}^-$ in General Formula (Ia), respectively, and suitable aspects thereof are also the same.

In General Formula (Ma), $L_3$ and $L_4$ have the same definition as $L_1$ in General Formula (Ia), and suitable aspects thereof are also the same.

In General Formula (Ma), two $M_{31}^+$'s and two $A_{31}^-$'s represent the same group as each other.

In General Formula (Ma), the monovalent organic group represented by $R^{2X}$ is not particularly limited, and examples thereof include an alkyl group (which preferably has 1 to 10 carbon atoms, and may be linear or branched), a cycloalkyl group (preferably having 3 to 15 carbon atoms), and an alkenyl group (preferably having 2 to 6 carbon atoms), in which —$CH_2$— may be substituted with one or a combination of two or more selected from the group consisting of —CO—, —NH—, —O—, —S—, —SO—, and —$SO_2$—.

In addition, the alkylene group, the cycloalkylene group, and the alkenylene group may be substituted with a substituent.

The molecular weight of the compound represented by each of the compounds (I-A) to (III-A) are preferably 300 to 3,000, more preferably 500 to 2,000, and still more preferably 700 to 1,500.

Specific examples of the specific compound are shown below, but the present invention is not limited thereto.

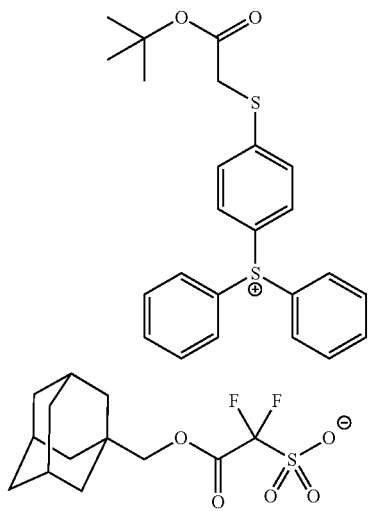

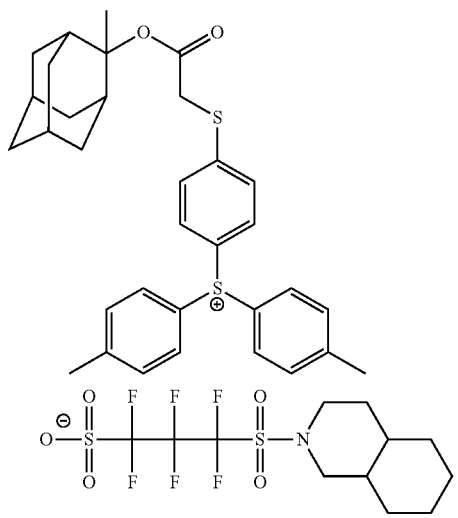

41
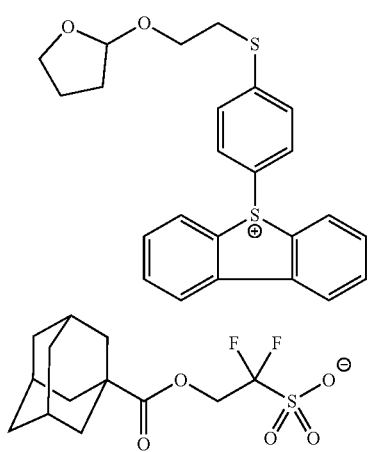
42
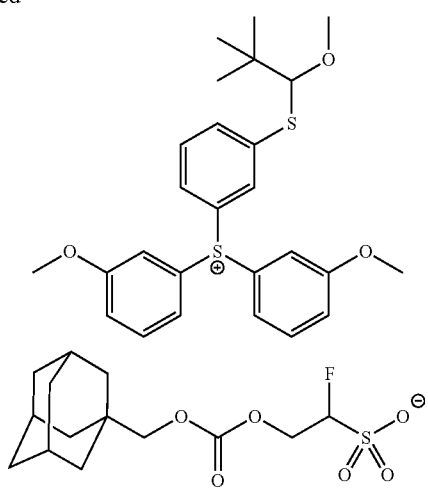
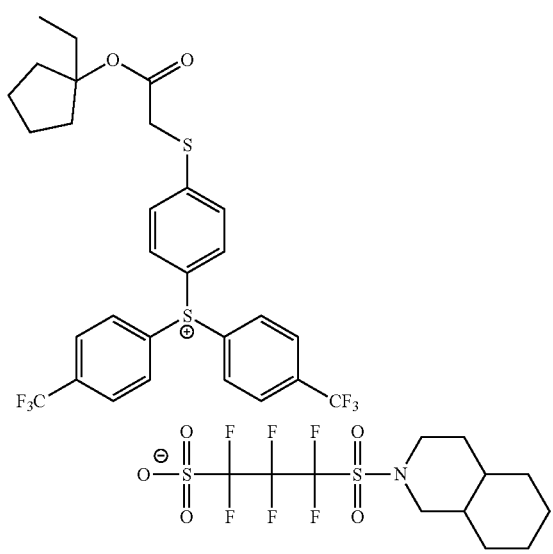
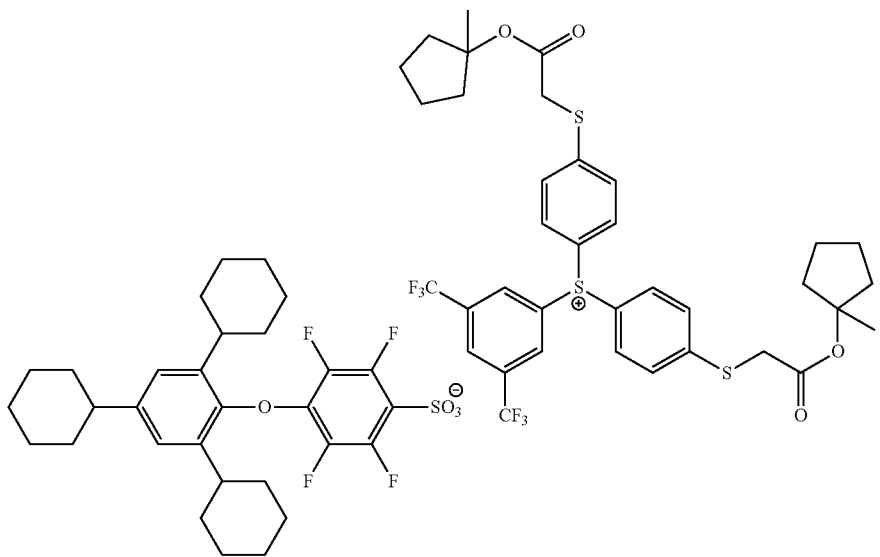

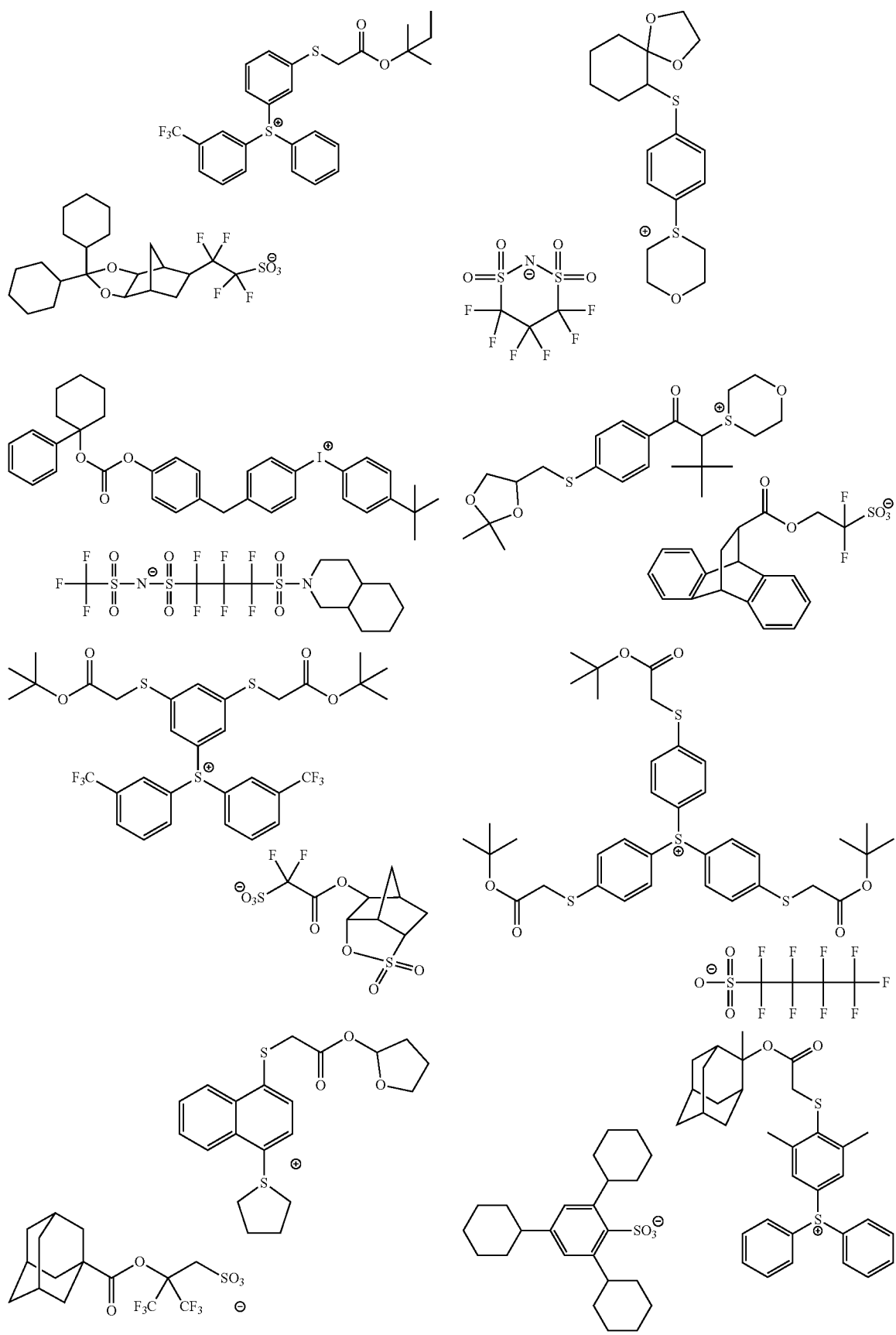

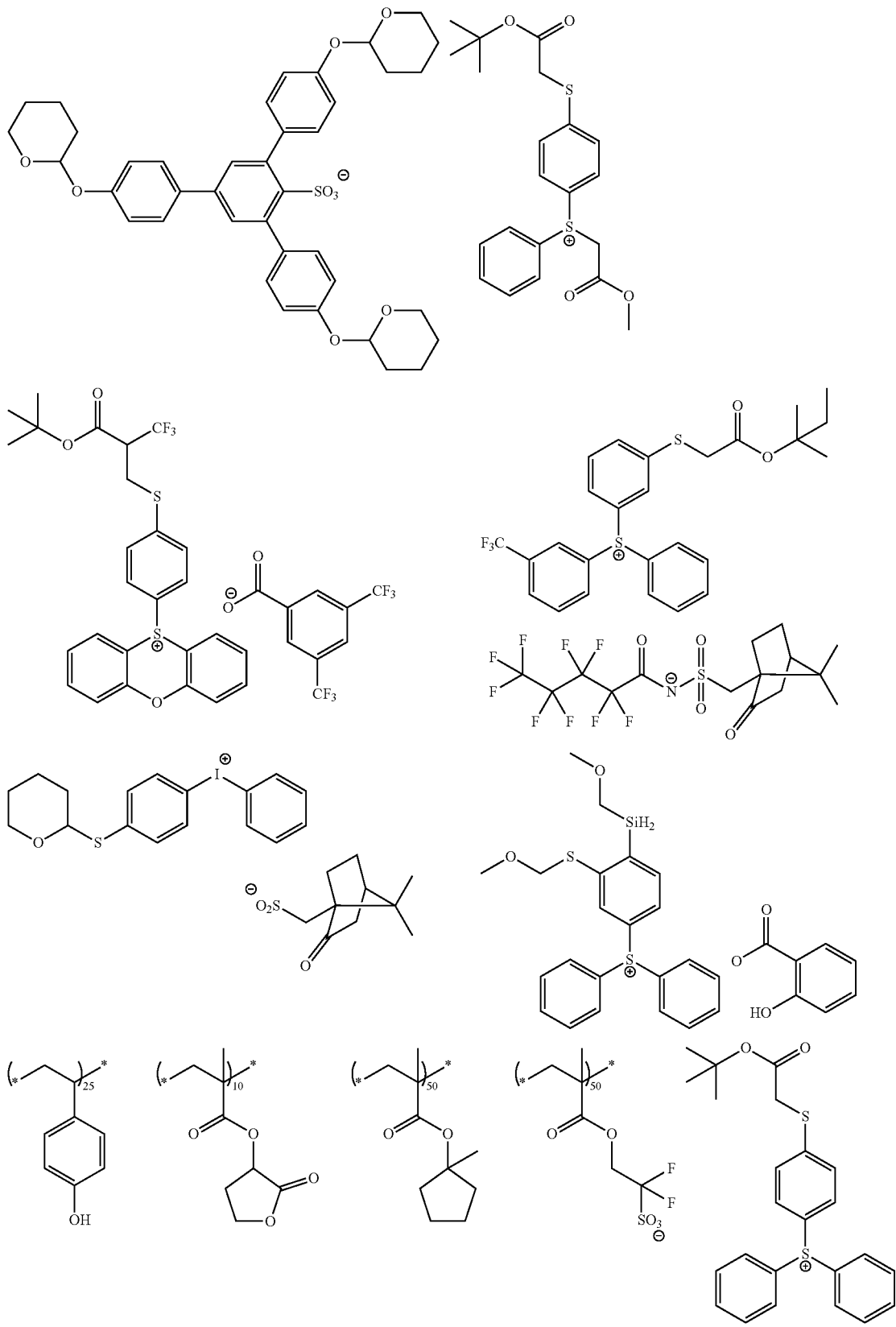

-continued
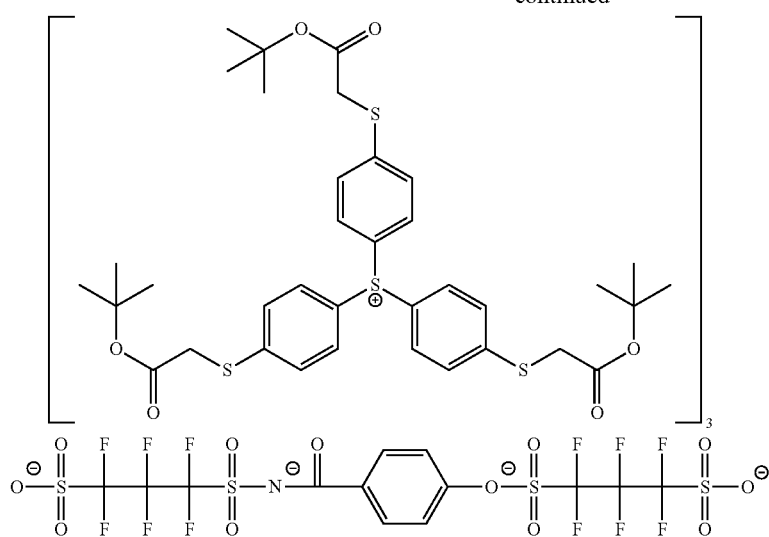
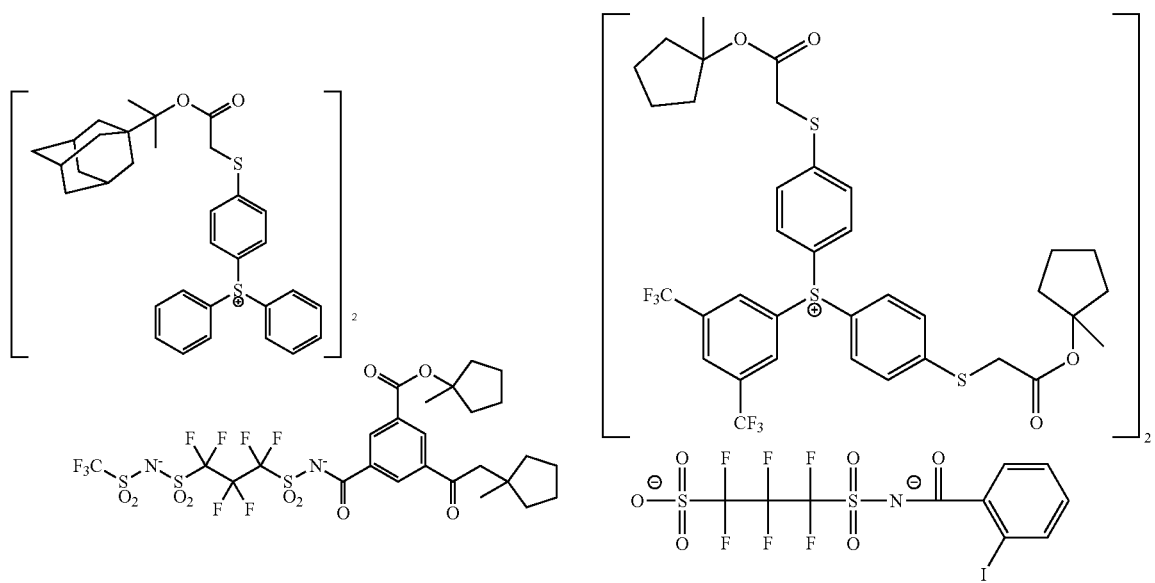

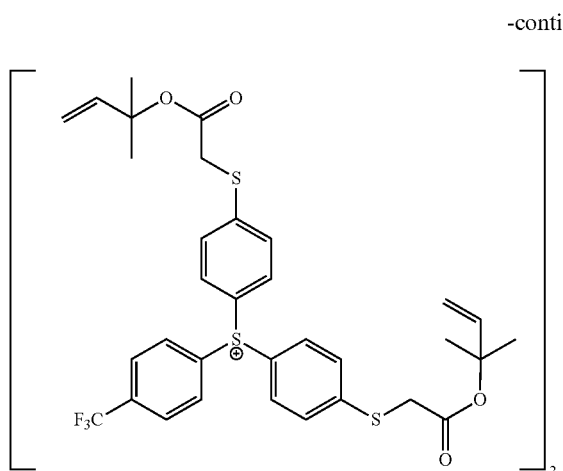
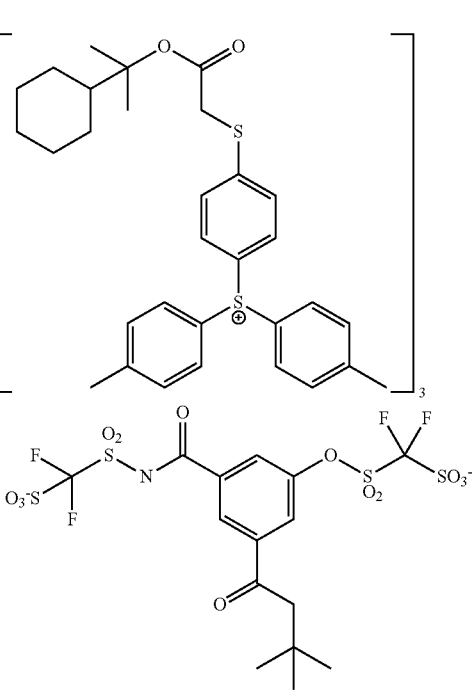
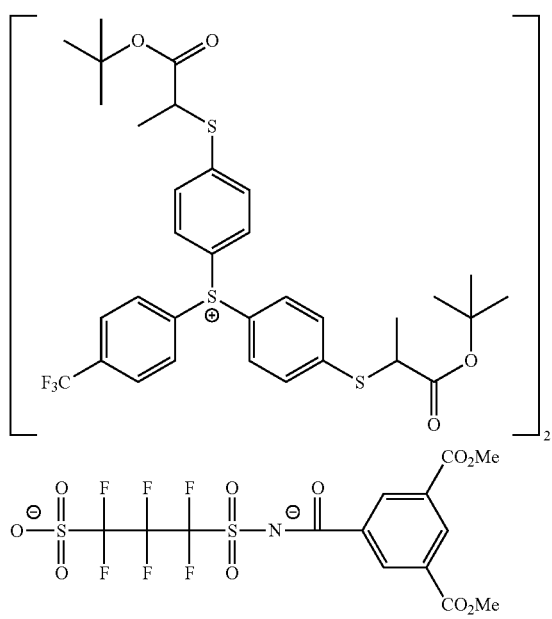

In the composition of the embodiment of the present invention, the content of the specific compound is preferably 1.0% to 70.0% by mass, more preferably 5.0% to 70.0% by mass, still more preferably 10.0% to 60.0% by mass with respect to the total solid content of the composition.

Furthermore, the solid content is intended to be components excluding the solvent in the composition, and any of components other than the solvent are regarded as the solid content even in a case where they are liquid components.

In addition, the specific compound may be used alone or in combination of a plurality thereof.

<Resin Having Repeating Unit Having Group Having Polarity that Increases Through Decomposition by Action of Acid (Resin (A))>

The composition of the embodiment of the present invention includes a resin (hereinafter also referred to as an "acid-decomposable resin" or a "resin (A)") having a repeating unit having a group having a polarity that increases through decomposition by the action of an acid.

That is, in the pattern forming method of an embodiment of the present invention, typically, in a case where an alkali developer is adopted as the developer, a positive tone pattern is suitably formed, and in a case where an organic developer is adopted as the developer, a negative tone pattern is suitably formed.

The resin (A) includes a repeating unit having a group (hereinafter also referred to as an "acid-decomposable group") having a polarity that increases through decomposition by the action of an acid.

As described above, the resin (A) may further include a repeating unit (specific repeating unit) having a cation represented by General Formula (1) mentioned above (specific cation), in addition to the repeating unit having an acid-decomposable group.

The definition of the specific cation contained in the specific repeating unit is as described above.

The structure of the specific repeating unit is not particularly limited, but a repeating unit represented by General Formula (U) is preferable from the viewpoint that the effect of the present invention is more excellent.

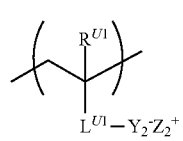

(U)

In General Formula (U), $R^{U1}$ represents a hydrogen atom or a substituent. The type of the substituent is not particularly limited, and examples of the substituent include an alkyl group and a halogen atom.

$L^{U1}$ represents a single bond or a divalent linking group. Examples of the divalent linking group include —O—, —OC—, —CO—, —COO—, —OCO—, —S—, —N—, CS—, —SO—, —SO$_2$—, a hydrocarbon group (for example, an alkylene group, a cycloalkylene group, an alkenylene group, and an arylene group) which may have a substituent, and a linking group formed by the linking of a plurality of those groups.

$Y_2^-$ represents an anionic functional group. The definition of the anionic functional group is as described above.

$Z_2^+$ represents a specific cation. The definition of $Z_2^+$ is the same as that of $Z_2^+$ in General Formula (3) mentioned above.

In a case where the resin (A) has a specific repeating unit, the content of the specific repeating unit is not particularly limited, but from the viewpoint that the effect of the present invention is more excellent, the content is preferably 10% to 90% by mole, more preferably 20% to 80% by mole, and still more preferably 30% to 70% by mole with respect to all the repeating units of the resin (A).

(Repeating Unit Having Acid-Decomposable Group)

The acid-decomposable group refers to a group that decomposes by the action of an acid to generate a polar group. The acid-decomposable group preferably has a structure in which the polar group is protected by a leaving group that leaves by the action of an acid. That is, the resin (A) has a repeating unit having a group that decomposes by the action of an acid to generate a polar group. A resin having this repeating unit has an increased polarity by the action of an acid, and thus has an increased solubility in an alkali developer, and a decreased solubility in an organic solvent.

As the polar group, an alkali-soluble group is preferable, and examples thereof include an acidic group such as a carboxyl group, a phenolic hydroxyl group, a fluorinated alcohol group, a sulfonic acid group, a phosphoric acid group, a sulfonamide group, a sulfonylimide group, an (alkylsulfonyl)(alkylcarbonyl)methylene group, an (alkylsulfonyl)(alkylcarbonyl)imide group, a bis(alkylcarbonyl)methylene group, a bis(alkylcarbonyl)imide group, a bis(alkyl sulfonyl)methylene group, a bis(alkylsulfonyl)imide group, a tris(alkylcarbonyl)methylene group, and a tris(alkylsulfonyl)methylene group, and an alcoholic hydroxyl group.

Among those, as the polar group, the carboxyl group, the phenolic hydroxyl group, the fluorinated alcohol group (preferably a hexafluoroisopropanol group), or the sulfonic acid group is preferable.

Examples of the leaving group that leaves by the action of an acid include groups represented by General Formulae (Y1) to (Y4).

—C(Rx$_1$)(Rx$_2$)(Rx$_3$)    General Formula (Y1):

—C(=O)OC(Rx$_1$)(Rx$_2$)(Rx$_3$)    General Formula (Y2):

—C(R$_{36}$)(R$_{37}$)(OR$_{38}$)    General Formula (Y3):

—C(Rn)(H)(Ar)    General Formula (Y4):

In General Formulae (Y1) and (Y2), Rx$_1$ to Rx$_3$ each independently represent an (linear or branched) alkyl group or (monocyclic or polycyclic) cycloalkyl group, an (linear or branched) alkenyl group, or an (monocyclic or polycyclic) aryl group. Furthermore, in a case where all of Rx$_1$ to Rx$_3$ are (linear or branched) alkyl groups, it is preferable that at least two of Rx$_1$, Rx$_2$, or Rx$_3$ are methyl groups.

Above all, it is preferable that Rx$_1$ to Rx$_3$ each independently represent a linear or branched alkyl group, and it is more preferable that Rx$_1$ to Rx$_3$ each independently represent the linear alkyl group.

Two of Rx$_1$ to Rx$_3$ may be bonded to each other to form a monocycle or a polycycle.

As the alkyl group of each of Rx$_1$ to Rx$_3$, an alkyl group having 1 to 5 carbon atoms, such as a methyl group, an ethyl group, an n-propyl group, an isopropyl group, an n-butyl group, an isobutyl group, and a t-butyl group, is preferable.

As the cycloalkyl group of each of Rx$_1$ to Rx$_3$, a monocyclic cycloalkyl group such as a cyclopentyl group and a cyclohexyl group, or a polycyclic cycloalkyl group such as a norbornyl group, a tetracyclodecanyl group, a tetracyclododecanyl group, and an adamantyl group is preferable.

As the aryl group of each of Rx$_1$ to Rx$_3$, an aryl group having 6 to 10 carbon atoms is preferable, and examples thereof include a phenyl group, a naphthyl group, and an anthryl group.

As the alkenyl group of each of Rx$_1$ to Rx$_3$, a vinyl group is preferable.

As a ring formed by the bonding of two of Rx$_1$ to Rx$_3$, a cycloalkyl group is preferable. As the cycloalkyl group formed by the bonding of two of Rx$_1$ to Rx$_3$, a monocyclic cycloalkyl group such as a cyclopentyl group or a cyclohexyl group, or a polycyclic cycloalkyl group such as a norbornyl group, a tetracyclodecanyl group, a tetracyclododecanyl group, or an adamantyl group is preferable, and a monocyclic cycloalkyl group having 5 or 6 carbon atoms is more preferable.

In the cycloalkyl group formed by the bonding of two of Rx$_1$ to Rx$_3$, for example, one of the methylene groups constituting the ring may be substituted with a heteroatom such as an oxygen atom, a group having a heteroatom, such as a carbonyl group, or a vinylidene group. In addition, in the cycloalkyl group, one or more of the ethylene groups constituting the cycloalkane ring may be substituted with a vinylene group.

With regard to the group represented by General Formula (Y1) or (Y2), for example, an aspect in which Rx$_1$ is a methyl group or an ethyl group, and Rx$_2$ and Rx$_3$ are bonded to each other to form a cycloalkyl group is preferable.

In General Formula (Y3), R$_{36}$ to R$_{38}$ each independently represent a hydrogen atom or a monovalent organic group. R$_{37}$ and R$_{38}$ may be bonded to each other to form a ring.

Examples of the monovalent organic group include an alkyl group, a cycloalkyl group, an aryl group, an aralkyl group, and an alkenyl group. It is also preferable that $R_{36}$ is the hydrogen atom.

Furthermore, the alkyl group, the cycloalkyl group, the aryl group, and the aralkyl group may include a heteroatom such as an oxygen atom, and/or a group having a heteroatom, such as a carbonyl group. For example, in the alkyl group, the cycloalkyl group, the aryl group, and the aralkyl group, one or more of the methylene groups may be substituted with a heteroatom such as an oxygen atom, and/or a group having a heteroatom, such as a carbonyl group.

In addition, $R_{38}$ and another substituent contained in the main chain of the repeating unit may be bonded to each other to form a ring. A group formed by the mutual bonding of $R_{38}$ and another substituent in the main chain of the repeating unit is preferably an alkylene group such as a methylene group.

As General Formula (Y3), a group represented by Formula (Y3-1) is preferable.

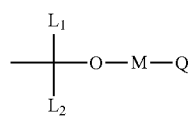

(Y3-1)

Here, $L_1$ and $L_2$ each independently represent a hydrogen atom, an alkyl group, a cycloalkyl group, an aryl group, or a group formed by combination thereof (for example, a group formed by combination of an alkyl group and an aryl group).

M represents a single bond or a divalent linking group.

Q represents an alkyl group which may include a heteroatom, a cycloalkyl group which may include a heteroatom, an aryl group which may include a heteroatom, an amino group, an ammonium group, a mercapto group, a cyano group, an aldehyde group, or a group formed by combination thereof (for example, a group formed by combination of an alkyl group and a cycloalkyl group).

In the alkyl group and the cycloalkyl group, for example, one of the methylene groups may be substituted with a heteroatom such as an oxygen atom or a group having a heteroatom, such as a carbonyl group.

Furthermore, it is preferable that one of $L_1$ or $L_2$ is a hydrogen atom, and the other is an alkyl group, a cycloalkyl group, an aryl group, or a group formed by combination of an alkylene group and an aryl group.

At least two of Q, M, or $L_1$ may be bonded to each other to form a ring (preferably a 5-membered ring or a 6-membered ring).

From the viewpoint of pattern miniaturization, $L_2$ is preferably a secondary or tertiary alkyl group, and more preferably the tertiary alkyl group. Examples of the secondary alkyl group include an isopropyl group, a cyclohexyl group, and a norbornyl group, and examples of the tertiary alkyl group include a tert-butyl group and an adamantane group. In these aspects, since the glass transition temperature (Tg) and the activation energy are increased, it is possible to suppress fogging in addition to ensuring film hardness.

In General Formula (Y4), Ar represents an aromatic ring group. Rn represents an alkyl group, a cycloalkyl group, or an aryl group. Rn and Ar may be bonded to each other to form a non-aromatic ring. Ar is more preferably the aryl group.

From the viewpoint that the acid decomposability of the repeating unit is excellent, in a case where a non-aromatic ring is directly bonded to a polar group (or a residue thereof) in a leaving group that protects the polar group, it is also preferable that a ring member atom adjacent to the ring member atom directly bonded to the polar group (or a residue thereof) in the non-aromatic ring has no halogen atom such as a fluorine atom as a substituent.

In addition, the leaving group that leaves by the action of an acid may be a 2-cyclopentenyl group having a substituent (an alkyl group and the like), such as a 3-methyl-2-cyclopentenyl group, and a cyclohexyl group having a substituent (an alkyl group and the like), such as a 1,1,4,4-tetramethylcyclohexyl group.

As the repeating unit having an acid-decomposable group, a repeating unit represented by General Formula (A) is also preferable.

(A)

$L_1$ represents a divalent linking group which may have a fluorine atom or an iodine atom, $R_1$ represents a fluorine atom, an iodine atom, a fluorine atom, an alkyl group which may have an iodine atom, an aryl group which may have a fluorine atom or an iodine atom, or a hydrogen atom, and $R_2$ represents a leaving group that leaves by the action of an acid and may have a fluorine atom or an iodine atom. It should be noted that at least one of $L_1$, $R_1$, or $R_2$ has a fluorine atom or an iodine atom.

$L_1$ represents a divalent linking group which may have a fluorine atom or an iodine atom. Examples of the divalent linking group which may have a fluorine atom or an iodine atom include —CO—, —O—, —S—, —SO—, —SO$_2$—, a hydrocarbon group which may have a fluorine atom or an iodine atom (for example, an alkylene group, a cycloalkylene group, an alkenylene group, and an arylene group), and a linking group formed by the linking of a plurality of these groups. Among those, as $L_1$, —CO— or -arylene group-alkylene group having a fluorine atom or an iodine atom- is preferable.

As the arylene group, a phenylene group is preferable.

The alkylene group may be linear or branched. The number of carbon atoms of the alkylene group is not particularly limited, but is preferably 1 to 10, and more preferably 1 to 3.

The total number of fluorine atoms and iodine atoms included in the alkylene group having a fluorine atom or an iodine atom is not particularly limited, but is preferably 2 or more, more preferably 2 to 10, and still more preferably 3 to 6.

$R_1$ represents a fluorine atom, an iodine atom, an alkyl group which may have a fluorine atom or an iodine atom, an aryl group which may have a fluorine atom or an iodine atom, or a hydrogen atom.

The alkyl group may be linear or branched. The number of carbon atoms of the alkyl group is not particularly limited, but is preferably 1 to 10, and more preferably 1 to 3.

The total number of fluorine atoms and iodine atoms included in the alkyl group having a fluorine atom or an iodine atom is not particularly limited, but is preferably 1 or more, more preferably 1 to 5, and still more preferably 1 to 3.

The alkyl group may include a heteroatom such as an oxygen atom, other than a halogen atom.

$R_2$ represents a leaving group that leaves by the action of an acid and may have a fluorine atom or an iodine atom.

Among those, examples of the leaving group include groups represented by General Formulae $(Z_1)$ to $(Z_4)$.

| —C(Rx$_{11}$)(Rx$_{12}$)(Rx$_{13}$). | General Formula (Z$_1$): |
| —C(=O)OC(Rx$_{11}$)(Rx$_{12}$)(Rx$_{13}$). | General Formula (Z$_2$): |
| —C(R$_{136}$)(R$_{137}$)(OR$_{138}$). | General Formula (Z$_3$): |
| —C(Rn$_1$)(H)(Ar$_1$) | General Formula (Z$_4$): |

In General Formulae $(Z_1)$ and $(Z_2)$, $Rx_{11}$ to $Rx_{13}$ each independently represent an (linear or branched) alkyl group which may have a fluorine atom or an iodine atom, a (monocyclic or polycyclic) cycloalkyl group which may have a fluorine atom or an iodine atom, an (linear or branched) alkenyl group which may have a fluorine atom or an iodine atom, or an (monocyclic or polycyclic) aryl group which may have a fluorine atom or an iodine atom. Furthermore, in a case where all of $Rx_{11}$ to $Rx_{13}$ are each an (linear or branched) alkyl group, it is preferable that at least two of $Rx_{11}$, $Rx_{12}$, or $Rx_{13}$ are methyl groups.

$Rx_{11}$ to $Rx_{13}$ are the same as $Rx_1$ to $Rx_3$ in General Formula (Y1) and General Formula (Y2) described above, respectively, except that they may have a fluorine atom or an iodine atom, and have the same definitions and suitable ranges as those of the alkyl group, the cycloalkyl group, the alkenyl group, and the aryl group.

In General Formula (Z3), $R_{136}$ to $R_{138}$ each independently represent a hydrogen atom, or a monovalent organic group which may have a fluorine atom or an iodine atom. $R_{137}$ and $R_{138}$ may be bonded to each other to form a ring. Examples of the monovalent organic group which may have a fluorine atom or an iodine atom include an alkyl group which may have a fluorine atom or an iodine atom, a cycloalkyl group which may have a fluorine atom or an iodine atom, an aryl group which may have a fluorine atom or an iodine atom, an aralkyl group which may have a fluorine atom or an iodine atom, and a group formed by combination thereof (for example, a group formed by combination of an alkyl group which may have a fluorine atom or an iodine atom with a cycloalkyl group which may have a fluorine atom or an iodine atom).

Incidentally, the alkyl group, the cycloalkyl group, the aryl group, and the aralkyl group may include a heteroatom such as an oxygen atom, in addition to the fluorine atom and the iodine atom. That is, in the alkyl group, the cycloalkyl group, the aryl group, and the aralkyl group, for example, one of the methylene groups may be substituted with a heteroatom such as an oxygen atom or a group having a heteroatom, such as a carbonyl group.

In addition, $R_{138}$ may combine with another substituent of the main chain of the repeating unit to form a ring. In this case, the group formed by combining $R_{138}$ with another substituent of the main chain of the repeating unit is preferably an alkylene group such as a methylene group.

As General Formula (Z3), a group represented by Formula (Z3-1) is preferable.

(Z3-1)

Here, $L_{11}$ and $L_{12}$ each independently represent a hydrogen atom; an alkyl group which may have a heteroatom selected from the group consisting of a fluorine atom, an iodine atom, and an oxygen atom; a cycloalkyl group which may have a heteroatom selected from the group consisting of a fluorine atom, an iodine atom, and an oxygen atom; an aryl group which may have a heteroatom selected from the group consisting of a fluorine atom, an iodine atom, and an oxygen atom; or a group formed by combination thereof (for example, a group formed by combination of an alkyl group which may have a heteroatom selected from the group consisting of a fluorine atom, an iodine atom, and an oxygen atom with a cycloalkyl group which may have a heteroatom selected from the group consisting of a fluorine atom, an iodine atom, and an oxygen atom).

$M_1$ represents a single bond or a divalent linking group.

$Q_1$ represents an alkyl group which may have a heteroatom selected from the group consisting of a fluorine atom, an iodine atom, and an oxygen atom; a cycloalkyl group which may have a heteroatom selected from the group consisting of a fluorine atom, an iodine atom, and an oxygen atom; an aryl group which may have a heteroatom selected from the group consisting of a fluorine atom, an iodine atom, and an oxygen atom; an amino group; an ammonium group; a mercapto group; a cyano group; an aldehyde group; a group formed by combination thereof (for example, a group formed by combination of the alkyl group and the cycloalkyl group, each of which may have a heteroatom selected from the group consisting of a fluorine atom, an iodine atom, and an oxygen atom).

In General Formula (Y4), $Ar_1$ represents an aromatic ring group which may have a fluorine atom or an iodine atom. $Rn_1$ represents an alkyl group which may have a fluorine atom or an iodine atom, a cycloalkyl group which may have a fluorine atom or an iodine atom, or an aryl group which may have a fluorine atom or an iodine atom. $Rn_1$ and $Ar_1$ may be bonded to each other to form a non-aromatic ring.

As the repeating unit having an acid-decomposable group, a repeating unit represented by General Formula (AI) is also preferable.

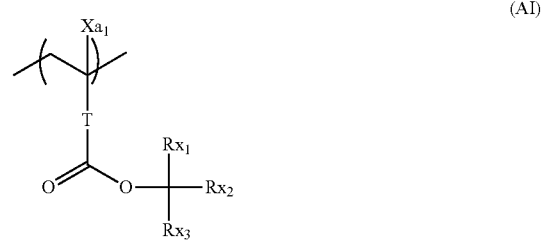

(AI)

In General Formula (AI), $Xa_1$ represents a hydrogen atom, or an alkyl group which may have a substituent.

T represents a single bond or a divalent linking group.

$Rx_1$ to $Rx_3$ each independently represent an (linear or branched) alkyl group, a (monocyclic or polycyclic) cycloalkyl group, an (linear or branched) alkenyl group, or an (monocyclic or polycyclic) aryl group. It should be noted that in a case where all of $Rx_1$ to $Rx_3$ are each an (linear or branched) alkyl group, it is preferable that at least two of $Rx_1$, $Rx_2$, or $Rx_3$ are methyl groups.

Two of $Rx_1$ to $Rx_3$ may be bonded to each other to form a monocycle or polycycle (a monocyclic or polycyclic cycloalkyl group and the like).

Examples of the alkyl group which may have a substituent, represented by $Xa_1$, include a methyl group and a group represented by —$CH_2$—$R_{11}$. $R_{11}$ represents a halogen atom (a fluorine atom or the like), a hydroxyl group, or a monovalent organic group, examples thereof include an alkyl group having 5 or less carbon atoms, which may have a halogen atom, an acyl group having 5 or less carbon atoms, which may have a halogen atom, and an alkoxy group having 5 or less carbon atoms, which may have a halogen atom; and an alkyl group having 3 or less carbon atoms is preferable, and a methyl group is more preferable. The lower limit of the number of carbon atoms of the alkyl group is preferably 1 or more. $Xa_1$ is preferably a hydrogen atom, a methyl group, a trifluoromethyl group, or a hydroxymethyl group.

Examples of the divalent linking group of T include an alkylene group, an aromatic ring group, a —COO-Rt- group, and an —O-Rt- group. In the formulae, Rt represents an alkylene group or a cycloalkylene group.

T is preferably the single bond or the —COO-Rt- group. In a case where T represents the —COO-Rt-group, Rt is preferably an alkylene group having 1 to 5 carbon atoms, and more preferably a —$CH_2$— group, a —$(CH_2)_2$— group, or a —$(CH_2)_3$— group.

As the alkyl group of each of $Rx_1$ to $Rx_3$, an alkyl group having 1 to 4 carbon atoms, such as a methyl group, an ethyl group, an n-propyl group, an isopropyl group, an n-butyl group, an isobutyl group, and a t-butyl group, is preferable.

As the cycloalkyl group of each of $Rx_1$ to $Rx_3$, a monocyclic cycloalkyl group such as a cyclopentyl group and a cyclohexyl group, or a polycyclic cycloalkyl group such as a norbornyl group, a tetracyclodecanyl group, a tetracyclododecanyl group, and an adamantyl group is preferable.

As the aryl group of each of $Rx_1$ to $Rx_3$, an aryl group having 6 to 10 carbon atoms is preferable, and examples thereof include a phenyl group, a naphthyl group, and an anthryl group.

As the alkenyl group of each of $Rx_1$ to $Rx_3$, a vinyl group is preferable.

As the cycloalkyl group formed by the bonding of two of $Rx_1$ to $Rx_3$, a monocyclic cycloalkyl group such as a cyclopentyl group and a cyclohexyl group is preferable, and in addition, a polycyclic cycloalkyl group such as a norbornyl group, a tetracyclodecanyl group, a tetracyclododecanyl group, and an adamantyl group is also preferable. Among those, a monocyclic cycloalkyl group having 5 or 6 carbon atoms is preferable.

In the cycloalkyl group formed by the bonding of two of $Rx_1$ to $Rx_3$, for example, one of the methylene groups constituting the ring may be substituted with a heteroatom such as an oxygen atom, a group having a heteroatom, such as a carbonyl group, or a vinylidene group. In addition, in the cycloalkyl group, one or more of the ethylene groups constituting the cycloalkane ring may be substituted with a vinylene group.

With regard to the repeating unit represented by General Formula (AI), for example, an aspect in which $Rx_1$ is a methyl group or an ethyl group, and $Rx_2$ and $Rx_3$ are bonded to each other to form the above-mentioned cycloalkyl group is preferable.

In a case where each of the groups has a substituent, examples of the substituent include an alkyl group (having 1 to 4 carbon atoms), a halogen atom, a hydroxyl group, an alkoxy group (having 1 to 4 carbon atoms), a carboxyl group, and an alkoxycarbonyl group (having 2 to 6 carbon atoms). The substituent preferably has 8 or less carbon atoms. The lower limit is preferably 1 or more.

The repeating unit represented by General Formula (AI) is preferably an acid-decomposable tertiary alkyl (meth) acrylate ester-based repeating unit (the repeating unit in which $Xa_1$ represents a hydrogen atom or a methyl group, and T represents a single bond).

The content of the repeating unit having an acid-decomposable group is preferably 15% to 80% by mole, more preferably 20% to 70% by mole, and still more preferably 20% to 65% by mole with respect to all repeating units in the resin (A).

Specific examples of the repeating unit having an acid-decomposable group are shown below, but the present invention is not limited thereto. Furthermore, in the formulae, $Xa_1$ represents any one group of H, F, $CH_3$, $CF_3$, or $CH_2OH$, and Rxa and Rxb each independently represent a linear or branched alkyl group having 1 to 5 carbon atoms.

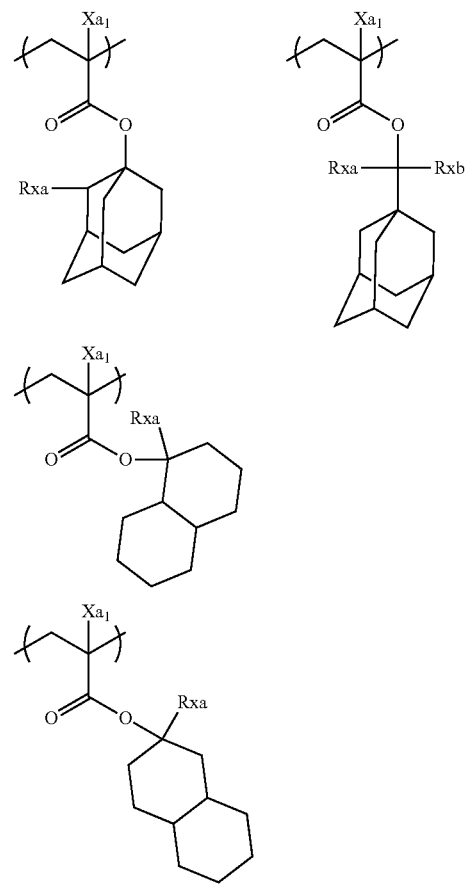

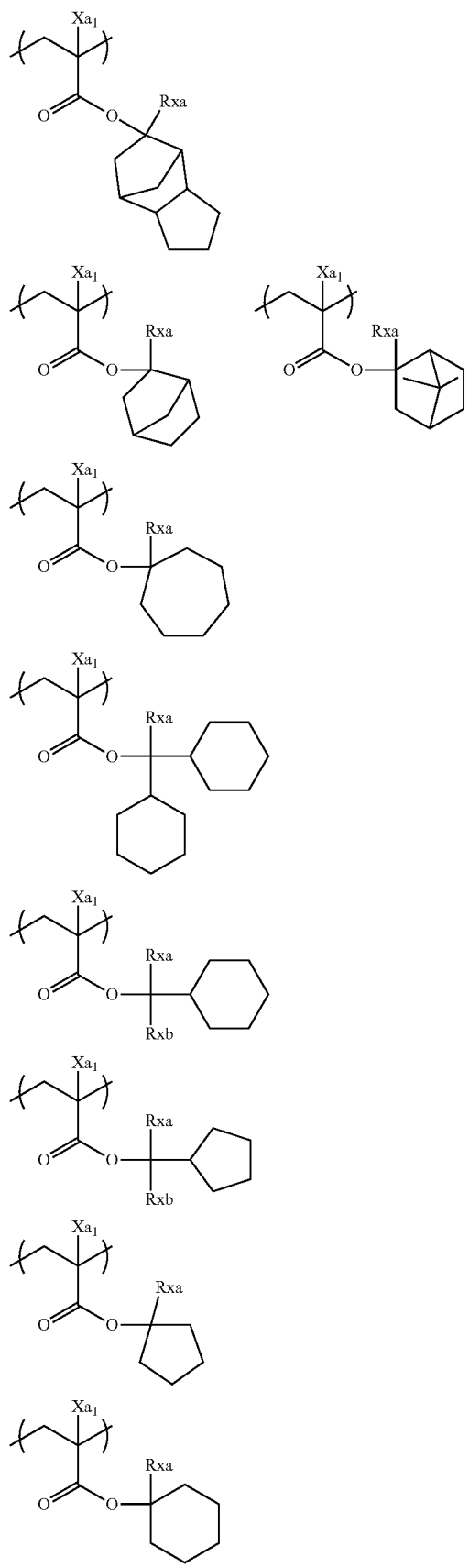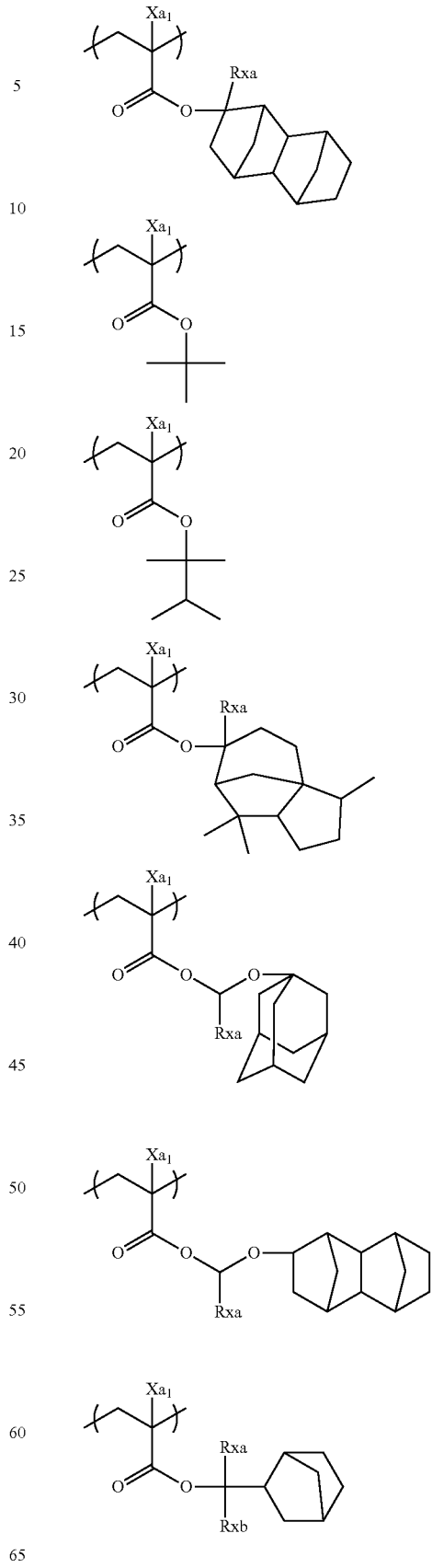

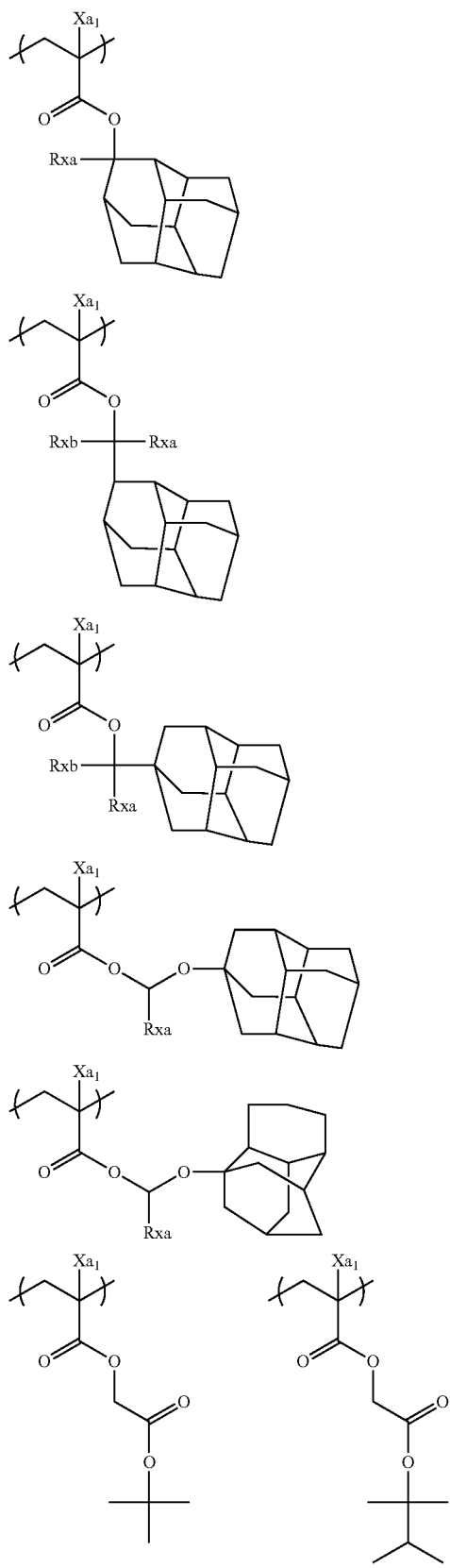
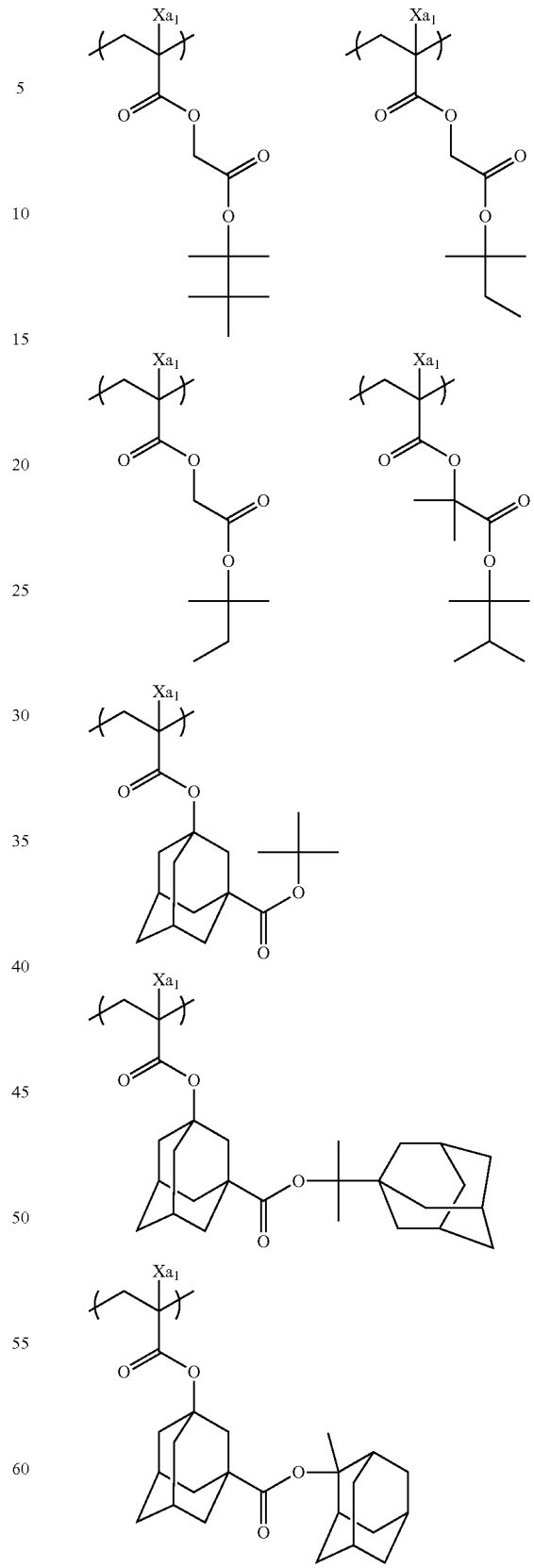

-continued
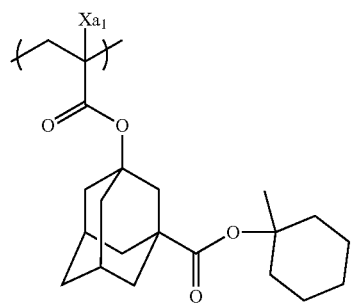
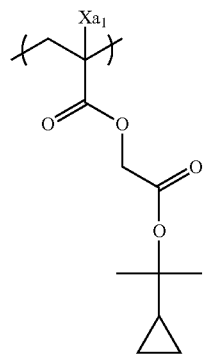
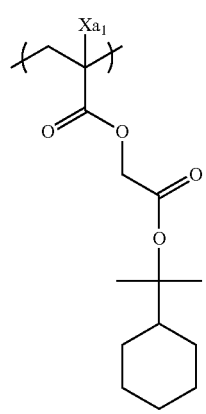
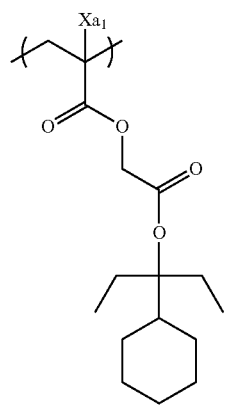
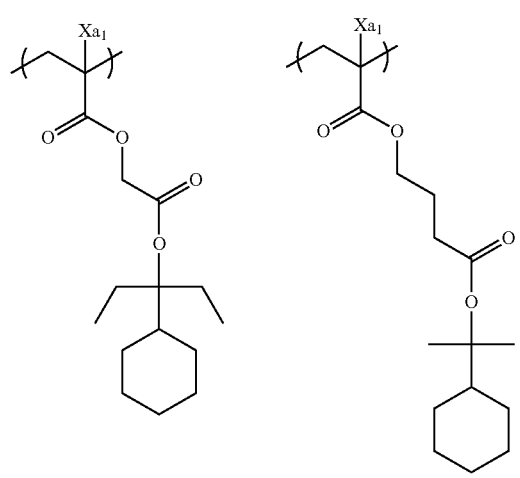
-continued
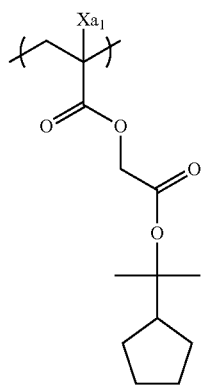
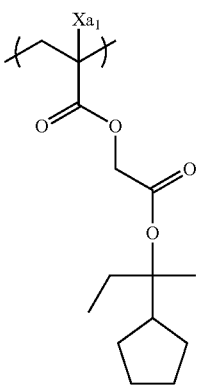
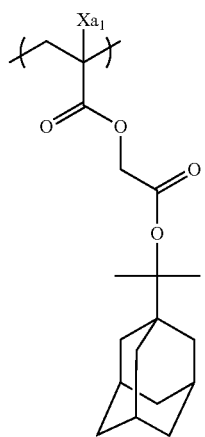
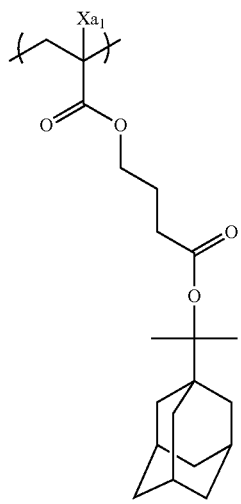

-continued
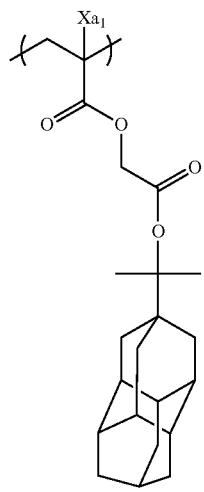
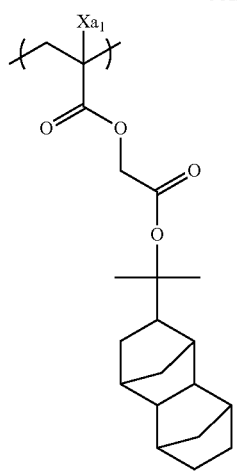 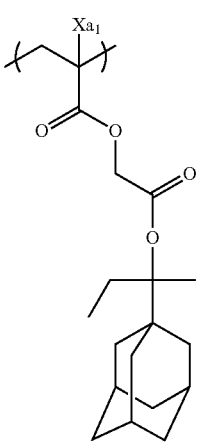
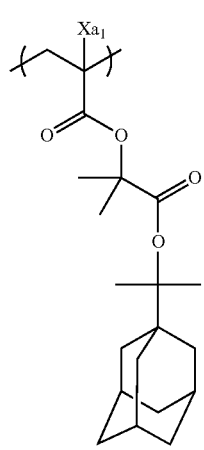
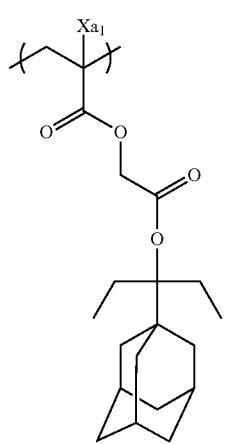 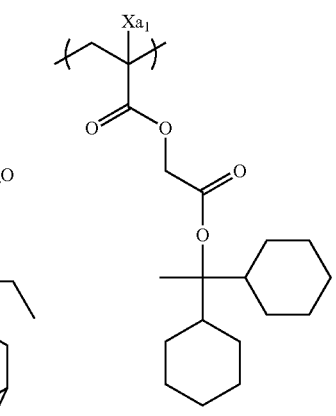
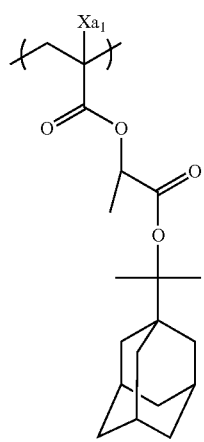 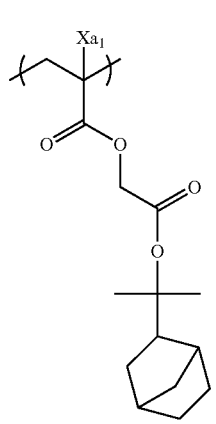 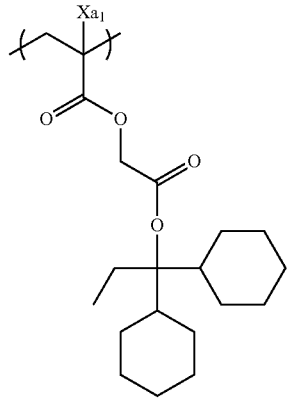

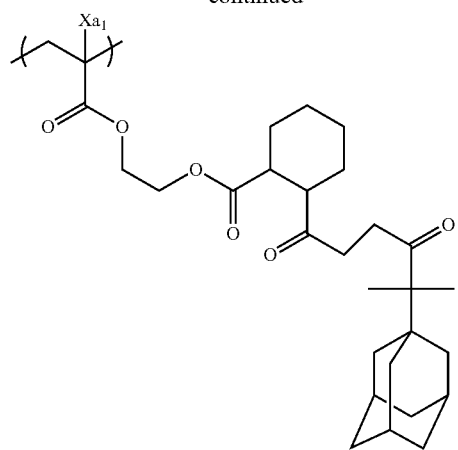
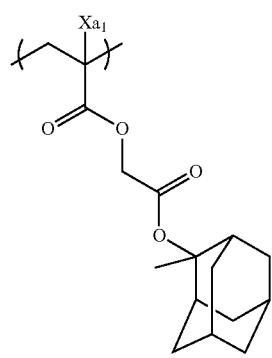
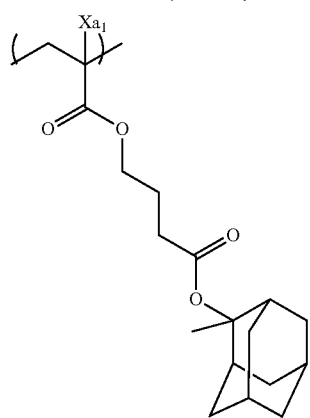
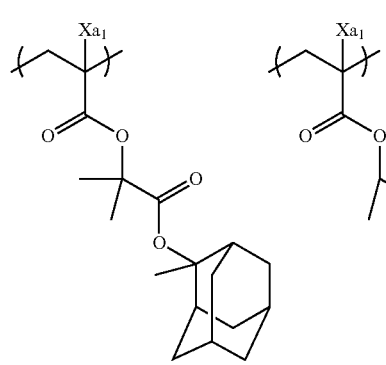
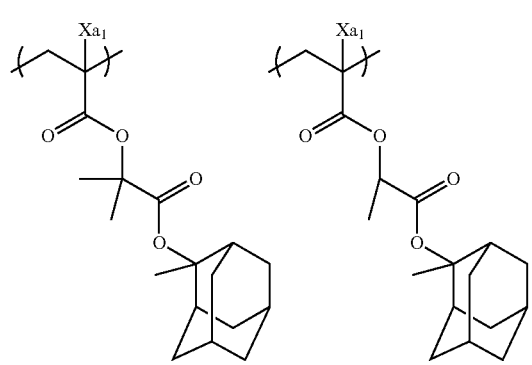
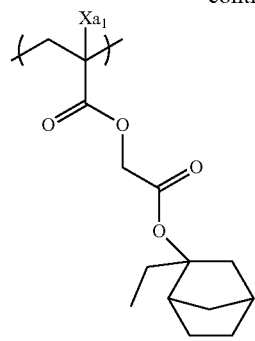
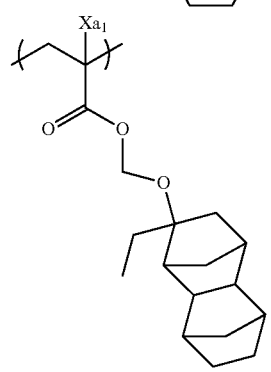
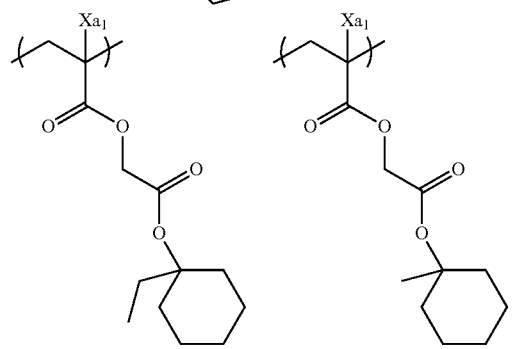
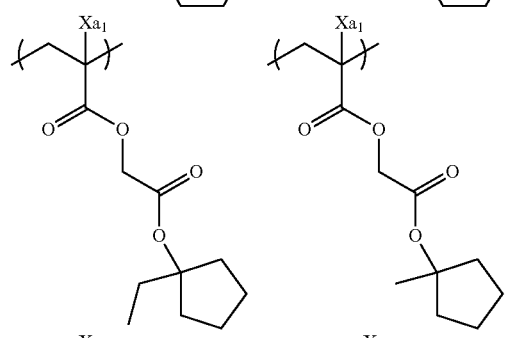
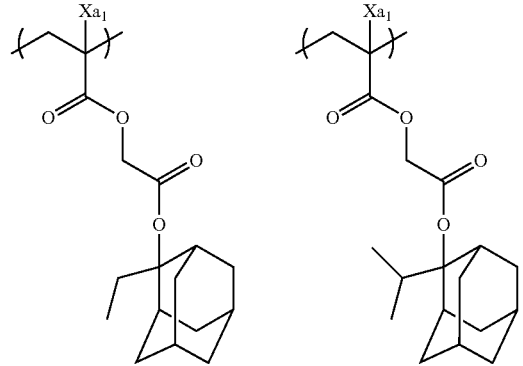

-continued
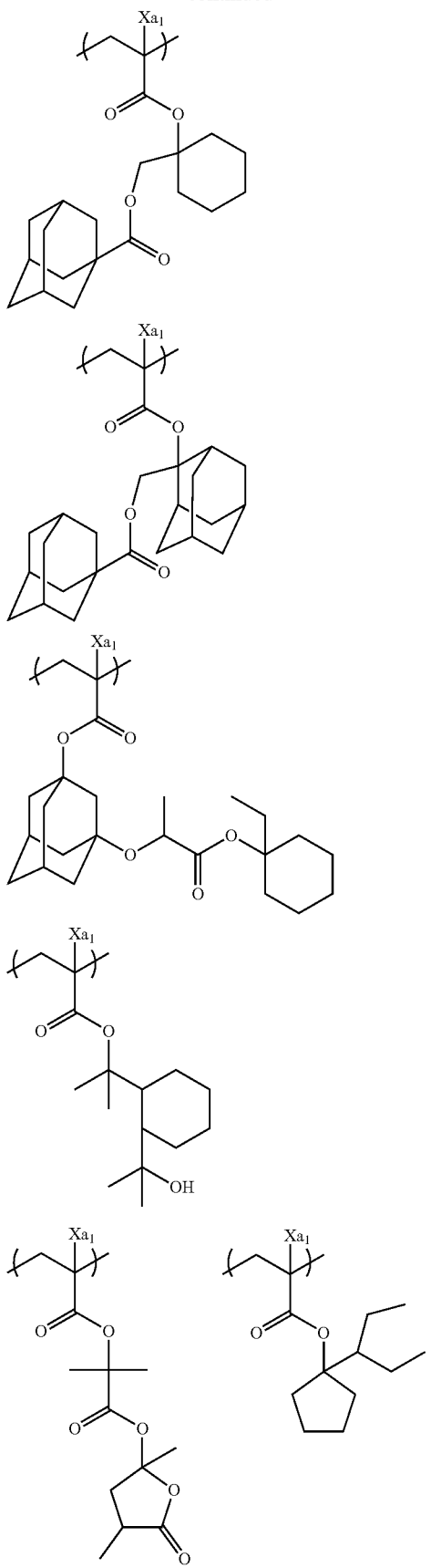
-continued
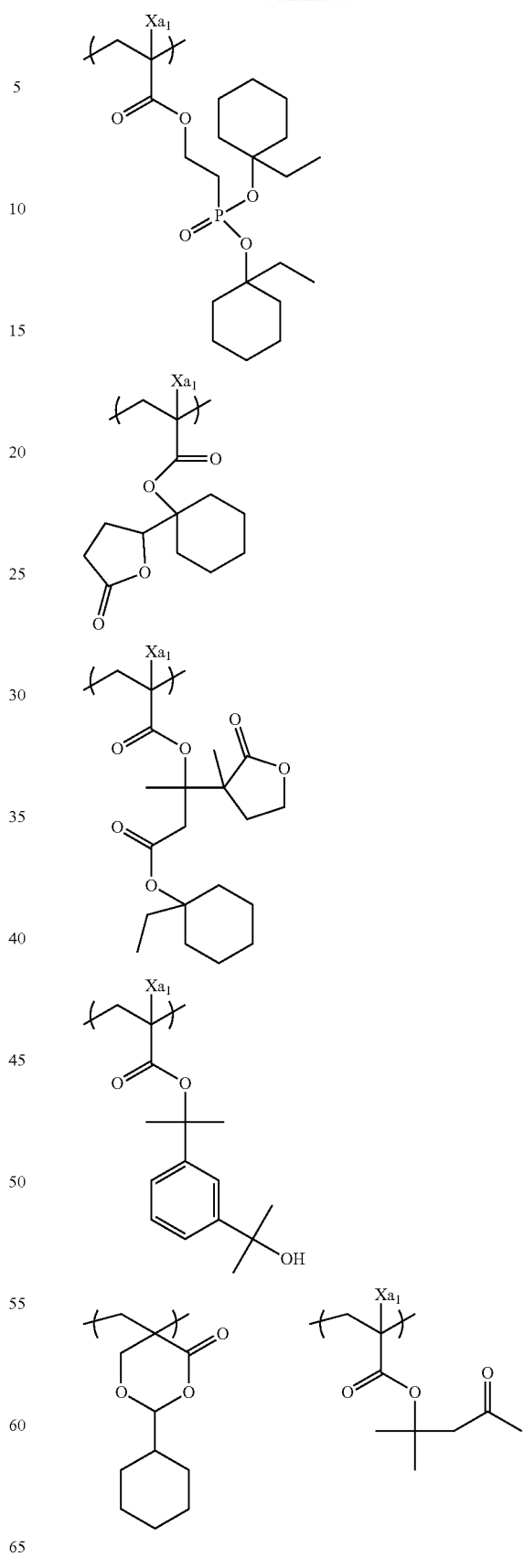

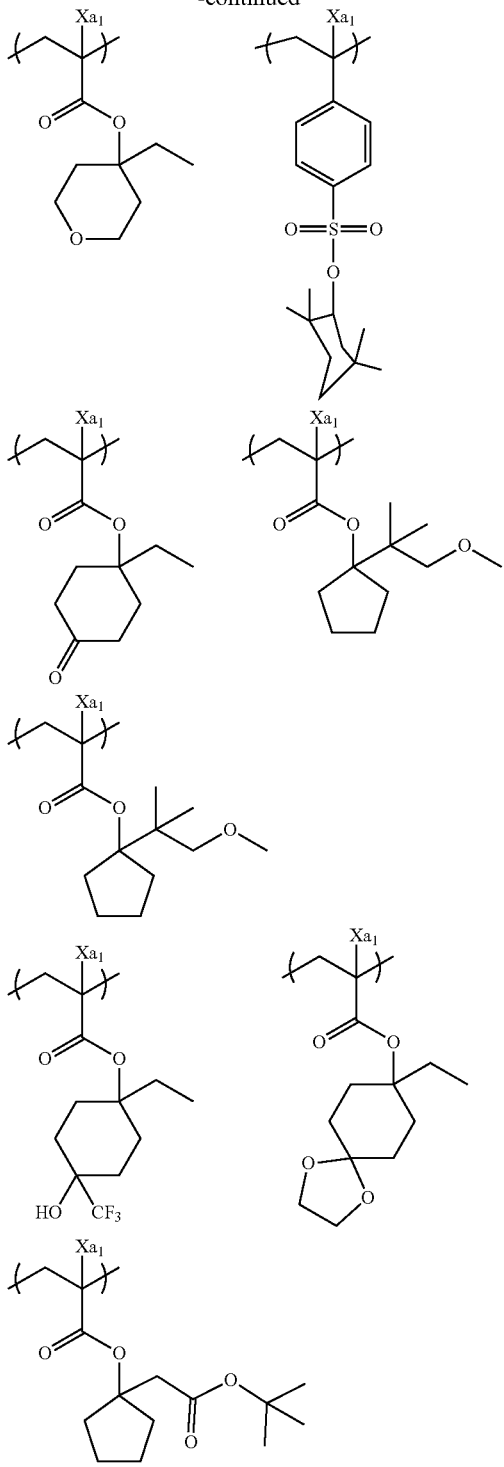

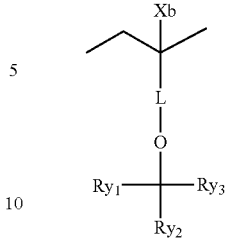

(B)

In General Formula (B),

Xb represents a hydrogen atom, a halogen atom, or an alkyl group which may have a substituent.

L represents a single bond, or a divalent linking group which may have a substituent.

$Ry_1$ to $Ry_3$ each independently represent a linear and branched alkyl group, a monocyclic or polycyclic cycloalkyl group, an alkenyl group, an alkynyl group, or a monocyclic or polycyclic aryl group. It should be noted that at least one of $Ry_1$ to $Ry_3$ represents an alkenyl group, an alkynyl group, a monocyclic or polycyclic cycloalkenyl group, or a monocyclic or polycyclic aryl group.

Two of $Ry_1$ to $Ry_3$ may be bonded to each other to form a monocycle or polycycle (a monocyclic or polycyclic cycloalkyl group, a cycloalkenyl group, or the like).

Examples of the alkyl group which may have a substituent, represented by Xb, include a methyl group and a group represented by —$CH_2$—$R_{11}$. Ru represents a halogen atom (a fluorine atom or the like), a hydroxyl group, or a monovalent organic group, examples thereof include an alkyl group having 5 or less carbon atoms, which may be substituted with a halogen atom, an acyl group having 5 or less carbon atoms, which may be substituted with a halogen atom, and an alkoxy group having 5 or less carbon atoms, which may be substituted with a halogen atom; and an alkyl group having 3 or less carbon atoms is preferable, and a methyl group is more preferable. The lower limit of the number of carbon atoms is preferably 1 or more. As Xb, a hydrogen atom, a fluorine atom, a methyl group, a trifluoromethyl group, or a hydroxymethyl group is preferable.

Examples of the divalent linking group which may have a substituent of L include an -Rt- group, a —CO— group, a —COO-Rt- group, a —COO-Rt-CO— group, an -Rt-CO— group, and an —O-Rt- group. In the formula, Rt represents an alkylene group, a cycloalkylene group, or an aromatic ring group, and is preferably the aromatic ring group.

As L, the -Rt- group, the —CO— group, the —COO-Rt-CO— group, or the -Rt-CO— group is preferable. Rt may have a substituent such as, for example, a halogen atom, a hydroxyl group, or an alkoxy group. The aromatic group is preferable.

As the alkyl group of each of $Ry_1$ to $Ry_3$, an alkyl group having 1 to 4 carbon atoms, such as a methyl group, an ethyl group, an n-propyl group, an isopropyl group, an n-butyl group, an isobutyl group, and a t-butyl group, is preferable.

As the cycloalkyl group of each of $Ry_1$ to $Ry_3$, a monocyclic cycloalkyl group such as a cyclopentyl group and a cyclohexyl group, or a polycyclic cycloalkyl group such as a norbornyl group, a tetracyclodecanyl group, a tetracyclododecanyl group, and an adamantyl group is preferable.

As the aryl group of each of $Ry_1$ to $Ry_3$, an aryl group having 6 to 10 carbon atoms is preferable, and examples thereof include a phenyl group, a naphthyl group, and an anthryl group.

The resin (A) may have a repeating unit having an acid-decomposable group including an unsaturated bond.

The repeating unit having an acid-decomposable group including an unsaturated bond is preferably a repeating unit represented by General Formula (B).

As the alkenyl group of each of $Ry_1$ to $Ry_3$, a vinyl group is preferable.

As the alkynyl group of each of $Ry_1$ to $Ry_3$, an ethynyl group is preferable.

As the cycloalkenyl group of each of $Ry_1$ to $Ry_3$, a structure including a double bond in a part of a monocyclic cycloalkyl group such as a cyclopentyl group and a cyclohexyl group is preferable.

As the cycloalkyl group formed by the bonding of two of $Ry_1$ to $Ry_3$, a monocyclic cycloalkyl group such as a cyclopentyl group and a cyclohexyl group is preferable, and in addition, a polycyclic cycloalkyl group such as a norbornyl group, a tetracyclodecanyl group, a tetracyclododecanyl group, and an adamantyl group is also preferable. Among those, a monocyclic cycloalkyl group having 5 or 6 carbon atoms is preferable.

In the cycloalkyl group or cycloalkenyl group formed by the bonding of two of $Ry_1$ to $Ry_3$, for example, one of the methylene groups constituting the ring may be substituted with a heteroatom such as an oxygen atom, a group having a heteroatom, such as a carbonyl group, an —$SO_2$— group, and an —$SO_3$— group, or a vinylidene group, or a combination thereof. In addition, in the cycloalkyl group or cycloalkenyl group, one or more of the ethylene groups constituting the cycloalkane ring or the cycloalkene ring may be substituted with a vinylene group.

In the repeating unit represented by General Formula (B), for example, an aspect in which $Ry_1$ is a methyl group, an ethyl group, a vinyl group, an allyl group, or an aryl group, and $Ry_2$ and $Rx_3$ are bonded to each other to form the above-mentioned cycloalkyl group or cycloalkenyl group is preferable.

In a case where each of the groups has a substituent, examples of the substituent include an alkyl group (having 1 to 4 carbon atoms), a halogen atom, a hydroxyl group, an alkoxy group (having 1 to 4 carbon atoms), a carboxyl group, and an alkoxycarbonyl group (having 2 to 6 carbon atoms). The substituent preferably has 8 or less carbon atoms. The lower limit of the number of carbon atoms is preferably 1 or more.

As the repeating unit represented by General Formula (B), an acid-decomposable (meth)acrylic acid tertiary ester-based repeating unit (a repeating unit in which Xb represents a hydrogen atom or a methyl group, and L represents a —CO— group), an acid-decomposable hydroxystyrene tertiary alkyl ether-based repeating unit (a repeating unit in which Xb represents a hydrogen atom or a methyl group and L represents a phenyl group), or an acid-decomposable styrenecarboxylic acid tertiary ester-based repeating unit (a repeating unit in which Xb represents a hydrogen atom or a methyl group, and L represents a -Rt-CO— group (Rt is an aromatic group)) is preferable.

The content of the repeating unit having an acid-decomposable group including an unsaturated bond is preferably 15% by mole or more, more preferably 20% by mole or more, and still more preferably 30% by mole or more with respect to all repeating units in the resin (A). In addition, an upper limit value thereof is preferably 80% by mole or less, more preferably 70% by mole or less, and still more preferably 60% by mole or less.

Specific examples of the repeating unit having an acid-decomposable group including an unsaturated bond are shown below, but the present invention is not limited thereto. Furthermore, in the formula, Xb and $L_1$ each represent any of the substituents or linking groups described above, Ar represents an aromatic group, R represents a hydrogen atom, an alkyl group, a cycloalkyl group, an aryl group, an aralkyl group, an alkenyl group, a hydroxyl group, an alkoxy group, an acyloxy group, a cyano group, a nitro group, an amino group, a halogen atom, an ester group (—OCOR''' or —COOR''': R''' is an alkyl group having 1 to 20 carbon atoms or a fluorinated alkyl group) or a substituent such as a carboxyl group, R' represents a linear or branched alkyl group, a monocyclic or polycyclic cycloalkyl group, an alkenyl group, an alkynyl group, a monocyclic group, or a polycyclic aryl group, Q represents a heteroatom such as an oxygen atom, a group having a heteroatom, such as a carbonyl group, an —$SO_2$— group, and an —$SO_3$— group, a vinylidene group, or a combination thereof, n and m represents an integer of 0 or more.

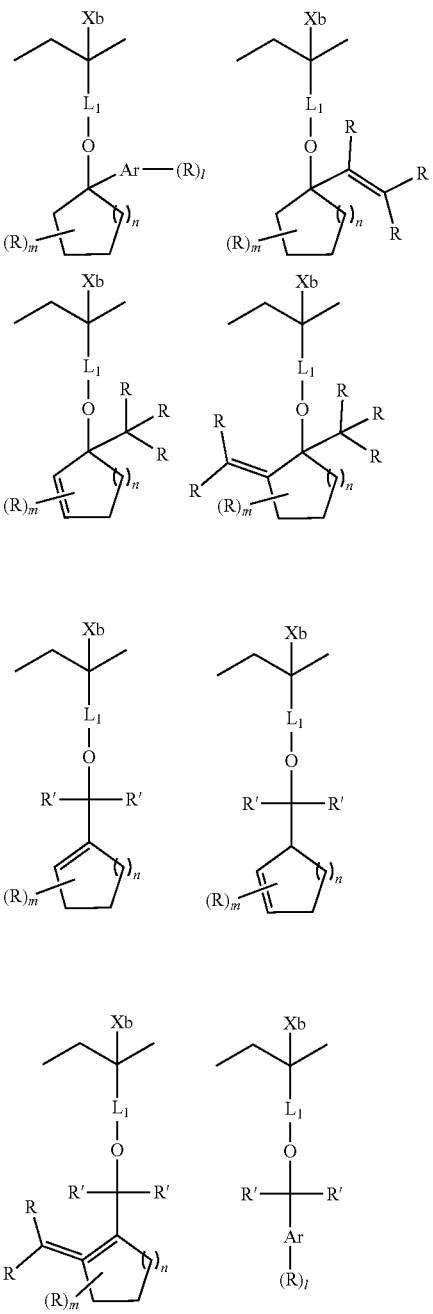

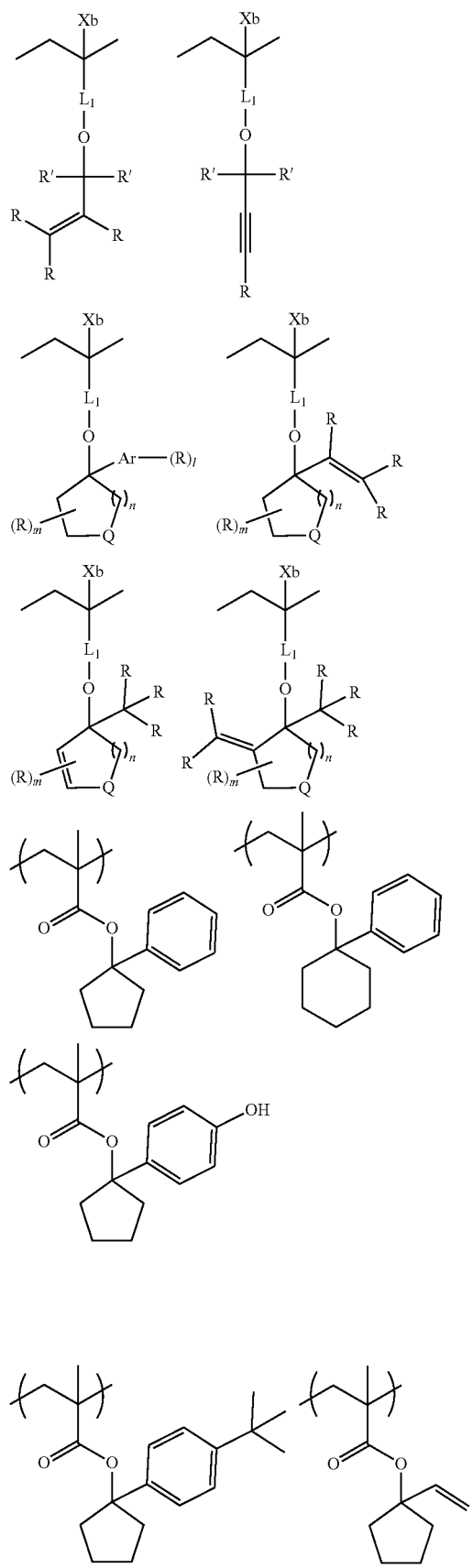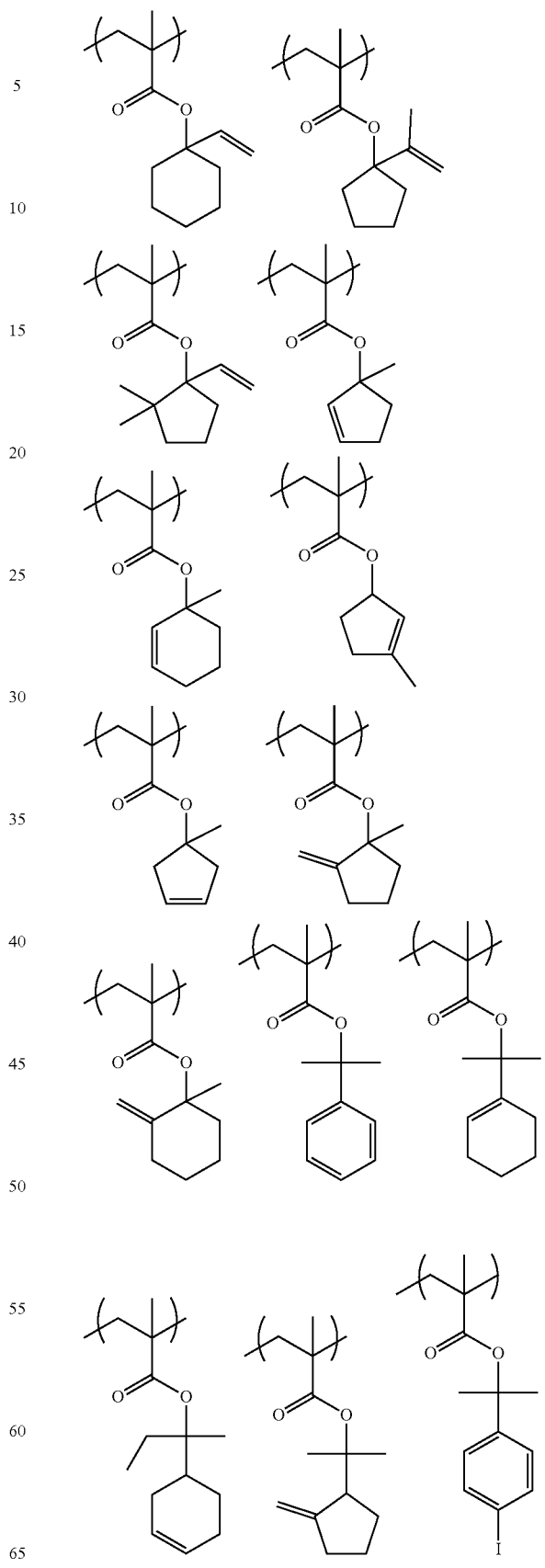

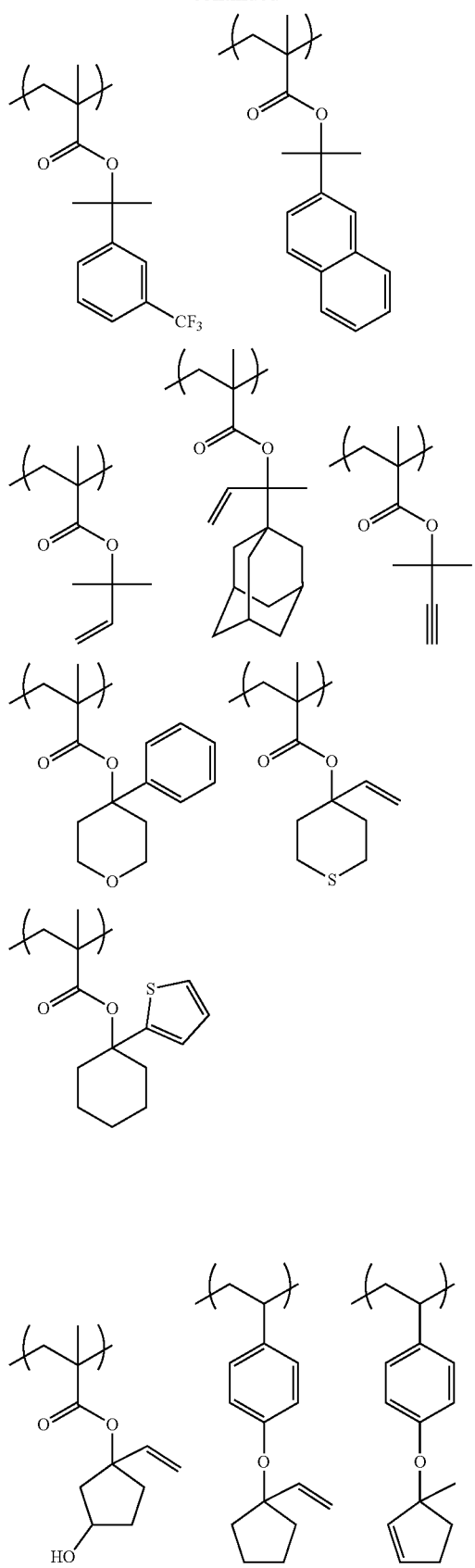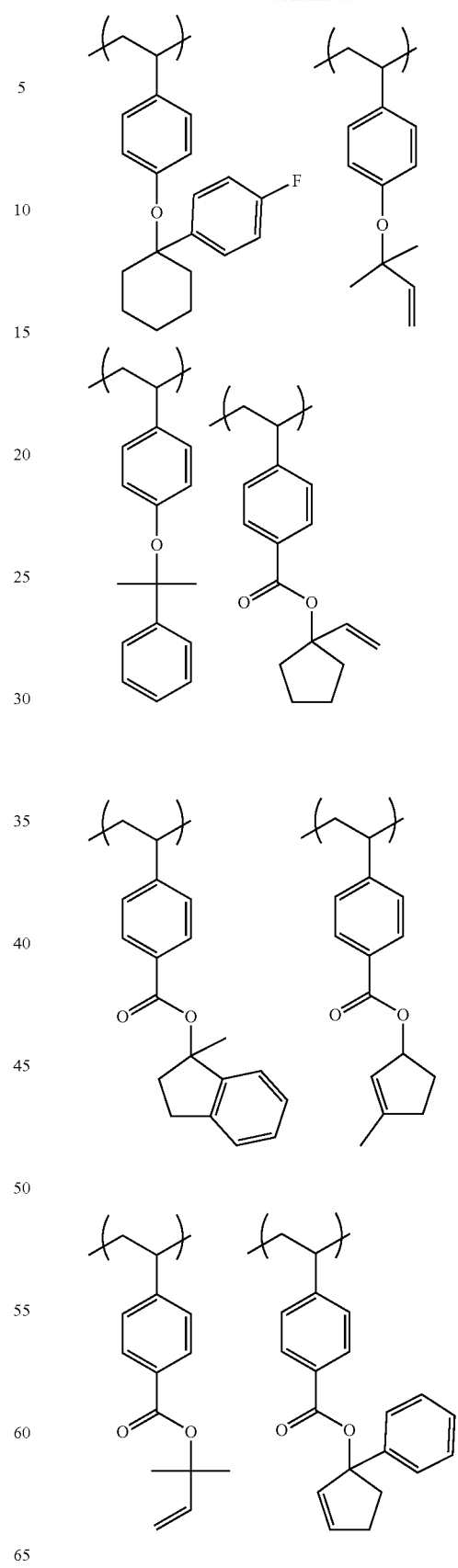

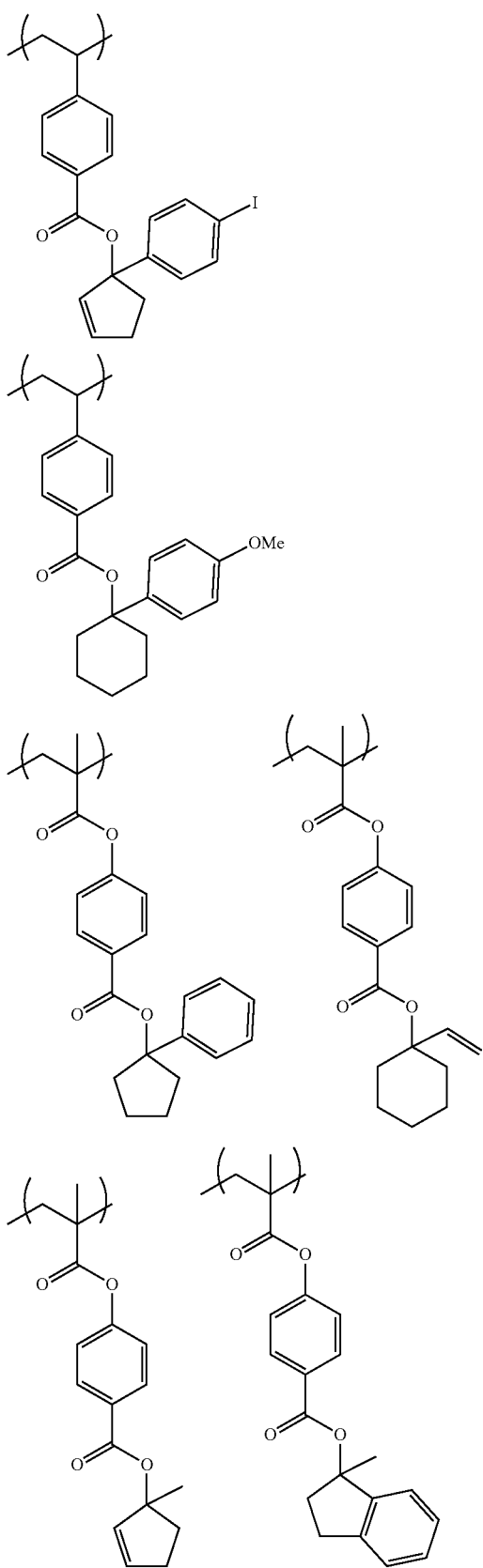
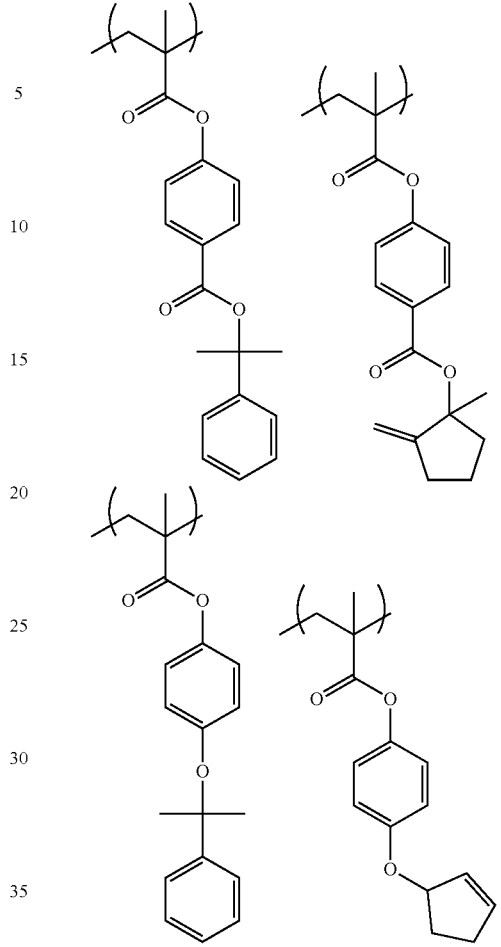

The resin (A) may include a repeating unit other than the above-mentioned repeating units.

For example, the resin (A) may include at least one repeating unit selected from the group consisting of the following group A and/or at least one repeating unit selected from the group consisting of the following group B.

Group A: A Group Consisting of the Following Repeating Units (20) to (29).

(20) A repeating unit having an acid group, which will be described later

(21) A repeating unit having a fluorine atom or an iodine atom, which will be described later

(22) A repeating unit having a lactone group, a sultone group, or a carbonate group, which will be described later

(23) A repeating unit having a photoacid generating group, which will be described later

(24) A repeating Unit represented by General Formula (V-1) or General Formula (V-2), which will be described later

(25) A repeating unit represented by Formula (A), which will be described later

(26) A repeating unit represented by Formula (B), which will be described later

(27) A repeating unit represented by Formula (C), which will be described later

(28) A repeating unit represented by Formula (D), which will be described later

(29) A repeating unit represented by Formula (E), which will be described later

Group B: A Group Consisting of the Following Repeating Units (30) to (32)

(30) A repeating unit having at least one group selected from a lactone group, a sultone group, a carbonate group, a hydroxyl group, a cyano group, or an alkali-soluble group, which will be described later

(31) A repeating unit having an alicyclic hydrocarbon structure and not exhibiting acid decomposability described later

(32) A repeating unit represented by General Formula (III) having neither a hydroxyl group nor a cyano group, which will be described later In a case where the composition of the embodiment of the present invention is used as an actinic ray-sensitive or radiation-sensitive resin composition for EUV, it is preferable that the resin (A) has at least one repeating unit selected from the group consisting of the group A.

Furthermore, in a case where the composition is used as the actinic ray-sensitive or radiation-sensitive resin composition for EUV, it is preferable that the resin (A) includes at least one of a fluorine atom or an iodine atom. In a case where the resin (A) includes both a fluorine atom and an iodine atom, the resin (A) may have one repeating unit including both a fluorine atom and an iodine atom, and the resin (A) may include two kinds of repeating units, that is, a repeating unit having a fluorine atom and a repeating unit having an iodine atom.

In addition, in a case where the composition is used as an actinic ray-sensitive or radiation-sensitive resin composition for EUV, it is also preferable that the resin (A) has a repeating unit having an aromatic group.

In a case where the composition of the embodiment of the present invention is used as an actinic ray-sensitive or radiation-sensitive resin composition for ArF, it is preferable that the resin (A) has at least one repeating unit selected from the group consisting of the group B.

Furthermore, in a case where the composition of the embodiment of the present invention is used as the actinic ray-sensitive or radiation-sensitive resin composition for ArF, it is preferable that the resin (A) includes neither a fluorine atom nor a silicon atom.

In addition, in a case where the composition is used as the actinic ray-sensitive or radiation-sensitive resin composition for ArF, it is preferable that the resin (A) does not have an aromatic group.

(Repeating Unit Having Acid Group)

The resin (A) may have a repeating unit having an acid group.

As the acid group, an acid group having a pKa of 13 or less is preferable. The acid dissociation constant of the acid group is preferably 13 or less, more preferably 3 to 13, and still more preferably 5 to 10, as described above.

As the acid group, for example, a carboxyl group, a phenolic hydroxyl group, a fluorinated alcohol group (preferably a hexafluoroisopropanol group), a sulfonic acid group, a sulfonamide group, or an isopropanol group is preferable.

In a case where the resin (A) has an acid group having a pKa of 13 or less, the content of the acid group in the resin (A) is not particularly limited, but is 0.2 to 6.0 mmol/g in many cases. Among those, the content of the acid group is preferably 0.8 to 6.0 mmol/g, more preferably 1.2 to 5.0 mmol/g, and still more preferably 1.6 to 4.0 mmol/g. In a case where the content of the acid group is within the range, the progress of development is improved, and thus, the shape of a pattern thus formed is excellent and the resolution is also excellent.

In addition, in the hexafluoroisopropanol group, one or more (preferably one or two) fluorine atoms may be substituted with a group (an alkoxycarbonyl group and the like) other than a fluorine atom. —C(CF$_3$)(OH)—CF$_2$— formed as above is also preferable as the acid group. In addition, one or more fluorine atoms may be substituted with a group other than a fluorine atom to form a ring including —C(CF$_3$)(OH)—CF$_2$—.

The repeating unit having an acid group is preferably a repeating unit different from a repeating unit having the structure in which a polar group is protected by the leaving group that leaves by the action of an acid as described above, and a repeating unit having a lactone group, a sultone group, or a carbonate group which will be described later.

A repeating unit having an acid group may have a fluorine atom or an iodine atom.

As the repeating unit having an acid group, a repeating unit represented by Formula (B) is preferable.

(B)

R$_3$ represents a hydrogen atom or a monovalent organic group which may have a fluorine atom or an iodine atom.

The monovalent organic group which may have a fluorine atom or an iodine atom is preferably a group represented by -L$_4$-R$_8$. L$_4$ represents a single bond or an ester group. R$_8$ represents an alkyl group which may have a fluorine atom or an iodine atom, a cycloalkyl group which may have a fluorine atom or an iodine atom, an aryl group which may have a fluorine atom or an iodine atom, or a group formed by combination thereof.

R$_4$ and R$_5$ each independently represent a hydrogen atom, a fluorine atom, an iodine atom, or an alkyl group which may have a fluorine atom or an iodine atom.

L$_2$ represents a single bond or an ester group.

L$_3$ represents an (n+m+1)-valent aromatic hydrocarbon ring group or an (n+m+1)-valent alicyclic hydrocarbon ring group. Examples of the aromatic hydrocarbon ring group include a benzene ring group and a naphthalene ring group. The alicyclic hydrocarbon ring group may be either a monocycle or a polycycle, and examples thereof include a cycloalkyl ring group.

R$_6$ represents a hydroxyl group or a fluorinated alcohol group (preferably a hexafluoroisopropanol group). Furthermore, in a case where R$_6$ is a hydroxyl group, L$_3$ is preferably the (n+m+1)-valent aromatic hydrocarbon ring group.

R$_7$ represents a halogen atom. Examples of the halogen atom include a fluorine atom, a chlorine atom, a bromine atom, or an iodine atom.

m represents an integer of 1 or more. m is preferably an integer of 1 to 3 and more preferably an integer of 1 or 2.

n represents 0 or an integer of 1 or more. n is preferably an integer of 1 to 4.

Furthermore, (n+m+1) is preferably an integer of 2 to 5.

Examples of the repeating unit having an acid group include the following repeating units.

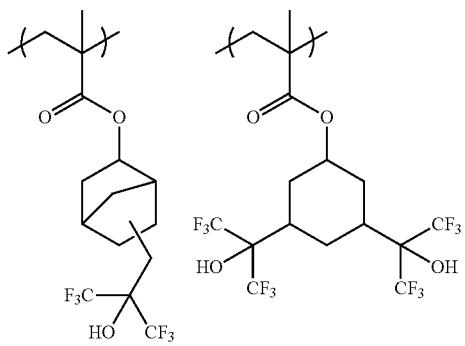
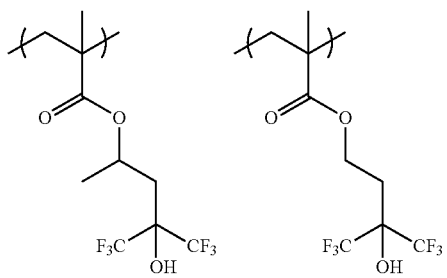
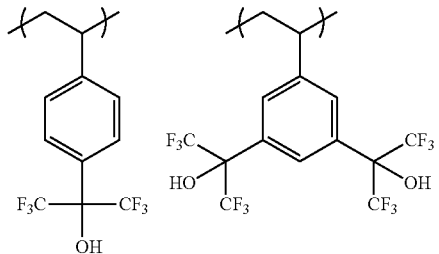
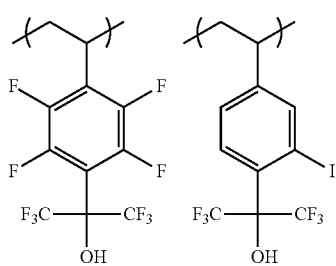
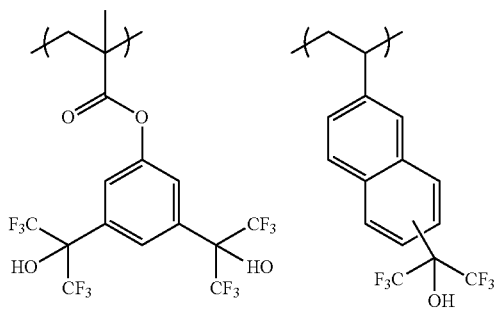

As the repeating unit having an acid group, a repeating unit represented by General Formula (I) is also preferable.

In General Formula (I), $R_{41}$, $R_{42}$, and $R_{43}$ each independently represent a hydrogen atom, an alkyl group, a cycloalkyl group, a halogen atom, a cyano group, or an alkoxycarbonyl group. It should be noted that $R_{42}$ may be bonded to $Ar_4$ to form a ring, in which case $R_{42}$ represents a single bond or an alkylene group.

$X_4$ represents a single bond, —COO—, or —CONR$_{64}$—, and $R_{64}$ represents a hydrogen atom or an alkyl group.

$L_4$ represents a single bond or an alkylene group.

$Ar_4$ represents an (n+1)-valent aromatic ring group, and in a case where $Ar_4$ is bonded to $R_{42}$ to form a ring, $Ar_4$ represents an (n+2)-valent aromatic ring group.

n represents an integer of 1 to 5.

As the alkyl group represented by each of $R_{41}$, $R_{42}$, and $R_{43}$ in General Formula (I), an alkyl group having 20 or less carbon atoms, such as a methyl group, an ethyl group, a propyl group, an isopropyl group, an n-butyl group, a sec-butyl group, a hexyl group, a 2-ethylhexyl group, an octyl group, and a dodecyl group is preferable, an alkyl group having 8 or less carbon atoms is more preferable, and an alkyl group having 3 or less carbon atoms is still more preferable. The lower limit of the number of carbon atoms is preferably 1 or more.

The cycloalkyl group of each of $R_{41}$, $R_{42}$, and $R_{43}$ in General Formula (I) may be a monocycle or a polycycle. Among those, a cycloalkyl group having 3 to 8 carbon atoms, such as a cyclopropyl group, a cyclopentyl group, and a monocyclic cyclohexyl group, is preferable.

Examples of the halogen atom of each of $R_{41}$, $R_{42}$, and $R_{43}$ in General Formula (I) include a fluorine atom, a chlorine atom, a bromine atom, and an iodine atom, and the fluorine atom is preferable.

As the alkyl group included in the alkoxycarbonyl group of each of $R_{41}$, $R_{42}$, and $R_{43}$ in General Formula (I), the same ones as the alkyl group in each of $R_{41}$, $R_{42}$, and $R_{43}$ are preferable.

Preferred examples of the substituent in each of the groups include an alkyl group, a cycloalkyl group, an aryl group, an amino group, an amide group, a ureide group, a urethane group, a hydroxyl group, a carboxyl group, a halogen atom, an alkoxy group, a thioether group, an acyl group, an acyloxy group, an alkoxycarbonyl group, a cyano group, and a nitro group. The substituent preferably has 8 or less carbon atoms. The lower limit of the number of carbon atoms is preferably 1 or more.

$Ar_4$ represents an (n+1)-valent aromatic ring group. The divalent aromatic ring group in a case where n is 1 is preferably, for example, an arylene group having 6 to 18 carbon atoms, such as a phenylene group, a tolylene group, a naphthylene group, and an anthracenylene group, or a divalent aromatic ring group including a heterocyclic ring such as a thiophene ring, a furan ring, a pyrrole ring, a benzothiophene ring, a benzofuran ring, a benzopyrrole ring, a triazine ring, an imidazole ring, a benzimidazole ring, a triazole ring, a thiadiazole ring, and a thiazole ring. Furthermore, the aromatic ring group may have a substituent.

Specific examples of the (n+1)-valent aromatic ring group in a case where n is an integer of 2 or more include groups formed by removing any (n−1) hydrogen atoms from the above-described specific examples of the divalent aromatic ring group.

The (n+1)-valent aromatic ring group may further have a substituent.

Examples of the substituent which can be contained in the alkyl group, the cycloalkyl group, the alkoxycarbonyl group, the alkylene group, and the (n+1)-valent aromatic ring group, each mentioned above, include the alkyl groups; the alkoxy groups such as a methoxy group, an ethoxy group, a hydroxyethoxy group, a propoxy group, a hydroxypropoxy group, and a butoxy group; the aryl groups such as a phenyl group; and the like, as mentioned for each of $R_{41}$, $R_{42}$, and $R_{43}$ in General Formula (I).

Examples of the alkyl group of $R_{64}$ in —$CONR_{64}$— represented by $X_4$ ($R_{64}$ represents a hydrogen atom or an alkyl group) include an alkyl group having 20 or less carbon atoms, such as a methyl group, an ethyl group, a propyl group, an isopropyl group, an n-butyl group, a sec-butyl group, a hexyl group, a 2-ethylhexyl group, an octyl group, and a dodecyl group, and an alkyl group having 8 or less carbon atoms, is preferable. The lower limit of the number of carbon atoms is preferably 1 or more.

As $X_4$, a single bond, —COO—, or —CONH— is preferable, and the single bond or —COO— is more preferable.

As the alkylene group in $L_4$, an alkylene group having 1 to 8 carbon atoms, such as a methylene group, an ethylene group, a propylene group, a butylene group, a hexylene group, and an octylene group, is preferable.

As $Ar_4$, an aromatic ring group having 6 to 18 carbon atoms is preferable, and a benzene ring group, a naphthalene ring group, or a biphenylene ring group is more preferable.

The repeating unit represented by General Formula (I) preferably comprises a hydroxystyrene structure. That is, $Ar_4$ is preferably the benzene ring group.

The repeating unit represented by General Formula (I) is preferably a repeating unit represented by General Formula (1).

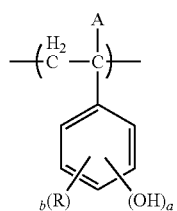

(1)

In General Formula (1),

A represents a hydrogen atom, an alkyl group, a cycloalkyl group, a halogen atom, or a cyano group.

R represents a halogen atom, an alkyl group, a cycloalkyl group, an aryl group, an alkenyl group, an aralkyl group, an alkoxy group, an alkylcarbonyloxy group, an alkylsulfonyloxy group, an alkyloxycarbonyl group, or an aryloxycarbonyl group, and in a case where a plurality of R's are present, R's may be the same as or different from each other.

In a case where there are a plurality of R's, R's may form a ring in combination with each other. As R, the hydrogen atom is preferable.

a represents an integer of 1 to 3.

b represents an integer of 0 to (5-a).

The repeating unit having an acid group is exemplified below. In the formulae, a represents 1 or 2.

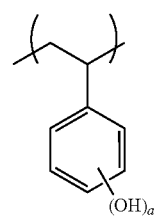

(B-1)

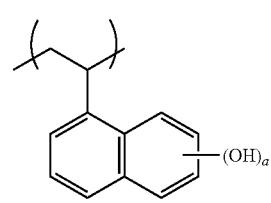

(B-2)

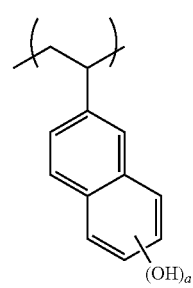

(B-3)

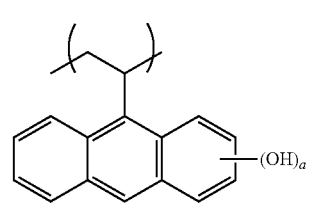

(B-4)

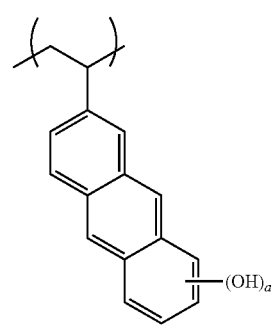

(B-5)

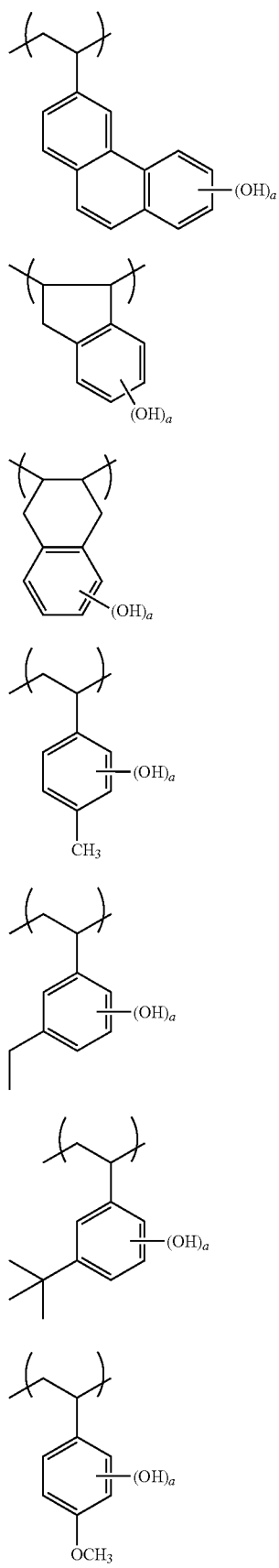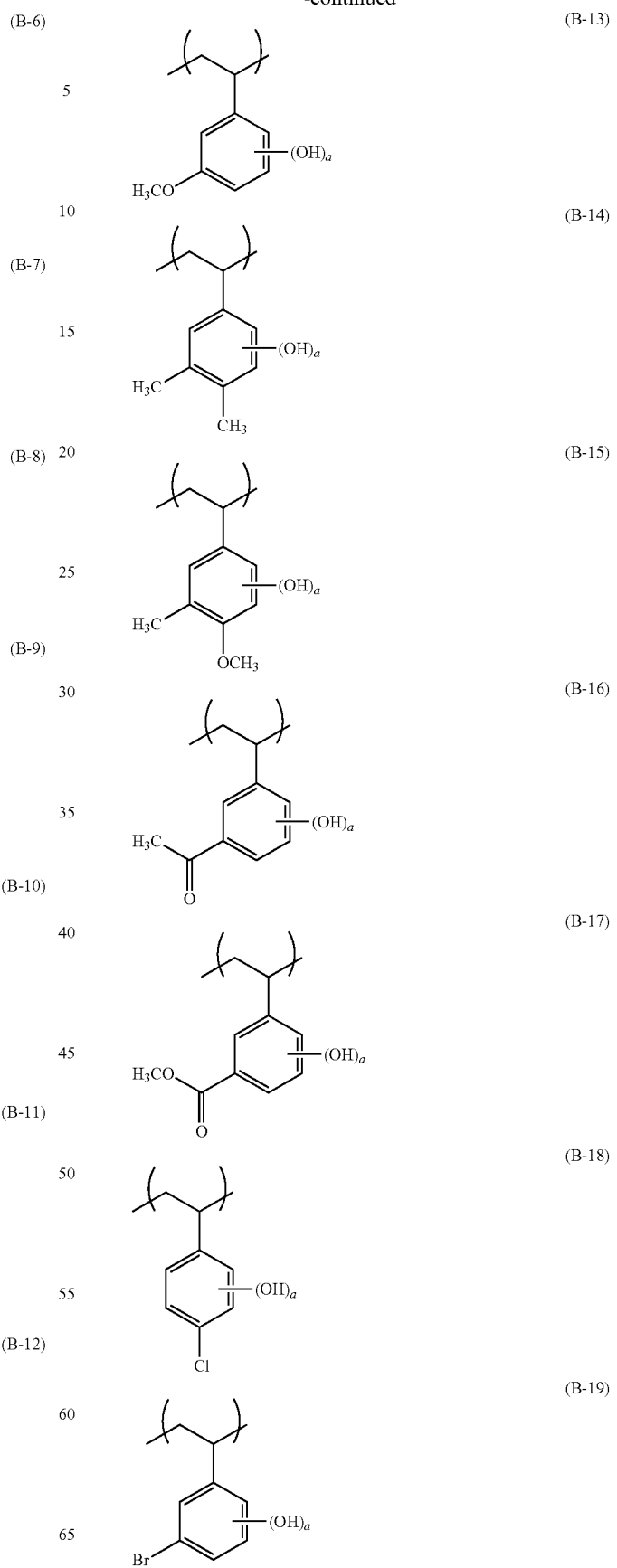

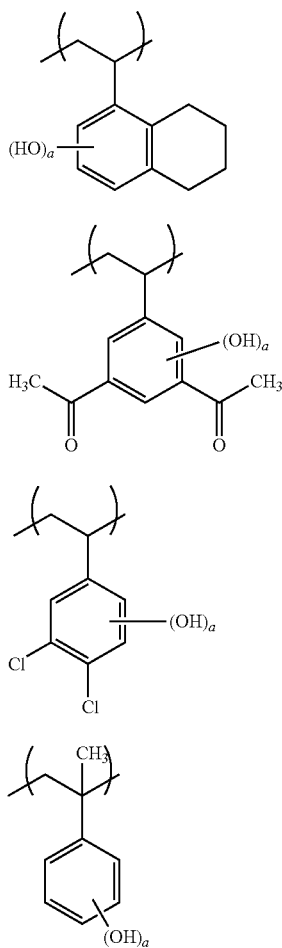
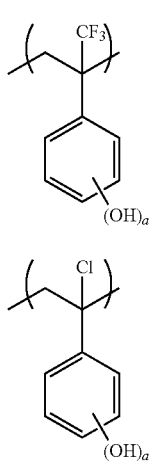
⟨?⟩ indicates text missing or illegible when filed
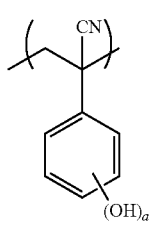
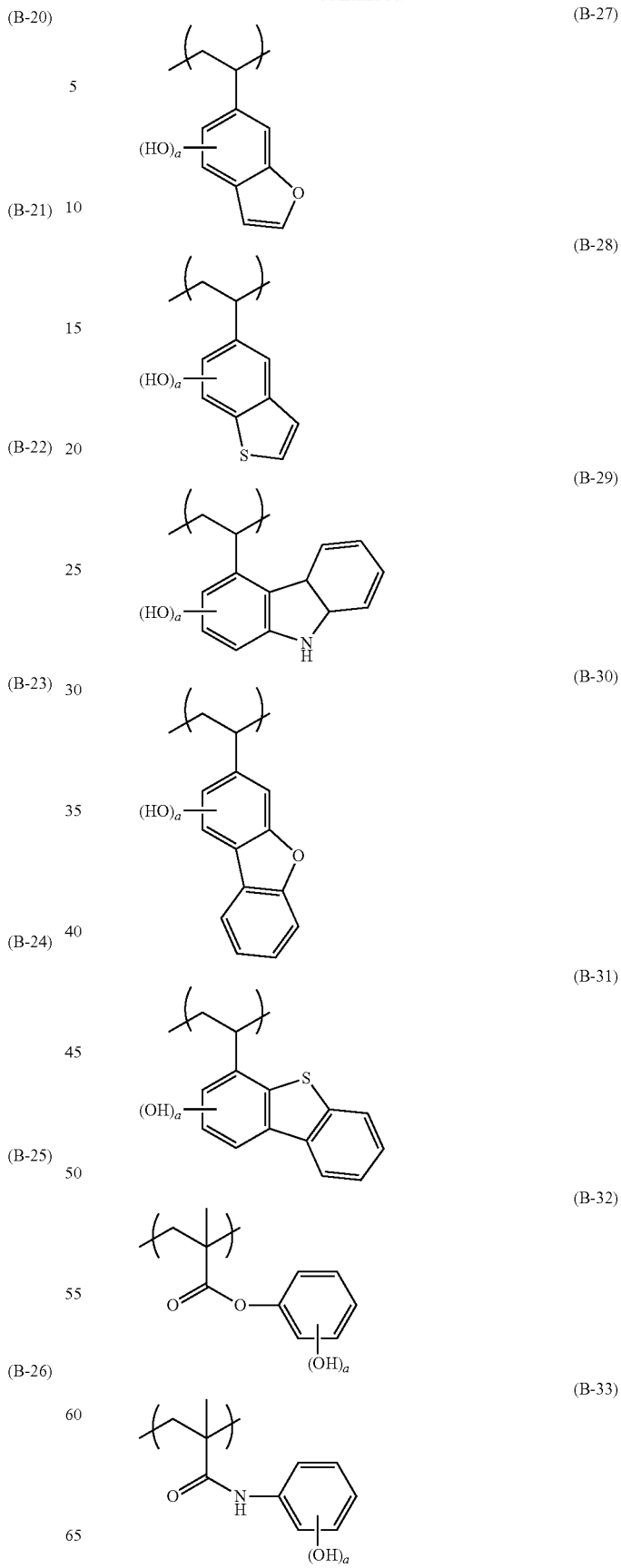

-continued
(B-34) 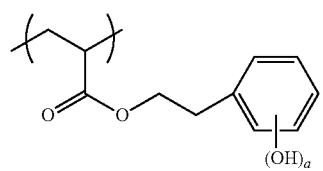
(B-35) 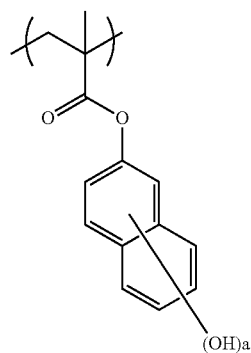
(B-36) 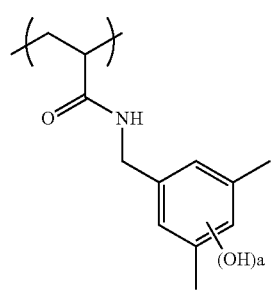
(B-37) 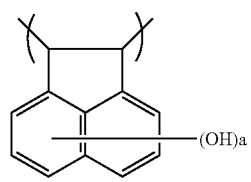
(B-38) 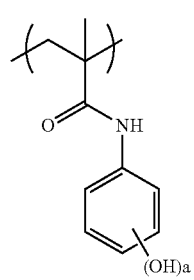
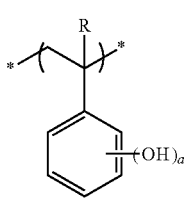
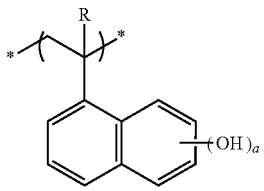
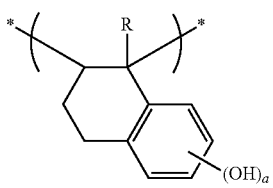
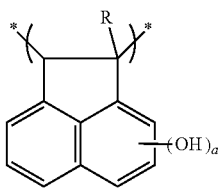
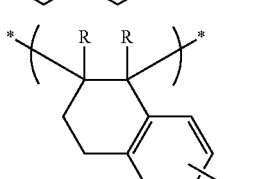
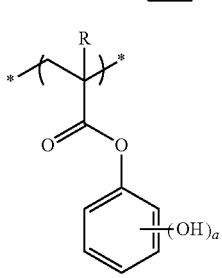
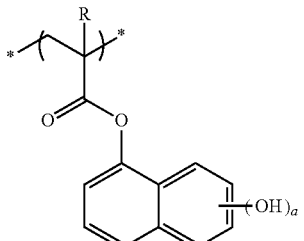
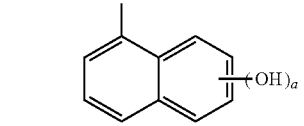
Moreover, among the repeating units, the repeating units specifically described below are preferable. In the formula, R represents a hydrogen atom or a methyl group, and a represents 2 or 3.

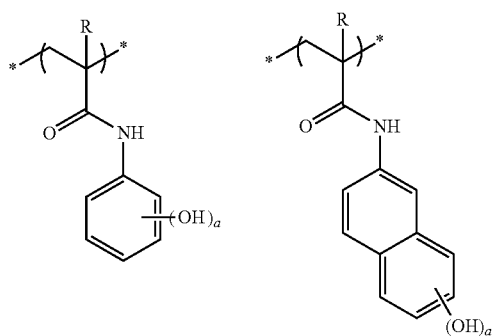
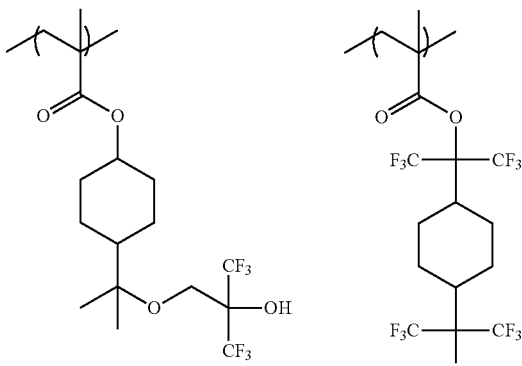
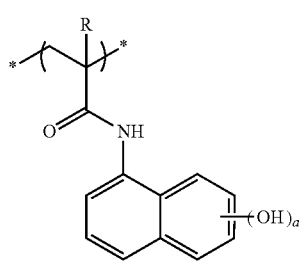
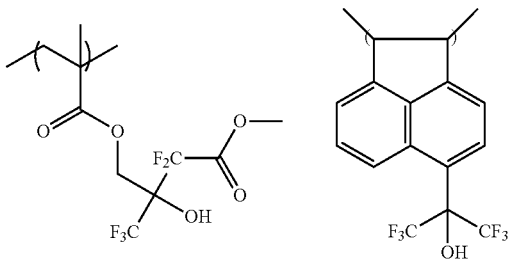
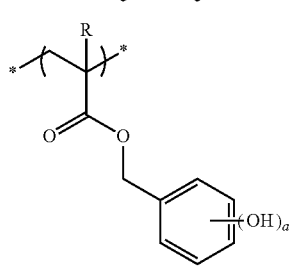
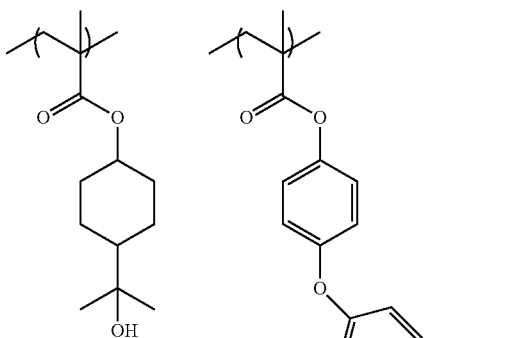
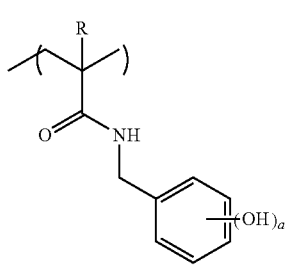
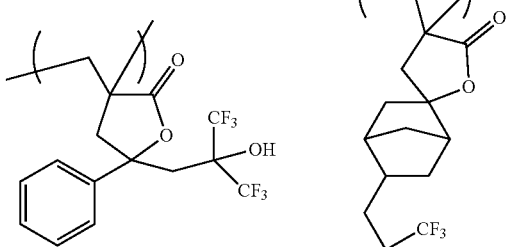
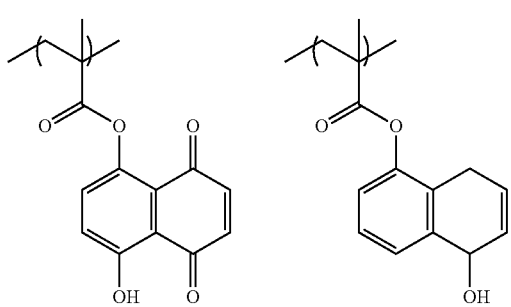
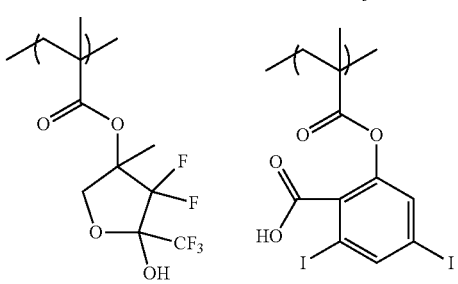

-continued

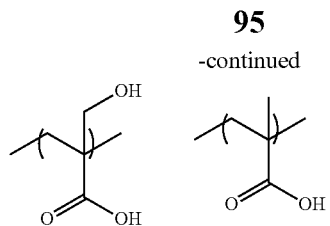

The content of the repeating unit having an acid group is preferably 10% to 70% by mole, more preferably 10% to 60% by mole, and still more preferably 10% to 50% by mole with respect to all repeating units in the resin (A).

(Repeating Unit Having Fluorine Atom or Iodine Atom)

The resin (A) may have a repeating unit having a fluorine atom or an iodine atom in addition to <Repeating Unit Having Acid-Decomposable Group> and <Repeating Unit Having Acid Group> mentioned above. In addition, <Repeating Unit Having Fluorine Atom or Iodine Atom> mentioned herein is preferably different from other kinds of repeating units belonging to the group A, such as <Repeating Unit Having Lactone Group, Sultone Group, or Carbonate Group> and <Repeating Unit Having Photoacid Generating Group>, which will be described later.

As the repeating unit having a fluorine atom or an iodine atom, a repeating unit represented by Formula (C) is preferable.

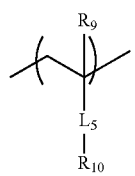

(C)

$L_5$ represents a single bond or an ester group.

$R_9$ represents a hydrogen atom, or an alkyl group which may have a fluorine atom or an iodine atom.

$R_{10}$ represents a hydrogen atom, an alkyl group which may have a fluorine atom or an iodine atom, a cycloalkyl group which may have a fluorine atom or an iodine atom, an aryl group which may have a fluorine atom or an iodine atom, or a group formed by combination thereof.

The repeating unit having a fluorine atom or an iodine atom will be exemplified below.

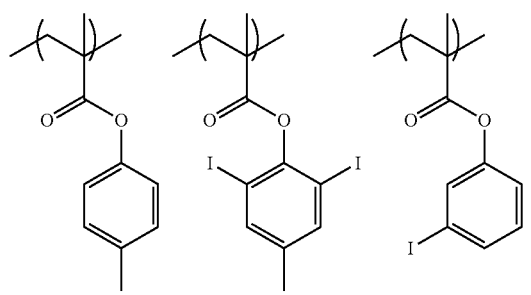

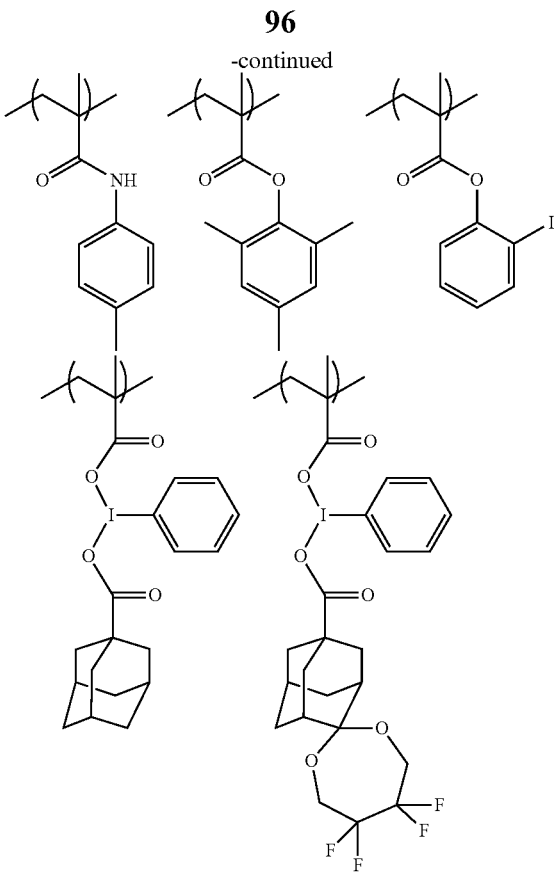

The content of the repeating unit having a fluorine atom or an iodine atom is preferably 0% to 60% by mole, more preferably 5% to 60% by mole, and still more preferably 10% to 60% by mole with respect to all repeating units in the resin (A).

Furthermore, since the repeating unit having a fluorine atom or an iodine atom does not include <Repeating Unit Having Acid-Decomposable Group> and <Repeating Unit Having Acid Group> as described above, the content of the repeating unit having a fluorine atom or an iodine atom is also intended to be the content of the repeating unit having a fluorine atom or an iodine atom excluding <Repeating Unit Having Acid-Decomposable Group> and <Repeating Unit Having Acid Group>.

Among the repeating units of the resin (A), the total content of the repeating units including at least one of a fluorine atom or an iodine atom is preferably 1% to 100% by mole, more preferably 5% to 80% by mole, and still more preferably 10% to 60% by mole with respect to all repeating units of the resin (A).

In addition, examples of the repeating unit including at least one of a fluorine atom or an iodine atom include a repeating unit which has a fluorine atom or an iodine atom, and has an acid-decomposable group, a repeating unit which has a fluorine atom or an iodine atom, and has an acid group, and a repeating unit having a fluorine atom or an iodine atom.

(Repeating Unit Having Lactone Group, Sultone Group, or Carbonate Group)

The resin (A) may have a repeating unit having at least one selected from the group consisting of a lactone group, a sultone group, and a carbonate group (hereinafter also collectively referred to as a "repeating unit having a lactone group, a sultone group, or a carbonate group").

It is also preferable that the repeating unit having a lactone group, a sultone group, or a carbonate group has no acid group such as a hexafluoropropanol group.

The lactone group or the sultone group may have a lactone structure or a sultone structure. The lactone structure or the sultone structure is preferably a 5- to 7-membered ring lactone structure or a 5- to 7-membered ring sultone structure. Among those, the structure is more preferably a 5- to 7-membered ring lactone structure with which another ring structure is fused so as to form a bicyclo structure or a spiro structure, or a 5- to 7-membered ring sultone structure with which another ring structure is fused so as to form a bicyclo structure or a spiro structure.

The resin (A) preferably has a repeating unit having a lactone group or a sultone group, formed by extracting one or more hydrogen atoms from a ring member atom of a lactone structure represented by any of General Formulae (LC1-1) to (LC1-21) or a sultone structure represented by any of General Formulae (SL1-1) to (SL1-3).

In addition, the lactone group or the sultone group may be bonded directly to the main chain. For example, a ring member atom of the lactone group or the sultone group may constitute the main chain of the resin (A).

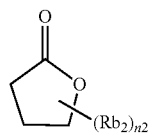

LC1-1

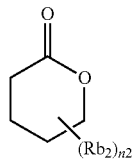

LC1-2

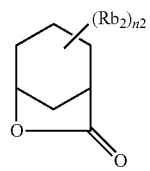

LC1-3

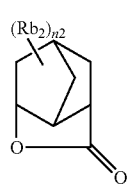

LC1-4

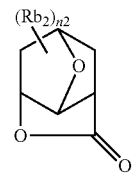

LC1-5

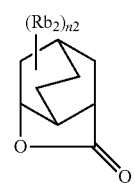

LC1-6

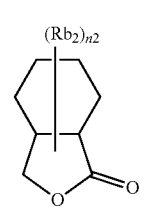

LC1-7

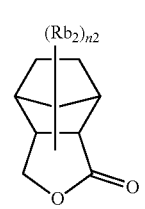

LC1-8

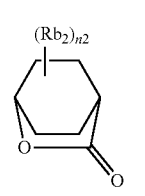

LC1-9

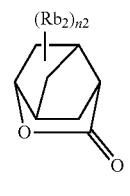

LC1-10

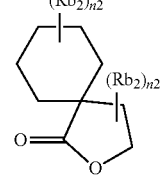

LC1-11

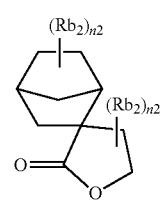

LC1-12

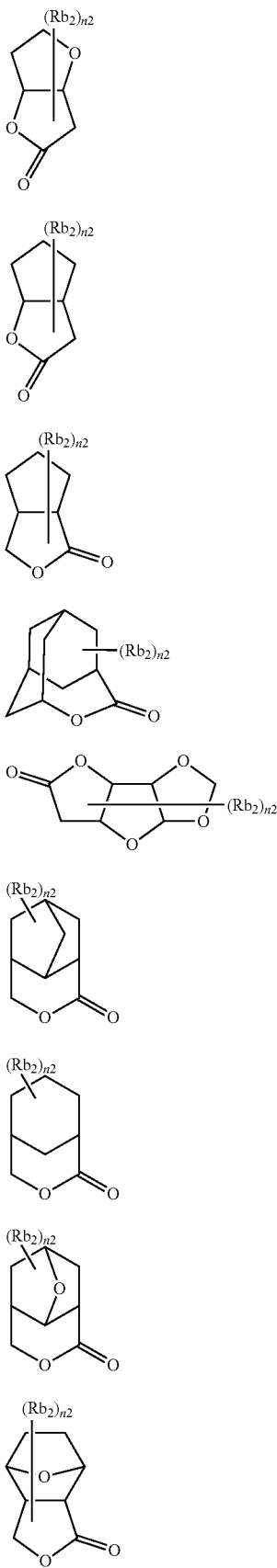

LC1-13
LC1-14
LC1-15
LC1-16
LC1-17
LC1-18
LC1-19
LC1-20
LC1-21

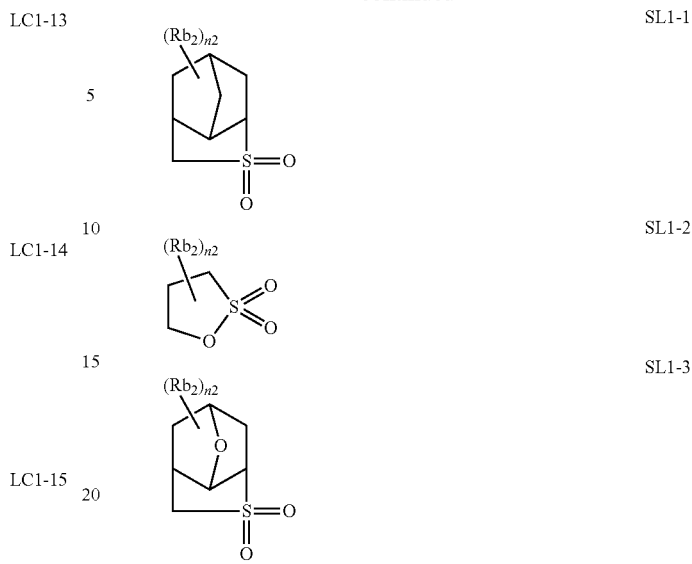

SL1-1
SL1-2
SL1-3

The moiety of the lactone structure or the sultone structure may have a substituent ($Rb_2$). Preferred examples of the substituent ($Rb_2$) include an alkyl group having 1 to 8 carbon atoms, a cycloalkyl group having 4 to 7 carbon atoms, an alkoxy group having 1 to 8 carbon atoms, an alkoxycarbonyl group having 1 to 8 carbon atoms, a carboxyl group, a halogen atom, a hydroxyl group, a cyano group, and an acid-decomposable group. n2 represents an integer of 0 to 4. In a case where n2 is 2 or more, $Rb_2$'s which are present in a plural number may be different from each other, and $Rb_2$'s which are present in a plural number may be bonded to each other to form a ring.

Examples of the repeating unit having a group having the lactone structure represented by any of General Formulae (LC1-1) to (LC1-21) or the sultone structure represented by any of General Formulae (SL1-1) to (SL1-3) include a repeating unit represented by General Formula (AI).

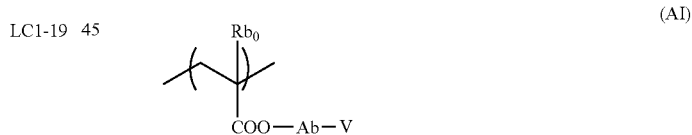

(AI)

In General Formula (AI), $Rb_0$ represents a hydrogen atom, a halogen atom, or an alkyl group having 1 to 4 carbon atoms.

Preferred examples of the substituent which may be contained in the alkyl group of $Rb_0$ include a hydroxyl group and a halogen atom.

Examples of the halogen atom of $Rb_0$ include a fluorine atom, a chlorine atom, a bromine atom, and an iodine atom. $Rb_0$ is preferably the hydrogen atom or a methyl group.

Ab represents a single bond, an alkylene group, a divalent linking group having a monocyclic or polycyclic alicyclic hydrocarbon structure, an ether group, an ester group, a carbonyl group, a carboxyl group, or a divalent group formed by combination thereof. Among those, the single bond or a linking group represented by -$Ab_1$-$CO_2$— is preferable. $Ab_1$ is a linear or branched alkylene group, or a monocyclic or polycyclic cycloalkylene group, and is preferably a methylene group, an ethylene group, a cyclohexylene group, an adamantylene group, or a norbornylene group.

V represents a group formed by extracting one hydrogen atom from a ring member atom of the lactone structure represented by any of General Formulae (LC1-1) to (LC1-21) or a group formed by extracting one hydrogen atom from a ring member atom of the sultone structure represented by any of General Formulae (SL1-1) to (SL1-3).

In a case where an optical isomer is present in the repeating unit having a lactone group or a sultone group, any of the optical isomers may be used. In addition, one kind of optical isomers may be used alone or a plurality of kinds of optical isomers may be mixed and used. In a case where one kind of optical isomers is mainly used, an optical purity (ee) thereof is preferably 90 or more, and more preferably 95 or more. The upper limit is preferably 100 or less.

As the carbonate group, a cyclic carbonic acid ester group is preferable.

As the repeating unit having a cyclic carbonic acid ester group, a repeating unit represented by General Formula (A-1) is preferable.

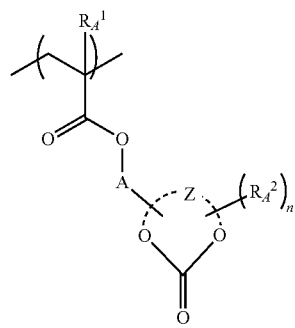

(A-1)

In General Formula (A-1), $R_A^1$ represents a hydrogen atom, a halogen atom, or a monovalent organic group (preferably a methyl group).

n represents an integer of 0 or more.

$R_A^2$ represents a substituent. In a case where n is 2 or more, $R_A^2$ which are present in a plural number may be the same as or different from each other.

A represents a single bond or a divalent linking group. As the divalent linking group, an alkylene group, a divalent linking group having a monocyclic or polycyclic alicyclic hydrocarbon structure, an ether group, an ester group, a carbonyl group, a carboxyl group, or a divalent group formed by combination thereof is preferable.

Z represents an atomic group that forms a monocycle or polycycle with a group represented by —O—CO—O— in the formula.

The repeating unit having a lactone group, a sultone group, or a carbonate group will be exemplified below.

(In Formula, Rx represents H, $CH_3$, $CH_2OH$, or $CF_3$)

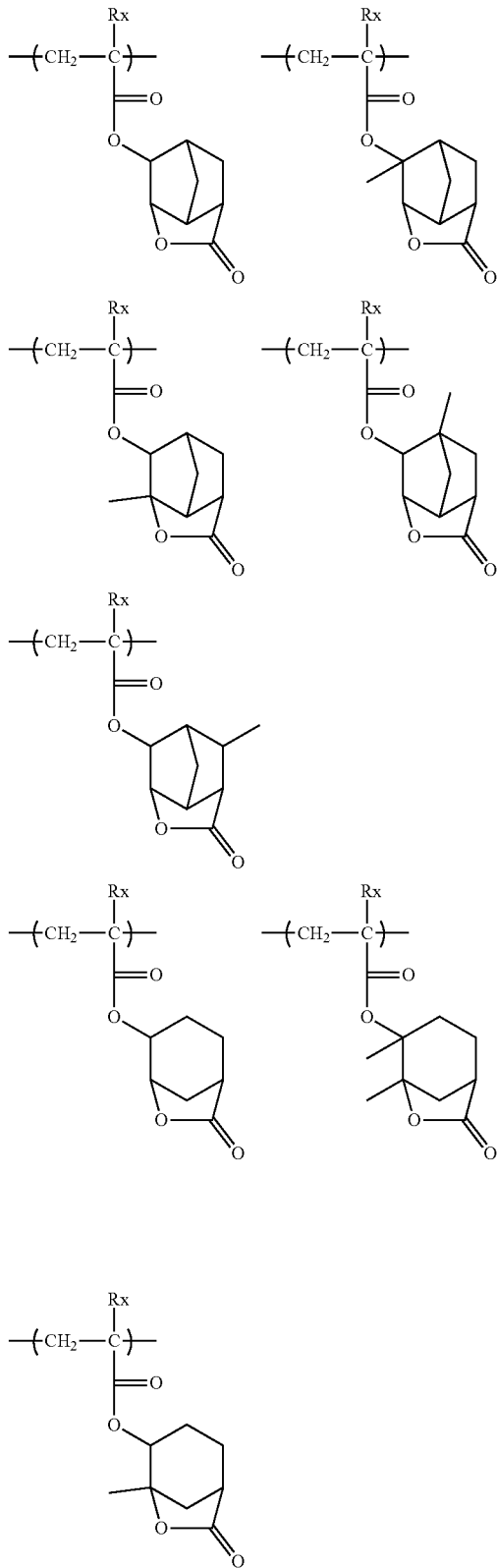

-continued
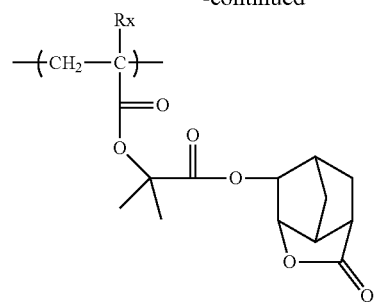
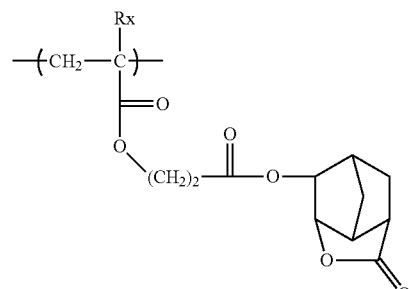
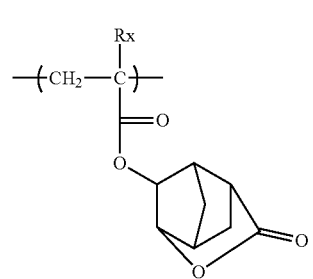
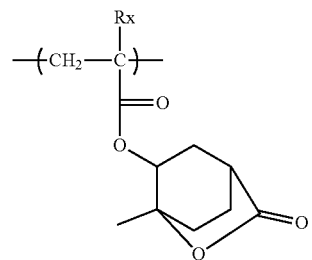
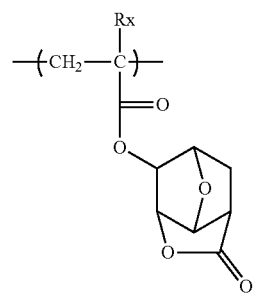
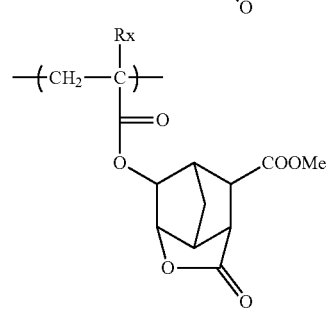
-continued
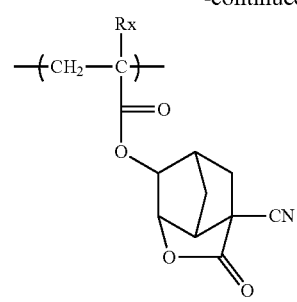
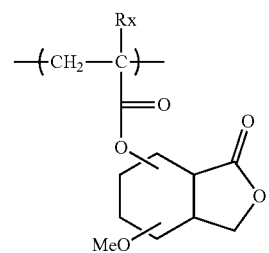
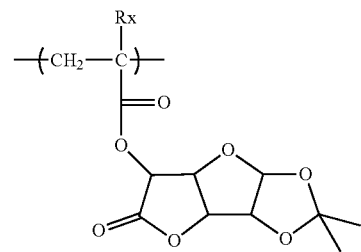
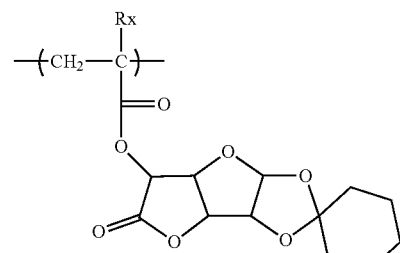
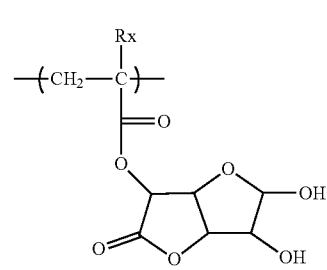
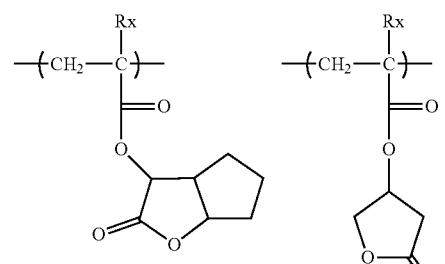

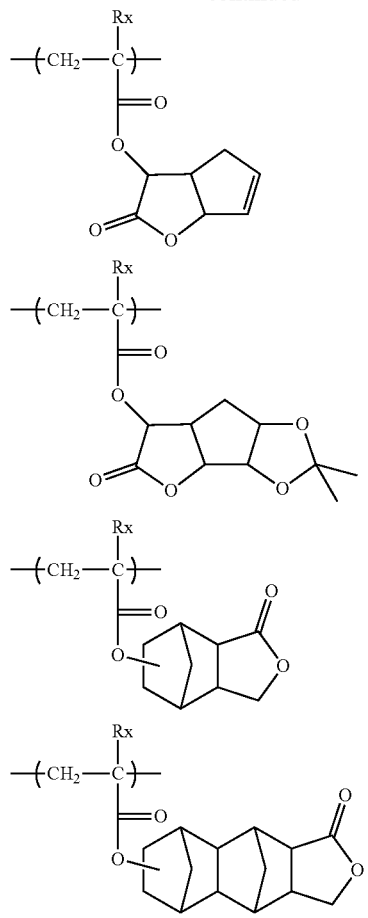
(In Formula, Rx represents H, CH₃, CH₂OH, or CF₃)
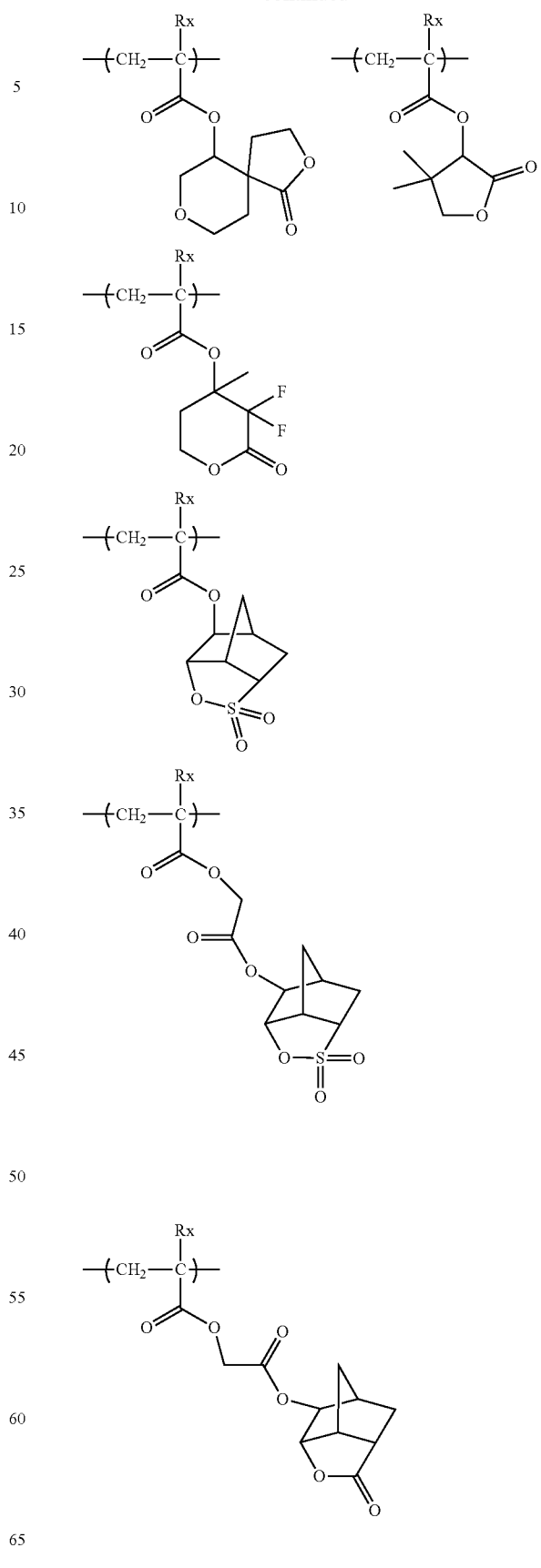

-continued

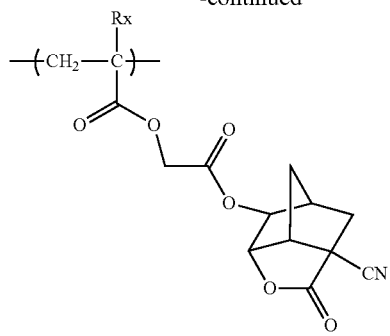

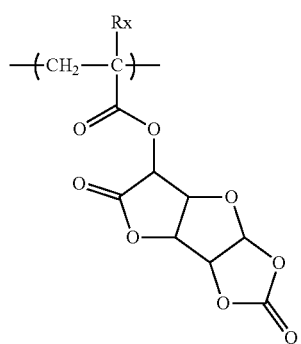

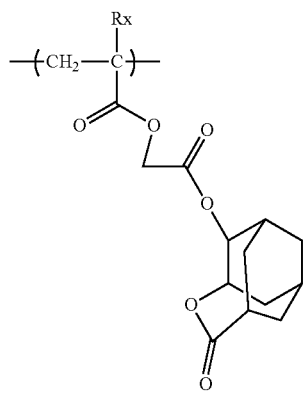

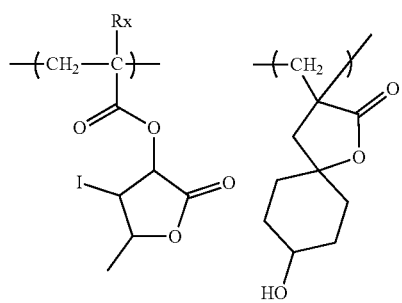

(In Formula, Rx represents H, CH$_3$, CH$_2$OH, or CF$_3$)

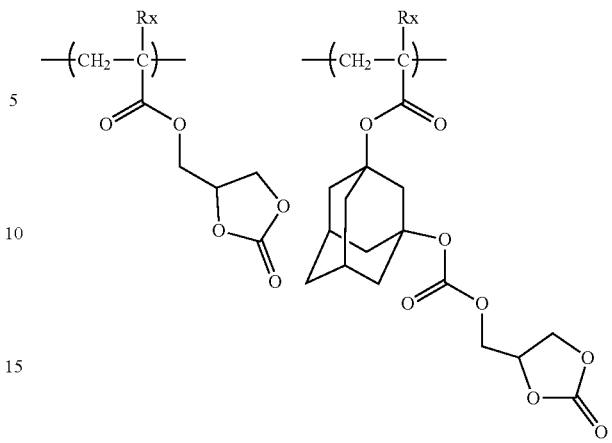

The content of the repeating unit having a lactone group, a sultone group, or a carbonate group is preferably 1% to 70% by mole, more preferably 5% to 65% by mole, and still more preferably 5% to 60% by mole with respect to all repeating units in the resin (A).

(Repeating Unit Having Photoacid Generating Group)

The resin (A) may have, as a repeating unit other than those above, a repeating unit having a group that generates an acid upon irradiation with actinic rays or radiation (hereinafter also referred to as a "photoacid generating group").

In this case, it can be considered that the repeating unit having a photoacid generating group corresponds to a compound that generates an acid upon irradiation with actinic rays or radiation which will be described later (hereinafter also referred to as a "photoacid generator").

Examples of such the repeating unit include a repeating unit represented by General Formula (4).

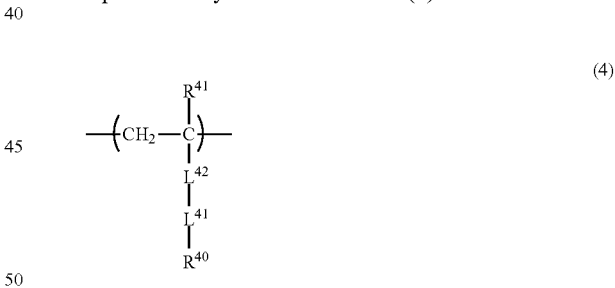

(4)

$R^{41}$ represents a hydrogen atom or a methyl group. $L^{41}$ represents a single bond or a divalent linking group. $L^{42}$ represents a divalent linking group. $R^{40}$ represents a structural moiety that decomposes upon irradiation with actinic rays or radiation to generate an acid in a side chain.

Examples of the repeating unit represented by General Formula (4) include the repeating units described in paragraphs [0094] to [0105] of JP2014-041327A and the repeating units described in paragraph [0094] of WO2018/193954A.

The content of the repeating unit having a photoacid generating group is preferably 1% to 40% by mole, more preferably 5% to 35% by mole, and still more preferably 5% to 30% by mole with respect to all repeating units in the resin (A).

(Repeating Unit Represented by General Formula (V-1) or (V-2))

The resin (A) may have a repeating unit represented by General Formula (V-1) or General Formula (V-2).

The repeating unit represented by General Formula (V-1) and General Formula (V-2) is preferably a repeating unit different from the above-mentioned repeating units.

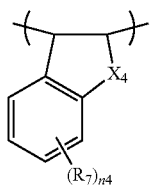
(V-1)

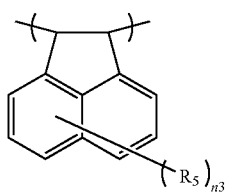
(V-2)

In the formulae, $R_6$ and $R_7$ each independently represent a hydrogen atom, a hydroxyl group, an alkyl group, an alkoxy group, an acyloxy group, a cyano group, a nitro group, an amino group, a halogen atom, an ester group (—OCOR or —COOR:R is an alkyl group or fluorinated alkyl group having 1 to 6 carbon atoms), or a carboxyl group. As the alkyl group, a linear, branched, or cyclic alkyl group having 1 to 10 carbon atoms is preferable.

n3 represents an integer of 0 to 6.
n4 represents an integer of 0 to 4.

$X_4$ is a methylene group, an oxygen atom, or a sulfur atom.

The repeating unit represented by General Formula (V-1) or (V-2) will be exemplified below.

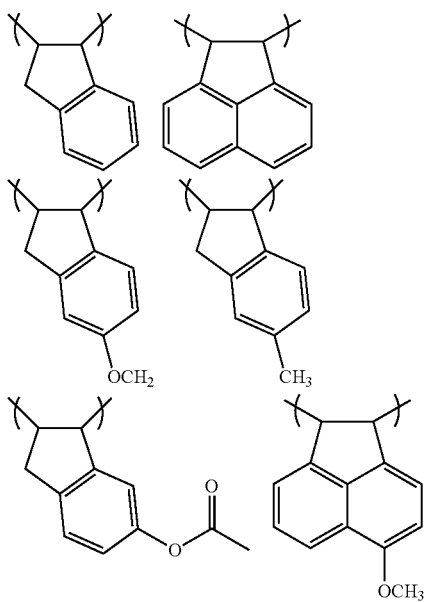

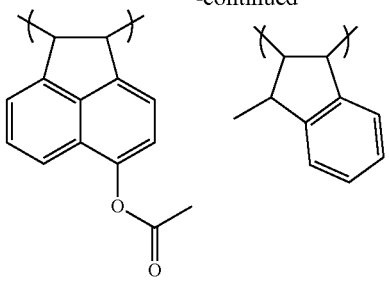

(Repeating Unit for Reducing Motility of Main Chain)

The resin (A) preferably has a high glass transition temperature (Tg) from the viewpoint that excessive diffusion of an acid generated or pattern collapse during development can be suppressed. Tg is preferably higher than 90° C., more preferably higher than 100° C., still more preferably higher than 110° C., and particularly preferably higher than 125° C. In addition, since an excessive increase in Tg causes a decrease in the dissolution rate in a developer, Tg is preferably 400° C. or lower, and more preferably 350° C. or lower.

Furthermore, in the present specification, the glass transition temperature (Tg) of a polymer such as the resin (A) is calculated by the following method. First, the Tg of a homopolymer consisting only of each repeating unit included in the polymer is calculated by a Bicerano method. Hereinafter, the calculated Tg is referred to as the "Tg of the repeating unit". Next, the mass proportion (%) of each repeating unit to all repeating units in the polymer is calculated. Then, the Tg at each mass proportion is calculated using a Fox's equation (described in Materials Letters 62 (2008) 3152, and the like), and these are summed to obtain the Tg (° C.) of the polymer.

The Bicerano method is described in Prediction of polymer properties, Marcel Dekker Inc., New York (1993), and the like. The calculation of a Tg by the Bicerano method can be carried out using MDL Polymer (MDL Information Systems, Inc.), which is software for estimating physical properties of a polymer.

In order to raise the Tg of the resin (A) (preferably to raise the Tg to higher than 90° C.), it is preferable to reduce the motility of the main chain of the resin (A). Examples of a method for reducing the motility of the main chain of the resin (A) include the following (a) to (e) methods.

(a) Introduction of a bulky substituent into the main chain
(b) Introduction of a plurality of substituents into the main chain
(c) Introduction of a substituent that induces an interaction between the resins (A) near the main chain
(d) Formation of the main chain in a cyclic structure
(e) Linking of a cyclic structure to the main chain Furthermore, the resin (A) preferably has a repeating unit having a Tg of a homopolymer exhibiting 130° C. or higher.

In addition, the type of the repeating unit having a Tg of the homopolymer exhibiting 130° C. or higher is not particularly limited, and may be any of repeating units having a Tg of a homopolymer of 130° C. or higher calculated by the Bicerano method. Moreover, it corresponds to a repeating unit having a Tg of a homopolymer exhibiting 130° C. or higher, depending on the type of a functional group in the repeating units represented by Formula (A) to Formula (E) which will be described later.

(Repeating Unit Represented by Formula (A))

As an example of a specific unit for accomplishing (a) above, a method of introducing a repeating unit represented by Formula (A) into the resin (A) may be mentioned.

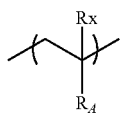

(A)

In Formula (A), $R^A$ represents a group having a polycyclic structure. Rx represents a hydrogen atom, a methyl group, or an ethyl group. The group having a polycyclic structure is a group having a plurality of ring structures, and the plurality of ring structures may or may not be fused.

Specific examples of the repeating unit represented by Formula (A) include those described in paragraphs [0107] to [0119] of WO2018/193954A.

(Repeating Unit Represented by Formula (B))

As an example of a specific unit for accomplishing (b) above, a method of introducing a repeating unit represented by Formula (B) into the resin (A) may be mentioned.

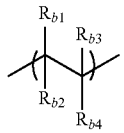

(B)

In Formula (B), $R_{b1}$ to $R_{b4}$ each independently represent a hydrogen atom or an organic group, and at least two or more of $R_{b1}$, . . . , or $R_{b4}$ represent an organic group.

Furthermore, in a case where at least one of the organic groups is a group in which a ring structure is directly linked to the main chain in the repeating unit, the types of the other organic groups are not particularly limited.

In addition, in a case where none of the organic groups is a group in which a ring structure is directly linked to the main chain in the repeating unit, at least two or more of the organic groups are substituents having three or more constituent atoms excluding hydrogen atoms.

Specific examples of the repeating unit represented by Formula (B) include those described in paragraphs [0113] to [0115] of WO2018/193954A.

(Repeating Unit Represented by Formula (C))

As an example of a specific unit for accomplishing (c) above, a method of introducing a repeating unit represented by Formula (C) into the resin (A) may be mentioned.

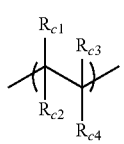

(C)

In Formula (C), $R_{c1}$ to $R_{c4}$ each independently represent a hydrogen atom or an organic group, and at least one of $R_{c1}$, . . . , or $R_{c4}$ is a group having a hydrogen-bonding hydrogen atom with a number of atoms of 3 or less from the main chain carbon. Among those, it is preferable that the group has hydrogen-bonding hydrogen atoms with a number of atoms of 2 or less (on a side closer to the vicinity of the main chain) so as to induce an interaction between the main chains of the resin (A).

Specific examples of the repeating unit represented by Formula (C) include those described in paragraphs [0119] to [0121] of WO2018/193954A.

(Repeating Unit Represented by Formula (D))

As an example of a specific unit for accomplishing (d) above, a method of introducing a repeating unit represented by Formula (D) into the resin (A) may be mentioned.

(D)

In Formula (D), "Cyclic" is a group that forms a main chain with a cyclic structure. The number of the ring-constituting atoms is not particularly limited.

Specific examples of the repeating unit represented by Formula (D) include those described in paragraphs [0126] and [0127] of WO2018/193954A.

(Repeating unit represented by Formula (E))

As an example of a specific unit for accomplishing (e) above, a method of introducing a repeating unit represented by Formula (E) into the resin (A) may be mentioned.

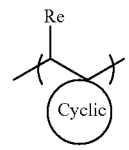

(E)

In Formula (E), Re represents a hydrogen atom or an organic group. Examples of the organic group include an alkyl group, a cycloalkyl group, an aryl group, an aralkyl group, and an alkenyl group, which may have a substituent.

"Cyclic" is a cyclic group including a carbon atom of the main chain. The number of atoms included in the cyclic group is not particularly limited.

Specific examples of the repeating unit represented by Formula (E) include those described in paragraphs [0131] to [0133] of WO2018/193954A.

The content of the repeating unit represented by Formula (E) is preferably 5% by mole or more, and more preferably 10% by mole or more with respect to all repeating units in the resin (A). In addition, an upper limit value thereof is preferably 60% by mole or less, and more preferably 55% by mole or less.

(Repeating Unit Having at Least One Group Selected from Lactone Group, Sultone Group, Carbonate Group, Hydroxyl Group, Cyano Group, or Alkali-Soluble Group)

The resin (A) may have a repeating unit having at least one group selected from a lactone group, a sultone group, a carbonate group, a hydroxyl group, a cyano group, or an alkali-soluble group.

Examples of the repeating unit having a lactone group, a sultone group, or a carbonate group contained in the resin (A) include the repeating units described in <Repeating Unit Having Lactone Group, Sultone Group, or Carbonate Group> mentioned above. A preferred content thereof is also the same as described in <Repeating Unit Having Lactone Group, Sultone Group, or Carbonate Group> mentioned above.

The resin (A) may have a repeating unit having a hydroxyl group or a cyano group. As a result, the adhesiveness to a substrate and the affinity for a developer are improved.

The repeating unit having a hydroxyl group or a cyano group is preferably a repeating unit having an alicyclic hydrocarbon structure substituted with a hydroxyl group or a cyano group.

The repeating unit having a hydroxyl group or a cyano group preferably has no acid-decomposable group. Examples of the repeating unit having a hydroxyl group or a cyano group include those described in paragraphs [0153] to [0158] of WO2020/004306A.

The resin (A) may have a repeating unit having an alkali-soluble group.

Examples of the alkali-soluble group include a carboxyl group, a sulfonamide group, a sulfonylimide group, a bis-sulfonylimide group, or an aliphatic alcohol group (for example, a hexafluoroisopropanol group) in which the α-position is substituted with an electron-withdrawing group, and the carboxyl group is preferable. In a case where the resin (A) includes a repeating unit having an alkali-soluble group, the resolution for use in contact holes increases.

Examples of the repeating unit having an alkali-soluble group include a repeating unit in which an alkali-soluble group is directly bonded to the main chain of a resin such as a repeating unit with acrylic acid and methacrylic acid, or a repeating unit in which an alkali-soluble group is bonded to the main chain of the resin through a linking group. Furthermore, the linking group may have a monocyclic or polycyclic cyclic hydrocarbon structure.

The repeating unit having an alkali-soluble group is preferably a repeating unit with acrylic acid or methacrylic acid.

The content of the repeating unit having an alkali-soluble group is preferably 0% by mole or more, more preferably 3% by mole or more, and still more preferably 5% by mole or more with respect to all repeating units in the resin (A). An upper limit value thereof is preferably 20% by mole or less, more preferably 15% by mole or less, and still more preferably 10% by mole or less.

Specific examples of the repeating unit having an alkali-soluble group are shown below, but the present invention is not limited thereto. In the specific examples, Rx represents H, $CH_3$, $CH_2OH$, or $CF_3$.

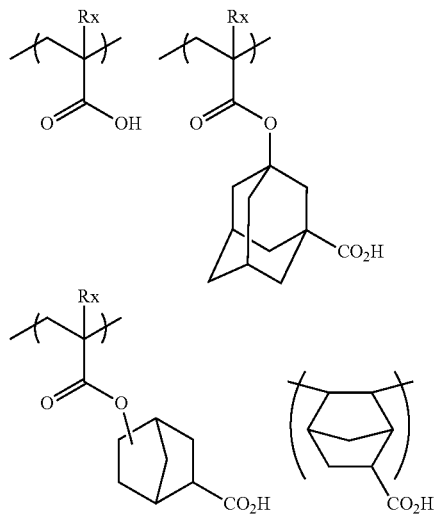

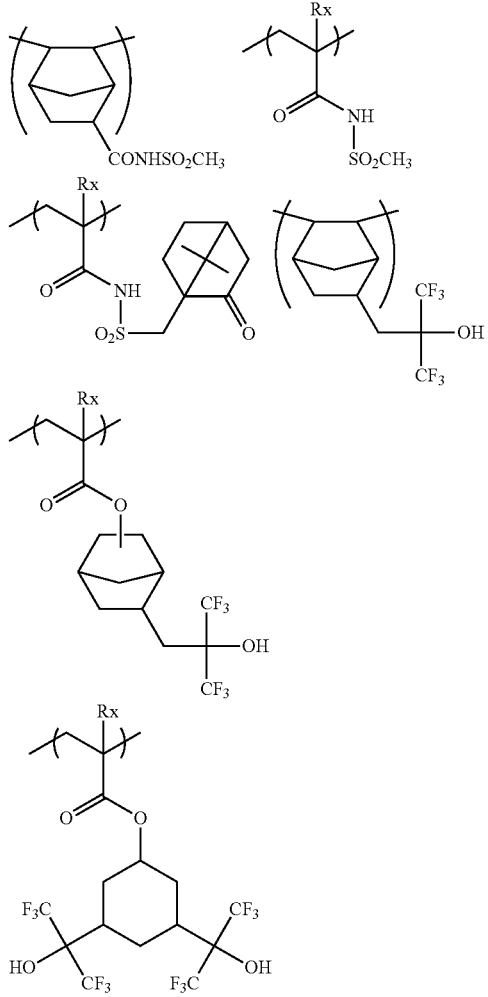

As the repeating unit having at least one group selected from a lactone group, a hydroxyl group, a cyano group, or an alkali-soluble group, a repeating unit having at least two selected from a lactone group, a hydroxyl group, a cyano group, or an alkali-soluble group is preferable, a repeating unit having a cyano group and a lactone group is more preferable, and a repeating unit having a structure in which a cyano group is substituted in the lactone structure represented by General Formula (LC1-4) is still more preferable.

(Repeating Unit Having Alicyclic Hydrocarbon Structure and not Exhibiting Acid Decomposability)

The resin (A) may have a repeating unit having an alicyclic hydrocarbon structure and not exhibiting acid decomposability. This can reduce the elution of low-molecular-weight components from the resist film into an immersion liquid during liquid immersion exposure. Examples of such the repeating unit include repeating units derived from 1-adamantyl (meth)acrylate, diamantyl (meth)acrylate, tricyclodecanyl (meth)acrylate, and cyclohexyl (meth)acrylate.

(Repeating Unit Represented by General Formula (III) Having Neither Hydroxyl Group Nor Cyano Group)

The resin (A) may have a repeating unit represented by General Formula (III), which has neither a hydroxyl group nor a cyano group.

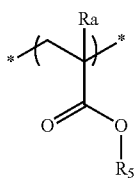

(III)

In General Formula (III), $R_5$ represents a hydrocarbon group having at least one cyclic structure and having neither a hydroxyl group nor a cyano group.

Ra represents a hydrogen atom, an alkyl group, or a —$CH_2$—O—$Ra_2$ group. In the formula, $Ra_2$ represents a hydrogen atom, an alkyl group, or an acyl group.

The cyclic structure contained in $R_5$ includes a monocyclic hydrocarbon group and a polycyclic hydrocarbon group. Examples of the monocyclic hydrocarbon group include a cycloalkyl group having 3 to 12 carbon atoms (more preferably having 3 to 7 carbon atoms) or a cycloalkenyl group having 3 to 12 carbon atoms.

Detailed definitions of each group in General Formula (III) and specific examples of the repeating unit include those described in paragraphs [0169] to [0173] of WO2020/004306A.

(Other Repeating Units)

Furthermore, the resin (A) may have repeating units other than the repeating units described above.

For example, the resin (A) may have a repeating unit selected from the group consisting of a repeating unit having an oxathiane ring group, a repeating unit having an oxazolone ring group, a repeating unit having a dioxane ring group, and a repeating unit having a hydantoin ring group.

Such repeating units will be exemplified below.

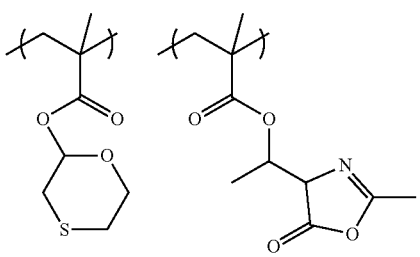

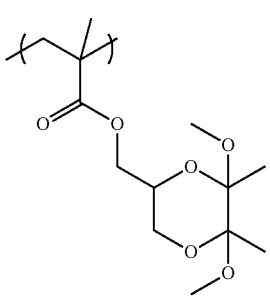

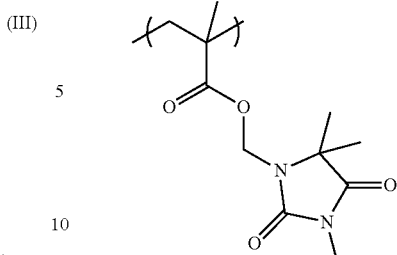

The resin (A) may have a variety of repeating structural units, in addition to the repeating structural units described above, for the purpose of adjusting dry etching resistance, suitability for a standard developer, adhesiveness to a substrate, a resist profile, resolving power, heat resistance, sensitivity, and the like.

For the resin (A), it is also preferable that all of the repeating units are composed of (meth)acrylate-based repeating units (particularly in a case where the composition is used as an actinic ray-sensitive or radiation-sensitive resin composition for ArF). In this case, any of a resin in which all of the repeating units are methacrylate-based repeating units, a resin in which all of the repeating units are acrylate-based repeating units, and a resin in which all of the repeating units are methacrylate-based repeating units and acrylate-based repeating units can be used, and it is preferable that the amount of the acrylate-based repeating units is 50% by mole or less with respect to all repeating units.

The resin (A) can be synthesized in accordance with an ordinary method (for example, radical polymerization).

The weight-average molecular weight of the resin (A) as a value expressed in terms of polystyrene by a GPC method is preferably 1,000 to 200,000, more preferably 3,000 to 20,000, and still more preferably 5,000 to 15,000. By setting the weight-average molecular weight of the resin (A) to 1,000 to 200,000, deterioration of heat resistance and dry etching resistance can be further suppressed. In addition, deterioration of developability and deterioration of film forming property due to high viscosity can also be further suppressed.

The dispersity (molecular weight distribution) of the resin (A) is usually 1 to 5, preferably 1 to 3, more preferably 1.20 to 3.00, and still more preferably 1.20 to 2.00. The smaller the dispersity, the more excellent the resolution and the resist shape, and the smoother the side wall of the resist pattern, the more excellent the roughness.

In the composition of the embodiment of the present invention, a content of the resin (A) is preferably 50% to 99.9% by mass, and more preferably 60% to 99.0% by mass with respect to the total solid content of the composition.

Furthermore, the solid content is intended to be components excluding the solvent in the composition, and any of components other than the solvent are regarded as the solid content even in a case where they are liquid components.

In addition, the resin (A) may be used alone or in combination of a plurality thereof <Another Photoacid Generator>

The resist composition may include another photoacid generator (a compound which does not correspond to the specific compound and generates an acid upon irradiation with actinic rays or radiation) which does not correspond to the specific compound. Such another photoacid generator is a compound which generates an acid upon exposure (preferably exposure to EUV light and/or ArF).

Such another photoacid generator may be in a form of a low-molecular-weight compound or a form incorporated into a part of a polymer. Furthermore, a combination of the form of a low-molecular-weight compound and the form incorporated into a part of a polymer may also be used.

In a case where such another photoacid generator is in the form of a low-molecular-weight compound, the molecular weight is preferably 3,000 or less, more preferably 2,000 or less, and still more preferably 1,000 or less. The lower limit is preferably 50 or more.

In a case where such another photoacid generator is in the form incorporated into a part of a polymer, it may be incorporated into a part of the resin (A) or into a resin that is different from the resin (A).

In the present invention, the photoacid generator is preferably in the form of the low-molecular-weight compound.

Such another photoacid generator is not particularly limited, and above all, a compound that generates an organic acid is preferable.

Examples of the organic acid include the same ones of the organic acid described as the organic acid that can be generated by the specific compound.

Examples of such another photoacid generator include a compound (onium salt) represented by "M$^+$Y$^-$".

In the compound represented by "M$^+$Y$^-$", Y$^-$ represents a monovalent organic anion.

Examples of Y$^-$ in "M$^+$Y$^-$" include the monovalent organic anions among the organic anions included in the above-mentioned specific compounds.

In the compound represented by "M$^+$Y$^-$", M$^+$ represents a monovalent organic cation.

The monovalent organic cations are each independently preferably a cation represented by General Formula (ZaI) (cation (ZaI)) or a cation represented by General Formula (ZaII) (cation (ZaII)).

It should be noted that the cation represented by General Formula (ZaI) is different from the cation (a moiety other than Y$^-$) in the specific compound (the compound represented by each of General Formulae (1) to (3)).

In General Formula (ZaI), $R^{201}$, $R^{202}$, and $R^{203}$ each independently represent an organic group.

The organic group as each of $R^{201}$, $R^{202}$, and $R^{203}$ usually has 1 to 30 carbon atoms, and preferably has 1 to 20 carbon atoms. In addition, two of $R^{201}$ to $R^{203}$ may be bonded to each other to form a ring structure, and the ring may include an oxygen atom, a sulfur atom, an ester group, an amide group, or a carbonyl group. Examples of the group formed by the bonding of two of $R^{201}$ to $R^{203}$ include an alkylene group (for example, a butylene group and a pentylene group), and —CH$_2$—CH$_2$—O—CH$_2$—CH$_2$—.

Examples of the cation in General Formula (ZaI) include a cation (ZaI-1) which will be described later.

The cation (ZaI-1) is an arylsulfonium cation in which at least one of $R^{201}$, $R^{202}$, or $R^{203}$ of General Formula (ZaI) is an aryl group.

In the arylsulfonium cation, all of $R^{201}$ to $R^{203}$ may be aryl groups, or some of $R^{201}$ to $R^{203}$ may be an aryl group, and the rest may be an alkyl group or a cycloalkyl group.

In addition, one of $R^{201}$ to $R^{203}$ may be an aryl group, two of $R^{201}$ to $R^{203}$ may be bonded to each other to form a ring structure, and an oxygen atom, a sulfur atom, an ester group, an amide group, or a carbonyl group may be included in the ring. Examples of the group formed by the bonding of two of $R^{201}$ to $R^{203}$ include an alkylene group (for example, a butylene group, a pentylene group, or —CH$_2$—CH$_2$—O—CH$_2$—CH$_2$—) in which one or more methylene groups may be substituted with an oxygen atom, a sulfur atom, an ester group, an amide group, and/or a carbonyl group.

Examples of the arylsulfonium cation include a triarylsulfonium cation, a diarylalkylsulfonium cation, an aryldialkylsulfonium cation, a diarylcycloalkyl sulfonium cation, and an aryldicycloalkylsulfonium cation.

The aryl group included in the arylsulfonium cation is preferably a phenyl group or a naphthyl group, and more preferably the phenyl group. The aryl group may be an aryl group which has a heterocyclic structure having an oxygen atom, a nitrogen atom, a sulfur atom, or the like. Examples of the heterocyclic structure include a pyrrole residue, a furan residue, a thiophene residue, an indole residue, a benzofuran residue, and a benzothiophene residue. In a case where the arylsulfonium cation has two or more aryl groups, the two or more aryl groups may be the same as or different from each other.

The alkyl group or the cycloalkyl group contained in the arylsulfonium cation, as necessary, is preferably a linear alkyl group having 1 to 15 carbon atoms, a branched alkyl group having 3 to 15 carbon atoms, or a cycloalkyl group having 3 to 15 carbon atoms, and more preferably a methyl group, an ethyl group, a propyl group, an n-butyl group, a sec-butyl group, a t-butyl group, a cyclopropyl group, a cyclobutyl group, or a cyclohexyl group.

The substituents which may be contained in each of the aryl group, the alkyl group, and the cycloalkyl group of each of $R^{201}$ to $R^{203}$ are each independently preferably an alkyl group (for example, having 1 to 15 carbon atoms), a cycloalkyl group (for example, having 3 to 15 carbon atoms), an aryl group (for example, having 6 to 14 carbon atoms), an alkoxy group (for example, having 1 to 15 carbon atoms), a cycloalkylalkoxy group (for example, having 3 to 15 carbon atoms), a halogen atom (for example, fluorine and iodine), a hydroxyl group, a carboxyl group, an ester group, a sulfinyl group, a sulfonyl group, an alkylthio group, or a phenylthio group.

The substituent may further have a substituent as possible, and may be in the form of an alkyl halide group such as a trifluoromethyl group, for example, in which an alkyl group has a halogen atom as a substituent.

It is also preferable that the substituents form an acid-decomposable group by any combination. The acid-decomposable group is a group that decomposes by the action of an acid to produce a polar group, and it is preferable that the acid-decomposable group has a structure in which a polar group is protected by an eliminable group that is eliminated by the action of an acid. Examples of the polar group, the leaving group, and the acid-decomposable group include those exemplified for the above-described specific compound.

Examples of such another photoacid generator include the following compound.

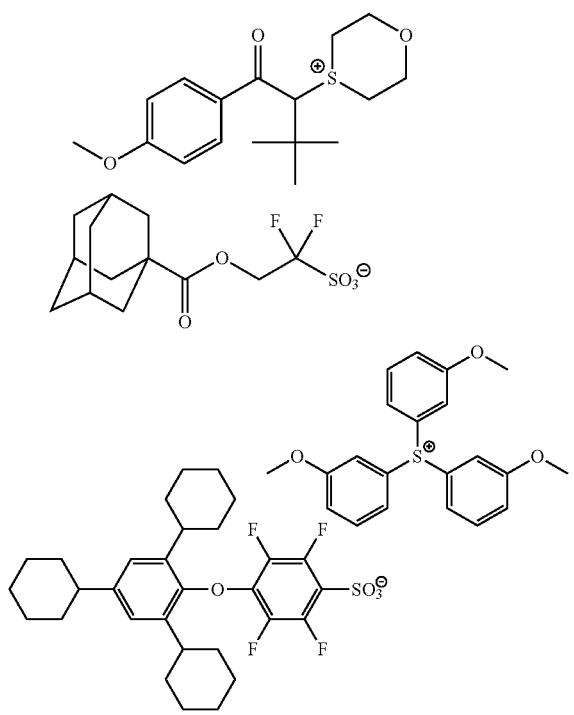
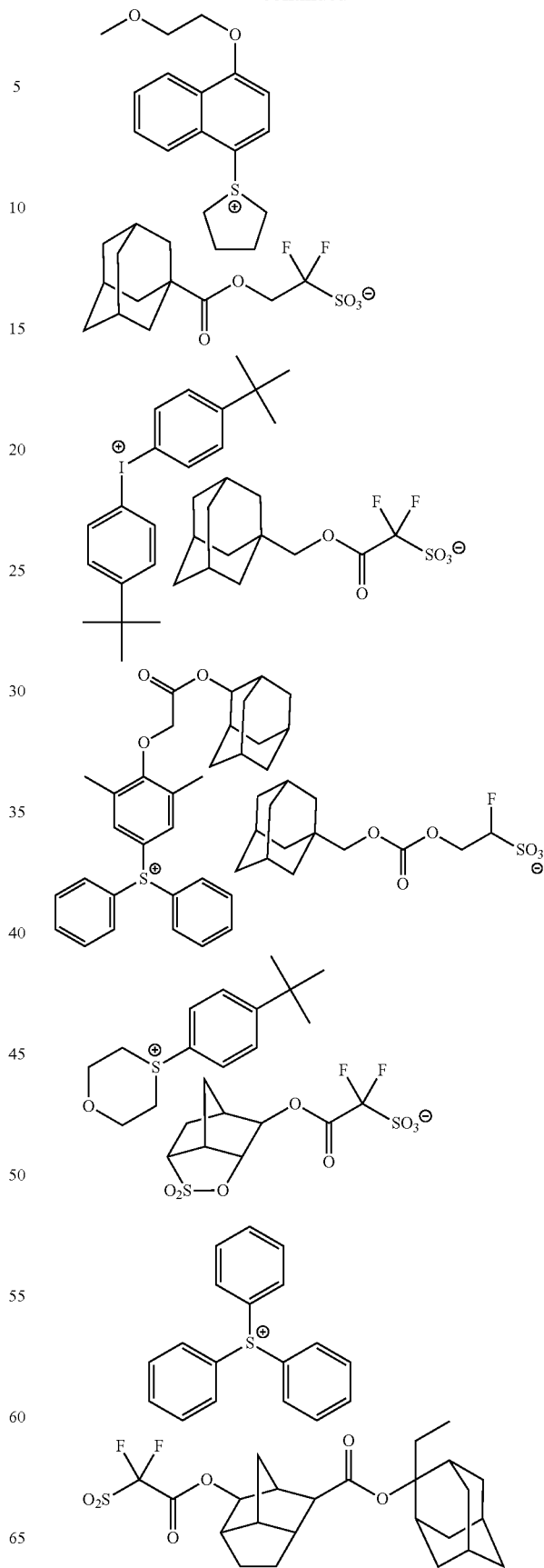

-continued

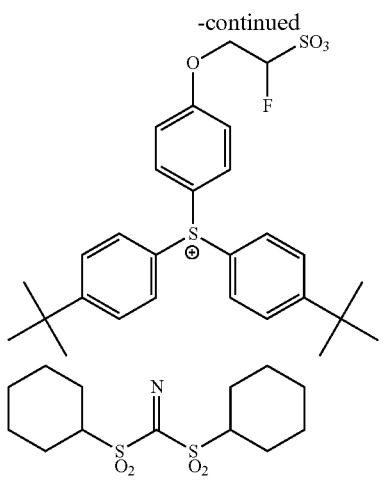

In a case where the resist composition includes such another photoacid generator, a content thereof is not particularly limited, but from the viewpoint that the effect of the present invention is more excellent, the content is preferably 0.5% by mass or more, more preferably 1% by mass or more, and still more preferably 2% by mass or more with respect to a total solid content of the composition. In addition, the content is preferably 40% by mass or less, more preferably 35% by mass or less, and still more preferably 30% by mass or less.

The photoacid generators may be used alone or in combination of two or more kinds thereof <Solvent>

The resist composition may include a solvent.

The solvent preferably includes at least one solvent of (M1) propylene glycol monoalkyl ether carboxylate, or (M2) at least one selected from the group consisting of a propylene glycol monoalkyl ether, a lactic acid ester, an acetic acid ester, an alkoxypropionic acid ester, a chain ketone, a cyclic ketone, a lactone, and an alkylene carbonate. Furthermore, this solvent may further include components other than the components (M1) and (M2).

The present inventors have found that by using such a solvent and the above-mentioned resin in combination, a pattern having a small number of development defects can be formed while improving the coating property of the composition. A reason therefor is not necessarily clear, but the present inventors have considered that since these solvents have a good balance among the solubility, the boiling point, and the viscosity of the resin, the unevenness of the film thickness of a composition film, the generation of precipitates during spin coating, and the like can be suppressed.

Details of the component (M1) and the component (M2) are described in paragraphs [0218] to [0226] of WO2020/004306A.

The solvent may further include components other than the components (M1) and (M2). In this case, a content of the components other than the component (M1) or (M2) is preferably 5% to 30% by mass with respect to the total mass of the solvent.

The content of the solvent in the resist composition is preferably set such that the concentration of solid contents is 0.5% to 30% by mass, and more preferably set such that the concentration of solid contents is 1% to 20% by mass. With this content, the coating property of the resist composition can be further improved.

Furthermore, the solid content means all the components excluding the solvent.

<Acid Diffusion Control Agent>

The resist composition may further include an acid diffusion control agent. The acid diffusion control agent acts as a quencher that traps an acid generated from a photoacid generator and functions to control the phenomenon of acid diffusion in the resist film.

Examples of the acid diffusion control agent include a basic compound.

The basic compound is preferably a compound having a structure represented by each of General Formulae (A) to (E).

 (A)

 (B)

 (C)

 (D)

 (E)

In General Formula (A) and General Formula (E), $R^{200}$, $R^{201}$, and $R^{202}$ may be the same as or different from each other, and each represent a hydrogen atom, an alkyl group (preferably having 1 to 20 carbon atoms), a cycloalkyl group (preferably having 3 to 20 carbon atoms), or an aryl group (preferably having 6 to 20 carbon atoms), where $R^{201}$ and $R^{202}$ may be bonded to each other to form a ring.

With regard to the alkyl group, the alkyl group having a substituent is preferably an aminoalkyl group having 1 to 20 carbon atoms, a hydroxyalkyl group having 1 to 20 carbon atoms, or a cyanoalkyl group having 1 to 20 carbon atoms.

$R^{203}$, $R^{204}$, $R^{205}$, and $R^{206}$ may be the same as or different from each other, and each represent an alkyl group having 1 to 20 carbon atoms.

The alkyl group in each of General Formulae (A) and (E) are preferably unsubstituted.

The resist composition may include a compound (hereinafter also referred to as a "compound (PA)") which has a proton-accepting functional group and generates a compound that decomposes upon irradiation with actinic rays or radiation to exhibit deterioration in proton-accepting properties, no proton-accepting properties, or a change from the proton-accepting properties to acidic properties as an acid diffusion control agent.

The proton-accepting functional group refers to a functional group having a group or electron capable of electrostatically interacting with a proton, and for example, means a functional group with a macrocyclic structure, such as a cyclic polyether, or a functional group having a nitrogen atom having an unshared electron pair not contributing to it-conjugation. The nitrogen atom having an unshared electron pair not contributing to n-conjugation is, for example, a nitrogen atom having a partial structure represented by the following general formula.

 Unshared electron pair

Examples of the acid diffusion control agent include the compounds described in paragraphs [0238] to [0271] of WO2020/004306A.

In a case where the resist composition includes an acid diffusion control agent, a content of the acid diffusion control agent is preferably 0.001% to 15% by mass, and more preferably 0.01% to 10% by mass with respect to a total solid content of the resist composition.

The acid diffusion control agents may be used alone or in combination of two or more kinds thereof.

In addition, in a case where the resist composition includes a specific compound having an anion represented by any of Formulae (d1-1) to (d1-3) and/or another photoacid generator having an anion represented by any of Formulae (d1-1) to (d1-3) (hereinafter collectively referred to as a "d1-based photoacid generator"), the d1-based photoacid generator can also serve as an acid diffusion control agent. In a case where the resist composition includes the d1-based photoacid generator, it is also preferable that the resist composition does not substantially include an acid diffusion control agent. Here, the expression that the acid diffusion control agent is not substantially included means that a content of the acid diffusion control agent is 5% by mass or less with respect to a total content of the d1-based photoacid generator.

In addition, in a case where the resist composition includes both the d1-based photoacid generator and the acid diffusion control agent, a total content thereof is preferably 1% to 30% by mass, and more preferably 3% to 20% by mass.

It is preferable that a proportion of the photoacid generator and the acid diffusion control agent to be used in the resist composition, that is, the photoacid generator/the acid diffusion control agent (molar ratio) is 2.0 to 300. From the viewpoint of sensitivity and resolution, the molar ratio is preferably 2.0 or more. The upper limit is not particularly limited, but from the viewpoint of suppressing a reduction in the resolution due to an increase in the thickness of a resist pattern over time after exposure until a heating treatment, the molar ratio is preferably 300 or less. The photoacid generator/the acid diffusion control agent (molar ratio) is more preferably 2.0 to 200, and still more preferably 2.0 to 150.

Examples of the acid diffusion control agent include the compounds (amine compounds, amide group-containing compounds, urea compounds, nitrogen-containing heterocyclic compounds, and the like) described in paragraphs [0140] to [0144] of JP2013-11833A.

<Hydrophobic Resin>

The resist composition may include a hydrophobic resin different from the resin (A), in addition to the resin (A).

Although it is preferable that the hydrophobic resin is designed to be unevenly distributed on a surface of the resist film, it does not necessarily need to have a hydrophilic group in the molecule as different from the surfactant, and does not need to contribute to uniform mixing of polar materials and non-polar materials.

Examples of the effect caused by the addition of the hydrophobic resin include a control of static and dynamic contact angles of a surface of the resist film with respect to water and suppression of out gas.

The hydrophobic resin preferably has any one or more of a "fluorine atom", a "silicon atom", and a "$CH_3$ partial structure which is contained in a side chain moiety of a resin" from the viewpoint of uneven distribution on the film surface layer, and more preferably has two or more kinds thereof. In addition, the hydrophobic resin preferably has a hydrocarbon group having 5 or more carbon atoms. These groups may be contained in the main chain of the resin or may be substituted in a side chain.

Examples of the hydrophobic resin include the compounds described in paragraphs [0275] to [0279] of WO2020/004306A.

In a case where the resist composition includes a hydrophobic resin, a content of the hydrophobic resin is preferably 0.01% to 20% by mass, and more preferably 0.1% to 15% by mass with respect to the total solid content of the resist composition.

<Surfactant>

The resist composition may include a surfactant.

In a case where resist composition includes the surfactant, it is possible to form a pattern having more excellent adhesiveness and fewer development defects.

The surfactant is preferably a fluorine-based and/or silicon-based surfactant.

Examples of the surfactant include compounds described in paragraphs [0281] and [0282] of WO2020/004306A.

The surfactant may be used alone or in combination of two or more kinds thereof.

In a case where the resist composition includes a surfactant, a content of the surfactant is preferably 0.0001% to 2% by mass, more preferably 0.0005% to 1% by mass, and still more preferably 0.05% to 0.5% by mass with respect to the total solid content of the composition.

<Other Additives>

The resist composition may further include a dissolution inhibiting compound, a dye, a plasticizer, a photosensitizer, a light absorber, and/or a compound accelerating a solubility in a developer (for example, a phenol compound having a molecular weight of 1,000 or less or an alicyclic or aliphatic compound having a carboxylic acid group), or the like.

The resist composition may further include a dissolution inhibiting compound. Here, the "dissolution inhibiting compound" is intended to be a compound having a molecular weight of 3,000 or less, having a solubility in an organic developer decreases by decomposition by the action of an acid.

The resist composition of the embodiment of the present invention is suitably used as a photosensitive composition for EUV light.

EUV light has a wavelength of 13.5 nm, which is a shorter wavelength than that of ArF (wavelength of 193 nm) light or the like, and therefore, the EUV light has a smaller number of incidence photons upon exposure with the same sensitivity. Thus, an effect of "photon shot noise" that the number of photons is statistically non-uniform is significant, and a deterioration in LER and a bridge defect are caused. In order to reduce the photon shot noise, a method in which an exposure amount increases to cause an increase in the number of incidence photons is available, but the method is a trade-off with a demand for a higher sensitivity.

In a case where the A value obtained by Expression (1) is high, the absorption efficiency of EUV light and electron beam of the resist film formed from the resist composition is higher, which is effective in reducing the photon shot noise. The A value represents the absorption efficiency of EUV light and electron beams of the resist film in terms of a mass proportion.

$$A=([H]\times0.04+[C]\times1.0+[N]\times2.1+[O]\times3.6+[F]\times5.6+[S]\times1.5+[I]\times39.5)/([H]\times1+[C]\times12+[N]\times14+[O]\times16+[F]\times19+[S]\times32+[I]\times127) \quad \text{Expression (1):}$$

The A value is preferably 0.120 or more. An upper limit thereof is not particularly limited, but in a case where the A value is extremely high, the transmittance of EUV light and electron beams of the resist film is lowered and the optical image profile in the resist film is deteriorated, which results in difficulty in obtaining a good pattern shape, and therefore, the upper limit is preferably 0.240 or less, and more preferably 0.220 or less.

Moreover, in Formula (1), [H] represents a molar ratio of hydrogen atoms derived from the total solid content with respect to all the atoms of the total solid content in the actinic ray-sensitive or radiation-sensitive resin composition, [C] represents a molar ratio of carbon atoms derived from the total solid content with respect to all the atoms of the total solid content in the actinic ray-sensitive or radiation-sensitive resin composition, [N] represents a molar ratio of nitrogen atoms derived from the total solid content with respect to all the atoms of the total solid content in the actinic ray-sensitive or radiation-sensitive resin composition, [O] represents a molar ratio of oxygen atoms derived from the total solid content with respect to all the atoms of the total solid content in the actinic ray-sensitive or radiation-sensitive resin composition, [F] represents a molar ratio of fluorine atoms derived from the total solid content with respect to all the atoms of the total solid content in the actinic ray-sensitive or radiation-sensitive resin composition, [S] represents a molar ratio of sulfur atoms derived from the total solid content with respect to all the atoms of the total solid content in the actinic ray-sensitive or radiation-sensitive resin composition, and [I] represents a molar ratio of iodine atoms derived from the total solid content with respect to all the atoms of the total solid content in the actinic ray-sensitive or radiation-sensitive resin composition.

For example, in a case where the resist composition includes a resin (acid-decomposable resin) having a polarity that increases by the action of an acid, a photoacid generator, an acid diffusion control agent, and a solvent, the resin, the photoacid generator, and the acid diffusion control agent correspond to the solid content. That is, all the atoms of the total solid content correspond to a sum of all the atoms derived from the resin, all the atoms derived from the photoacid generator, and all the atoms derived from the acid diffusion control agent. For example, [H] represents a molar ratio of hydrogen atoms derived from the total solid content with respect to all the atoms in the total solid content, and by way of description based on the example above, [H] represents a molar ratio of a sum of the hydrogen atoms derived from the resin, the hydrogen atoms derived from the photoacid generator, and the hydrogen atoms derived from the acid diffusion control agent with respect to a sum of all the atoms derived from the resin, all the atoms derived from the photoacid generator, and all the atoms derived from the acid diffusion control agent.

The A value can be calculated by computation of the structure of constituent components of the total solid content in the resist composition, and the atomic number ratio contained in a case where the content is already known. In addition, even in a case where the constituent component is not known yet, it is possible to calculate a constituent atomic number ratio by subjecting a resist film obtained after evaporating the solvent components of the resist composition to computation according to an analytic approach such as elemental analysis.

[Resist Film and Pattern Forming Method]

The procedure of the pattern forming method using the resist composition is not particularly limited, but preferably has the following steps.

Step 1: A step of forming a resist film on a substrate using a resist composition Step 2: A step of exposing the resist film Step 3: A step of developing the exposed resist film using a developer to form a pattern Hereinafter, the procedure of each of the steps will be described in detail.

<Step 1: Resist Film Forming Step>

The step 1 is a step of forming a resist film on a substrate using a resist composition.

The definition of the resist composition is as described above.

Examples of a method in which a resist film is formed on a substrate, using a resist composition include a method in which a resist composition is applied onto a substrate.

In addition, it is preferable that the resist composition before the application is filtered through a filter, as necessary. A pore size of the filter is preferably 0.1 µm or less, more preferably 0.05 µm or less, and still more preferably 0.03 µm or less. In addition, the filter is preferably a polytetrafluoroethylene-, polyethylene-, or nylon-made filter.

The resist composition can be applied onto a substrate (for example, silicon and silicon dioxide coating) as used in the manufacture of integrated circuit elements by a suitable application method such as ones using a spinner or a coater. The application method is preferably spin application using a spinner. A rotation speed upon the spin application using a spinner is preferably 1,000 to 3,000 rpm.

After the application of the resist composition, the substrate may be dried to form a resist film. In addition, various underlying films (an inorganic film, an organic film, and an antireflection film) may be formed on the underlayer of the resist film, as necessary.

Examples of the drying method include a method of heating and drying. The heating can be carried out using a unit included in an ordinary exposure machine and/or an ordinary development machine, and may also be carried out using a hot plate or the like. A heating temperature is preferably 80° C. to 150° C., more preferably 80° C. to 140° C., and still more preferably 80° C. to 130° C. A heating time is preferably 30 to 1,000 seconds, more preferably 60 to 800 seconds, and still more preferably 60 to 600 seconds.

A film thickness of the resist film is not particularly limited, but is preferably 10 to 65 nm, and more preferably 15 to 50 nm from the viewpoint that a fine pattern having higher accuracy can be formed.

Moreover, a topcoat may be formed on the upper layer of the resist film, using the topcoat composition.

It is preferable that the topcoat composition is not mixed with the resist film and can further be uniformly applied onto the upper layer of the resist film.

The topcoat is not particularly limited, a topcoat known in the related art can be formed by the methods known in the related art, and the topcoat can be formed, based on the description in paragraphs [0072] to [0082] of JP2014-059543A, for example.

It is preferable that a topcoat including a basic compound as described in JP2013-61648A, for example, is formed on a resist film. Specific examples of the basic compound which can be included in the topcoat include a basic compound which may be included in the resist composition.

In addition, it is also preferable that the topcoat includes a compound which includes at least one group or bond selected from the group consisting of an ether bond, a thioether bond, a hydroxyl group, a thiol group, a carbonyl bond, and an ester bond.

<Step 2: Exposing Step>

The step 2 is a step of exposing the resist film.

Examples of an exposing method include a method in which a resist film formed is irradiated with EUV light through a predetermined mask.

It is preferable to perform baking (heating) before performing development after the exposure. The baking accelerates a reaction in the exposed area, and the sensitivity and the pattern shape are improved.

A heating temperature is preferably 80° C. to 150° C., more preferably 80° C. to 140° C., and still more preferably 80° C. to 130° C.

A heating time is preferably 10 to 1,000 seconds, more preferably 10 to 180 seconds, and still more preferably 30 to 120 seconds.

The heating can be carried out using a unit included in an ordinary exposure machine and/or an ordinary development machine, and may also be performed using a hot plate or the like.

This step is also referred to as a post-exposure baking.

<Step 3: Developing Step>

The step 3 is a step of developing the exposed resist film using a developer to form a pattern.

The developer may be either an alkali developer or a developer containing an organic solvent (hereinafter also referred to as an "organic developer").

Examples of the developing method include a method in which a substrate is immersed in a tank filled with a developer for a certain period of time (a dip method), a method in which development is performed by heaping a developer up onto the surface of a substrate by surface tension, and then leaving it to stand for a certain period of time (a puddle method), a method in which a developer is sprayed on the surface of a substrate (a spray method), and a method in which a developer is continuously jetted onto a substrate rotating at a constant rate while scanning a developer jetting nozzle at a constant rate (a dynamic dispense method).

In addition, after the step of performing development, a step of stopping the development may be carried out while substituting the solvent with another solvent.

A developing time is not particularly limited as long as it is a period of time where the unexposed area of a resin is sufficiently dissolved, and is preferably 10 to 300 seconds, and more preferably 20 to 120 seconds.

The temperature of the developer is preferably 0° C. to 50° C., and more preferably 15° C. to 35° C.

As the alkali developer, it is preferable to use an aqueous alkali solution including an alkali. The type of the aqueous alkali solution is not particularly limited, but examples thereof include an aqueous alkali solution including a quaternary ammonium salt typified by tetramethylammonium hydroxide, an inorganic alkali, a primary amine, a secondary amine, a tertiary amine, an alcoholamine, a cyclic amine, or the like. Among those, the aqueous solutions of the quaternary ammonium salts typified by tetramethylammonium hydroxide (TMAH) are preferable as the alkali developer. An appropriate amount of an alcohol, a surfactant, or the like may be added to the alkali developer. The alkali concentration of the alkali developer is usually 0.1% to 20% by mass. Furthermore, the pH of the alkali developer is usually 10.0 to 15.0.

The organic developer is preferably a developer containing at least one organic solvent selected from the group consisting of a ketone-based solvent, an ester-based solvent, an alcohol-based solvent, an amide-based solvent, an ether-based solvent, and a hydrocarbon-based solvent.

<Other Steps>

It is preferable that the pattern forming method includes a step of performing washing using a rinsing liquid after the step 3.

Examples of the rinsing liquid used in the rinsing step after the step of performing development using an alkali developer include pure water. Furthermore, an appropriate amount of a surfactant may be added to pure water.

An appropriate amount of a surfactant may be added to the rinsing liquid.

The rinsing liquid used in the rinsing step after the developing step with an organic developer is not particularly limited as long as the rinsing liquid does not dissolve the pattern, and a solution including a common organic solvent can be used. As the rinsing liquid, a rinsing liquid containing at least one organic solvent selected from the group consisting of a hydrocarbon-based solvent, a ketone-based solvent, an ester-based solvent, an alcohol-based solvent, an amide-based solvent, and an ether-based solvent is preferably used.

Examples of the hydrocarbon-based solvent, the ketone-based solvent, the ester-based solvent, the alcohol-based solvent, the amide-based solvent, and the ether-based solvent include the same as those described for the developer including an organic solvent.

A method for the rinsing step is not particularly limited, and examples thereof include a method in which a rinsing liquid is continuously jetted on a substrate rotated at a constant rate (a rotation application method), a method in which a substrate is dipped in a tank filled with a rinsing liquid for a certain period of time (a dip method), and a method in which a rinsing liquid is sprayed on a substrate surface (a spray method).

Furthermore, the pattern forming method of the embodiment of the present invention may include a heating step (post bake) after the rinsing step. By the present step, the developer and the rinsing liquid remaining between and inside the patterns are removed by baking. In addition, the present step also has an effect that a resist pattern is annealed and the surface roughness of the pattern is improved. The heating step after the rinsing step is usually performed at 40° C. to 250° C. (preferably 90° C. to 200° C.) for usually 10 seconds to 3 minutes (preferably 30 seconds to 120 seconds).

In addition, an etching treatment on the substrate may be carried out using a pattern thus formed as a mask. That is, the substrate (or the underlayer film and the substrate) may be processed using the pattern thus formed in the step 3 as a mask to form a pattern on the substrate.

A method for processing the substrate (or the underlayer film and the substrate) is not particularly limited, but a method in which a pattern is formed on a substrate by subjecting the substrate (or the underlayer film and the substrate) to dry etching using the pattern thus formed in the step 3 as a mask is preferable.

The dry etching may be one-stage etching or multi-stage etching. In a case where the etching is etching including a plurality of stages, the etchings at the respective stages may be the same treatment or different treatments.

For etching, any of known methods can be used, and various conditions and the like are appropriately determined according to the type of a substrate, usage, and the like. Etching can be carried out, for example, in accordance with Journal of The International Society for Optical Engineering (Proc. of SPIE), Vol. 6924, 692420 (2008), JP2009-267112A, and the like. In addition, the etching can also be carried out in accordance with the method described in "Chapter 4 Etching" in "Semiconductor Process Text Book, 4th Ed., published in 2007, publisher: SEMI Japan".

Among those, oxygen plasma etching is preferable as the dry etching.

It is preferable that various materials (for example, a solvent, a developer, a rinsing liquid, a composition for forming an antireflection film, and a composition for forming a topcoat) used in the resist composition and the pattern forming method of the embodiment of the present invention do not include impurities such as metals. The content of the impurities included in these materials is preferably 1 ppm by mass or less, more preferably 10 ppb by mass or less, still more preferably 100 ppt by mass or less, particularly preferably 10 ppt by mass or less, and most preferably 1 ppt by mass or less. Here, examples of the metal impurities include Na, K, Ca, Fe, Cu, Mg, Al, Li, Cr, Ni, Sn, Ag, As, Au, Ba, Cd, Co, Pb, Ti, V, W, and Zn.

Examples of a method for removing impurities such as metals from the various materials include filtration using a filter. Details of filtration using a filter are described in paragraph [0321] of WO2020/004306.

In addition, examples of a method for reducing impurities such as metals included in various materials include a method of selecting raw materials having a low content of metals as raw materials constituting various materials, a method of subjecting raw materials constituting various materials to filter filtration, and a method of performing distillation under the condition for suppressing the contamination as much as possible by, for example, lining the inside of a device with TEFLON (registered trademark).

In addition to the filter filtration, removal of impurities by an adsorbing material may be performed, or a combination of filter filtration and an adsorbing material may be used. As the adsorbing material, known adsorbing materials may be used, and for example, inorganic adsorbing materials such as silica gel and zeolite, and organic adsorbing materials such as activated carbon can be used. It is necessary to prevent the incorporation of impurities such as metals in the production process in order to reduce the metal impurities included in the various materials. Sufficient removal of metal impurities from a production device can be confirmed by measuring a content of metal components included in a cleaning liquid used to wash the production device. The content of the metal components included in the cleaning liquid after the use is preferably 100 parts per trillion (ppt) by mass or less, more preferably 10 ppt by mass or less, and still more preferably 1 ppt by mass or less.

A conductive compound may be added to an organic treatment liquid such as a rinsing liquid in order to prevent breakdown of chemical liquid pipes and various parts (a filter, an O-ring, a tube, and the like) due to electrostatic charging, and subsequently generated electrostatic discharging. The conductive compound is not particularly limited, but examples thereof include methanol. The addition amount is not particularly limited, but from the viewpoint that preferred development characteristics or rinsing characteristics are maintained, the addition amount is preferably 10% by mass or less, and more preferably 5% by mass or less.

For members of the chemical liquid pipe, for example, various pipes coated with stainless steel (SUS), or a polyethylene, polypropylene, or fluorine resin (a polytetrafluoroethylene or perfluoroalkoxy resin, or the like) that has been subjected to an antistatic treatment can be used. In the same manner, for the filter or the O-ring, polyethylene, polypropylene, or a fluorine resin (a polytetrafluoroethylene or perfluoroalkoxy resin, or the like) that has been subjected to an antistatic treatment can be used.

A method for improving the surface roughness of a pattern may be applied to a pattern formed by the method of the embodiment of the present invention. Examples of the method for improving the surface roughness of the pattern include the method of treating a pattern by a plasma of a hydrogen-containing gas disclosed in WO2014/002808A. Additional examples of the method include known methods as described in JP2004-235468A, US2010/0020297A, JP2008-83384A, and Proc. of SPIE Vol. 8328 83280N-1 "EUV Resist Curing Technique for LWR Reduction and Etch Selectivity Enhancement".

In a case where a pattern formed is in the form of a line, an aspect ratio determined by dividing the height of the pattern by the line width is preferably 2.5 or less, more preferably 2.1 or less, and still more preferably 1.7 or less.

In a case where a pattern formed is in the form of a trench (groove) pattern or a contact hole pattern, an aspect ratio determined by dividing the height of the pattern by the trench width or the hole diameter is preferably 4.0 or less, more preferably 3.5 or less, and still more preferably 3.0 or less.

The pattern forming method of the embodiment of the present invention can also be used for forming a guide pattern in a directed self-assembly (DSA) (see, for example, ACS Nano Vol. 4, No. 8, Pages 4815-4823).

In addition, a pattern formed by the method can be used as a core material (core) of the spacer process disclosed in, for example, JP1991-270227A (JP-H03-270227A) and JP2013-164509A.

[Method for Producing Specific Compound]

A method for producing the specific compound is not particularly limited, but a method having a step of reacting a compound having at least one cation represented by General Formula (4) with a compound represented by General Formula (5) in a presence of a basic compound to produce the specific compound.

Hereinbelow, first, the materials to be used in the production method will be described in detail, and then the procedure of the production method will be described in detail.

<Compound Having Cation Represented by General Formula (4)>

A compound having at least one cation represented by General Formula (4) is used in the method for producing the specific compound.

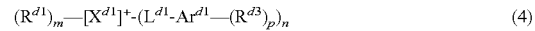

$(R^{d1})_m$—$[X^{d1}]^+$-$(L^{d1}$-$Ar^{d1}$—$(R^{d3})_p)_n$ (4)

In General Formula (4), the definitions of $X^{d1}$, $R^{d1}$, $L^{d1}$, $Ar^{d1}$, n, m, and p are the same as the definitions of $X^{d1}$, $R^{d1}$, $L^{d1}$, $Ar^{d1}$, n, m, and p in General Formula (1) mentioned above, respectively.

$R^{d3}$ represents a halogen atom.

Examples of the halogen atom represented by $R^{d3}$ include a fluorine atom, a chlorine atom, a bromine atom, and an iodine atom. Among those, the fluorine atom is preferable as $R^{d3}$ from the viewpoint that the effect of the present invention is more excellent.

As the compound having at least one cation represented by General Formula (4), a compound represented by General Formula (4-1) or a compound represented by General Formula (4-2) is preferable.

$$Z_p^+ Y_1^-$$ General Formula (4-1)

In General Formula (4-1), $Z_p^+$ represents a cation represented by General Formula (4).

$Y_1^-$ represents a monovalent organic anion. The monovalent organic anion is intended to be a monovalent organic anion among the above-mentioned organic anions.

$$L{\text{-}}(Y_2^- Z_p^+)_q \qquad (4\text{-}2)$$

In General Formula (4-2), $Z_p^+$ represents a cation, and at least one of $Z_p^+$'s represents a cation represented by General Formula (4). Cations other than the cation represented by General Formula (4) are not particularly limited, and examples thereof include known sulfonium cations and iodonium cations.

$Y_2^-$ represents an anionic functional group. The definition of the anionic functional group is as described above.

L represents a q-valent linking group. q represents an integer of 2 or more. The definitions of L and q are the same as those of L and q in General Formula (3), respectively.

The compound represented by General Formula (4) is preferably a compound represented by General Formula (U-1).

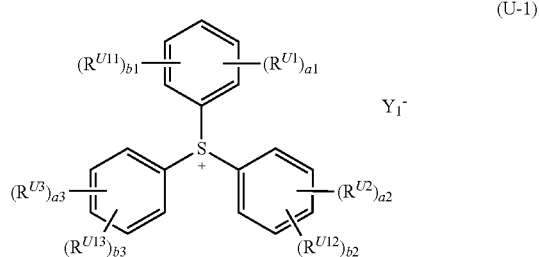

In General Formula (U-1), $Y_1^-$ represents a monovalent organic anion. The monovalent organic anion is intended to be a monovalent organic anion among the above-mentioned organic anions.

$R^{U1}$ to $R^{U3}$ each independently represent a halogen atom.

$R^{U11}$ to $R^{U13}$ each independently represent an organic group.

$R^{U11}$ to $R^{U13}$ have the same definitions as those of $R^{b1}$ to $R^{b3}$ in General Formula (S-1).

a1 to a3 and b1 to b3 in General Formula (U-1) have the same definitions as those of a1 to a3 and b1 to b3 in General Formula (S-1), respectively.

<Compound Represented by General Formula (5)>

In the method for producing the specific compound, a compound represented by General Formula (5) is used.

$$HS\text{—}X^{d2}$$ General Formula (5)

In General Formula (5), $X^{d2}$ represents the group represented by General Formula (1-1) or a leaving group that leaves by the action of an acid.

$$*\text{-}L^{d2}\text{-}R^{d2}$$ Formula (1-1)

In Formula (1-1), $L^{d2}$ represents a single bond or a divalent linking group. $R^{d2}$ represents a group having a polarity that increases through decomposition by the action of an acid. * represents a bonding position.

The definitions of $X^{d2}$ in General Formula (5), and $L^{d2}$ and $R^{d2}$ in General Formula (1-1) are as described above.

<Basic Compound>

A basic compound is used in the method for producing the specific compound.

The basic compound may be an organic compound or an inorganic compound.

Examples of the basic compound include organic metal compounds such as primary to quaternary amine compounds, metal salts, and alkoxy metal compounds. In addition, as the basic compound, a basic compound that serves as an acid diffusion control agent can also be used. Among those, the basic compound is preferably a carbonate or a hydroxide of an alkali metal or an alkaline earth metal.

Examples of the organic compound include amine compounds such as methylamine, dimethylamine, trimethylamine, ethylamine, diethylamine, triethylamine, ethylenediamine, monoethanolamine, N-(β-aminoethyl)ethanolamine, hexamethylenediamine, diethylenetriamine, and triethylenetetramine, and derivatives thereof; piperazine compounds such as piperazine anhydride, piperazine hexahydrate, 1-(2-aminoethyl) piperazine, and N-methylpiperazine, and derivatives thereof; pyridine compounds and derivatives thereof; an azole compounds such as imidazole and triazole, and derivatives thereof; ammonium compounds such as tetramethylammonium hydroxide, tetraethylammonium hydroxide, and tetrabutylammonium hydroxide, and derivatives thereof; guanidine.

Examples of the inorganic compounds include carbonates of alkali metals, such as sodium carbonate and potassium carbonate; carbonates of alkaline earth metals, such as calcium carbonate and magnesium carbonate; hydroxides of alkali metals such as sodium hydroxide and potassium hydroxide; hydroxides of alkaline earth metals, such as calcium hydroxide and magnesium hydroxide; hydrides of alkali metals, such as lithium hydride and sodium hydride; hydrides of alkaline earth metals, such as magnesium hydride and calcium hydride.

The basic compound may be used alone or in combination of two or more kinds thereof <Solvent>

A solvent may be used in the method for producing the specific compound.

The solvent is not particularly limited as long as it dissolves materials used. As the solvent, the solvent included in the above-mentioned resist composition can also be used.

The solvent may be an organic solvent or an aqueous solvent.

Examples of the solvent include alcohol-based solvents such as methanol and ethanol; alkane-based solvents such as hexane, cyclohexane, and heptane; ketone-based solvents such as cyclohexanone and methyl-2-n-amyl ketone; ether-based solvents such as propylene glycol monomethyl ether, ethylene glycol monomethyl ether, and diethylene glycol dimethyl ether; ester-based solvents such as ethyl acetate, butyl acetate, and acetate; and lactone-based solvents such as γ-butyrolactone.

Among those, as the solvent A, the alcohol-based solvents such as methanol and ethanol is preferable, and methanol or ethanol is more preferable.

The solvent may be used singly or in combination of two or more kinds thereof

<Procedure>

The procedure of the production method is not particularly limited as long as the compound represented by General Formula (4) can be reacted with the compound represented by General Formula (5) in the presence of a basic compound.

For example, the compound represented by General Formula (4) and the compound represented by General Formula (5) may be added to a reaction system in which the basic compound is present, and reacted.

The ratio of the amount of the compound represented by General Formula (5) to the amount of the compound represented by General Formula (4) used (the amount of the compound represented by General Formula (5)/the amount of the compound represented by General Formula (4)) is not particularly limited, and from the viewpoint that the yield of the specific compound is excellent, the ratio is preferably 3.0 to 1.0, and more preferably 2.0 to 1.0.

The ratio of the amount of the basic compound used to the amount of the compound represented by General Formula (5) (the amount of the basic compound used/the amount of the compound represented by General Formula (5) used) is not particularly limited, and from the viewpoint that the yield of the specific compound is excellent, the ratio is preferably 5.0 to 1.0, and more preferably 3.0 to 1.0.

The reaction temperature is not particularly limited, but is preferably −50° C. to 100° C., more preferably −30° C. to 50° C., and still more preferably −10° C. to 10° C.

The reaction time is not particularly limited, but is preferably 1 minute to 24 hours, and more preferably 10 minutes to 1 hour.

Moreover, the present invention further relates to a method for manufacturing an electronic device, including the pattern forming method, and an electronic device manufactured by the manufacturing method.

The electronic device of an embodiment of the present invention is suitably mounted on electric and electronic equipment (for example, home appliances, office automation (OA), media-related equipment, optical equipment, telecommunication equipment, and the like).

EXAMPLES

Hereinbelow, the present invention will be described in more detail with reference to Examples. The materials, the amounts of materials used, the proportions, the treatment details, the treatment procedure, and the like shown in Examples below may be modified as appropriate as long as the modifications do not depart from the spirit of the present invention. Therefore, the scope of the present invention should not be construed as being limited to Examples shown below.

[Production of Resist Composition (Actinic Ray-Sensitive or Radiation-Sensitive Resin Composition)]

The components included in the resist composition used in Examples or Comparative Examples, and the production procedure are shown below.

<Specific Compound>

Synthesis Example 1: Synthesis of Compound B-1

A compound B-1 was synthesized according to the following scheme.

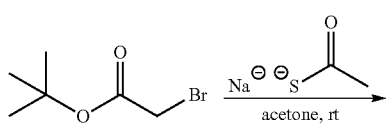

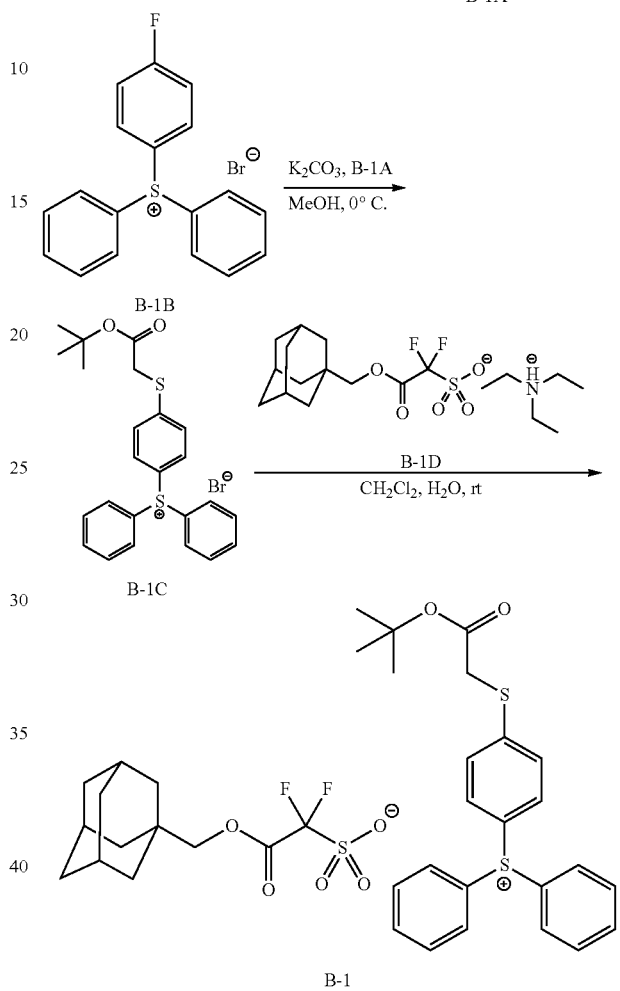

tert-Butyl bromoacetate (25 g) and acetone (125 g) were added to a three-necked flask, sodium thioacetate (17.5 g) was added to the three-necked flask, and the obtained solution was stirred at room temperature for 2 hours. Then, water (100 ml) and ethyl acetate (150 g) were added to the obtained solution, the organic phase was separated, and the obtained organic phase was washed successively with water (100 g) and a saturated aqueous sodium chloride solution (100 g). Then, the organic phase was concentrated to obtain 23 g of a desired compound B-1A.

$^1$H-NMR, 400 MHz, δ (CDCl$_3$) ppm: 1.46 (9H, s), 3.62 (3H, s)

A compound B-1B was synthesized with reference to the following papers.

Imazeki, Shigeaki; Sumino, Motoshige; Fukasawa, Kazuhito; Ishihara, Masami; Akiyama, Takahiko [Synthesis, 2004, #10, p. 1648-1654

The compound B-1A (4.0 g), methanol (50 g), and potassium carbonate (12.3 g) were added to a three-necked flask, and the obtained solution was stirred at 0° C. for 30 minutes. Then, 4-fluorophenyldiphenylsulfonium bromide (a compound B-1B, 7.6 g) was added to the obtained solution, and the obtained solution was further stirred at 0° C. for 30 minutes. Then, water (100 g) and dichloromethane (150 g) were added to the obtained solution, and the organic phase was separated and washed successively with water (50 g) and a saturated aqueous sodium chloride solution (50 g). Then, the organic phase was concentrated to obtain a desired compound B-1C (9.2 g). The compound B-1C was used immediately in subsequent steps without further purification.

The compound B-1C (9.2 g), dichloromethane (50 g), and water (30 g) were added to a three-necked flask, and the obtained solution was stirred at room temperature for 30 minutes. Then, a compound B-1D (8.2 g) was added thereto, and the obtained solution was further stirred at 0° C. for 30 minutes. Then, the organic phase was separated and washed with 0.01 N hydrochloric acid water (50 g), and then the organic phase was washed five times with water (30 g). Then, a solid obtained by concentrating the organic phase was washed with diisopropyl ether (50 g) to obtain a desired compound B-1 (13.3 g).

$^1$H-NMR, 400 MHz, δ (CDCl$_3$) ppm: 1.40-2.05 (24H, m), 3.72 (2H, s), 4.80 (2H, t), 4.41 (2H, brt), 4.53 (2H, td), 7.1-7.83 (14H, m).

Synthesis Example 2: Synthesis of Compound B-12

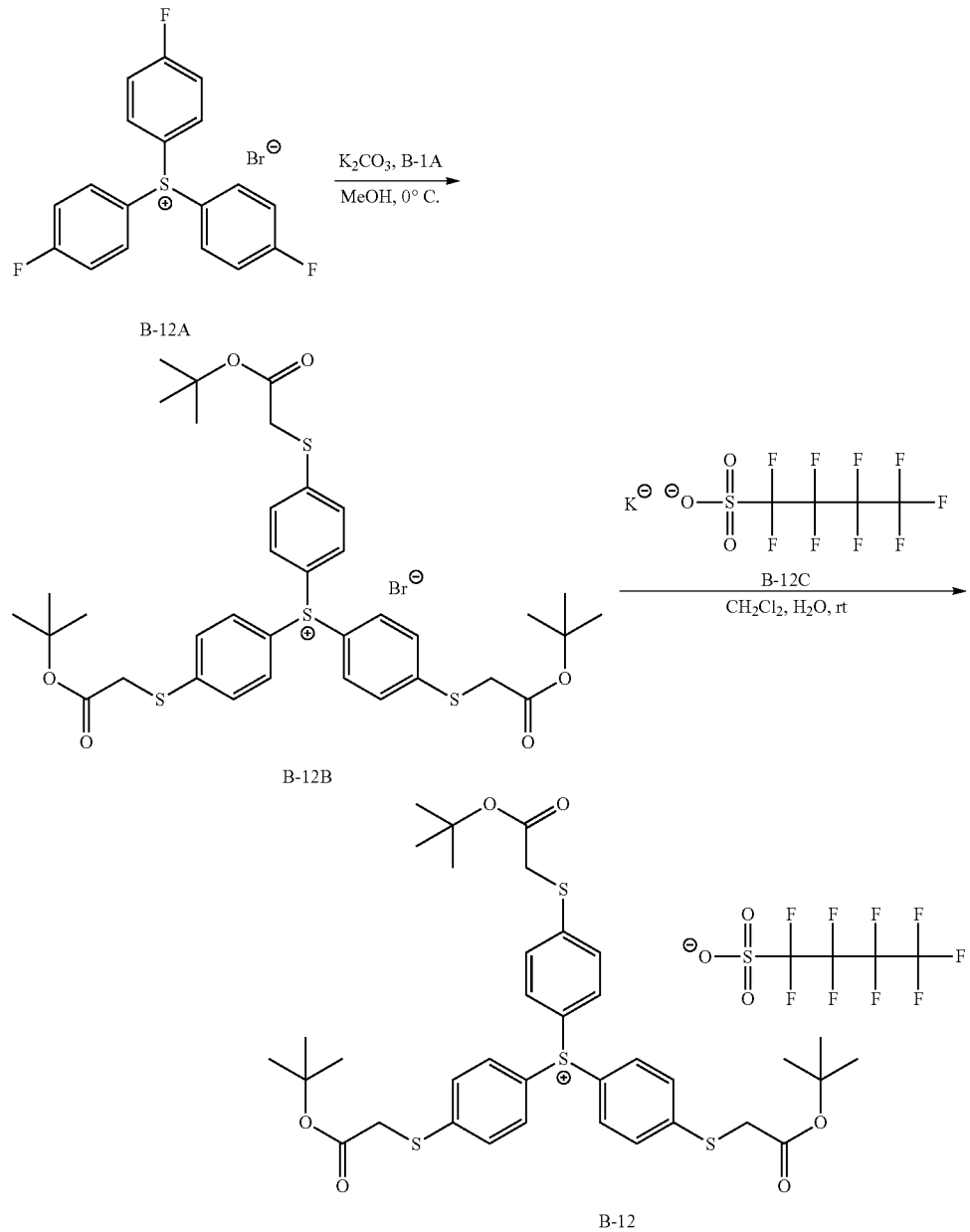

A compound B-12A was synthesized with reference to the following papers.

Imazeki, Shigeaki; Sumino, Motoshige; Fukasawa, Kazuhito; Ishihara, Masami; Akiyama, Takahiko [Synthesis, 2004, #10, p. 1648-1654.

The compound B-1A (15.3 g) and methanol (50 g) were added to a three-necked flask, stirring was started at 0° C., potassium carbonate (15.0 g) was added to the obtained solution, and the mixture was stirred for 30 minutes. Then, tris(4-fluorophenyl)sulfonium bromide (10 g, the compound B-12A) was added thereto, and the obtained solution was further stirred at 0° C. for 30 minutes. Water (100 ml) and chloroform (100 ml) were then added to the resulting solution, and the organic phase was separated and washed with water (100 g). Then, the organic phase was concentrated to obtain 18.3 g of a desired compound B-12B.

$^1$H-NMR, 400 MHz, δ (CDCl$_3$) ppm: 1.46 (27H, s), 3.68 (6H, s), 7.52 (6H, d), 7.76 (6H, d).

The compound B-12B (7.8 g), the compound B-12C (3.4 g), chloroform (50 g), and water (30 g) were added to a three-neck flask, and stirred at room temperature for 30 minutes. Then, the organic phase was separated and washed with 0.01 N hydrochloric acid water (30 g), and then the organic phase was washed five times with water (30 g). Then, a solid obtained by concentrating the organic phase was washed with 50 g of cyclopentylmethyl ether to obtain a desired compound B-12 (9.8 g).

$^1$H-NMR, 400 MHz, δ (CDCl$_3$) ppm: 1.43 (27H, s), 3.72 (6H, s), 7.48 (6H, d), 7.80 (6H, d).

Synthesis Example 3: Synthesis of Compound B-17

The compound B-12A (7.5 g), the compound B-17A (2.5 g), dichloromethane (100 g), and water (90 g) were added to a three-necked flask, and stirred at room temperature for 30 minutes. Then, the organic phase was separated and washed with 0.01 N hydrochloric acid water (50 g), and then the organic phase was washed five times with water (50 g). Then, a viscous liquid obtained by concentrating the organic phase was decant-washed with diisopropyl ether (50 g) to obtain a desired compound B-17 (8.7 g).

$^1$H-NMR, 400 MHz, δ (CDCl$_3$) ppm: 1.43 (81H, s), 3.69 (18H, s), 6.91 (2H, d), 7.49 (18H, d), 7.55 (18H, d), 7.86 (2H, d).

Another specific compound was synthesized by the same synthesis method as that for the specific compound B-1, B-12, or B-17.

An attempt was made to synthesize a comparative compound B-12A' according to the following scheme, but an intermediate B-12A" could not be isolated and purified, and a comparative compound B-12A' could not be synthesized.

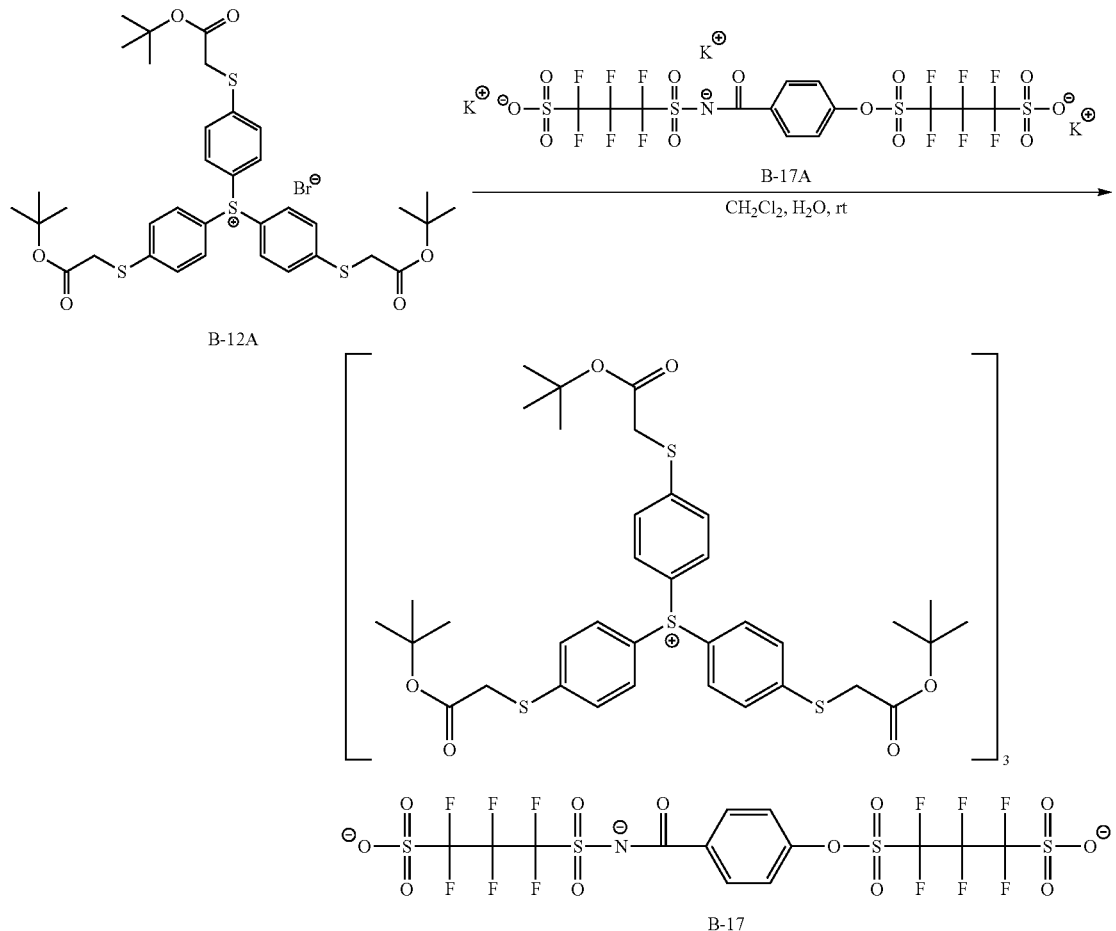

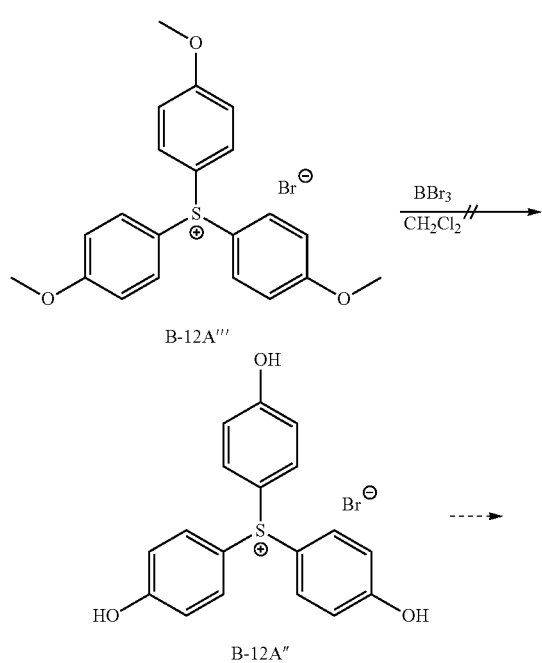
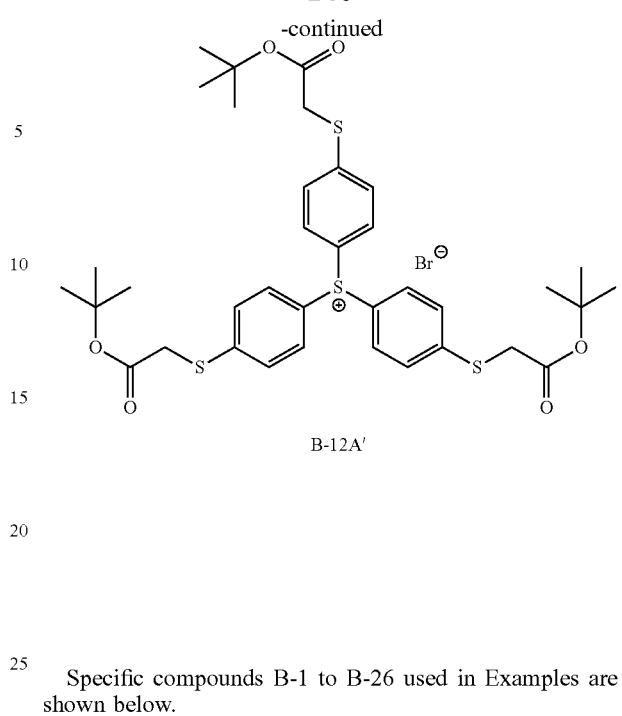
Specific compounds B-1 to B-26 used in Examples are shown below.
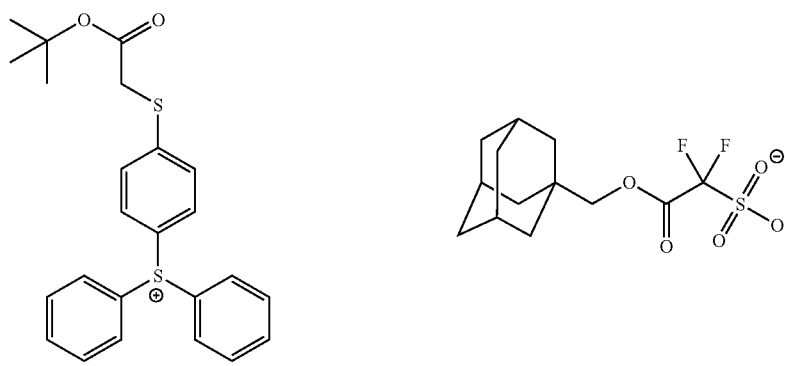
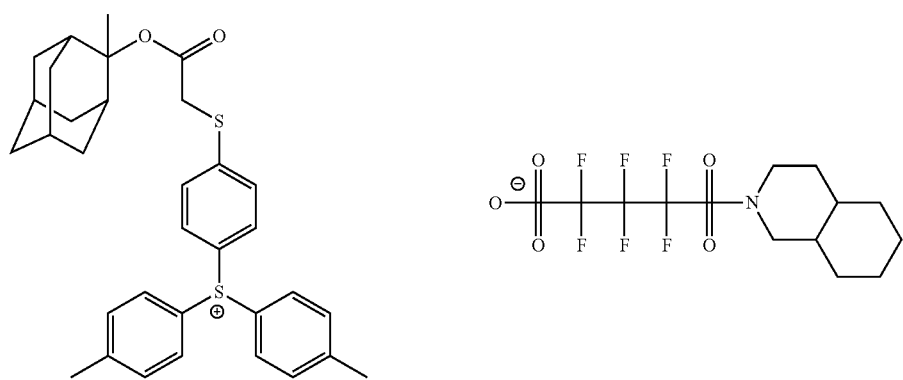

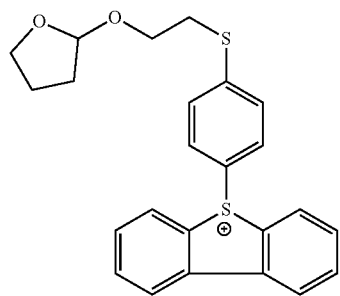
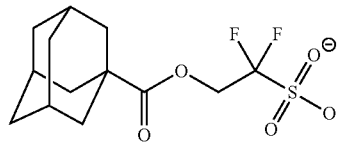
B-3
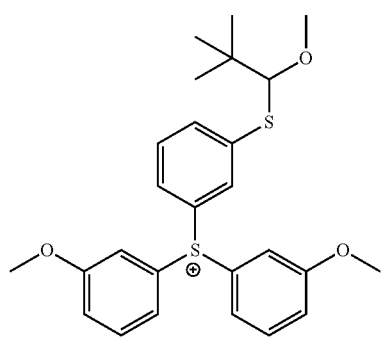
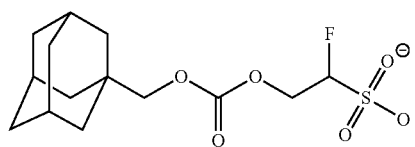
B-4
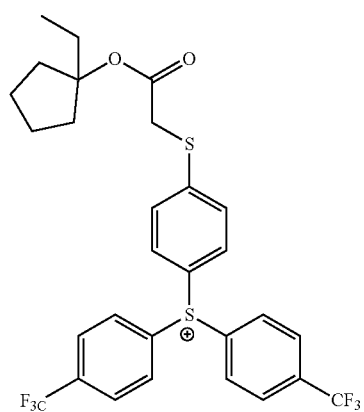
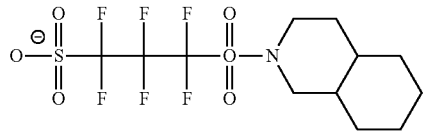
B-5
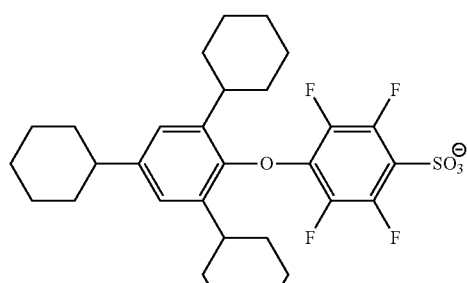
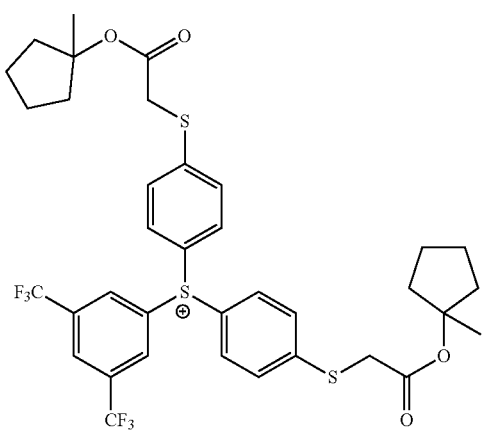
B-6

-continued
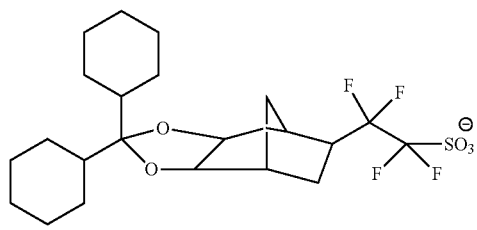
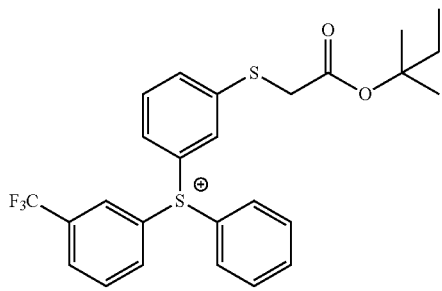
B-7
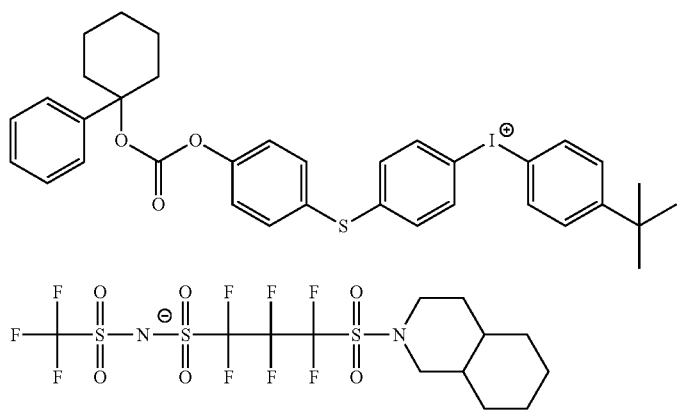
B-8
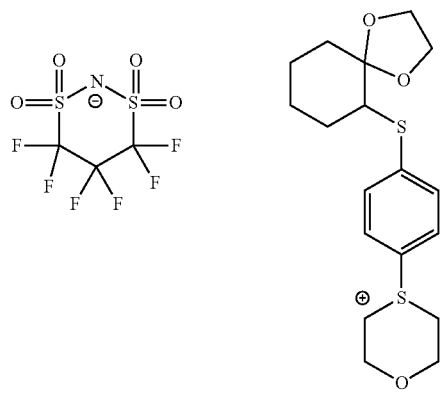
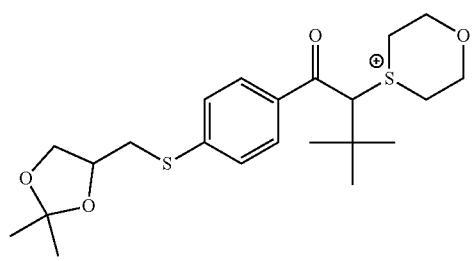
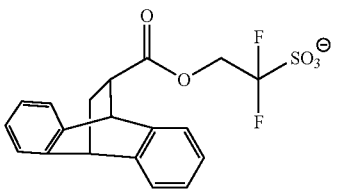
B-9
B-10

-continued
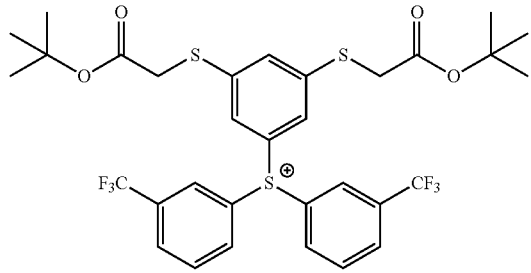
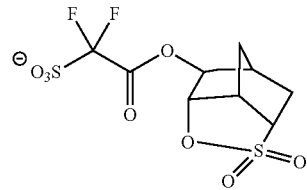
B-11
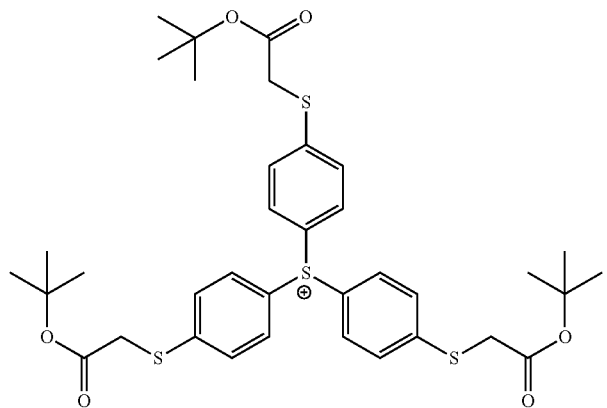
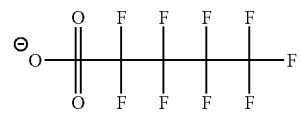
B-12
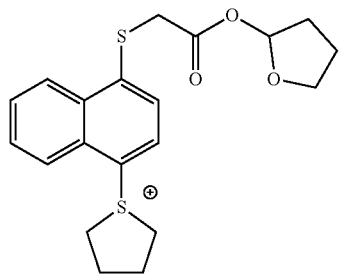
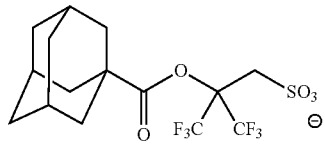
B-13
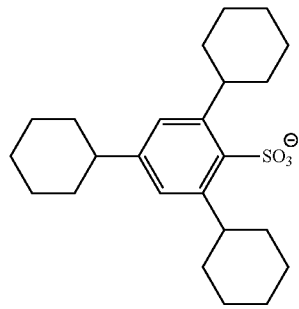
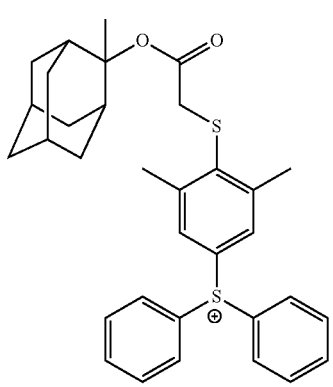
B-14

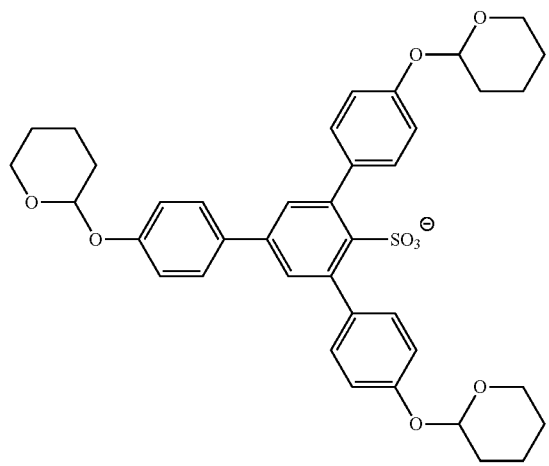
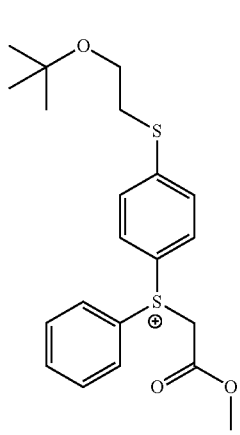
B-15
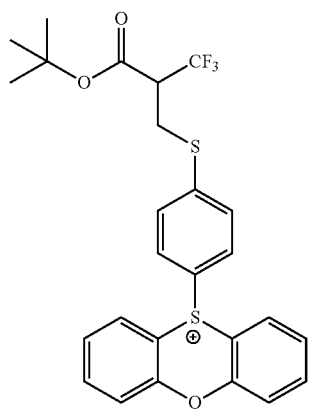
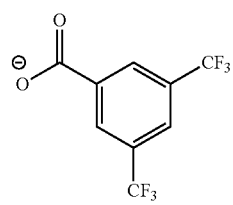
B-16
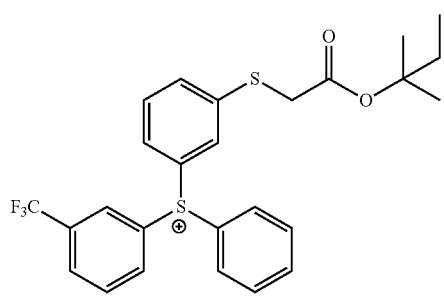
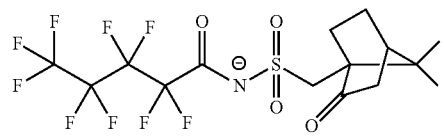
B-17
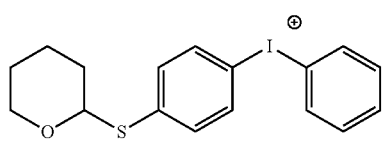
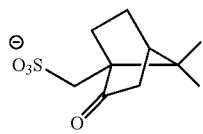
B-18

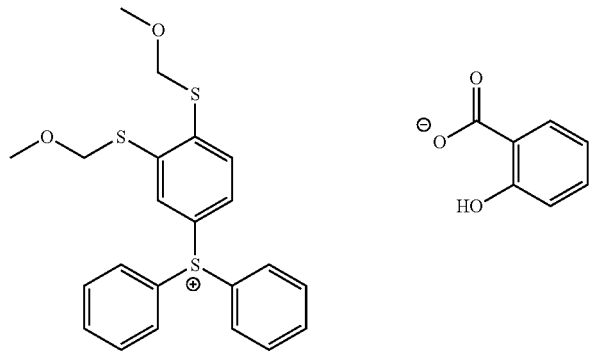
B-19
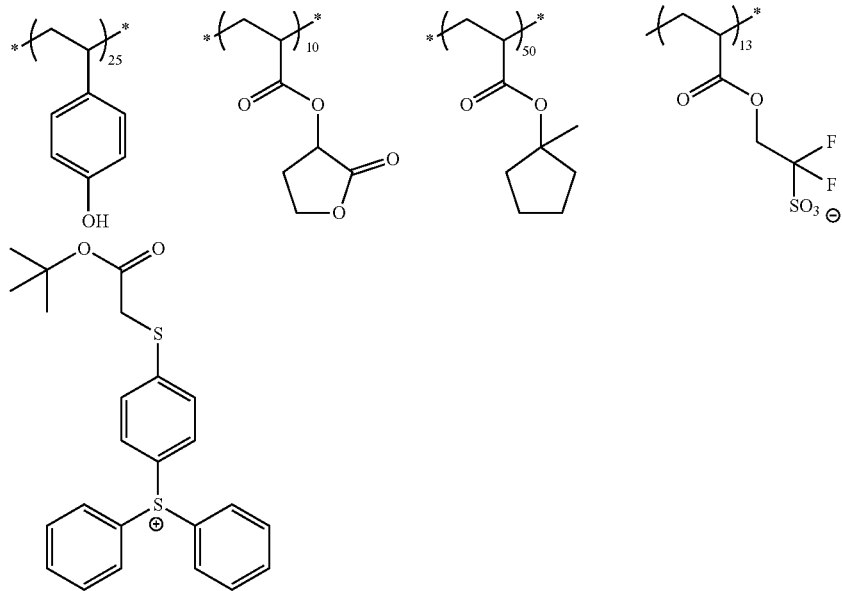
B-20
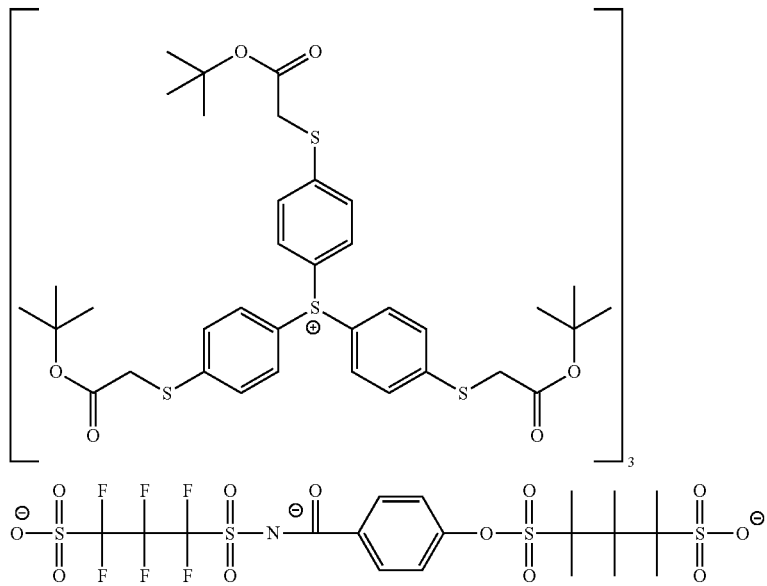
B-21

-continued
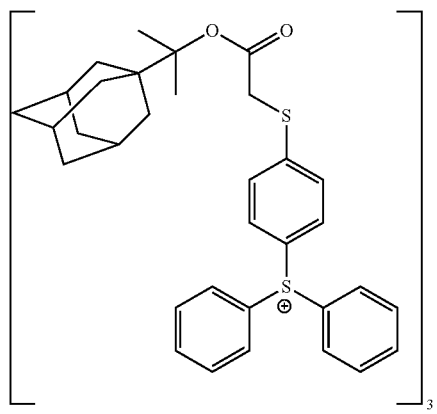
B-22
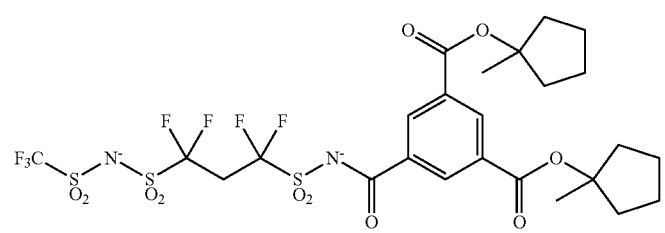
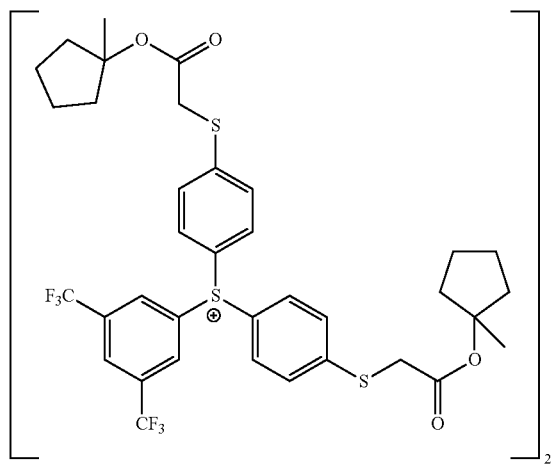
B-23
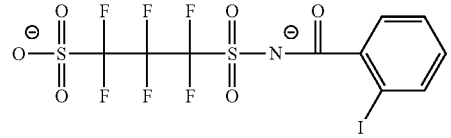
B-24
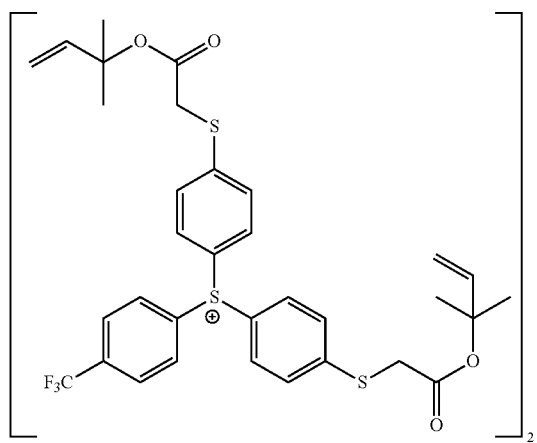
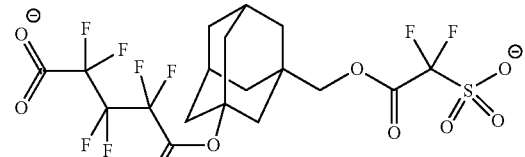

-continued

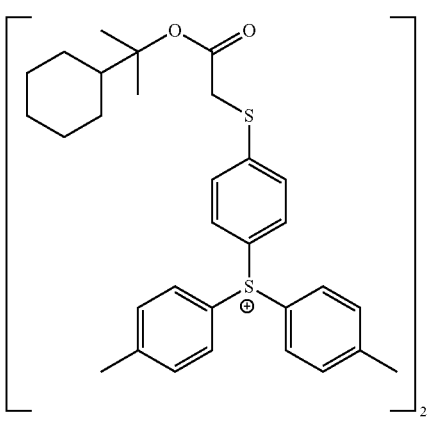
B-25

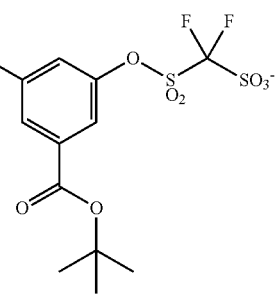

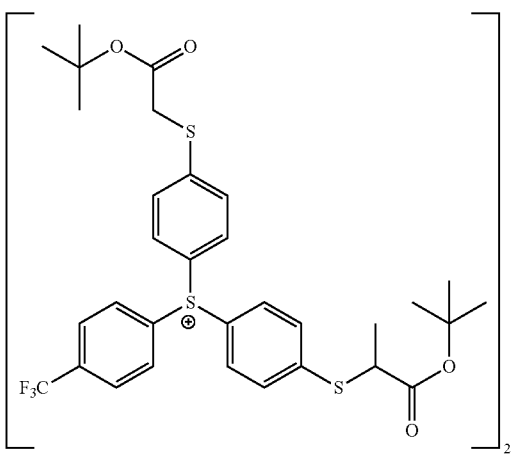
B-26

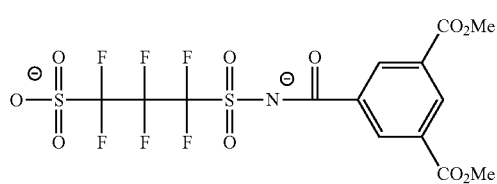

A comparative compound Z-1 is shown below.

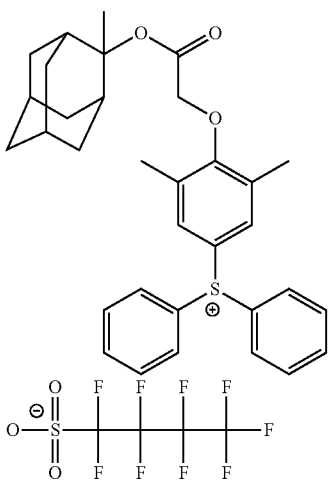

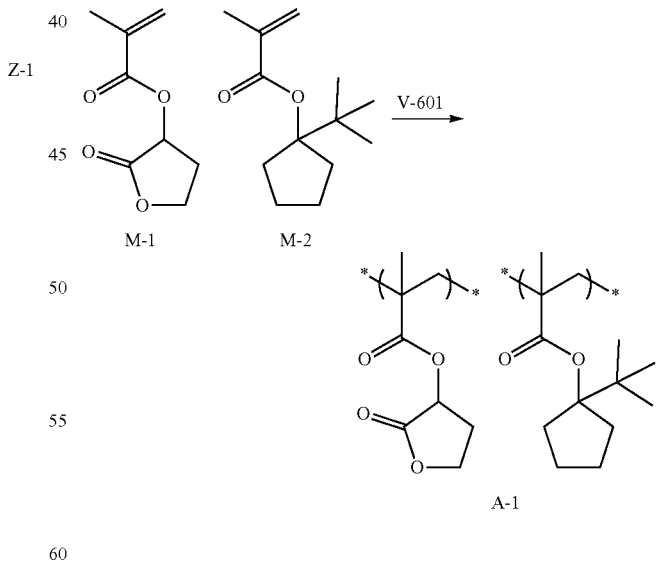

<Acid-Decomposable Resin (Resin (A))>

Synthesis Example 1: Synthesis of Resin A-1

A resin A-1 was synthesized according to the following scheme.

Cyclohexanone (113 g) was heated to 80° C. under a nitrogen stream. While stirring this liquid, a mixed solution of a monomer represented by Formula M-1 (25.5 g), a monomer represented by Formula M-2 (31.6 g), cyclohexanone (210 g), and dimethyl 2,2'-azobisisobutyrate [V-601, manufactured by FUJIFILM Wako Pure Chemical Corporation] (6.21 g) was added dropwise thereto over 6 hours to obtain a reaction solution. After completion of dropwise addition, the reaction solution was further stirred at 80° C. for 2 hours. The obtained reaction solution was cooled, then reprecipitated with a large amount of methanol/water (mass ratio: 9:1), and filtered, and the obtained solid was vacuum-dried to obtain 52 g of a resin A-1.

Resins A-2 to A-30 were synthesized with reference to the method for synthesizing the resin A-1.

The compositional ratio (molar ratio; corresponding in order from the left) of the respective repeating units shown below, the weight-average molecular weight (Mw), and the dispersity (Mw/Mn) are shown in Table 1.

Furthermore, the weight-average molecular weight (Mw) and the dispersity (Mw/Mn) of the resins A-1 to A-30 were measured by GPC (carrier: tetrahydrofuran (THF)) (an amount expressed in terms of polystyrene). In addition, the compositional ratio (ratio based on % by mole) of the resin was measured by $^{13}C$-nuclear magnetic resonance (NMR).

TABLE 1

|  | Molar ratio of repeating unit |  |  |  | Mw | Mw/Mn |
|---|---|---|---|---|---|---|
| Resin A-1 | 50 | 50 | — | — | 6,500 | 1.52 |
| Resin A-2 | 45 | 55 | — | — | 8,300 | 1.65 |
| Resin A-3 | 40 | 30 | 30 | — | 7,800 | 1.55 |
| Resin A-4 | 40 | 50 | 10 | — | 12,000 | 1.68 |
| Resin A-5 | 50 | 50 | — | — | 5,500 | 1.49 |

TABLE 1-continued

|  | Molar ratio of repeating unit |  |  |  | Mw | Mw/Mn |
|---|---|---|---|---|---|---|
| Resin A-6 | 25 | 30 | 30 | 15 | 8,600 | 1.63 |
| Resin A-7 | 40 | 10 | 30 | 20 | 9,600 | 1.72 |
| Resin A-8 | 40 | 5 | 55 | — | 10,200 | 1.64 |
| Resin A-9 | 30 | 20 | 40 | 10 | 7,500 | 1.54 |
| Resin A-10 | 40 | 10 | 40 | 10 | 7,000 | 1.61 |
| Resin A-11 | 40 | 10 | 10 | 40 | 6,500 | 1.63 |
| Resin A-12 | 40 | 30 | 30 | — | 5,900 | 1.59 |
| Resin A-13 | 10 | 30 | 60 | — | 5,200 | 1.53 |
| Resin A-14 | 25 | 15 | 60 | — | 6,200 | 1.48 |
| Resin A-15 | 50 | 50 | — | — | 7,000 | 1.73 |
| Resin A-16 | 30 | 10 | 60 | — | 11,500 | 1.56 |
| Resin A-17 | 35 | 10 | 55 | — | 8,400 | 1.58 |
| Resin A-18 | 40 | 10 | 50 | — | 9,200 | 1.66 |
| Resin A-19 | 25 | 25 | 50 | — | 5,700 | 1.75 |
| Resin A-20 | 30 | 20 | 50 | — | 15,000 | 1.64 |
| Resin A-21 | 40 | 20 | 40 | — | 7,600 | 1.56 |
| Resin A-22 | 50 | 50 | — | — | 7,200 | 1.23 |
| Resin A-23 | 20 | 10 | 20 | 50 | 8,000 | 1.58 |
| Resin A-24 | 25 | 25 | 50 | — | 9,000 | 1.64 |
| Resin A-25 | 40 | 10 | 50 | — | 8,400 | 1.58 |
| Resin A-26 | 45 | 55 | — | — | 7,000 | 1.73 |
| Resin A-27 | 30 | 70 | — | — | 8,000 | 1.48 |
| Resin A-28 | 55 | 45 | — | — | 6,500 | 1.56 |
| Resin A-29 | 40 | 60 | — | — | 6,000 | 1.55 |
| Resin A-30 | 20 | 30 | 50 | — | 5,000 | 1.64 |

Resins A-1 to A-30 are shown below. * represents a bonding position.

A-1

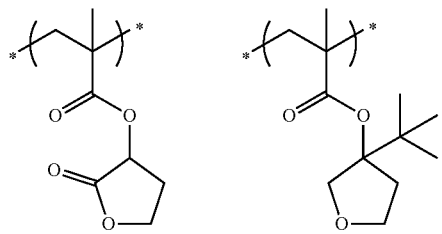

A-2

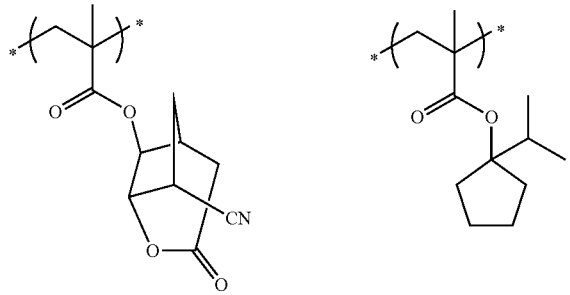

A-3

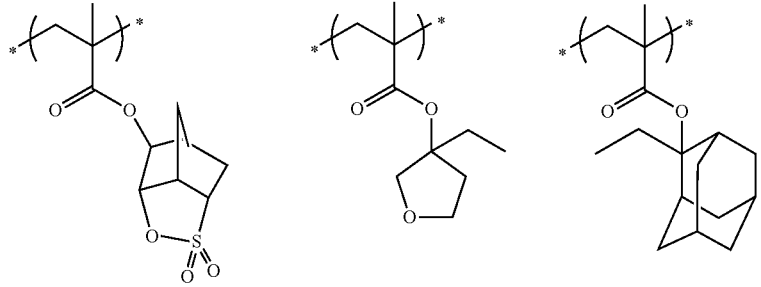

-continued
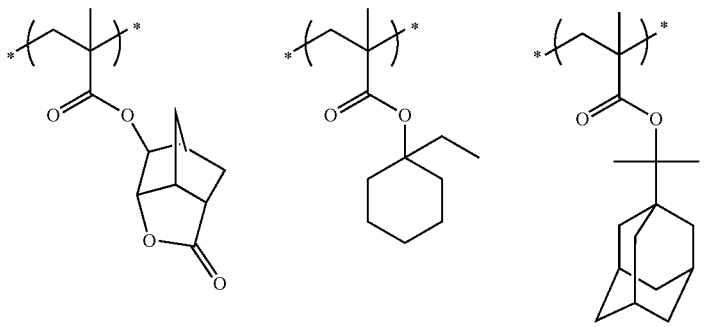
A-4
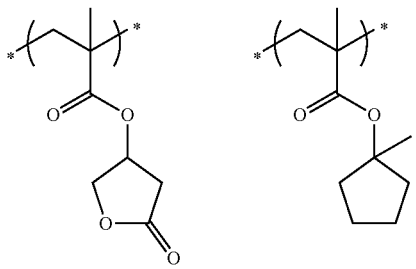
A-5
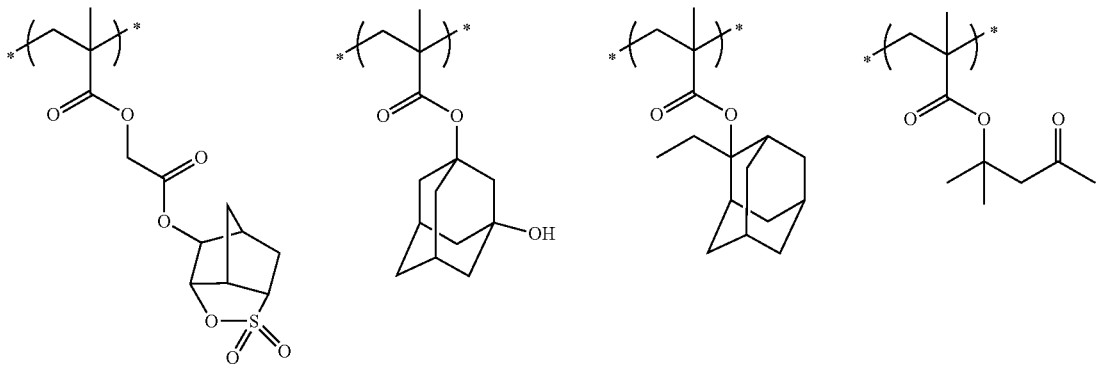
A-6
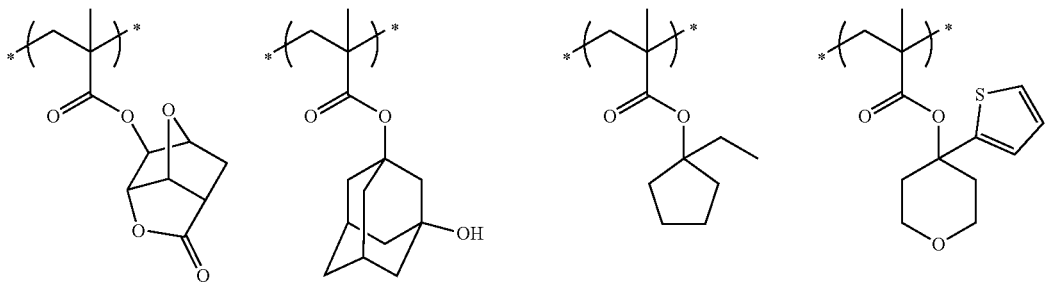
A-7
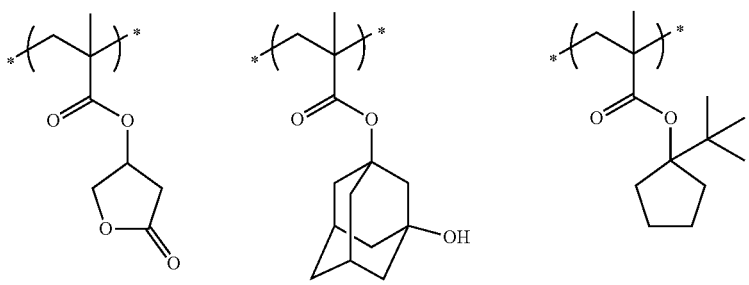
A-8

-continued
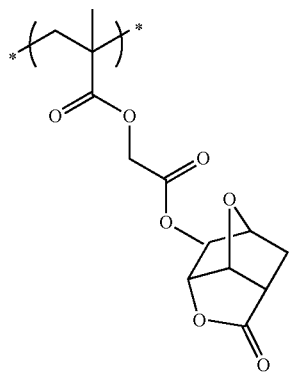 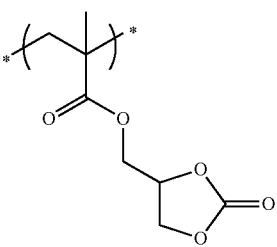 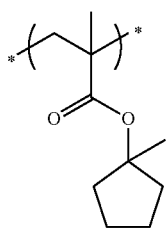 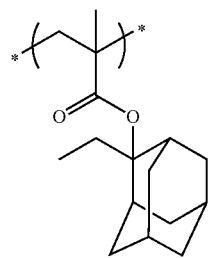
A-9
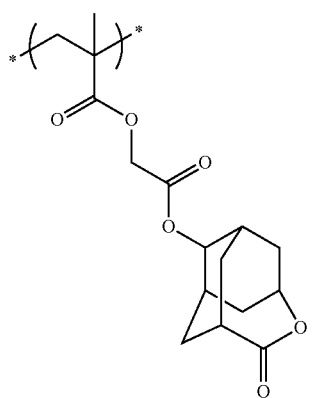 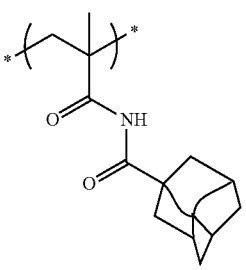 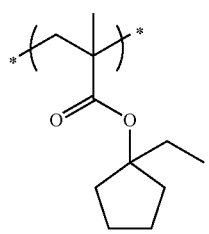 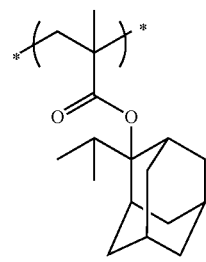
A-10
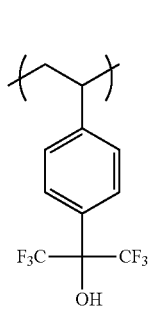 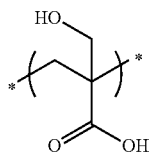 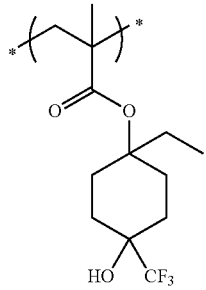 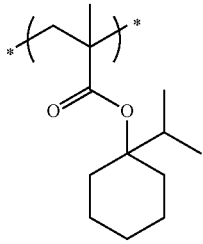
A-11
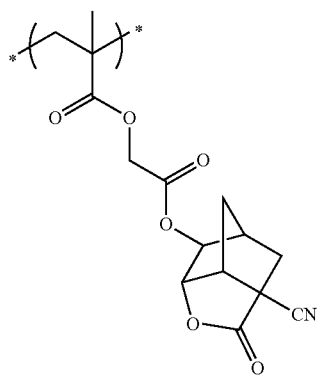 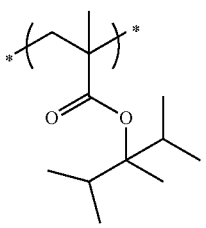 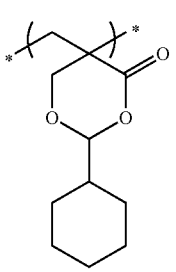
A-12

A-13
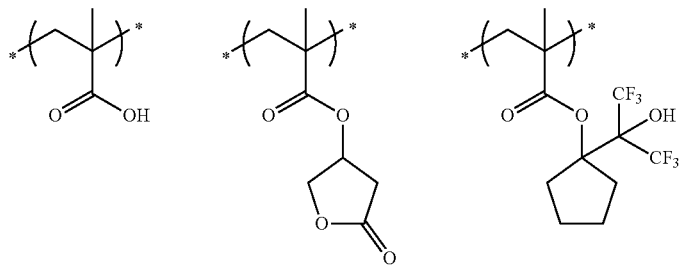
A-14
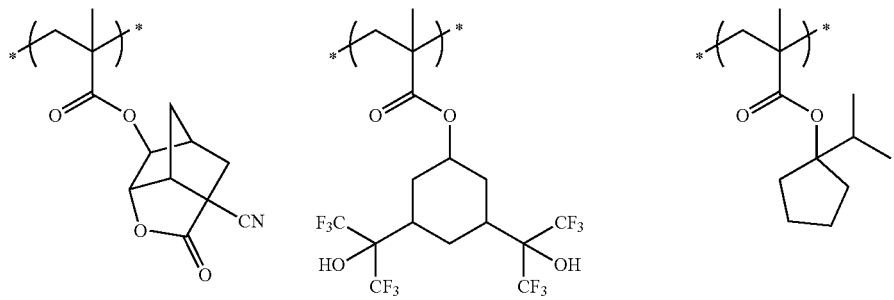
A-15
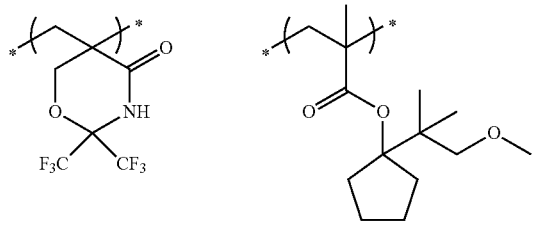
A-16
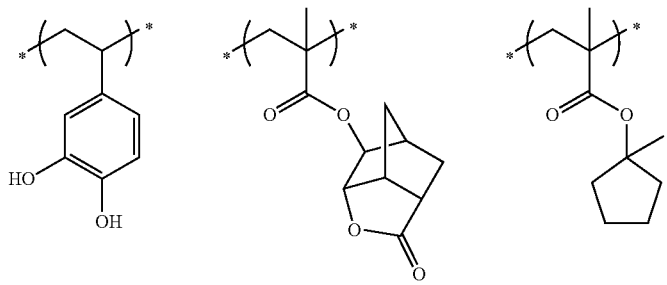
A-17
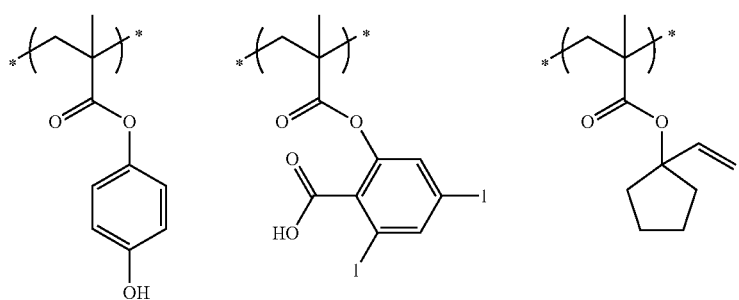

-continued
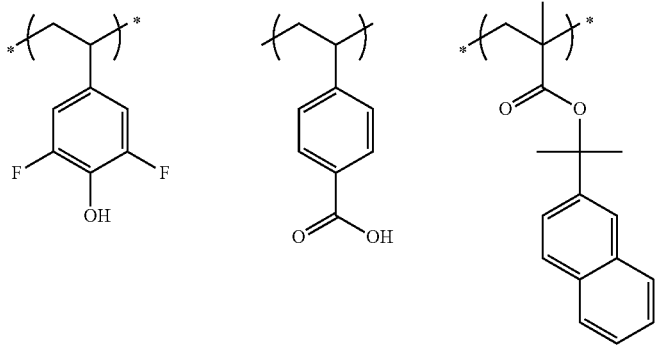
A-18
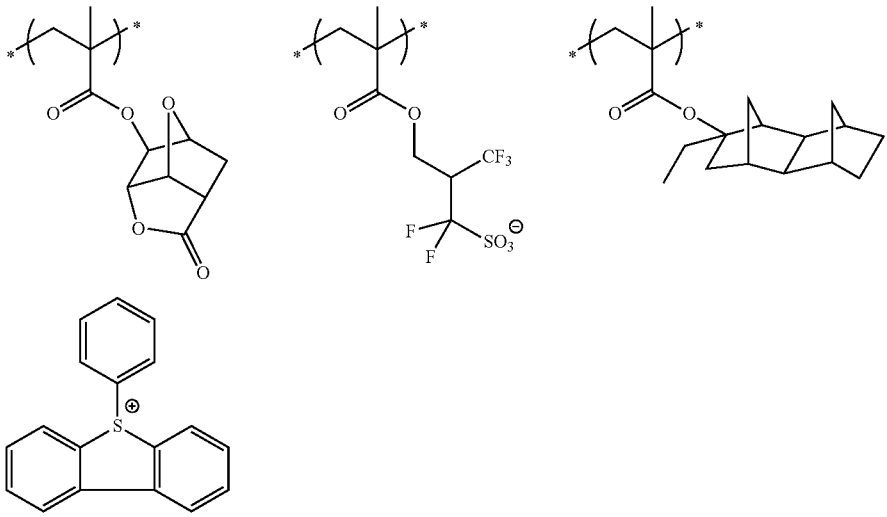
A-19
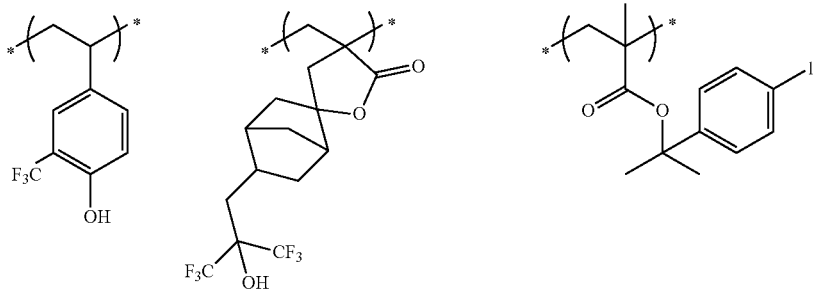
A-20
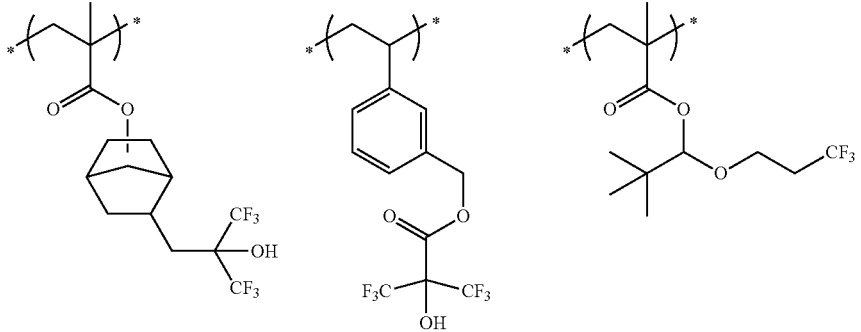
A-21

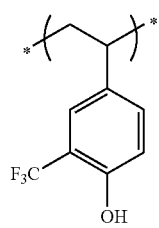
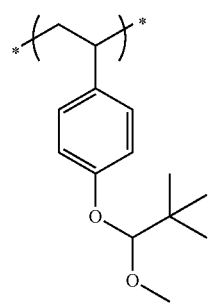
A-22
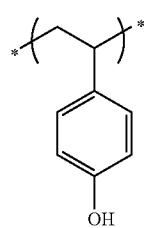
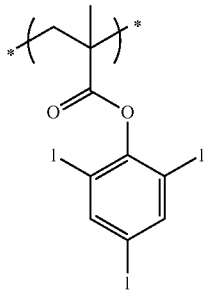
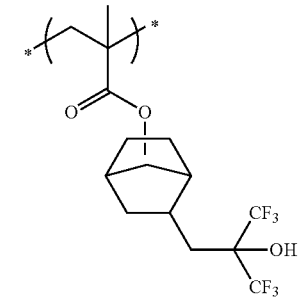
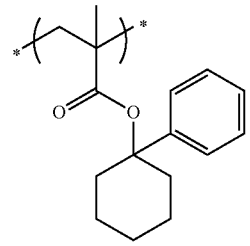
A-23
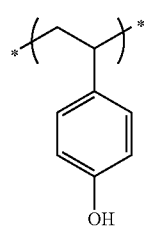
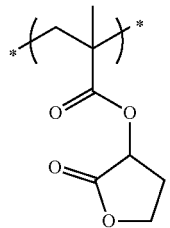
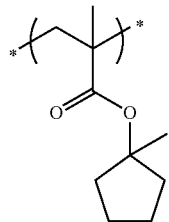
A-24
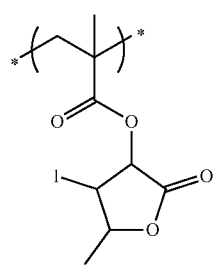
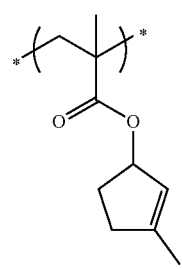
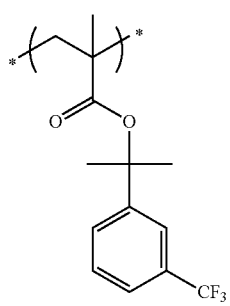
A-25
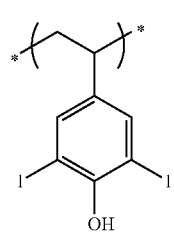
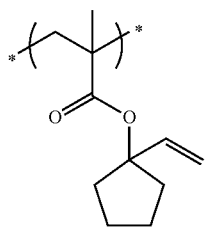
A-26

-continued
A-27
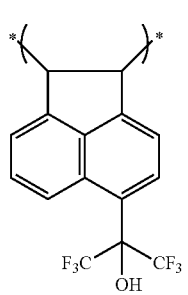 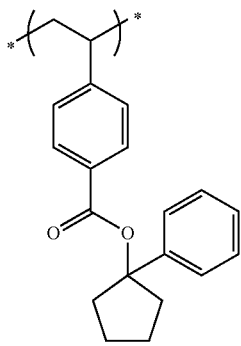
A-28
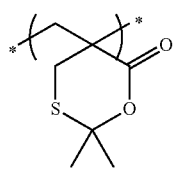 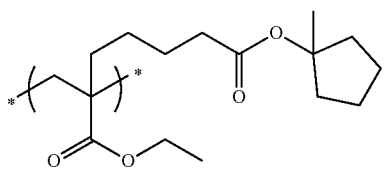
A-29
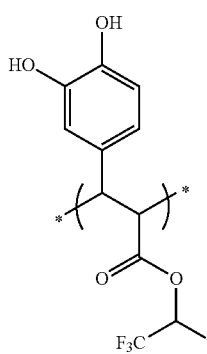 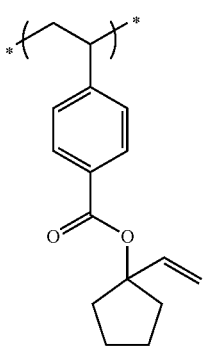
A-30
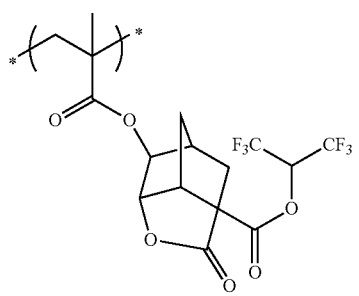 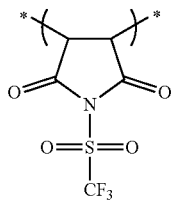 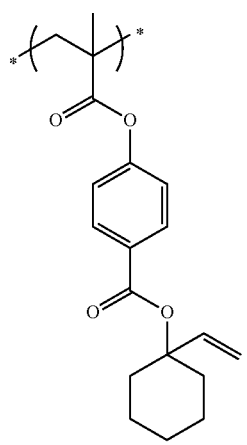

<Acid Diffusion Control Agent>
Acid diffusion control agents C-1 to C-9 are shown below.
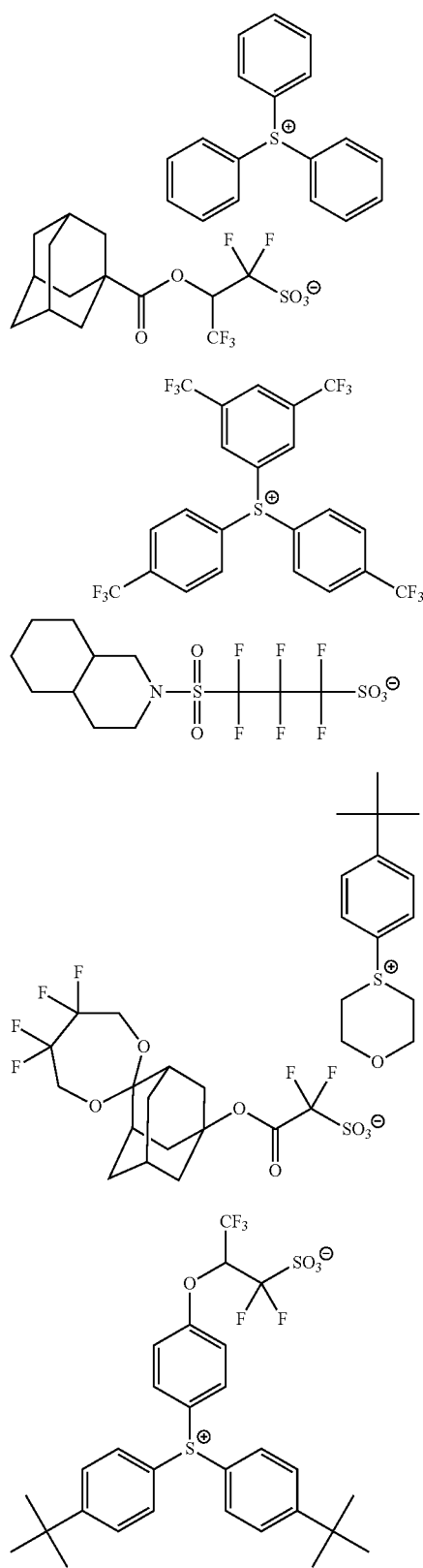
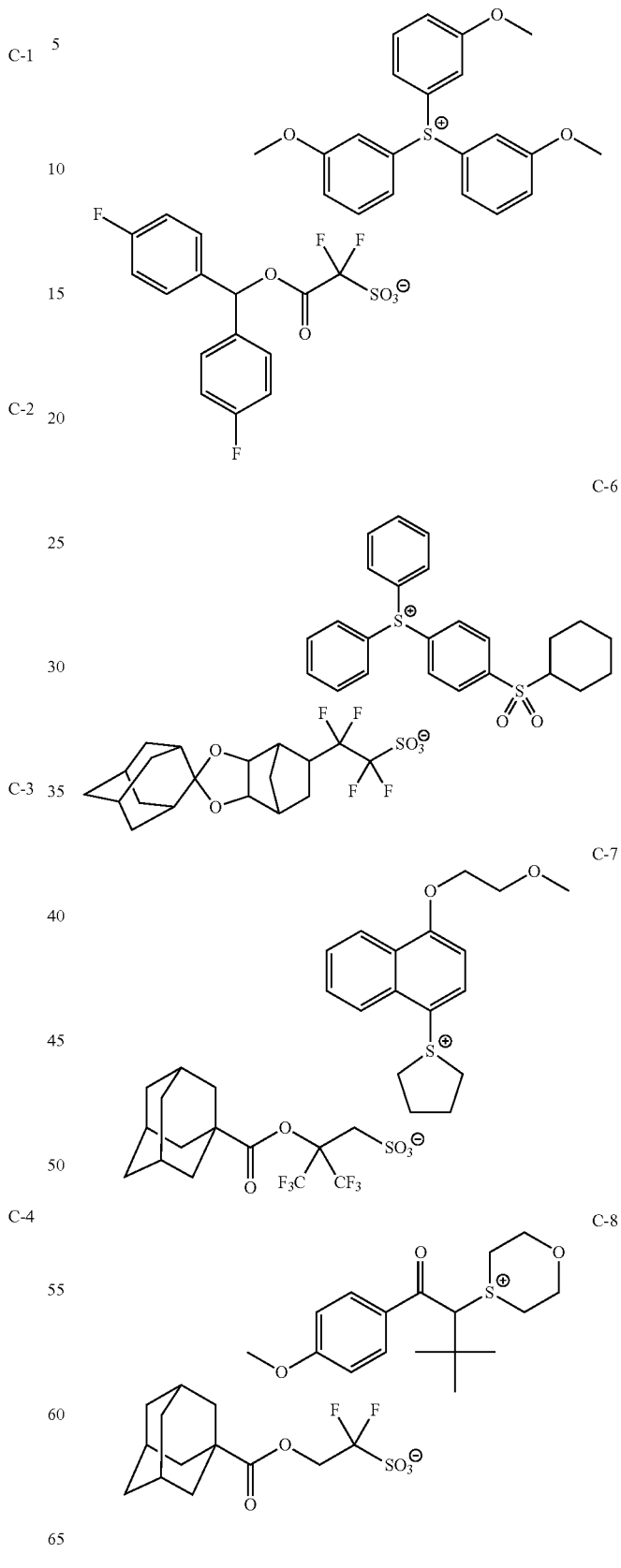

C-9
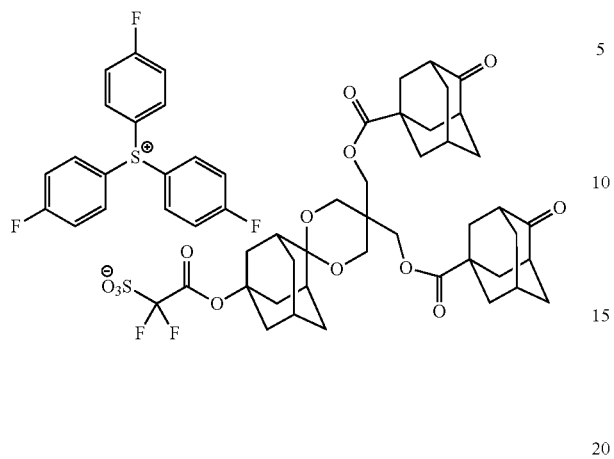
Acid diffusion control agents D-1 to D-11 other than those above are shown below.
D-1
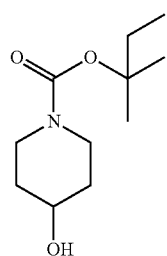
D-2
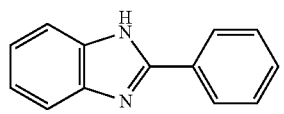
D-3
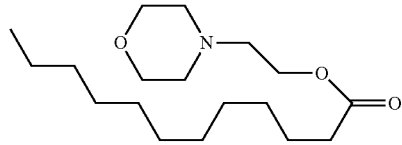
D-4
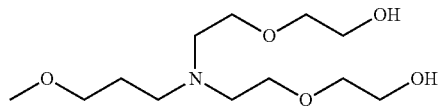
D-5
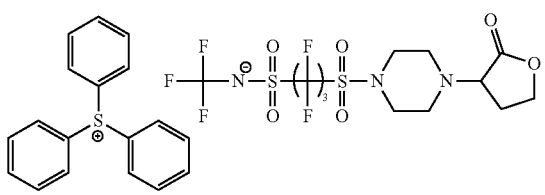
D-6
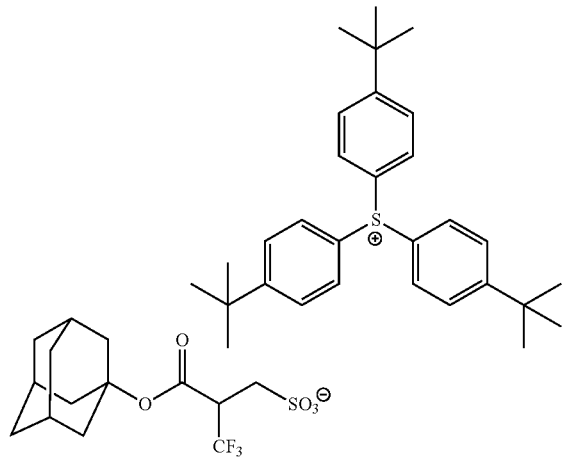
D-7
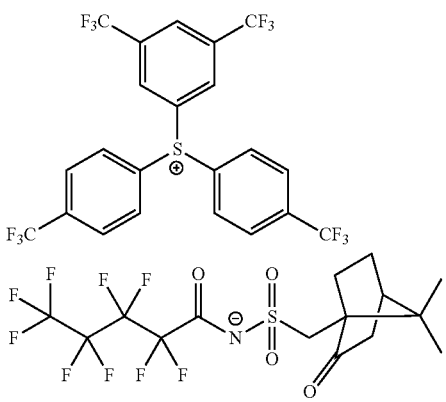
D-8
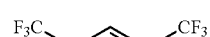
D-9
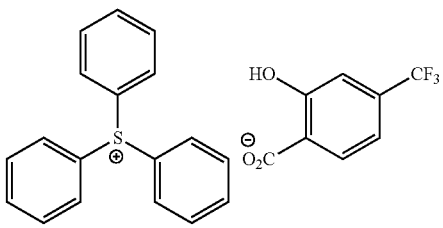

-continued

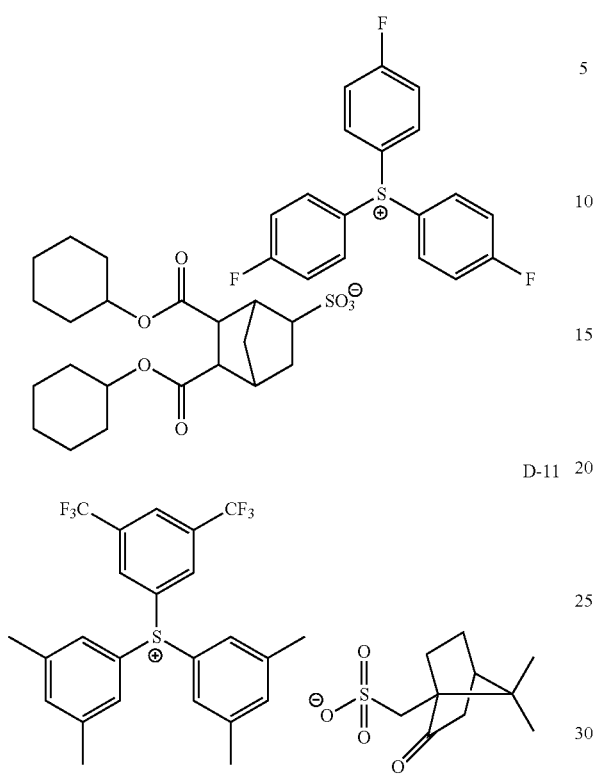

<Hydrophobic Resin and Resin for Topcoat>

Hydrophobic resins (E-1 to E-11) and topcoat resins (PT-1 to PT-3) were synthesized according to Table 2.

In addition, the molar ratios of the repeating units, the weight-average molecular weights (Mw), and the disparities (Mw/Mn) in the hydrophobic resins (E-1 to E-11) and the resins (PT-1 to PT-3) for a topcoat are shown in Table 2.

Furthermore, the weight-average molecular weights (Mw) and the disparities (Mw/Mn) of the hydrophobic resins E-1 to E-11, or the resins PT-1 to PT-3 for a topcoat were measured by GPC (carrier: tetrahydrofuran (THF)) (an amount expressed in terms of polystyrene). In addition, the compositional ratio (ratio based on % by mole) of the resin was measured by $^{13}C$-nuclear magnetic resonance (NMR).

The monomers ME-1 to ME-20 used in the synthesis of the hydrophobic resins E-1 to E-11 shown in Table 2 and the resins PT-1 to PT-3 for a topcoat shown in Table 2 are shown below.

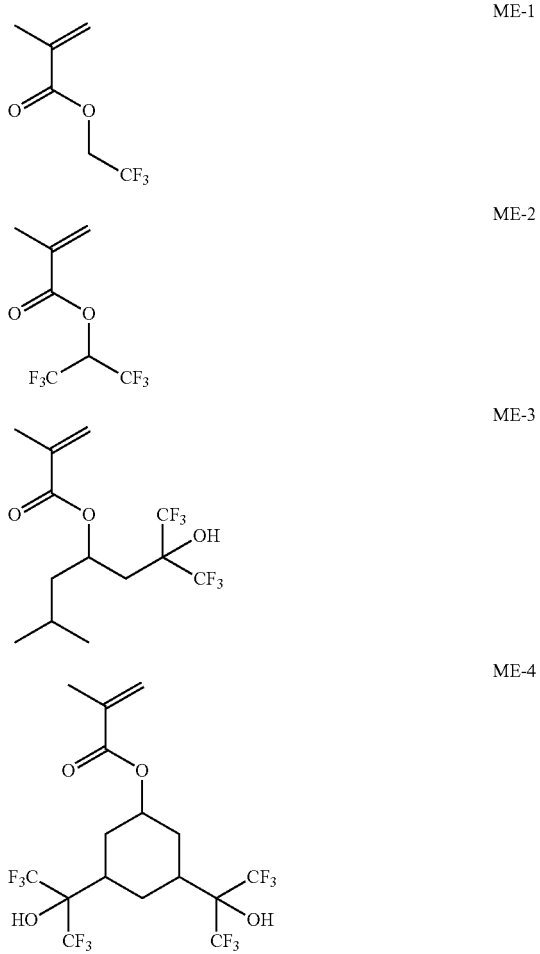

TABLE 2

|  | Molar ratio of repeating unit 1 |  | Molar ratio of repeating unit 2 |  | Molar ratio of repeating unit 3 |  | Molar ratio of repeating unit 4 |  | Mw | Mw/Mn |
|---|---|---|---|---|---|---|---|---|---|---|
| Resin E-1 | ME-3 | 60 | ME-4 | 40 |  |  |  |  | 10,000 | 1.4 |
| Resin E-2 | ME-15 | 50 | ME-1 | 50 |  |  |  |  | 12,000 | 1.5 |
| Resin E-3 | ME-2 | 40 | ME-13 | 50 | ME-9 | 5 | ME-20 | 5 | 6,000 | 1.3 |
| Resin E-4 | ME-19 | 50 | ME-14 | 50 |  |  |  |  | 9,000 | 1.5 |
| Resin E-5 | ME-10 | 50 | ME-2 | 50 |  |  |  |  | 15,000 | 1.5 |
| Resin E-6 | ME-17 | 50 | ME-15 | 50 |  |  |  |  | 10,000 | 1.5 |
| Resin E-7 | ME-7 | 100 |  |  |  |  |  |  | 23,000 | 1.7 |
| Resin E-8 | ME-5 | 100 |  |  |  |  |  |  | 13,000 | 1.5 |
| Resin E-9 | ME-6 | 50 | ME-16 | 50 |  |  |  |  | 10,000 | 1.7 |
| Resin E-10 | ME-13 | 10 | ME-18 | 85 | ME-9 | 5 |  |  | 11,000 | 1.4 |
| Resin E-11 | ME-8 | 80 | ME-11 | 20 |  |  |  |  | 13,000 | 1.4 |
| Resin PT-1 | ME-2 | 40 | ME-11 | 30 | ME-9 | 30 |  |  | 8,000 | 1.6 |
| Resin PT-2 | ME-2 | 50 | ME-8 | 40 | ME-3 | 10 |  |  | 5,000 | 1.5 |
| Resin PT-3 | ME-3 | 30 | ME-4 | 65 | ME-12 | 5 |  |  | 8,500 | 1.7 |

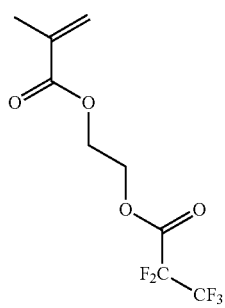
ME-5
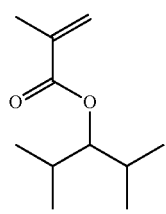
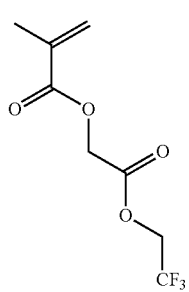
ME-6
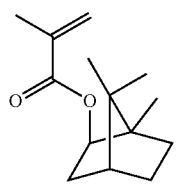
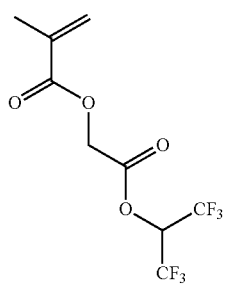
ME-7
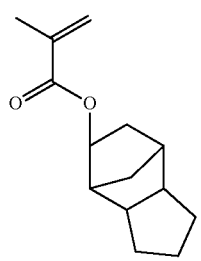
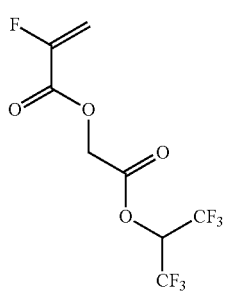
ME-8
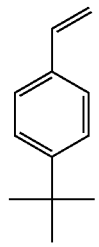
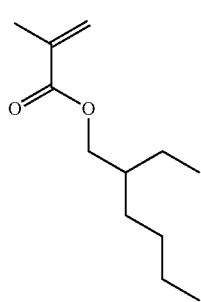
ME-9
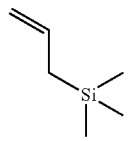
ME-10
ME-11
ME-12
ME-13
ME-14
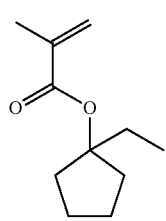
ME-15
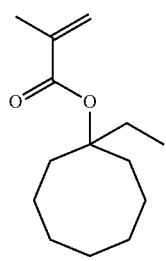
ME-16

-continued

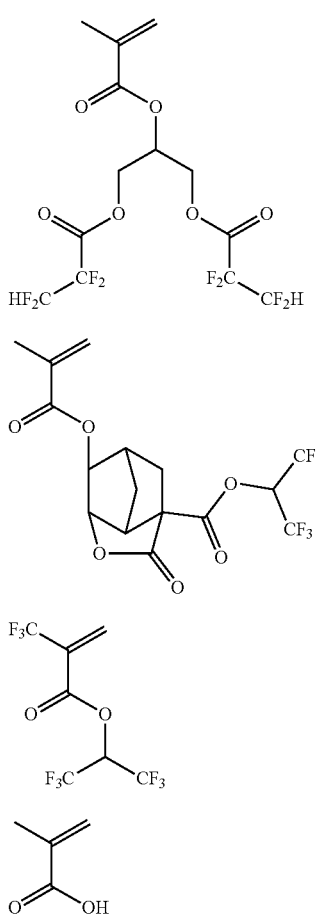

ME-17
ME-18
ME-19
ME-20

<Preparation of Resist Composition>
(Preparation of Resist Composition for ArF Exposure Test (Re-1 to Re-16))

The respective components shown in Table 3 were mixed so that the concentration of solid contents was 4% by mass. Then, the obtained mixed liquid was filtered initially through a polyethylene-made filter having a pore diameter of 50 nm, then through a nylon-made filter having a pore diameter of 10 nm, and lastly through a polyethylene-made filter having a pore diameter of 5 nm in this order to prepare a resist composition. In addition, in the resist composition, the solid content means all the components excluding the solvent. The obtained resist composition was used in Examples and Comparative Examples.

Furthermore, in Table 3, the content (% by mass) of each component means a content with respect to the total solid content.

(Preparation of Resist Composition for EUV Exposure Test (Re-17 to Re-41))

The respective components shown in Table 4 were mixed so that the concentration of solid contents was 2% by mass. Then, the obtained mixed liquid was filtered initially through a polyethylene-made filter having a pore diameter of 50 nm, then through a nylon-made filter having a pore diameter of 10 nm, and lastly through a polyethylene-made filter having a pore diameter of 5 nm in this order to prepare a resist composition. In addition, in the resist composition, the solid content means all the components excluding the solvent. The obtained resist composition was used in Examples and Comparative Examples.

The formulation of each resist composition is shown below.

TABLE 3

| | Resin A | | Specific compound B | | | | | | Acid diffusion control agent D |
|---|---|---|---|---|---|---|---|---|---|
| | | | Photoacid generator | | Acid diffusion control agent | | Photoacid generator C | | |
| | Type | Content (% by mass) | Type | Content (% by mass) | Type | Content (% by mass) | Type | Content (% by mass) | Type |
| Re-1 | A-1 | 80.5 | B-1 | 15 | — | — | — | — | D-9 |
| Re-2 | A-2 | 68.0 | B-2 | 25 | — | — | — | — | D-8 |
| Re-3 | A-3 | 87.5 | B-3 | 8 | — | — | — | — | D-7 |
| Re-4 | A-4 | 75.5 | B-4 | 10 | — | — | C-1 | 10 | D-1 |
| Re-5 | A-5 | 64.8 | B-5 | 30 | — | — | — | — | D-11 |
| Re-6 | A-6 | 81.9 | B-6 | 13 | B-16 | 5 | — | — | — |
| Re-7 | A-7 | 75.0 | B-8 | 12 | — | — | C-4 | — | D-6 |
| Re-8 | A-8 | 79.0 | B-9 | 15 | — | — | — | — | D-5 |
| Re-9 | A-9 | 69.5 | B-10 | 20 | B-17 | 5 | — | — | D-10 |
| Re-10 | A-10 | 41.0 | B-12 | 50 | — | — | — | — | D-2 |
| Re-11 | A-11 | 75.4 | B-13 | 8 | — | — | C-2 | 8 | D-9 |
| Re-12 | A-12 | 66.0 | — | — | B-16 | 10 | C-3 | 20 | — |
| Re-13 | A-13 | 70.0 | — | — | B-16/B-17 | 5/5 | C-4 | 15 | — |
| Re-14 | A-25 | 81.5 | B-23 | 12 | — | — | — | — | D-3 |
| Re-15 | A-14 | 72.0 | B-1/B-14 | 15/5 | — | — | — | — | D-4 |
| Re-16 | A-1 | 80.5 | Z-1 | 15 | — | — | — | — | D-9 |

TABLE 3-continued

|  | Acid diffusion control agent D Content (% by mass) | Hydrophobic resin E Type | Content (% by mass) | Surfactant H Type | Content (% by mass) | Solvent F Type | Mixing ratio (mass ratio) |
|---|---|---|---|---|---|---|---|
| Re-1 | 4 | E-3 | 0.5 | — | — | F-1/F-2 | 70/30 |
| Re-2 | 5 | E-1/E-2 | 1.0/1.0 | — | — | F-1/F-8 | 85/15 |
| Re-3 | 2 | E-4 | 2.5 | — | — | F-1/F-2/F-8 | 70/25/5 |
| Re-4 | 3 | E-8 | 1.5 | — | — | F-4 | 100 |
| Re-5 | 5 | — | — | H-1/H-2 | 0.1/0.1 | F-1/F-7 | 80/20 |
| Re-6 | — | — | — | H-3 | 0.1 | F-1/F-3 | 70/30 |
| Re-7 | 5 | E-6 | 3 | — | — | F-1/F-5 | 50/50 |
| Re-8 | 5 | E-5 | 1.0 | — | — | F-1/F-9 | 90/10 |
| Re-9 | 4 | E-9 | 1.5 | — | — | F-1/F-6 | 40/60 |
| Re-10 | 6 | E-10 | 3 | — | — | F-1/F-8 | 90/10 |
| Re-11 | 8 | E-11 | 0.5 | H-1 | 0.1 | F-1/F-2 | 80/20 |
| Re-12 | — | E-8 | 4 | — | — | F-1 | 100 |
| Re-13 | — | E-9 | 5 | — | — | F-2 | 100 |
| Re-14 | 5 | E-7 | 1.5 | — | — | F-7 | 100 |
| Re-15 | 7 | E-5 | 1 | — | — | F-1/F-2/F-8 | 50/40/10 |
| Re-16 | 4 | E-3 | 0.5 | — | — | F-1/F-2 | 70/30 |

TABLE 4

|  | Resin A Type | Content (% by mass) | Specific compound B Photoacid generator Type | Content (% by mass) | Acid diffusion control agent Type | Content (% by mass) | Photoacid generator C Type | Content (% by mass) | Acid diffusion control agent D Type |
|---|---|---|---|---|---|---|---|---|---|
| Re-17 | A-15 | 78.0 | B-1 | 14 | — | — | — | — | D-8 |
| Re-18 | A-16 | 79.0 | B-2 | 12 | — | — | — | — | D-9 |
| Re-19 | A-17 | 76.0 | B-4 | 18 | — | — | — | — | D-6 |
| Re-20 | A-18 | 82.0 | B-5 | 10 | — | — | C-8 | 5 | D-1 |
| Re-21 | A-19 | 45.0 | B-6 | 40 | — | — | — | — | D-10 |
| Re-22 | A-20 | 80.0 | B-7 | 15 | B-16 | 5 | — | — | — |
| Re-23 | A-21 | 79.0 | B-8 | 12 | — | — | — | — | D-5 |
| Re-24 | A-22 | 75.9 | B-10 | 8 | — | — | C-7 | 8 | D-6 |
| Re-25 | A-23 | 67.3 | B-11 | 17.7 | B-17 | 5 | — | — | D-12 |
| Re-26 | A-24 | 83.0 | B-12 | 13 | — | — | — | — | D-3 |
| Re-27 | A-25 | 82.0 | B-14/B-2 | 5.0/5.0 | — | — | — | — | D-9 |
| Re-28 | A-5/A10 | 35/35 | B-15 | 15 | B-16 | 10 | — | — | — |
| Re-29 | A-15 | 71.0 | B-7 | 19 | B-17/B-19 | 5/5 | — | — | — |
| Re-30 | A-30 | 75.0 | — | — | B-18 | 5 | C-5 | 15 | D-2 |
| Re-31 | A-26 | 80.0 | — | — | B-19 | 5 | C-6 | 10 | D-4 |
| Re-32 | — | — | B-20 | 92 | — | — | — | — | D-7 |
| Re-33 | A-27 | 65.0 | B-21 | 25 | B-17 | 10 | — | — | — |
| Re-34 | A-22 | 71.9 | B-22 | 14 | — | — | C-9 | 5 | D-11 |
| Re-35 | A-14 | 50.0 | B-21 | 50 | — | — | — | — | — |
| Re-36 | A-16 | 30.0 | B-23 | 70 | — | — | — | — | — |
| Re-37 | A-24 | 60.0 | B-24 | 40 | — | — | — | — | — |
| Re-38 | A-25 | 75.0 | B-25 | 25 | — | — | — | — | — |
| Re-39 | A-29 | 65.0 | B-26 | 30 | — | — | — | — | — |
| Re-40 | A-22 | 40.0 | B-25/B-26 | 30/30 | — | — | — | — | — |
| Re-41 | A-15 | 82.0 | Z-1 | 10 | — | — | — | — | D-8 |

|  | Acid diffusion control agent D Content (% by mass) | Hydrophobic resin E Type | Content (% by mass) | Surfactant H Type | Content (% by mass) | Solvent F Type | Mixing ratio (mass ratio) |
|---|---|---|---|---|---|---|---|
| Re-17 | 8 | — | — | — | — | F-1/F-8 | 85/15 |
| Re-18 | 9 | — | — | — | — | F-1/F-2/F-8 | 70/25/5 |
| Re-19 | 6 | — | — | — | — | F-4 | 100 |
| Re-20 | 3 | — | — | — | — | F-1/F-2 | 70/30 |
| Re-21 | 15 | — | — | — | — | F-1/F-8 | 85/15 |
| Re-22 | — | — | — | — | — | F-1/F-8 | 85/15 |
| Re-23 | 7 | E-6 | 2 | — | — | F-1/F-2 | 70/30 |
| Re-24 | 8 | — | — | H-1 | 0.1 | F-1/F-8 | 85/15 |
| Re-25 | 10 | — | — | — | — | F-1/F-2/F-8 | 50/40/10 |

TABLE 4-continued

| | | | | | | | |
|---|---|---|---|---|---|---|---|
| Re-26 | 4 | — | — | — | — | F-1/F-9 | 90/10 |
| Re-27 | 8 | — | — | — | — | F-1/F-6 | 40/60 |
| Re-28 | — | E-10 | 5 | — | — | F-1/F-8 | 90/10 |
| Re-29 | — | — | — | — | — | F-1/F-2 | 80/20 |
| Re-30 | 5 | — | — | — | — | F-1 | 100 |
| Re-31 | 5 | — | — | — | — | F-1/F-2 | 70/30 |
| Re-32 | 8 | — | — | — | — | F-1/F-8 | 85/15 |
| Re-33 | — | — | — | — | — | F-1/F-8 | 85/15 |
| Re-34 | 9 | — | — | H-1 | 0.1 | F-1/F-2 | 70/30 |
| Re-35 | — | — | — | — | — | F-1/F-2 | 70/30 |
| Re-36 | — | — | — | — | — | F-1/F-2/F-8 | 70/25/5 |
| Re-37 | — | — | — | — | — | F-1/F-2 | 70/30 |
| Re-38 | — | — | — | — | — | F-1/F-9 | 90/10 |
| Re-39 | — | E-9 | 5 | — | — | F-1/F-6 | 40/60 |
| Re-40 | — | — | — | — | — | F-1/F-8 | 85/15 |
| Re-41 | 8 | — | — | — | — | F-1/F-8 | 85/15 |

<Surfactant>

In a case where the resist composition included a surfactant, the following surfactants were used.

H-1: MEGAFACE F176 (manufactured by DIC Corporation, fluorine-based surfactant)

H-2: MEGAFACE R08 (manufactured by DIC Corporation, fluorine- and silicon-based surfactant)

H-3: PF656 (manufactured by OMNOVA Solutions Inc., fluorine-based surfactant)

<Solvent>

Solvents included in the resist composition are shown below.

F-1: Propylene glycol monomethyl ether acetate (PGMEA)

F-2: Propylene glycol monomethyl ether (PGME)

F-3: Propylene glycol monoethyl ether (PGEE)

F-4: Cyclohexanone

F-5: Cyclopentanone

F-6: 2-Heptanone

F-7: Ethyl lactate

F-8: γ-Butyrolactone

F-9: Propylene carbonate

[Production of Topcoat Composition]

Various components included in the topcoat composition shown in Table 5 are shown below.

<Resin>

As the resin shown in Table 5, resins PT-1 to PT-3 shown in Table 2 were used.

<Preparation of Topcoat Composition>

The respective components shown in Table 5 were mixed so that the concentration of solid contents was 3% by mass, and then the obtained mixed liquid was filtered initially through a polyethylene-made filter having a pore diameter of 50 nm, then through a nylon-made filter having a pore diameter of 10 nm, and lastly through a polyethylene-made filter having a pore diameter of 5 nm in this order to prepare a topcoat composition. Furthermore, the solid content as mentioned herein means all the components other than the solvent. The obtained topcoat composition was used in Examples.

<Additive>

The structures of the additives shown in Table 5 are shown below.

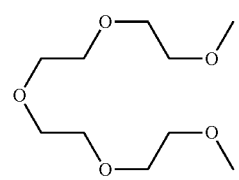

DT-1

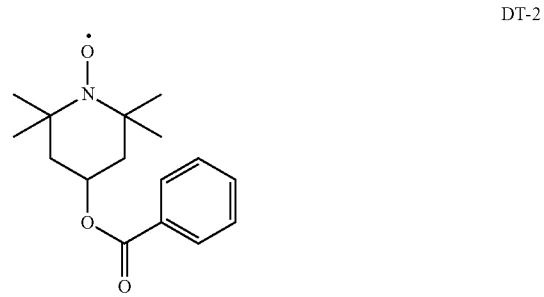

DT-2

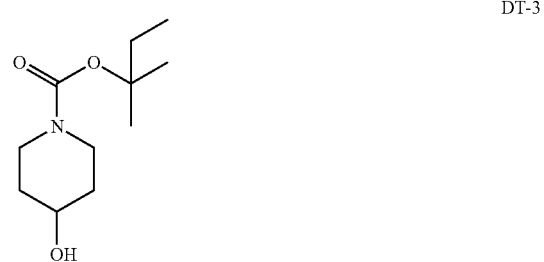

DT-3

<Surfactant>

As the surfactant shown in Table 5, the surfactant H-3 was used.

TABLE 5

| | Resin | | Additive | | Surfactant | | Solvent | |
|---|---|---|---|---|---|---|---|---|
| | Type | Mass [g] | Type | Mass [g] | Type | Mass [g] | Type | Mixing ratio (mass) |
| TC-1 | PT-1 | 10 | DT-1/DT-2 | 1.3/0.06 | | | FT-1/FT-2 | 70/30 |
| TC-2 | PT-2 | 10 | DT-3/DT-4 | 0.04/0.06 | H-3 | 0.005 | FT-1/FT-3 | 75/25 |
| TC-3 | PT-3 | 10 | DT-5 | 0.05 | | | FT-1/FT-3 | 10/90 |

<Solvent>

The solvents shown in Table 5 are shown below.

FT-1: 4-Methyl-2-pentanol (MIBC)

FT-2: n-Decane

FT-3: Diisoamyl ether

[Pattern Formation (1): ArF Liquid Immersion Exposure and Organic Solvent Development]

A composition for forming an organic antireflection film, ARC29SR (manufactured by Brewer Science, Inc.), was applied onto a silicon wafer and baked at 205° C. for 60 seconds to form an antireflection film having a film thickness of 98 nm. A resist composition shown in Table 3 (see Tables 3 and 4 for the composition of the resist composition) was applied thereon and baked at 100° C. for 60 seconds to form a resist film (actinic ray-sensitive or radiation-sensitive film) having a film thickness of 90 nm. Furthermore, in Examples 1-5, 1-6, and 1-12, a topcoat film was formed on the upper layer of the resist film. The film thickness of the topcoat film was 100 nm in any case.

The resist film was exposed through a 6% halftone mask having a 1:1 line-and-space pattern with a line width of 45 nm, using an ArF excimer laser immersion scanner (XT1700i, manufactured by ASML, NA 1.20, Dipole, outer sigma: 0.950, inner sigma: 0.850, Y deflection). Ultrapure water was used as the immersion liquid.

The resist film after the exposure was baked at 90° C. for 60 seconds, developed with n-butyl acetate for 30 seconds, and then rinsed with 4-methyl-2-pentanol for 30 seconds. Then, the film was spin-dried to obtain a negative tone pattern.

<Evaluation of Defects>

After forming the pattern having a line width of 45 nm, the defect distribution on the silicon wafer was detected with UVision5 (manufactured by AMAT), and the shape of the defect was observed using SEMVisionG4 (manufactured by AMAT). The number of defects per sheet of the silicon wafer was counted and evaluated in accordance with the following evaluation standard. A smaller number of defects indicate better results. The evaluation results are shown in Table 6 below.

"A": The number of defects is 100 or less

"B": The number of defects is more than 100 and 300 or less

"C": The number of defects is more than 300 and 500 or less

"D": The number of defects is more than 500

<Evaluation of LWR>

In a case where a 45 nm (1:1) line-and-space pattern resolved with an optimum exposure amount upon resolving a line pattern having an average line width of 45 nm was observed from the upper part of the pattern using a critical dimension scanning electron microscope (SEM (S-9380II manufactured by Hitachi, Ltd.)), the line width was observed at any points, and a measurement deviation thereof was evaluated as 3σ. A smaller value thereof indicates better performance. Further, LWR (nm) is preferably 2.8 nm or less, more preferably 2.5 nm or less, still more preferably 2.3 nm or less, and particularly preferably 2.0 nm or less. The evaluation results are shown in Table 6 below.

In Table 6, in the "$X^{d2}$" column, "A" indicates that $X^{d2}$ is a group represented by General Formula (1-1), and "B" indicates that $X^{d2}$ is a leaving group that leaves by the action of an acid.

In Table 6, "Type of acid-decomposable group" indicates that in an aspect where the "$X^{d2}$" column is "A", the acid-decomposable group corresponds to any of groups represented by General Formula (a-1) to General Formula (a-5). Incidentally, the notation of "(a-1)/(a-1)" indicates which group the acid-decomposable group included in the specific compound corresponds to in a case where two kinds of the specific compounds are used.

In Table 6, the "Number" column shows the number of acid-decomposable groups included in the specific compound or the number of leaving groups that are eliminated by the action of acid.

TABLE 6

|  | Resist composition | Topcoat composition | Specific compound | Atom represented by $X^{d1}$ | $X^{d2}$ | Type of acid-decomposable group | Number | Evaluation item 1 Defects | Evaluation item 2 LWR (nm) |
|---|---|---|---|---|---|---|---|---|---|
| Example 1-1 | Re-1 | — | B-1 | Sulfur | A | (a-1) | 1 | A | 1.9 |
| Example 1-2 | Re-2 | — | B-2 | Sulfur | A | (a-1) | 1 | A | 1.8 |
| Example 1-3 | Re-3 | — | B-3 | Sulfur | A | (a-2) | 1 | B | 2.2 |
| Example 1-4 | Re-4 | — | B-4 | Sulfur | B | — | 1 | B | 2.3 |
| Example 1-5 | Re-5 | TC-1 | B-5 | Sulfur | A | (a-1) | 1 | A | 1.8 |
| Example 1-6 | Re-6 | TC-2 | B-6/B-16 | Sulfur | A | (a-1)/(a-1) | 2/1 | A | 1.6 |
| Example 1-7 | Re-7 | — | B-8 | Iodine | A | (a-3) | 1 | C | 2.5 |
| Example 1-8 | Re-8 | — | B-9 | Sulfur | A | (a-4) | 1 | B | 2.2 |
| Example 1-9 | Re-9 | — | B-10/B-17 | Sulfur | A | (a-5)/(a-1) | 1/1 | A | 2.0 |
| Example 1-10 | Re-10 | — | B-12 | Sulfur | A | (a-1) | 3 | A | 1.6 |
| Example 1-11 | Re-11 | — | B-13 | Sulfur | A | (a-1) | 1 | A | 1.9 |
| Example 1-12 | Re-12 | TC-3 | B-16 | Sulfur | A | (a-1) | 1 | A | 1.8 |
| Example 1-13 | Re-13 | — | B-16/B-17 | Sulfur | A | (a-1)/(a-1) | 1/1 | A | 1.9 |
| Example 1-14 | Re-14 | — | B-23 | Sulfur | A | (a-1) | 2 | A | 1.7 |
| Example 1-15 | Re-15 | — | B-1/B-14 | Sulfur | A | (a-1)/(a-1) | 1/1 | A | 1.9 |
| Comparative Example 1-1 | Re-16 | — | — | — | — | — | — | D | 3.2 |

As shown in Table 6, it was confirmed that the resist composition of the embodiment of the present invention can form a pattern having excellent LWR performance in a case where ArF exposure is performed to obtain a pattern by organic solvent development.

From the comparison of Examples 1-3, 1-4, 1-7, and 1-8 with other Examples among those, it was confirmed that in a case where the acid-decomposable group is the group represented by General Formula (a-1), a more excellent effect can be obtained.

Moreover, from the comparison of Example 1-7 with other Examples, it was confirmed that in a case where the atom represented by $X^{d1}$ is a sulfur atom, a more excellent effect can be obtained.

In addition, from the comparison of Examples 1-6, 1-10, and 1-14, it was confirmed that in a case where the number of acid-decomposable groups and the number of leaving groups that leave by the action of an acid are 2 or more, a more excellent effect can be obtained.

[Pattern Formation (2): ArF Liquid Immersion Exposure and Aqueous Alkaline Solution Development]

A composition for forming an organic antireflection film, ARC29SR (manufactured by Brewer Science, Inc.), was applied onto a silicon wafer and baked at 205° C. for 60 seconds to form an antireflection film having a film thickness of 98 nm. A resin composition shown in Table 6 (see Table 3 for the composition of the resin composition) was applied thereon and baked at 100° C. for 60 seconds to form a resist film having a film thickness of 90 nm. Furthermore, in Example 2-5 and Example 2-6, a topcoat film was formed on the upper layer of the resist film. The film thickness of the topcoat film was 100 nm in any case.

The resist film was exposed through a 6% halftone mask having a 1:1 line-and-space pattern with a line width of 45 nm, using an ArF excimer laser immersion scanner (XT1700i, manufactured by ASML, NA 1.20, Dipole, outer sigma: 0.950, inner sigma: 0.890, Y deflection). Ultrapure water was used as the immersion liquid.

The resist film after the exposure was baked at 90° C. for 60 seconds, developed with an aqueous tetramethylammonium hydroxide solution (2.38% by mass) for 30 seconds, and then rinsed with pure water for 30 seconds. Thereafter, the resist film was spin-dried to obtain a positive tone pattern.

The obtained positive tone pattern was evaluated in the same manner as in <Evaluation of Defects> and <Evaluation of LWR> carried out in [Pattern Formation (1): ArF Liquid Immersion Exposure and Organic Solvent Development] mentioned above. The evaluation results are shown in Table 7 below.

In Table 7, in the "$X^{d2}$" column, "A" indicates that $X^{d2}$ is a group represented by General Formula (1-1), and "B" indicates that $X^{d2}$ is a leaving group that leaves by the action of an acid.

In Table 7, "Type of acid-decomposable group" indicates that in an aspect where the "$X^{d2}$" column is "A", the acid-decomposable group corresponds to any of groups represented by General Formula (a-1) to General Formula (a-5). Incidentally, the notation of "(a-1)/(a-1)" indicates which group the acid-decomposable group included in the specific compound corresponds to in a case where two kinds of the specific compounds are used.

In Table 7, the "Number" column shows the number of acid-decomposable groups included in the specific compound or the number of leaving groups that are eliminated by the action of acid.

TABLE 7

| | Resist composition | Topcoat composition | Specific compound | Atom represented by $X^{d1}$ | $X^{d2}$ | Type of acid-decomposable group | Number | Evaluation item 1 Defects | Evaluation item 2 LWR (nm) |
|---|---|---|---|---|---|---|---|---|---|
| Example 2-1 | Re-1 | — | B-1 | Sulfur | A | (a-1) | 1 | A | 1.8 |
| Example 2-2 | Re-2 | — | B-2 | Sulfur | A | (a-1) | 1 | A | 1.8 |
| Example 2-3 | Re-3 | — | B-3 | Sulfur | A | (a-2) | 1 | B | 2.3 |
| Example 2-4 | Re-4 | — | B-4 | Sulfur | B | — | 1 | B | 2.2 |
| Example 2-5 | Re-5 | TC-2 | B-5 | Sulfur | A | (a-1) | 1 | A | 1.9 |
| Example 2-6 | Re-6 | TC-3 | B-6/B16 | Sulfur | A | (a-1)/(a-1) | 2/1 | A | 1.5 |
| Example 2-7 | Re-7 | — | B-8 | Iodine | A | (a-3) | 1 | C | 2.5 |
| Example 2-8 | Re-8 | — | B-9 | Sulfur | A | (a-4) | 1 | B | 2.2 |
| Example 2-9 | Re-9 | — | B-10/B-17 | Sulfur | A | (a-5)/(a-1) | 1/1 | A | 1.9 |
| Example 2-10 | Re-10 | — | B-12 | Sulfur | A | (a-1) | 3 | A | 1.6 |
| Example 2-11 | Re-11 | — | B-13 | Sulfur | A | (a-1) | 1 | A | 2.0 |
| Example 2-12 | Re-12 | — | B-16 | Sulfur | A | (a-1) | 1 | A | 2.0 |
| Example 2-13 | Re-13 | — | B-16/B-17 | Sulfur | A | (a-1)/(a-1) | 1/1 | A | 1.9 |
| Example 2-14 | Re-14 | — | B-23 | Sulfur | A | (a-1) | 2 | A | 1.6 |
| Example 2-15 | Re-15 | — | B-1/B-4 | Sulfur | A | (a-1)/(a-1) | 1/1 | A | 2.0 |
| Comparative Example 2-1 | Re-16 | — | — | — | — | — | — | D | 3.1 |

As shown in Table 7, it was confirmed that in a case where ArF exposure is performed and a pattern is obtained by alkali aqueous solution development, the resist composition of the embodiment of the present invention can form a pattern having excellent LWR performance.

In addition, the same tendency as the results of [Pattern Formation (1): ArF Liquid Immersion Exposure and Organic Solvent Development] was confirmed.

[Pattern Formation (3): EUV Exposure and Organic Solvent Development]

A composition for forming an underlayer film, AL412 (manufactured by Brewer Science, Inc.), was applied onto a silicon wafer and baked at 205° C. for 60 seconds to form an underlying film having a film thickness of 20 nm. A resin composition shown in Table 8 (see Table 4 for the composition of the resin composition) was applied thereon and baked at 100° C. for 60 seconds to form a resist film having a film thickness of 30 nm.

The silicon wafer having the obtained resist film was subjected to patternwise irradiation using an EUV exposure device (manufactured by Exitech Ltd., Micro Exposure Tool, NA 0.3, Quadrupol, outer sigma 0.68, inner sigma 0.36). Furthermore, as the reticle, a mask having a line size=20 nm and a line:space=1:1 was used.

The resist film after the exposure was baked at 90° C. for 60 seconds, developed with n-butyl acetate for 30 seconds, and spin-dried to obtain a negative tone pattern.

<Evaluation of Defects>

After forming the pattern having a line width of 20 nm, the defect distribution on the silicon wafer was detected with UVision5 (manufactured by AMAT), and the shape of the defect was observed using SEMVisionG4 (manufactured by AMAT). The number of defects per sheet of the silicon wafer was counted and evaluated in accordance with the following evaluation standard. A smaller number of defects indicate better results. The evaluation results are shown in Table 8 below.

(a-5). Incidentally, the notation of "(a-1)/(a-1)" indicates which group the acid-decomposable group included in the specific compound corresponds to in a case where two kinds of the specific compounds are used.

In Table 8, the "Number" column shows the number of acid-decomposable groups included in the specific compound or the number of leaving groups that are eliminated by the action of acid.

TABLE 8

| | Resist composition | Specific compound | Atom represented by $X^{d1}$ | $X^{d2}$ | Type of acid-decomposable group | Number | Evaluation item 1 Defects | Evaluation item 2 LWR (nm) |
|---|---|---|---|---|---|---|---|---|
| Example 3-1 | Re-17 | B-1 | Sulfur | A | (a-1) | 1 | A | 3.1 |
| Example 3-2 | Re-18 | B-2 | Sulfur | A | (a-1) | 1 | A | 3.2 |
| Example 3-3 | Re-19 | B-4 | Sulfur | B | | 1 | B | 3.5 |
| Example 3-4 | Re-20 | B-5 | Sulfur | A | (a-1) | 1 | A | 3.1 |
| Example 3-5 | Re-21 | B-6 | Sulfur | A | (a-1) | 2 | A | 2.9 |
| Example 3-6 | Re-22 | B-7/B-16 | Sulfur | A | (a-1)/(a-1) | 1/1 | A | 3.0 |
| Example 3-7 | Re-23 | B-8 | Iodine | A | (a-3) | 1 | C | 3.8 |
| Example 3-8 | Re-24 | B-10 | Sulfur | A | (a-5) | 1 | B | 3.5 |
| Example 3-9 | Re-25 | B-11/B-17 | Sulfur | A | (a-1)/(a-1) | 2/1 | A | 2.7 |
| Example 3-10 | Re-26 | B-12 | Sulfur | A | (a-1) | 3 | A | 2.9 |
| Example 3-11 | Re-27 | B-14/B-2 | Sulfur | A | (a-1)/(a-1) | 1/1 | A | 3.1 |
| Example 3-12 | Re-28 | B-15/B-16 | Sulfur | A | (a-2)/(a-1) | 1/1 | A | 3.2 |
| Example 3-13 | Re-29 | B-7/B-17/B-19 | Sulfur | A | (a-1)/(a-1)/— | 1/1/2 | A | 3.2 |
| Example 3-14 | Re-30 | B-18 | Iodine | B | — | 1 | C | 3.9 |
| Example 3-15 | Re-31 | B-19 | Sulfur | B | — | 2 | A | 3.1 |
| Example 3-16 | Re-32 | B-20 | Sulfur | A | (a-1) | 1 | A | 3.1 |
| Example 3-17 | Re-33 | B-21/B-17 | Sulfur | A | (a-1)/(a-1) | 3/1 | A | 2.7 |
| Example 3-18 | Re-34 | B-22 | Sulfur | A | (a-1) | 1 | A | 3.0 |
| Example 3-19 | Re-35 | B-21 | Sulfur | A | (a-1) | 3 | A | 2.8 |
| Example 3-20 | Re-36 | B-23 | Sulfur | A | (a-1) | 2 | A | 2.7 |
| Example 3-21 | Re-37 | B-24 | Sulfur | A | (a-1) | 2 | A | 2.8 |
| Example 3-21 | Re-38 | B-25 | Sulfur | A | (a-1) | 1 | A | 3.0 |
| Example 3-23 | Re-39 | B-26 | Sulfur | A | (a-1) | 2 | A | 2.7 |
| Example 3-24 | Re-40 | B-25/B-26 | Sulfur | A | (a-1) | 2 | A | 2.7 |
| Comparative Example 3-1 | Re-41 | — | — | | — | — | D | 4.4 |

"A": The number of defects is 100 or less
"B": The number of defects is more than 100 and 300 or less
"C": The number of defects is more than 300 and 500 or less
"D": The number of defects is more than 500
<Evaluation of LWR>

In a case where a 20 nm (1:1) line-and-space pattern resolved with an optimum exposure amount upon resolving a line pattern having an average line width of 20 nm was observed from the upper part of the pattern using a critical dimension scanning electron microscope (SEM (S-9380II manufactured by Hitachi, Ltd.)), the line width was observed at any points, and a measurement deviation thereof was evaluated as 3σ. A smaller value thereof indicates better performance. Furthermore, LWR (nm) is preferably 4.2 nm or less, more preferably 3.8 nm or less, still more preferably 3.5 nm or less, particularly preferably 3.2 nm or less, most preferably 3.0 nm or less, and especially most preferably 2.9 nm or less. The evaluation results are shown in Table 8 below.

In Table 8, in the "$X^{d2}$" column, "A" indicates that $X^{d2}$ is a group represented by General Formula (1-1), and "B" indicates that $X^{d2}$ is a leaving group that leaves by the action of an acid.

In Table 8, "Type of acid-decomposable group" indicates that in an aspect where the "$X^{d2}$" column is "A", the acid-decomposable group corresponds to any of groups represented by General Formula (a-1) to General Formula As shown in Table 8, it was confirmed that in a case where EUV exposure is performed and a pattern is obtained by organic solvent development, the resist composition of the embodiment of the present invention can form a pattern having excellent LWR performance.

From the comparison of Examples 3-7 and 3-14 with other Examples, it was confirmed that in a case where $X^{d1}$ is a sulfur atom in General Formula (1), the effect is more excellent.

From the comparison of Examples 3-3, 3-7, 3-8, and 3-12, it was confirmed that in a case where the group having a polarity that increases through decomposition by the action of an acid is represented by General Formula (a-1) in General Formula (1), the effect was more excellent.

From the results in Table 8 above, it was confirmed that in a case where the number of acid-decomposable groups and the number of leaving groups that leave by the action of acid are 2 or more, a more excellent effect can be obtained.

[Pattern Formation (4): EUV Exposure and Aqueous Alkaline Solution Development]

A composition for forming an underlayer film, AL412 (manufactured by Brewer Science, Inc.), was applied onto a silicon wafer and baked at 205° C. for 60 seconds to form an underlying film having a film thickness of 20 nm. A resin composition shown in Table 9 (see Table 4 for the composition of the resin composition) was applied thereon and baked at 100° C. for 60 seconds to form a resist film having a film thickness of 30 nm.

The silicon wafer having the obtained resist film was subjected to patternwise irradiation using an EUV exposure device (manufactured by Exitech Ltd., Micro Exposure Tool, NA 0.3, Quadrupol, outer sigma 0.68, inner sigma 0.36). Furthermore, as the reticle, a mask having a line size=20 nm and a line:space=1:1 was used.

The resist film after the exposure was baked at 90° C. for 60 seconds, developed with an aqueous tetramethylammonium hydroxide solution (2.38% by mass) for 30 seconds, and then rinsed with pure water for 30 seconds. Thereafter, the resist film was spin-dried to obtain a positive tone pattern.

The obtained positive tone pattern was evaluated in the same manner as in <Evaluation of Defects> and <Evaluation of LWR> carried out in [Pattern Formation (3): EUV Exposure and Organic Solvent Development] mentioned above. The evaluation results are shown in Table 9 below.

in General Formula (1), $X^{d1}$ represents a sulfur atom or an iodine atom, $R^{d1}$ represents a linear, branched, or cyclic alkyl group which may have a substituent, a linear, branched, or cyclic alkenyl group which may have a substituent, or an aryl group which may have a substituent, in a case where m represents 2, two $R^{d1}$'s may be bonded to each other to form a ring, $L^{d1}$ represents a single bond or a divalent linking group, $Ar^{d1}$ represents an aromatic hydrocarbon ring group which may have a substituent, and $X^{d2}$ represents a group represented by General Formula (1-1) or a leaving group that leaves by an action of an acid,

  General Formula (1-1)

in General Formula (1-1), $L^{d2}$ represents a single bond or a divalent linking group, $R^{d2}$ represents a group having

TABLE 9

| | Resist composition | Specific compound | Atom represented by $X^{d1}$ | $X^{d2}$ | Type of acid-decomposable group | Number | Evaluation item 1 Defects | Evaluation item 2 LWR (nm) |
|---|---|---|---|---|---|---|---|---|
| Example 4-1 | Re-17 | B-1 | Sulfur | A | (a-1) | 1 | A | 3.0 |
| Example 4-2 | Re-18 | B-2 | Sulfur | A | (a-1) | 1 | A | 3.1 |
| Example 4-3 | Re-19 | B-4 | Sulfur | B | — | 1 | B | 3.0 |
| Example 4-4 | Re-20 | B-5 | Sulfur | A | (a-1) | 1 | A | 3.5 |
| Example 4-5 | Re-21 | B-6 | Sulfur | A | (a-1) | 2 | A | 2.9 |
| Example 4-6 | Re-22 | B-7/B-16 | Sulfur | A | (a-1)/(a-1) | 1/1 | A | 3.0 |
| Example 4-7 | Re-23 | B-8 | Iodine | A | (a-3) | 1 | C | 3.9 |
| Example 4-8 | Re-24 | B-10 | Sulfur | A | (a-5) | 1 | B | 3.6 |
| Example 4-9 | Re-25 | B-11/B-17 | Sulfur | A | (a-1)/(a-1) | 2/1 | A | 2.7 |
| Example 4-10 | Re-26 | B-12 | Sulfur | A | (a-1) | 3 | A | 2.8 |
| Example 4-11 | Re-27 | B-14/B-2 | Sulfur | A | (a-1)/(a-1) | 1/1 | A | 3.0 |
| Example 4-12 | Re-28 | B-15/B-16 | Sulfur | A | (a-2)/(a-1) | 1/1 | A | 3.1 |
| Example 4-13 | Re-29 | B-7/B-17/B-19 | Sulfur | A | (a-1)/(a-1)/— | 1/1/2 | A | 3.1 |
| Example 4-14 | Re-30 | B-18 | Iodine | B | — | 1 | C | 3.8 |
| Example 4-15 | Re-31 | B-19 | Sulfur | B | — | 2 | A | 3.2 |
| Example 4-16 | Re-32 | B-20 | Sulfur | A | (a-1) | 1 | A | 3.1 |
| Example 4-17 | Re-33 | B-21/B-17 | Sulfur | A | (a-1)/(a-1) | 3/1 | A | 2.8 |
| Example 4-18 | Re-34 | B-22 | Sulfur | A | (a-1) | 1 | A | 3.0 |
| Example 4-19 | Re-35 | B-23 | Sulfur | A | (a-1) | 3 | A | 2.9 |
| Example 4-20 | Re-36 | B-23 | Sulfur | A | (a-1) | 2 | A | 2.6 |
| Example 4-21 | Re-37 | B-24 | Sulfur | A | (a-1) | 2 | A | 2.7 |
| Example 4-22 | Re-38 | B-25 | Sulfur | A | (a-1) | 1 | A | 3.0 |
| Example 4-23 | Re-39 | B-26 | Sulfur | A | (a-1) | 2 | A | 2.8 |
| Example 4-24 | Re-40 | B-25/B-26 | Sulfur | A | (a-1) | 2 | A | 2.9 |
| Comparative Example 4-1 | Re-36 | — | — | — | — | — | D | 4.3 |

As shown in Table 9, it was confirmed that in a case where EUV exposure is performed and a pattern is obtained by alkali aqueous solution development, the resist composition of the embodiment of the present invention can form a pattern having excellent LWR performance.

In addition, the same tendency as the results of [Pattern Formation (3): EUV Exposure and Organic Solvent Development] was confirmed.

What is claimed is:

1. An actinic ray-sensitive or radiation-sensitive resin composition comprising a resin having a repeating unit having a group having a polarity that increases through decomposition by an action of an acid,
wherein the actinic ray-sensitive or radiation-sensitive resin composition further includes, in addition to the resin, a compound having at least one cation represented by General Formula (1), or
the resin further has, in addition to the repeating unit, a repeating unit having a cation represented by General Formula (1),

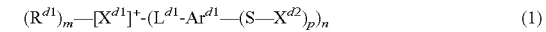  (1)

a polarity that increases through decomposition by an action of an acid, * represents a bonding position,
in a case where $X^{d1}$ represents the sulfur atom, n represents an integer of 1 to 3, m represents an integer of 0 to 2, and m+n is 3, in a case where $X^{d1}$ represents the iodine atom, n represents 1 or 2, m represents 0 or 1, and m+n is 2, and p represents an integer of 1 to 5, and
wherein in General Formula (1), n represents an integer of 2 or 3, or p represents an integer of 2 to 5.

2. The actinic ray-sensitive or radiation-sensitive resin composition according to claim 1,
wherein the actinic ray-sensitive or radiation-sensitive resin composition has a compound having at least one cation represented by General Formula (1), and
the compound having at least one cation represented by General Formula (1) includes at least one selected from the group consisting of a compound represented by General Formula (2) and a compound represented by General Formula (3),

  General Formula (2)

in General Formula (2), $Z_1^+$ represents the cation represented by General Formula (1), and $Y_1^-$ represents a monovalent organic anion,

   (3)

in General Formula (3), $Z_2^{+}$'s represents a cation, and at least one of $Z_2^{+}$'s represents the cation represented by General Formula (1), $Y_2^-$ represents an anionic functional group, L represents a q-valent linking group, and q represents an integer of 2 or more.

3. The actinic ray-sensitive or radiation-sensitive resin composition according to claim 2,
wherein $X^{d1}$ is a sulfur atom.

4. The actinic ray-sensitive or radiation-sensitive resin composition according to claim 2,
wherein in General Formula (1), the group having a polarity that increases through decomposition by an action of an acid is a group represented by General Formula (a-1),

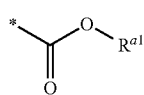   (a-1)

in General Formula (a-1), $R^{a1}$ represents a leaving group that leaves by an action of an acid, and * represents a bonding position.

5. A resist film formed of the actinic ray-sensitive or radiation-sensitive resin composition according to claim 2.

6. A pattern forming method comprising:
a step of forming a resist film on a substrate using the actinic ray-sensitive or radiation-sensitive resin composition according to claim 2;
a step of exposing the resist film; and
a step of developing the exposed resist film using a developer to form a pattern.

7. A method for manufacturing an electronic device, comprising the pattern forming method according to claim 6.

8. The actinic ray-sensitive or radiation-sensitive resin composition according to claim 1,
wherein $X^{d1}$ is a sulfur atom.

9. The actinic ray-sensitive or radiation-sensitive resin composition according to claim 1,
wherein in General Formula (1), the group having a polarity that increases through decomposition by an action of an acid is a group represented by General Formula (a-1),

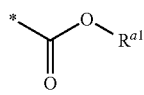   (a-1)

in General Formula (a-1), $R^{a1}$ represents a leaving group that leaves by an action of an acid, and * represents a bonding position.

10. A resist film formed of the actinic ray-sensitive or radiation-sensitive resin composition according to claim 1.

11. A pattern forming method comprising:
a step of forming a resist film on a substrate using the actinic ray-sensitive or radiation-sensitive resin composition according to claim 1;
a step of exposing the resist film; and
a step of developing the exposed resist film using a developer to form a pattern.

12. A method for manufacturing an electronic device, comprising the pattern forming method according to claim 11.

13. A compound comprising at least one cation represented by General Formula (1),

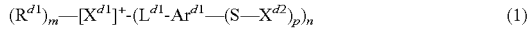   (1)

in General Formula (1), $X^{d1}$ represents a sulfur atom or an iodine atom, $R^{d1}$ represents a linear, branched, or cyclic alkyl group which may have a substituent, a linear, branched, or cyclic alkenyl group which may have a substituent, or an aryl group which may have a substituent, in a case where m represents 2, two $R^{d1}$'s may be bonded to each other to form a ring, $L^{d1}$ represents a single bond or a divalent linking group, $Ar^{d1}$ represents an aromatic hydrocarbon ring group which may have a substituent, and $X^{d2}$ represents a group represented by General Formula (1-1) or a leaving group that leaves by an action of an acid,

*-$L^{d2}$-$R^{d2}$       General Formula (1-1)

in General Formula (1-1), $L^{d2}$ represents a single bond or a divalent linking group, $R^{d2}$ represents a group having a polarity that increases through decomposition by the action of an acid, * represents a bonding position,
in a case where $X^{d1}$ represents the sulfur atom, n represents an integer of 1 to 3, m represents an integer of 0 to 2, and m+n is 3, in a case where $X^{d1}$ represents the iodine atom, n represents 1 or 2, m represents 0 or 1, and m+n is 2, and p represents an integer of 1 to 5, and
wherein in General Formula (1), n is an integer of 2 or 3, or p is an integer of 2 to 5.

14. The compound according to claim 13,
wherein the compound is a compound represented by General Formula (2) or a compound represented by General Formula (3), $Z_1^+Y_1^-$       General Formula (2)

in General Formula (2), $Z_1^+$ represents the cation represented by General Formula (1), and $Y_1^-$ represents a monovalent organic anion,

   (3)

in General Formula (3), $Z_2^{+}$'s represents a cation, and at least one of $Z_2^{+}$'s represents the cation represented by General Formula (1), $Y_2^-$ represents an anionic functional group, L represents a q-valent linking group, and q represents an integer of 2 or more.

15. The compound according to claim 13,
wherein $X^{d1}$ is a sulfur atom.

16. The compound according to claim 13,
wherein in General Formula (1), the group having a polarity that increases through decomposition by an action of an acid is a group represented by General Formula (a-1),

   (a-1)

in General Formula (a-1), $R^{a1}$ represents a leaving group that leaves by an action of an acid, and * represents a bonding position.

17. A method for producing the compound having at least one cation represented by General Formula (1), wherein a compound having at least one cation represented by General Formula (4) is reacted with a compound represented by General Formula (5) in a presence of a basic compound to produce the compound having at least one cation represented by General Formula (1), $$(R^{d1})_m\text{—}[X^{d1}]^+\text{-}(L^{d1}\text{-}Ar^{d1}\text{—}(R^{d3})_p)_n \quad (4)$$

in General Formula (4), $X^{d1}$ represents a sulfur atom or an iodine atom, $R^{d1}$ represents a linear, branched, or cyclic alkyl group which may have a substituent, a linear, branched, or cyclic alkenyl group which may have a substituent, or an aryl group which may have a substituent, in a case where m represents 2, two $R^{d1}$'s may be bonded to each other to form a ring, $L^{d1}$ represents a single bond or a divalent linking group, $Ar^{d1}$ represents an aromatic hydrocarbon ring group which may have a substituent, in a case where $X^{d1}$ represents the sulfur atom, n represents an integer of 1 to 3, m represents an integer of 0 to 2, and m+n is 3, in a case where $X^{d1}$ represents the iodine atom, n represents 1 or 2, m represents 0 or 1, and m+n is 2, p represents an integer of 1 to 5, and $R^{d3}$ represents a halogen atom, $$HS\text{-}X^{d2} \quad \text{General Formula (5)}$$

$X^{d2}$ represents a group represented by General Formula (1-1) or a leaving group that leaves by an action of an acid, $$\text{*-}L^{d2}\text{-}R^{d2} \quad \text{Formula (1-1)}$$

in Formula (1-1), $L^{d2}$ represents a single bond or a divalent linking group, $R^{d2}$ represents a group having a polarity that increases through decomposition by an action of an acid, and * represents a bonding position, $$(R^{d1})_m\text{—}[X^{d1}]^+\text{-}(L^{d1}\text{-}Ar^{d1}\text{—}(S\text{—}X^{d2})_p)_n \quad (1)$$

in General Formula (1), $X^{d1}$ represents a sulfur atom or an iodine atom, $R^{a1}$ represents a linear, branched, or cyclic alkyl group which may have a substituent, a linear, branched, or cyclic alkenyl group which may have a substituent, or an aryl group which may have a substituent, in a case where m represents 2, two $R^{d1}$'s may be bonded to each other to form a ring, $L^{d1}$ represents a single bond or a divalent linking group, $Ar^{d1}$ represents an aromatic hydrocarbon ring group which may have a substituent, and $X^{d2}$ represents a group represented by General Formula (1-1) or a leaving group that leaves by an action of an acid, $$\text{*-}L^{d2}\text{-}R^{d2} \quad \text{General Formula (1-1)}$$

in General Formula (1-1), $L^{d2}$ represents a single bond or a divalent linking group, $R^{d2}$ represents a group having a polarity that increases through decomposition by the action of an acid, * represents a bonding position, in a case where $X^{d1}$ represents the sulfur atom, n represents an integer of 1 to 3, m represents an integer of 0 to 2, and m+n is 3, in a case where $X^{d1}$ represents the iodine atom, n represents 1 or 2, m represents 0 or 1, and m+n is 2, and p represents an integer of 1 to 5.

* * * * *